(12) United States Patent
Shim et al.

(10) Patent No.: US 12,415,950 B2
(45) Date of Patent: Sep. 16, 2025

(54) BORON COMPOUND AND ORGANIC LIGHT EMITTING DIODE INCLUDING SAME

(71) Applicant: SFC CO., LTD., Cheongju-si (KR)

(72) Inventors: So Young Shim, Cheongju-si (KR); Se Jin Yu, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 932 days.

(21) Appl. No.: 17/624,212

(22) PCT Filed: Jul. 16, 2020

(86) PCT No.: PCT/KR2020/009383
§ 371 (c)(1),
(2) Date: Dec. 30, 2021

(87) PCT Pub. No.: WO2021/010770
PCT Pub. Date: Jan. 21, 2021

(65) Prior Publication Data
US 2023/0002419 A1    Jan. 5, 2023

(30) Foreign Application Priority Data
Jul. 17, 2019 (KR) .......................... 10-2019-0086567

(51) Int. Cl.
| H01L 51/54 | (2006.01) |
| C07F 5/02 | (2006.01) |
| C07F 7/08 | (2006.01) |
| C09K 11/06 | (2006.01) |
| H10K 71/16 | (2023.01) |
| H10K 85/30 | (2023.01) |
| H10K 85/40 | (2023.01) |
| H10K 85/60 | (2023.01) |

(52) U.S. Cl.
CPC .............. *C09K 11/06* (2013.01); *C07F 5/027* (2013.01); *C07F 7/0805* (2013.01); *C07F 7/0812* (2013.01); *H10K 71/16* (2023.02); *H10K 85/322* (2023.02); *H10K 85/361* (2023.02); *H10K 85/40* (2023.02); *H10K 85/615* (2023.02); *H10K 85/631* (2023.02); *H10K 85/652* (2023.02); *H10K 85/654* (2023.02); *H10K 85/657* (2023.02); *H10K 85/6572* (2023.02); *H10K 85/6574* (2023.02); *H10K 85/658* (2023.02)

(58) Field of Classification Search
None
See application file for complete search history.

(56) References Cited

FOREIGN PATENT DOCUMENTS

| CN | 107501311 A | 12/2017 |
| CN | 108409761 A | 8/2018 |
| EP | 3109253 A1 | 12/2016 |
| KR | 20160119683 A | 10/2016 |
| KR | 20180108559 A | 10/2018 |
| KR | 20180134850 A | 12/2018 |
| KR | 20190042791 A | 4/2019 |
| KR | 101990818 B1 | 6/2019 |
| WO | WO2017188111 A1 | 11/2017 |
| WO | WO2018186374 A1 | 10/2018 |
| WO | WO2018203666 A1 | 11/2018 |

OTHER PUBLICATIONS

International search report of PCT/KR2020/009383, Oct. 27, 2020, English translation.
The extended European search report of EP 20 84 0303, Jun. 19, 2023.

*Primary Examiner* — Andrew K Bohaty
(74) *Attorney, Agent, or Firm* — STIP Law Group, LLC

(57) ABSTRACT

The present disclosure relates to a boron compound applicable to an organic light-emitting diode and an organic light-emitting diode comprising same. More specifically, the present disclosure relates to a boron compound represented by any one of Chemical Formulas A to D and an organic light-emitting diode comprising same, wherein Chemical Formulas A to D are as defined in the description.

22 Claims, 1 Drawing Sheet

| 80 |
|----|
| 70 |
| 60 |
| 50 |
| 40 |
| 30 |
| 20 |
| 10 |

BORON COMPOUND AND ORGANIC LIGHT EMITTING DIODE INCLUDING SAME

CROSS-REFERENCE TO RELATED APPLICATIONS

This application is the U.S. National Phase under 35 U.S.C. § 371 of International Application No. PCT/KR2020/009383 filed on Jul. 16, 2020, which in turn claims the benefit of Korean Application No. 10-2019-0086567 filed on Jul. 17, 2019, the disclosures of which are incorporated by reference into the present application.

TECHNICAL FIELD

The present disclosure relates to a novel boron compound for use in an organic light emitting diode and, more particularly, to a boron compound useful as a dopant material for a light-emitting layer in an organic light-emitting diode, thereby achieving the diode properties of high luminance efficiency and a long lifespan, and an organic light-emitting diode comprising the boron compound.

BACKGROUND ART

Organic light-emitting diodes (OLEDs), based on self-luminescence, are used to create digital displays with the advantage of having a wide viewing angle and being able to be made thinner and lighter than liquid crystal displays. In addition, an OLED display exhibits a very fast response time. Accordingly, OLEDs have found applications in the full color display field or the illumination field.

In general, the term "organic light-emitting phenomenon" refers to a phenomenon in which electrical energy is converted to light energy by means of an organic material. An organic light-emitting diode using the organic light-emitting phenomenon has a structure usually including an anode, a cathode, and an organic material layer interposed therebetween. In this regard, the organic material layer may have, for the most part, a multilayer structure consisting of different materials, for example, a hole injection layer, a hole transport layer, a light-emitting layer, an electron transport layer, and an electron injection layer in order to enhance the efficiency and stability of the organic light-emitting diode. In the organic light-emitting diode having such a structure, application of a voltage between the two electrodes injects a hole from the anode and an electron from the cathode to the organic layer. In the luminescent zone, the hole and the electron recombine to produce an exciton. When the exciton returns to the ground state from the excited state, the molecule of the organic layer emits light. Such an organic light-emitting diode is known to have characteristics such as self-luminescence, high luminance, high efficiency, a low driving voltage, a wide viewing angle, high contrast, and high-speed response.

Materials used as organic layers in OLEDs may be divided according to functions into luminescent materials and charge transport materials, for example, a hole injection material, a hole transport material, an electron transport material, and an electron injection material. As for the luminescent materials, there are two main families of OLED: those based on small molecules and those employing polymers. The light-emitting mechanism forms the basis of classification of luminescent materials as fluorescent and phosphorescent materials, which use excitons in singlet and triplet states, respectively.

When a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer.

This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

Meanwhile, studies have been made to use boron compounds as dopant compounds. With regard to related art pertaining to the use of boron compounds, reference may be made to Korean Patent No. 10-2016-0119683 A (issued Oct. 14, 2016), which discloses an organic light-emitting diode employing a novel polycyclic aromatic compound in which multiple aromatic rings are connected via boron and oxygen atoms. In addition, International Patent No. WO 2017/188111 (Nov. 2, 2017) disclosed an organic light emitting diode in which a compound structured to connect multiple polycondensed aromatic rings via boron and nitrogen atoms is used as a dopant in a light emitting layer while an anthracene derivative is used as a host.

Despite a variety of kinds of compounds prepared for use in light emitting layers in organic light emitting diodes including the related arts, there is still the continuing need to develop a novel compound that can be applied to an organic light emitting diode, allows low-voltage driving operation and exhibits stable and high efficiency properties, and an organic light emitting diode comprising the same.

DISCLOSURE

Technical Problem

Therefore, an aspect of the present disclosure is to provide a boron compound having a novel structure which can be employed as a dopant material in a light emitting layer.

Another aspect of the present disclosure is to an organic light emitting diode (OLED) in which the boron compound is employed as a dopant material in a light emitting layer, whereby the organic light emitting diode can exhibit improved properties including high luminance efficiency and a long lifespan.

Technical Solution

According to an aspect thereof, the present disclosure provides a boron compound represented by any one of the following Chemical Formulas A to D:

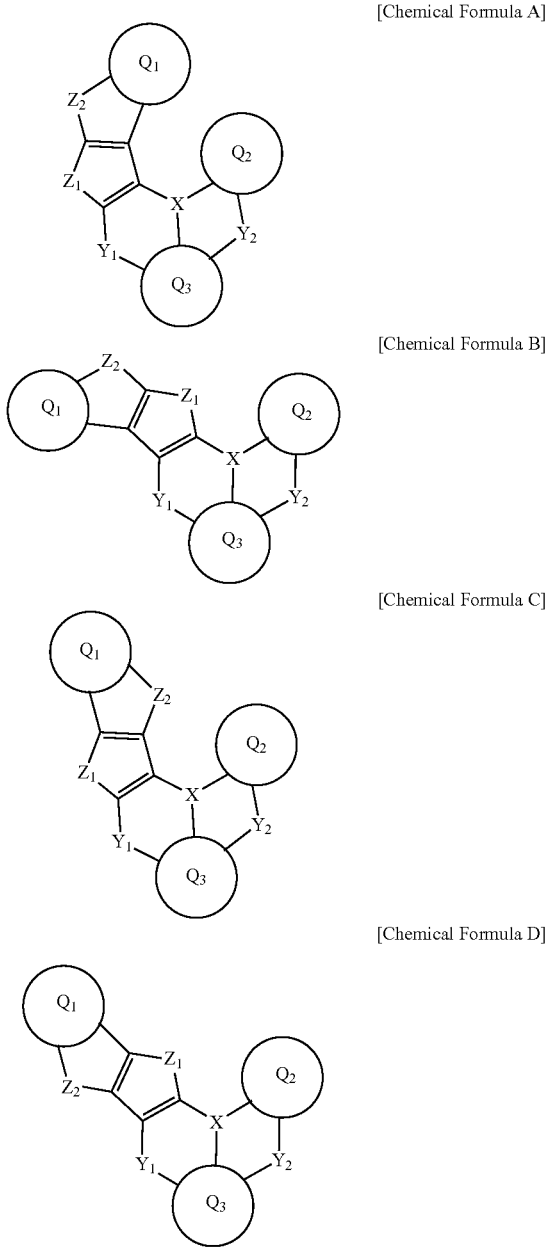

[Chemical Formula A]

[Chemical Formula B]

[Chemical Formula C]

[Chemical Formula D]

wherein, $Q_1$ to $Q_3$, which may be same or different, are each independently a substituted or unsubstituted aromatic hydrocarbon ring of 6 to 50 carbon atoms or a substituted or unsubstituted heteroaromatic ring of 2 to 50 carbon atoms, X is any one selected from B, P, and P=O, $Y_1$ and $Y_2$, which may be same or different, are each independently any one selected from N—$R_1$, $CR_2R_3$, O, S, and $SiR_4R_5$, and $Z_1$ and $Z_2$, which may be same or different, are each independently any one selected from N—$R_6$, $CR_2R_5$, O, S, and $SiR_9R_{10}$, wherein the substituents $R_1$ to $R_{10}$, which may be same or different, are each independently any one selected from a hydrogen atom, a deuterium atom, a substituted or unsubstituted alkyl of 1 to 30, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, a bond may be formed between $R_2$ and $R_3$, between $R_4$ and $R_5$, between $R_7$ and $R_8$, or between $R_9$ and $R_{10}$ to form an additional mono- or polycyclic aliphatic or aromatic ring, any of the substituents $R_1$ to $R_5$ for $Y_1$ may bond to the $Q_3$ ring to form an additional mono- or polycyclic aliphatic or aromatic ring, any of the substituents $R_1$ to $R_5$ for $Y_2$ may bond to the $Q_2$ or $Q_3$ ring to form an additional mono- or polycyclic aliphatic or aromatic ring, any of the substituents $R_6$ to $R_{10}$ for $Z_2$ may bond to the $Q_1$ ring to form an additional mono- or polycyclic aliphatic or aromatic ring, any of the substituents $R_6$ to $R_{10}$ for $Z_1$ in Chemical Formula A may bond to $Z_2$ or $Y_1$ to form an additional mono- or polycyclic aliphatic or aromatic ring, any of the substituents $R_6$ to $R_{10}$ for $Z_1$ in Chemical Formula B may bond to $Z_2$ to form an additional mono- or polycyclic aliphatic or polycyclic ring, any of the substituents $R_6$ to $R_{10}$ for $Z_1$ in Chemical Formula C may bond to $Y_1$ to form an additional mono- or polycyclic aliphatic or polycyclic ring, any of the substituents $R_6$ to $R_{10}$ for $Z_1$ in Chemical Formula D may bond to $Q_1$ to form an additional mono- or polycyclic aliphatic or polycyclic ring.

Advantageous Effects

When employing the novel boron compound according to the present disclosure as a dopant material, an organic light-emitting diode exhibits long lifespan and improved efficiency characteristics, compared to conventional organic light-emitting diodes.

BRIEF DESCRIPTION OF THE DRAWINGS

The above and other aspects, features and advantages of the present disclosure will be more apparent from the following detailed description taken in conjunction with the accompanying drawings, in which: FIG. 1 is a schematic diagram of an organic light-emitting diode according to some embodiments of the present disclosure.

BEST MODE

Below, a detailed description will be given of the present disclosure. In each drawing of the present disclosure, sizes or scales of components may be enlarged or reduced than their actual sizes or scales for better illustration, and known components are not depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between", may be used herein for ease of description to refer to the relative positioning.

Throughout the specification, when a portion may "include" a certain constituent element, unless explicitly described to the contrary, it may not be construed to exclude another constituent element but may be construed to further include other constituent elements. Further, throughout the specification, the word "on" means positioning on or below the object portion, but does not essentially mean positioning on the lower side of the object portion based on a gravity direction.

The present disclosure provides a boron compound represented by any one of the following Chemical Formulas A to D:

[Chemical Formula A]

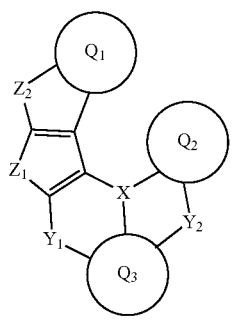

[Chemical Formula B]

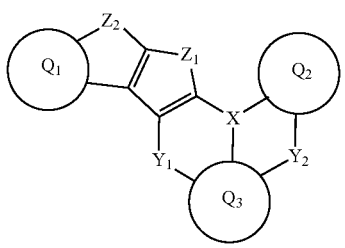

[Chemical Formula C]

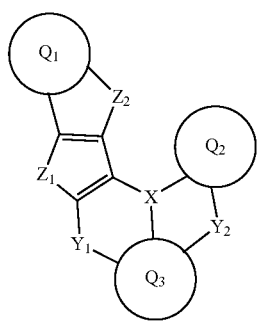

[Chemical Formula D]

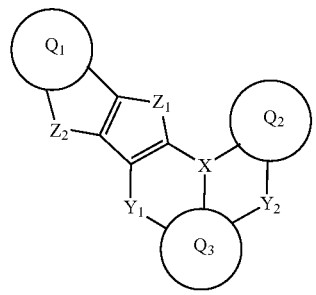

wherein, $Q_1$ to $Q_3$, which may be same or different, are each independently a substituted or unsubstituted aromatic hydrocarbon ring of 6 to 50 carbon atoms or a substituted or unsubstituted heteroaromatic ring of 2 to 50 carbon atoms, X is any one selected from B, P, and P=O, $Y_1$ and $Y_2$, which may be same or different, are each independently any one selected from N—$R_1$, $CR_2R_3$, O, S, and $SiR_4R_5$, and $Z_1$ and $Z_2$, which may be same or different, are each independently any one selected from N—$R_6$, $CR_2R_5$, O, S, and $SiR_9R_{10}$, wherein the substituents $R_1$ to $R_{10}$, which may be same or different, are each independently any one selected from a hydrogen atom, a deuterium atom, a substituted or unsubstituted alkyl of 1 to 30, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, a bond may be formed between $R_2$ and $R_3$, between $R_4$ and $R_5$, between $R_7$ and $R_8$, or between $R_9$ and $R_{10}$ to form an additional mono- or polycyclic aliphatic or aromatic ring, any of the substituents $R_1$ to $R_5$ for $Y_1$ may bond to the $Q_3$ ring to form an additional mono- or polycyclic aliphatic or aromatic ring, any of the substituents $R_1$ to $R_5$ for $Y_2$ may bond to the $Q_2$ or $Q_3$ ring to form an additional mono- or polycyclic aliphatic or aromatic ring, any of the substituents $R_6$ to $R_{10}$ for $Z_2$ may bond to the $Q_1$ ring to form an additional mono- or polycyclic aliphatic or aromatic ring, any of the substituents $R_6$ to $R_{10}$ for $Z_1$ in Chemical Formula A may bond to $Z_2$ or $Y_1$ to form an additional mono- or polycyclic aliphatic or aromatic ring, any of the substituents $R_6$ to $R_{10}$ for $Z_1$ in Chemical Formula B may bond to $Z_2$ to form an additional mono- or polycyclic aliphatic or polycyclic ring, any of the substituents $R_6$ to $R_{10}$ for $Z_1$ in Chemical Formula C may bond to $Y_1$ to form an additional mono- or polycyclic aliphatic or polycyclic ring, any of the substituents $R_6$ to $R_{10}$ for $Z_1$ in Chemical Formula D may bond to $Q_1$ to form an additional mono- or polycyclic aliphatic or polycyclic ring, wherein the term "substituted" in the expression "substituted or unsubstituted" used for compounds of Chemical Formulas A to D means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a cycloalkyl of 3 to 24 carbon atoms, a heteroalkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or a fused aromatic system, and when it comes to the latter, the aromatic system may include a fused ring that is formed by adjacent substituents on the aryl radical.

Examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl, but are not limited thereto. At least one hydrogen atom of the aryl may be substituted by a deuterium atom, a halogen atom, a hydroxy, a nitro, a cyano, a silyl, an amino (—$NH_2$, —NH(R), —N(R')(R'') wherein R' and R'' are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The term "heteroaryl" substituent used in the compound of the present disclosure refers to a hetero aromatic radical of 2 to 24 carbon atoms bearing 1 to 3 heteroatoms selected from among N, O, P, Si, S, Ge, Se, and Te. In the aromatic radical, two or more rings may be fused. One or more hydrogen atoms on the heteroaryl may be substituted by the same substituents as on the aryl.

In addition, the term "heteroaromatic ring", as used herein, refers to an aromatic hydrocarbon ring bearing as aromatic ring members 1 to 3 heteroatoms selected particularly from N, O, P, Si, S, Ge, Se, and Te.

As used herein, the term "alkyl" refers to an alkane missing one hydrogen atom and includes linear or branched structures. Examples of the alkyl substituent useful in the present disclosure include methyl, ethyl, propyl, isopropyl, isobutyl, sec-butyl, tert-butyl, pentyl, isoamyl, and hexyl. At least one hydrogen atom of the alkyl may be substituted by the same substituent as in the aryl.

The term "cyclo" as used in substituents of the present disclosure, such as cycloalkyl, cycloalkoxy, etc., refers to a structure responsible for a mono- or polycyclic ring of saturated hydrocarbons such as alkyl, alkoxy, etc. Concrete examples of cycloalkyl radicals include cyclopropyl, cyclobutyl, cyclopentyl, cyclohexyl, methylcyclopentyl, methylcyclohexyl, ethylcyclopentyl, ethylcyclohexyl, adamantyl, dicyclopentadienyl, decahydronaphthyl, norbornyl, bornyl, and isobornyl. One or more hydrogen atoms on the cycloalkyl may be substituted by the same substituents as on the aryl and it can be applied to cycloalkoxy, as well.

The term "alkoxy" as used in the compounds of the present disclosure refers to an alkyl or cycloalkyl singularly bonded to oxygen. Concrete examples of the alkoxy include methoxy, ethoxy, propoxy, isobutoxy, sec-butoxy, pentoxy, iso-amyloxy, hexyloxy, cyclobutyloxy, cyclopentyloxy, adamantyloxy, dicyclopentyloxy, bornyloxy, and isobornyloxy. One or more hydrogen atoms on the alkoxy may be substituted by the same substituents as on the aryl.

Concrete examples of the arylalkyl used in the compounds of the present disclosure include phenylmethyl (benzyl), phenylethyl, phenylpropyl, naphthylmethyl, and naphthylethyl. One or more hydrogen atoms on the arylalkyl may be substituted by the same substituents as on the aryl.

Concrete examples of the silyl radicals used in the compounds of the present disclosure include trimethylsilyl, triethylsilyl, triphenylsilyl, trimethoxysilyl, dimethoxyphenylsilyl, diphenylmethylsilyl, diphenylvinlysilyl, methylcyclobutylsilyl, and dimethyl furylsilyl. One or more hydrogen atoms on the silyl may be substituted by the same substituents as on the aryl.

As used herein, the term "alkenyl" refers to an unsaturated hydrocarbon group that contains a carbon-carbon double bond between two carbon atoms and the term "alkynyl" refers to an unsaturated hydrocarbon group that contains a carbon-carbon triple bond between two carbon atoms.

As used herein, the term "alkylene" refers to an organic aliphatic radical regarded as derived from a linear or branched saturated hydrocarbon alkane by removal of two hydrogen atoms from different carbon atoms. Concrete examples of the alkylene include methylene, ethylene, propylene, isopropylene, isobutylene, sec-butylene, tert-butylene, pentylene, iso-amylene, hexylene, and so on. One or more hydrogen atoms on the alkylene may be substituted by the same substituents as on the aryl.

Furthermore, as used herein, the term "diarylamino" refers to an amine radical having two identical or different aryl groups bonded to the nitrogen atom thereof, the term "diheteroarylamino" refers to an amine radical having two identical or different heteroaryl groups bonded to the nitrogen atom thereof, and the term "aryl(heteroaryl)amino" refers to an amine radical having an aryl group and a heteroarylgroup both bonded to the nitrogen atom thereof.

As more particular examples accounting for the term "substituted" in the expression "substituted or unsubstituted" used for compounds of Chemical Formulas A to D and H, the compounds may be substituted by at least one substituent selected from the group consisting of a deuterium atom, a cyano, a halogen, a hydroxy, a nitro, an alkyl of 1 to 12 carbon atoms, a halogenated alkyl of 1 to 12 carbon atoms, an alkenyl of 2 to 12 carbon atoms, an alkynyl of 2 to 12 carbon atoms, a cycloalkyl of 3 to 12 carbon atoms, a heteroalkyl of 1 to 12 carbon atoms, an aryl of 6 to 18 carbon atoms, an arylalkyl of 7 to 20 carbon atoms, an alkylaryl of 7 to 20 carbon atoms, a heteroaryl of 2 to 18 carbon atoms, a heteroarylalkyl of 2 to 18 carbon atoms, an alkoxy of 1 to 12 carbon atoms, an alkylamino of 1 to 12 carbon atoms, an arylamino of 6 to 18 carbon atoms, a heteroarylamino of 1 to 18 carbon atoms, an alkylsilyl of 1 to 12 carbon atoms, an arylsilyl of 6 to 18 carbon atoms, an aryloxy of 6 to 18 carbon atoms, and an arylthionyl of 6 to 18 carbon atoms.

In the present disclosure, the boron compound represented by any one of Chemical Formulas A to D is characterized by the structure in which the $Q_2$ and $Q_3$ ring moieties, which are each a substituted or unsubstituted aromatic hydrocarbon ring of 6 to 50 carbon atoms or a substituted or unsubstituted heteroaromatic ring of 2 to 50 carbon atoms, are each bonded to the central atom X and linked to each other via the linker $Y_2$; the $Q_3$ ring moiety is bonded to the linker $Y_1$; and two carbon atoms on one side of the 5-membered ring bearing $Z_1$ and two double bonds (diene) are connected to $Y_1$ and X, respectively and two carbon atoms on the other side of the 5-membered ring bearing $Z_1$ and two double bonds (diene) are connected respectively to $Z_2$ and $Q_1$, which is a substituted or unsubstituted aromatic hydrocarbon ring of 6 to 50 carbon atoms or a substituted or unsubstituted heteroaromatic ring of 2 to 50 carbon atoms, whereby the 5-membered ring bearing $Z_1$, the 5-membered ring bearing $Z_2$, and the 6-membered ring bearing X and $Y_1$ form a fused ring.

It is meant by the expression "a bond may be formed between $R_2$ and $R_3$, between $R_4$ and $R_5$, between $R_7$ and $R_8$, or between $R_9$ and $R_{10}$ to form an additional mono- or polycyclic aliphatic or aromatic ring" that $R_2$ and $R_3$ are each deprived of a hydrogen radical and then connected to each other to form an additional ring, $R_4$ and $R_5$ are also each deprived of a hydrogen radical and then connected to each other to form an additional ring, and the same is true of the other substituents.

What is meant by the expression "any of the substituents $R_1$ to $R_5$ for $Y_1$ may bond to the $Q_3$ ring to form an additional mono- or polycyclic aliphatic or aromatic ring" is that the $Q_3$ ring moiety and $R_1$ are each deprived of a hydrogen radical and then connected to each other to form an additional ring; the $Q_1$ ring moiety and $R_2$ or $R_3$ are each deprived of a hydrogen radical and then connected to each other to form an additional ring; and/or the $Q_3$ ring moiety and $R_4$ or $R_5$ are each deprived of a hydrogen radical and then connected to each other to form an additional ring. In this context, the wording " . . . connected to each other to form an additional ring", as used herein, means that two substituents are each deprived of a hydrogen radical and then connected to each other to form a ring.

The ring moieties $Q_1$ to $Q_3$ in Chemical Formulas A to D may be same or different and are each independently a substituted or unsubstituted aromatic hydrocarbon ring of 6 to 50 carbon atoms, or a substituted or unsubstituted heteroaromatic ring of 2 to 50 carbon atoms, particularly a substituted or unsubstituted aromatic hydrocarbon ring of 6 to 20 carbon atoms or a substituted or unsubstituted heteroaromatic ring of 2 to 20 carbon atoms, and more particularly a substituted or unsubstituted aromatic hydrocarbon ring of 6 to 14 carbon atoms or a substituted or unsubstituted heteroaromatic ring of 2 to 14 carbon atoms.

In an embodiment, at least one of the linkers $Y_1$ and $Y_2$ both bonded to the $Q_3$ ring moiety in Chemical Formulas A to D may be N—$R_1$. In this regard, $R_1$ is as defined above.

When at least one of the linkers $Y_1$ and $Y_2$ both bonded to the $Q_3$ ring moiety in Chemical Formulas A to D may be N—$R_1$, the substituent $R_1$ may be a substituted or unsubstituted aryl of 6 to 50 carbon atoms or a substituted or unsubstituted heteroaryl of 2 to 50 carbon atoms, and particularly a substituted or unsubstituted aryl of 6 to 20 carbon atoms or a substituted or unsubstituted heteroaryl of 2 to 20 carbon atoms.

When the linkers $Y_1$ and $Y_2$ in Chemical Formulas A to D are each N—$R_1$, the substituent $R_1$ may be particularly a substituted or unsubstituted aryl of 6 to 50 carbon atoms or a substituted or unsubstituted heteroaryl of 2 to 50 carbon atoms.

In addition, the linkers $Y_1$ and $Y_2$ in Chemical Formulas A to D may be same or different and at least one of them may be the linker represented by the following Structural Formula A:

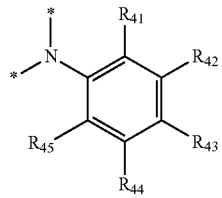

[Structural Formula A]

wherein

"—*" denotes a bonding site at which the N atom is bonded to the carbon atom connected to $Z_1$, the carbon atom connected to $Y_1$ in the 5-membered ring bearing $Z_1$, an aromatic carbon atom in the $Q_2$ ring moiety, or an aromatic carbon atom in the $Q_3$ ring moiety; and $R_{41}$ to $R_{45}$, which may be same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{41}$ and $R_{45}$ may each independently be bonded to the $Q_2$ or $Q_3$ ring moiety to form an additional aliphatic or aromatic mono- or polycyclic ring.

Meanwhile, the expression "$R_{41}$ and $R_{45}$ may each independently be bonded to the $Q_2$ or $Q_3$ ring moiety to form an additional aliphatic or aromatic mono- or polycyclic ring" means that the substituent $R_{41}$ or $R_{45}$ and the $Q_2$ or $Q_3$ ring moiety are each deprived of a hydrogen radical and connected to each other to form an additional ring, as described for the foregoing bond between $R_2$ and $R_3$, between $R_4$ and $R_5$, etc., and the meaning is true of the expression "to form an additional ring" that will be given herein.

In one embodiment, the linkers $Y_1$ and $Y_2$, which are linked to the $Q_3$ ring moiety in Chemical Formulas A to D, may be the same or different and may each independently be N—$R_1$ wherein $R_1$ is as defined above.

In Chemical Formulas A to D, at least one of the linkers $Y_1$ and $Y_2$ may be an oxygen atom (O). In Chemical Formulas A to D, the central atom X may be particularly a boron atom (B).

In the compound represented by Chemical Formulas A to D of the present disclosure, the aromatic hydrocarbon rings of $Q_1$ to $Q_3$, which may be the same or different, may each be independently a substituted or unsubstituted aromatic hydrocarbon ring of 6 to 50 carbon atoms. In this regard, the aromatic hydrocarbon rings of $Q_1$ and $Q_2$ in Chemical Formulas A to D may each independently any one selected from [Structural Formula 10] to [Structural Formula 21], below:

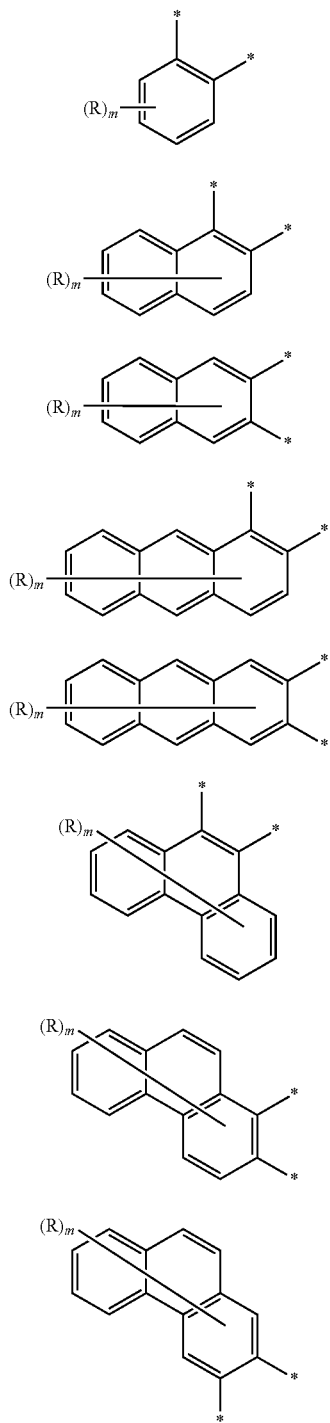

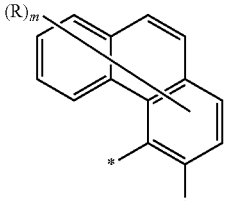

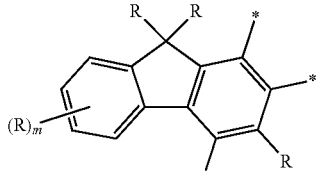

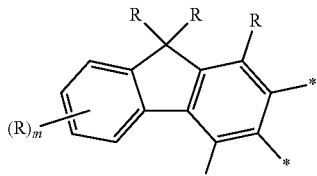

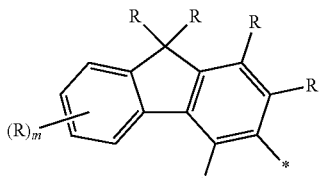

wherein,

"—*" denotes a bonding site at which the carbon ring member of $Q_1$ is bonded to $Z_2$ or a carbon member of the 5-membered ring bearing $Z_2$ or at which the carbon ring member of $Q_2$ is bonded to X or $Y_2$;

R's, which may be the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a diarylamino of 12 to 24 carbon atoms, a substituted or unsubstituted diheteroarylamino of 2 to 24 carbon atoms, a substituted or unsubstituted aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a cyano, and a halogen; and m is an integer of 1 to 8 wherein when m is 2 or greater or when two or more R's exist, the individual R's may be the same or different.

In addition, when the $Q_1$ to $Q_3$ ring moieties, which may be the same or different, are each independently a substituted or unsubstituted aromatic hydrocarbon ring of 6 to 50 carbon atoms, the aromatic hydrocarbon ring of $Q_3$ in Chemical Formulas A to D may be a ring represented by the following Structural Formula B:

[Structural Formula B]

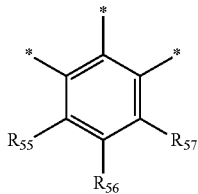

wherein,

"—*" denotes a bonding site at which the corresponding aromatic carbon ring members of $Q_3$ are bonded to $Y_1$, X, and $Y_2$, respectively; and $R_{55}$ to $R_{57}$, which may be the same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted diarylamino of 12 to 24 carbon atoms, a substituted or unsubstituted diheteroarylamino of 2 to 24 carbon atoms, a substituted or unsubstituted aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a cyano, and a halogen, and $R_{55}$ to $R_{57}$ may each be linked to an adjacent substituent to form an additional aliphatic or aromatic mono- or polycyclic ring.

Alternatively, when the $Q_1$ to $Q_3$ ring moieties in the compounds represented by Chemical Formulas A to D are each a substituted or unsubstituted heteroaromatic ring of 2 to 50 carbon atoms, the corresponding heteroaromatic rings may be the same or different and may each be independently any one selected from Structural Formulas 31 to 40:

[Structural Formula 31]

[Structural Formula 32]

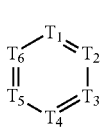

[Structural Formula 33]

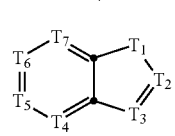

[Structural Formula 34]

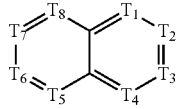

[Structural Formula 35]

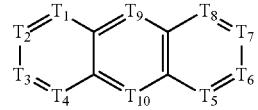

[Structural Formula 36]

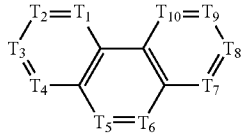

[Structural Formula 37]

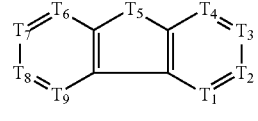

[Structural Formula 38]

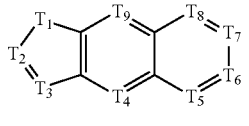

[Structural Formula 39]

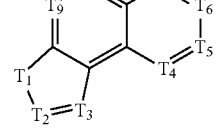

[Structural Formula 40]

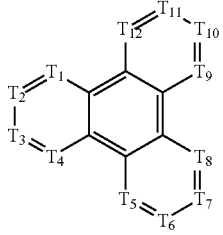

wherein,

T1 to T12, which may be the same or different, are each independently any one selected from $C(R_{61})$, $C(R_{62})(R_{63})$, N, $N(R_{64})$, O, S, Se, Te, Si $(R_{65})$ $(R_{66})$, and $Ge(R_{67})(R_{68})$, with a proviso that all of the T's as ring members in each aromatic ring moiety are not carbon atoms, wherein $R_{61}$ to $R_{68}$ are each as defined for $R_1$ above Here, the compound of Structural Formula 33 may include the compound represented by the following Structural Formula 33-1 due to a resonance structure based on delocalized electrons:

[Structural Formula 33-1]

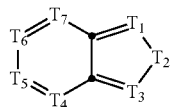

wherein, $T_1$ to $T_7$ are as defined in Structural Formulas 31 to 40.

Furthermore, the compounds of Structural Formulas 31 to 40 may each be any one selected from heterocyclic compounds of the following Structural Formula 50:

[Structural Formula 50]
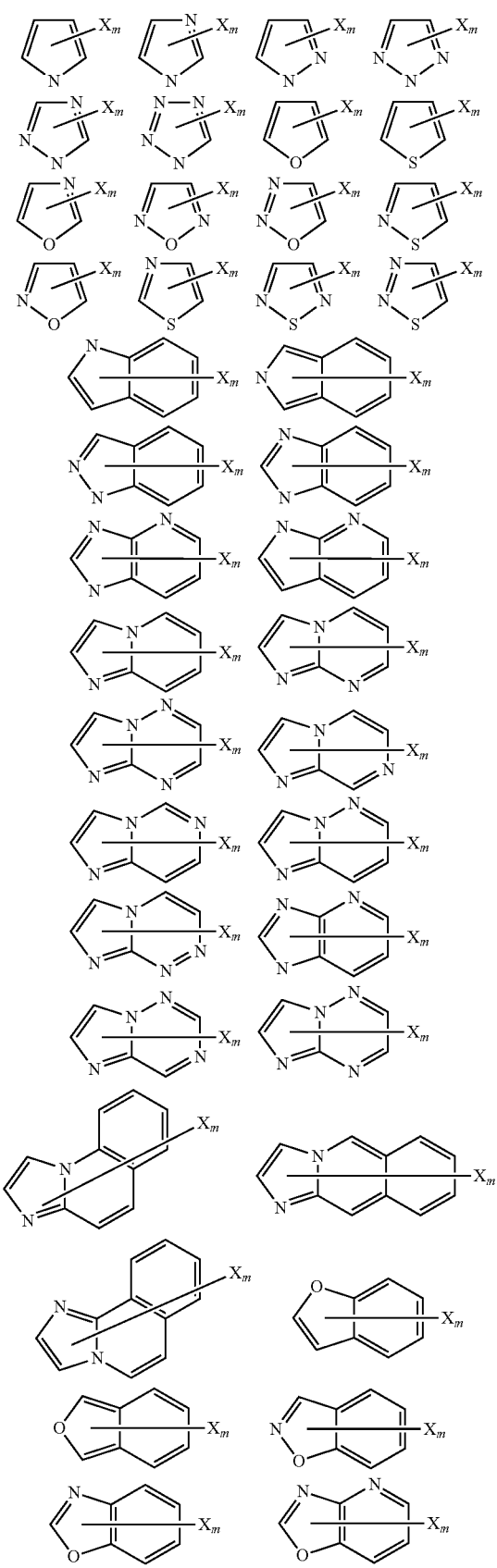
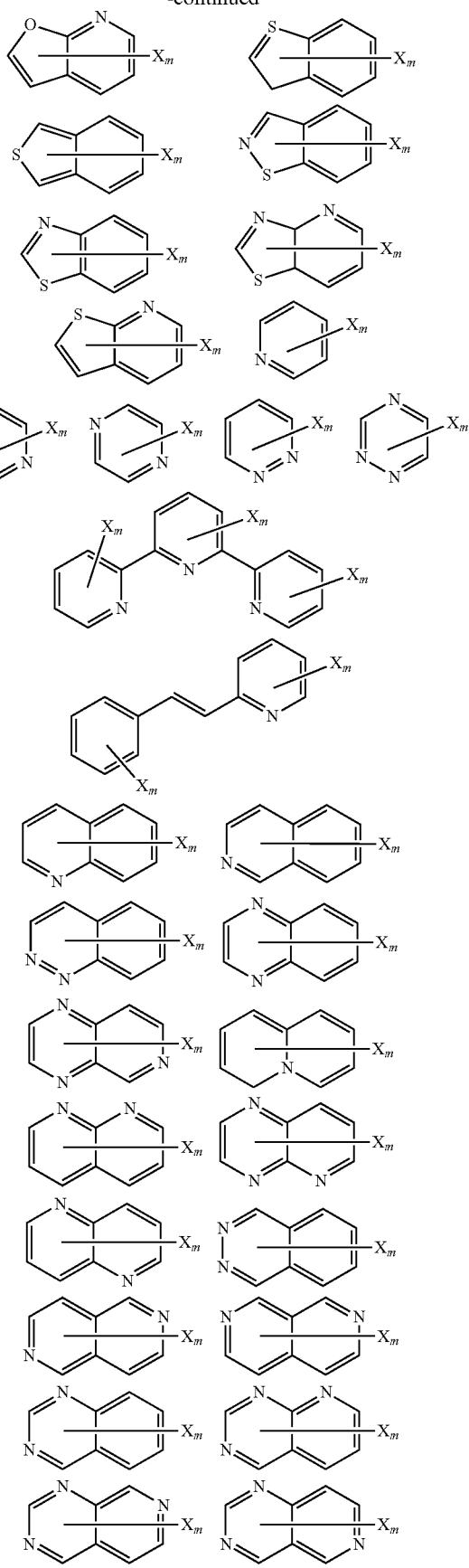

-continued
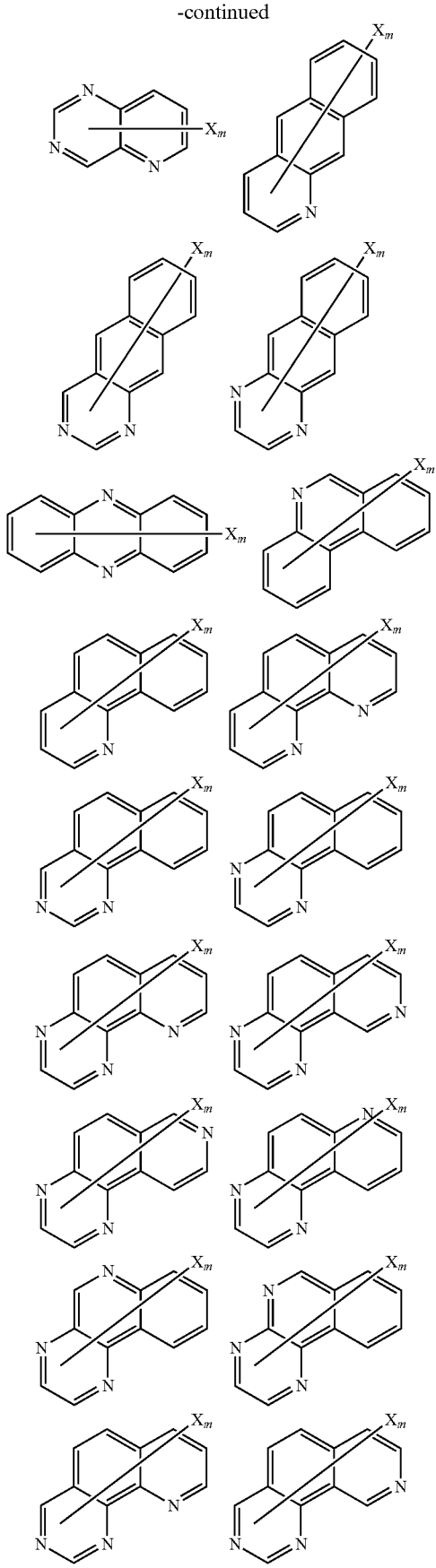
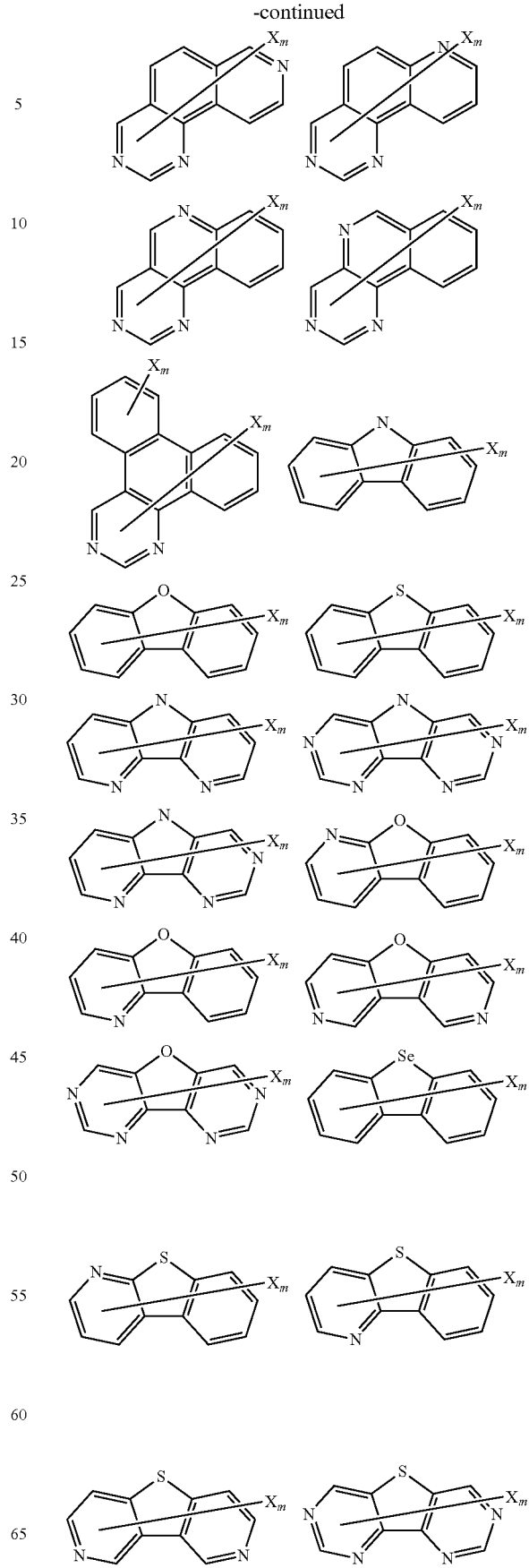

-continued

[Chemical structures: Te, Si, Ge, Si, Ge, Se variants with $X_m$ substituents]

wherein, the substituent X is as defined for $R_1$ above, and m is an integer of 1 to 11 wherein when m is 2 or greater, the corresponding multiple X's are the same or different.

In the compound represented by any one of Chemical Formulas A to D, at least one of the $Q_1$ to $Q_3$ ring moieties may have, as a substituent, an amine radical selected from a substituted or unsubstituted diarylamino of 12 to 24 carbon atoms, a substituted or unsubstituted diheteroarylamino of 2 to 24 carbon atoms, and a substituted or unsubstituted aryl(heteroaryl)amino of 7 to 24 carbon atoms. Particularly, one or two of the $Q_1$ to $Q_3$ ring moieties may have, as a substituent, an amine radical selected from a substituted or unsubstituted diarylamino of 12 to 24 carbon atoms, a substituted or unsubstituted diheteroarylamino of 2 to 24 carbon atoms, and a substituted or unsubstituted aryl(heteroaryl)amino of 7 to 24 carbon atoms. In this context, the term "substituted" in the expression "substituted or unsubstituted" is as defined above.

In Chemical Formulas A to D of the present disclosure, the aromatic hydrocarbon ring of 6 to 50 carbon atoms or the heteroaromatic ring of 2 to 50 carbon atoms of at least one of the $Q_1$ to $Q_3$ ring moieties may be bonded to an aryl amino radical, particularly 0 to 4 aryl amino radicals, more particularly to 0, 1, or two aryl amino radicals, each represented by the following Structural Formula F:

[Structural Formula F]

$$*-N\begin{matrix} Ar_{11} \\ Ar_{12} \end{matrix}$$

wherein,

"—*" denotes a bonding site participating in forming a bond to a carbon aromatic ring member of any one of $Q_1$ to $Q_3$, and $Ar_{11}$ and $Ar_{12}$, which may be the same or different, are each independently a substituted or unsubstituted aryl of 6 to 18 carbon atoms, and particularly a substituted or unsubstituted aryl of 6 to 12 carbon atoms, and may be linked to each other to form a ring.

In addition, the boron compound represented by any one of Chemical Formulas A to D may each be any one selected from to [Chemical Formula 1] to [Chemical Formula 112]:

[Chemical Formula 1]

[Chemical Formula 2]

[Chemical Formula 3]

[Chemical Formula 4]

[Chemical Formula 5]
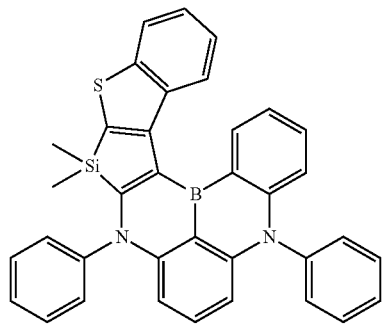
[Chemical Formula 6]
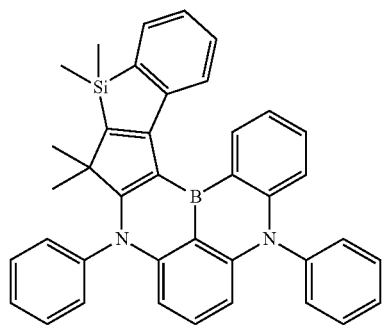
[Chemical Formula 7]
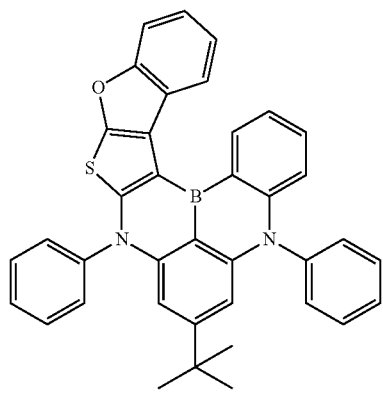
[Chemical Formula 8]
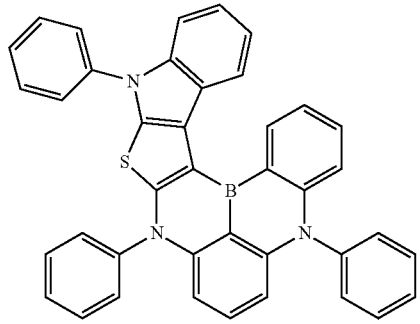
[Chemical Formula 9]
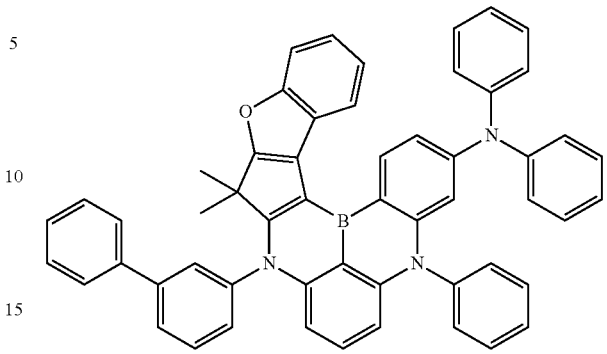
[Chemical Formula 10]
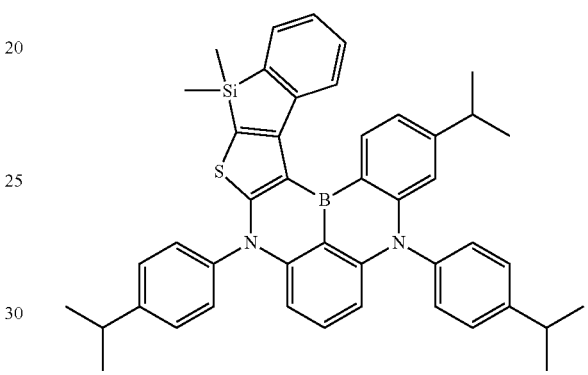
[Chemical Formula 11]
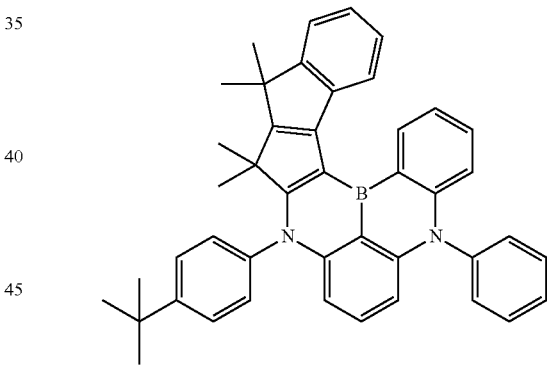
[Chemical Formula 12]
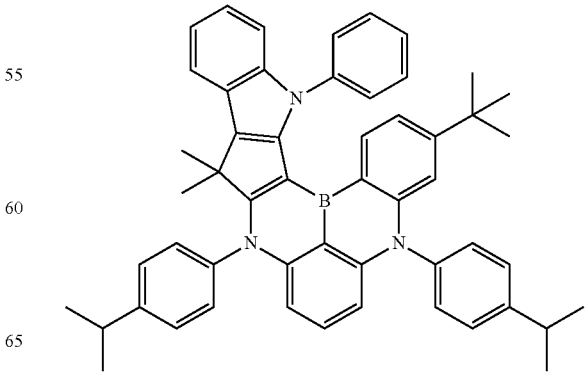

[Chemical Formula 13]
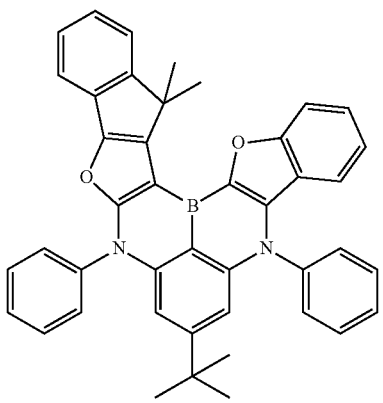
[Chemical Formula 14]
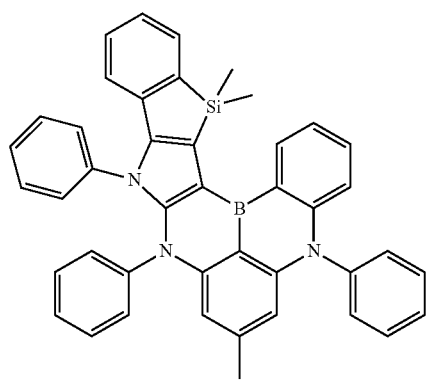
[Chemical Formula 15]
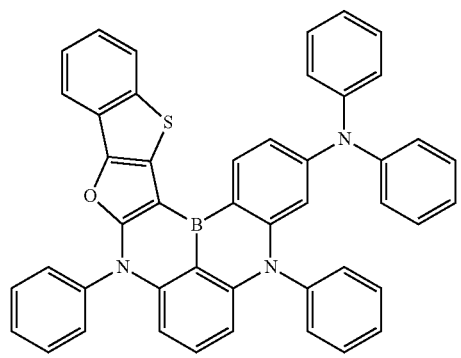
[Chemical Formula 16]
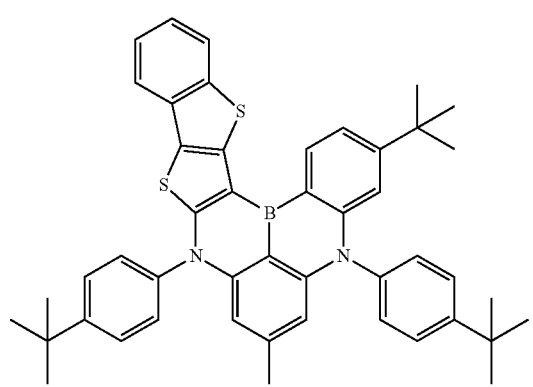
[Chemical Formula 17]
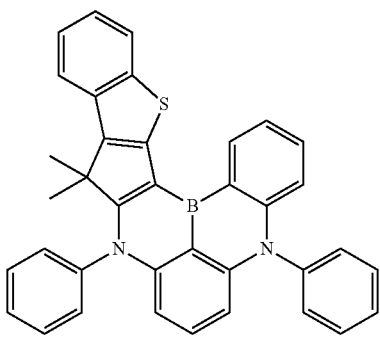
[Chemical Formula 18]
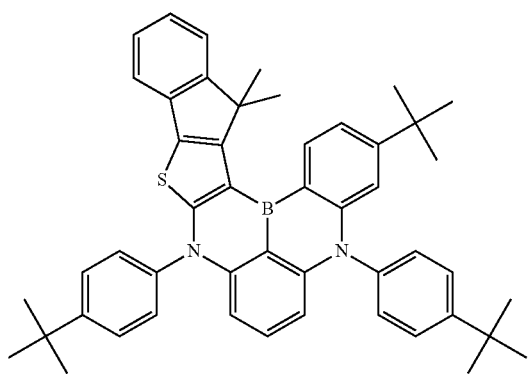
[Chemical Formula 19]
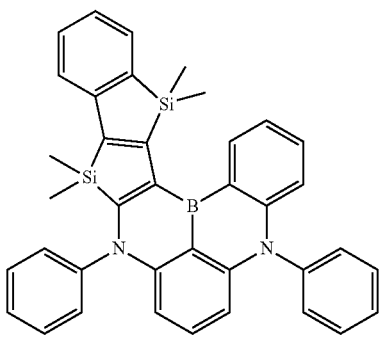
[Chemical Formula 20]
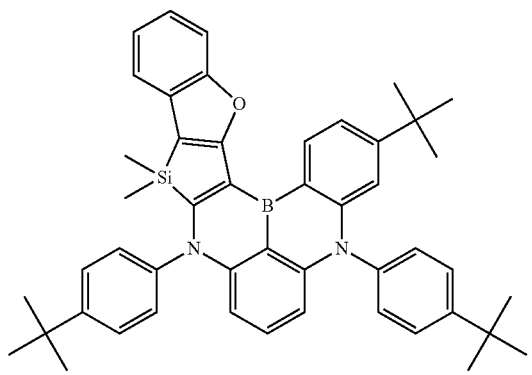

[Chemical Formula 21]
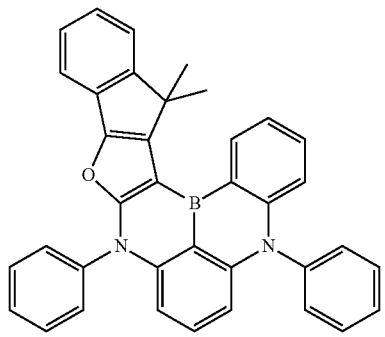
[Chemical Formula 22]
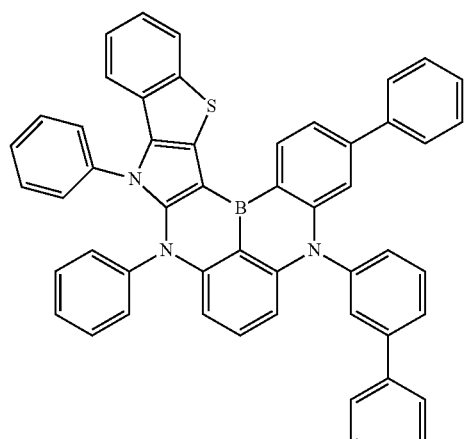
[Chemical Formula 23]
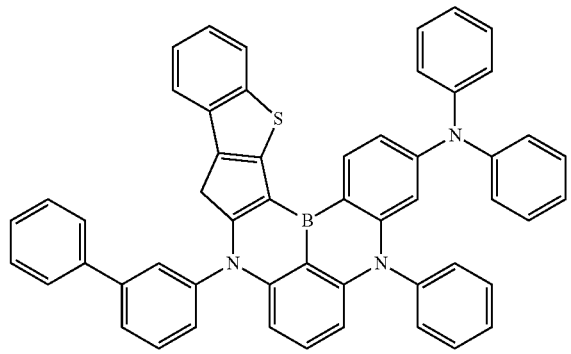
[Chemical Formula 24]
[Chemical Formula 25]
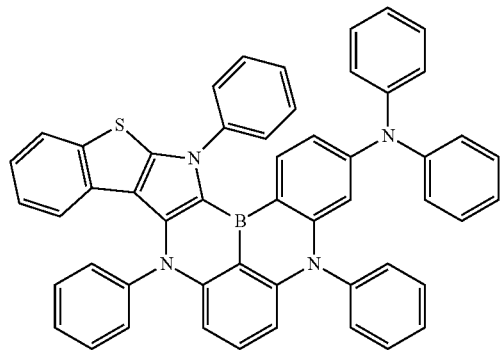
[Chemical Formula 26]
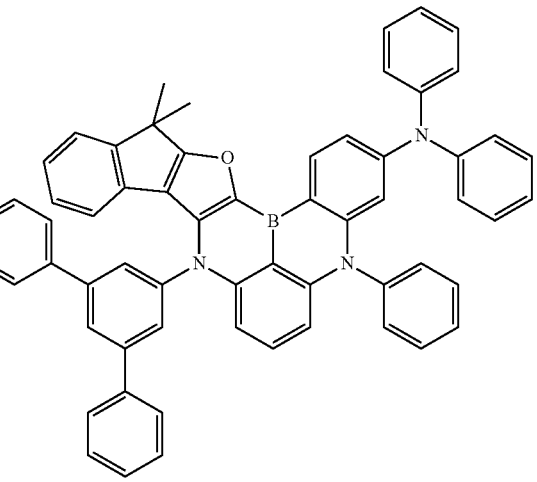
[Chemical Formula 27]
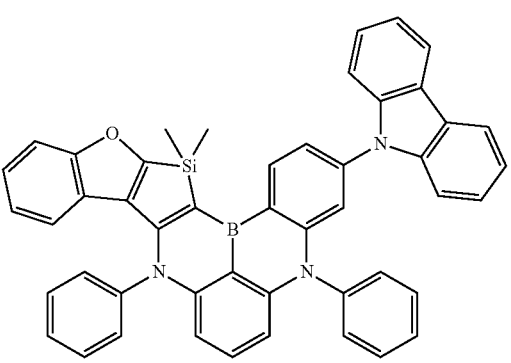

[Chemical Formula 28]
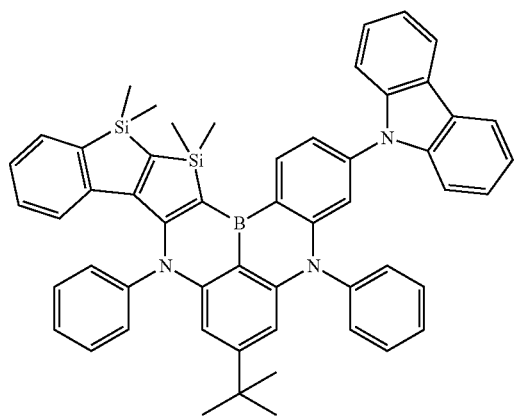
[Chemical Formula 29]
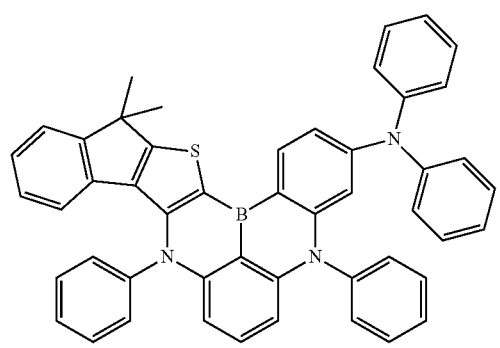
[Chemical Formula 30]
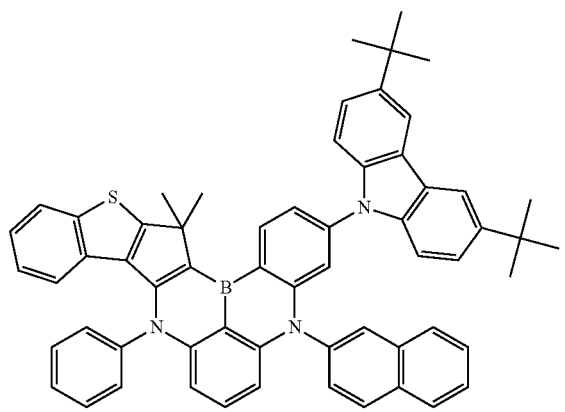
[Chemical Formula 31]
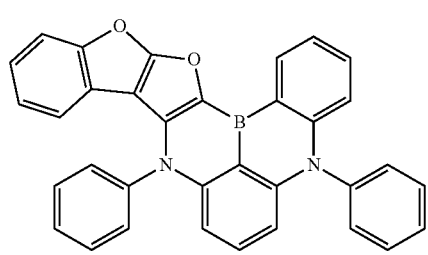
[Chemical Formula 32]
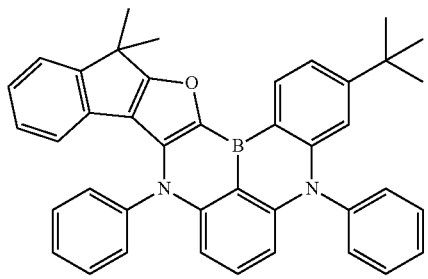
[Chemical Formula 33]
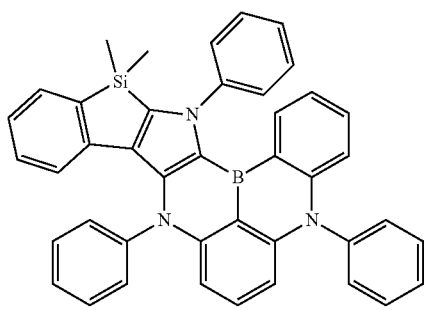
[Chemical Formula 34]
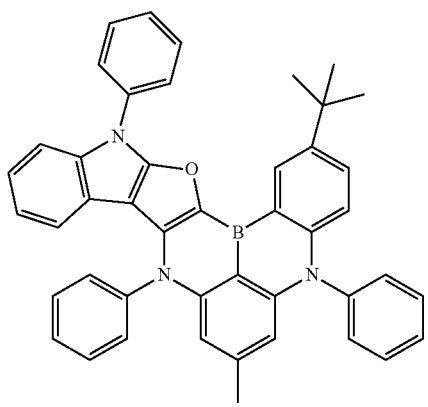
[Chemical Formula 35]
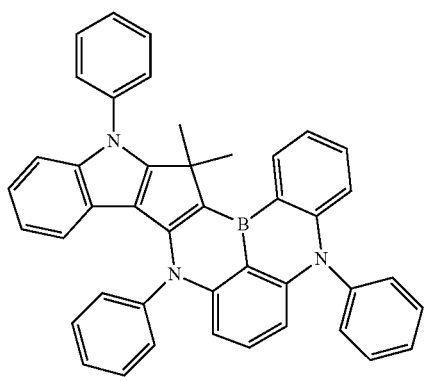

[Chemical Formula 36]
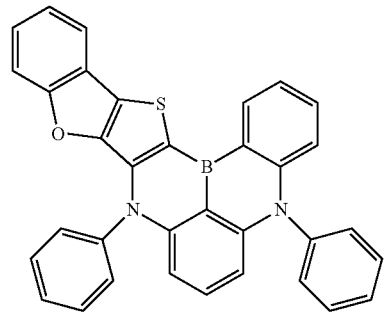
[Chemical Formula 37]
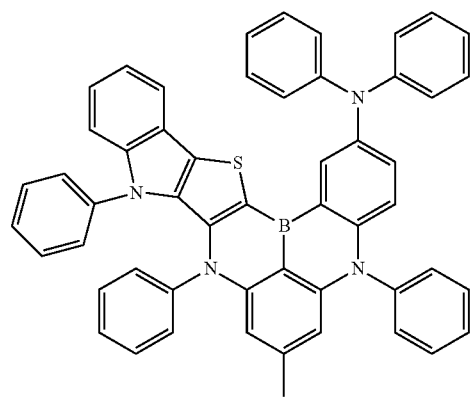
[Chemical Formula 38]
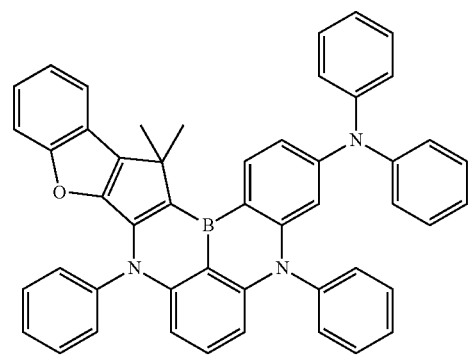
[Chemial Formula 39]
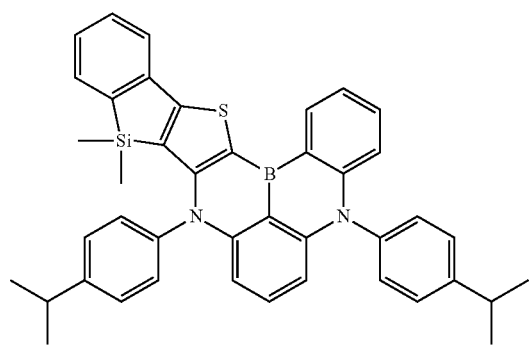
[Chemical Formula 40]
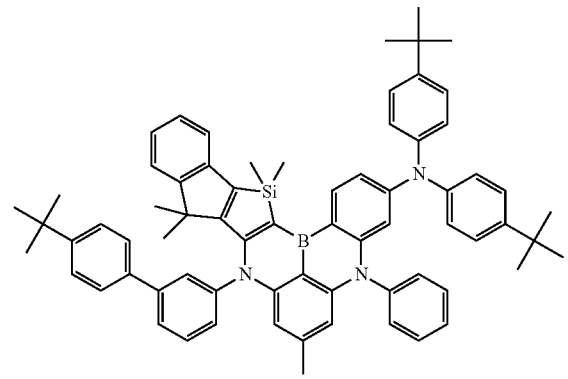
[Chemical Formula 41]
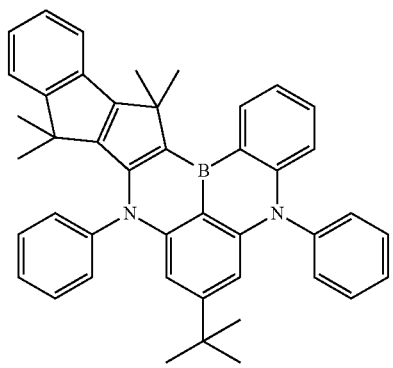
[Chemical Formula 42]
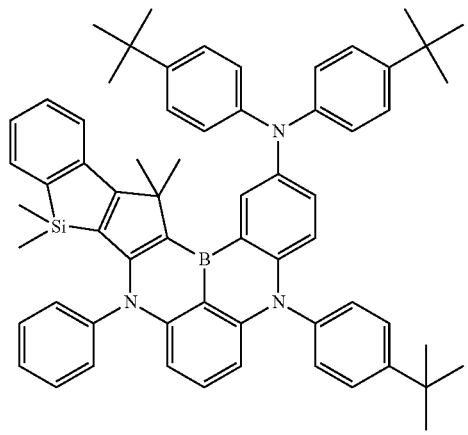

[Chemical Formula 43]
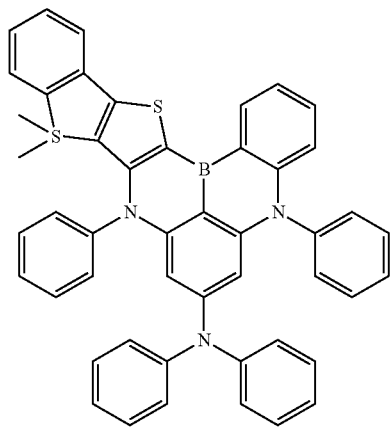
[Chemical Formula 44]
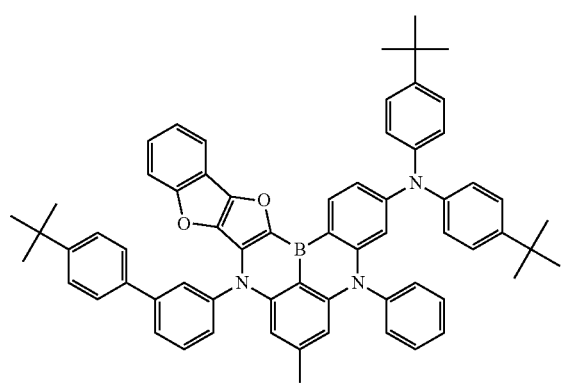
[Chemical Formula 45]
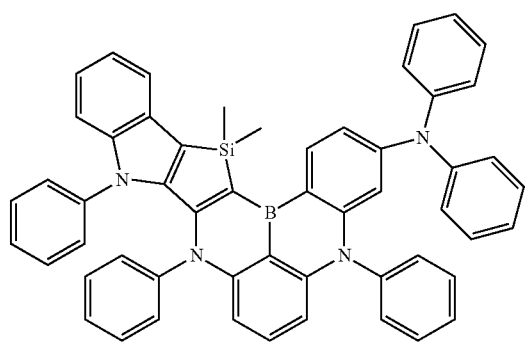
[Chemical Formula 46]
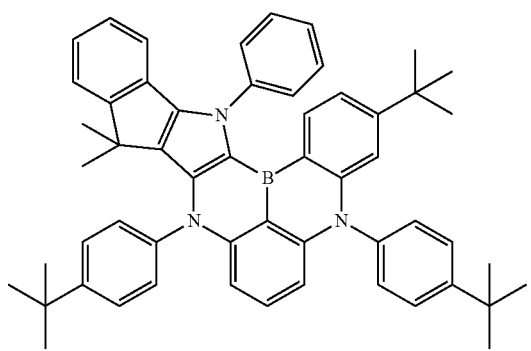
[Chemical Formula 47]
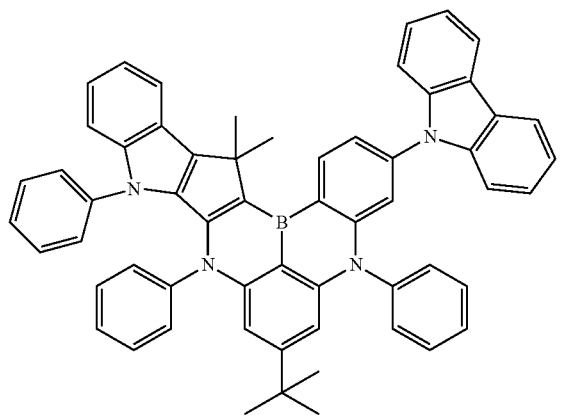
[Chemical Formula 48]
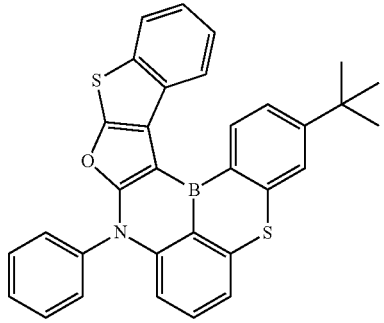
[Chemical Formula 49]
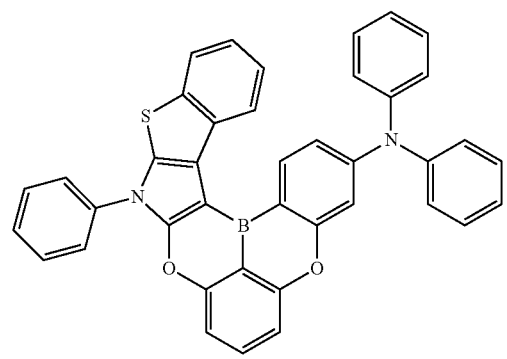
[Chemical Formula 50]
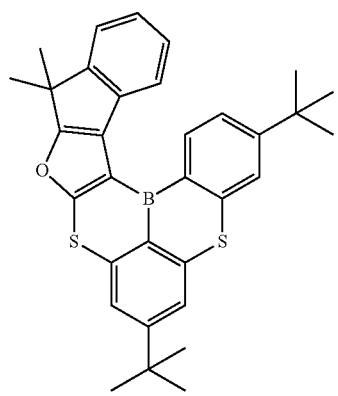

[Chemical Formula 51]
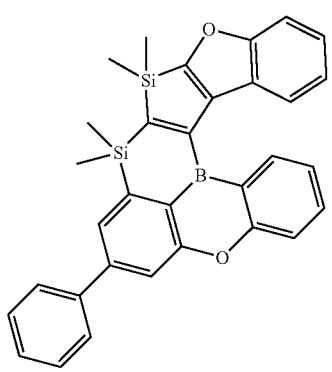
[Chemical Formula 52]
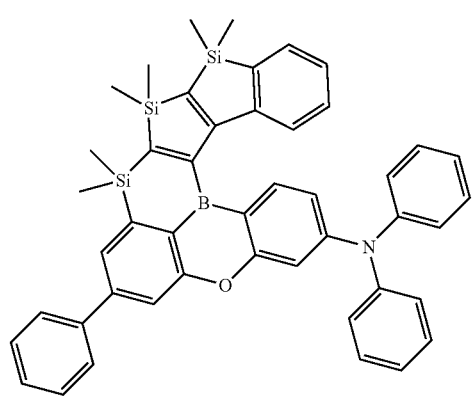
[Chemical Formula 53]
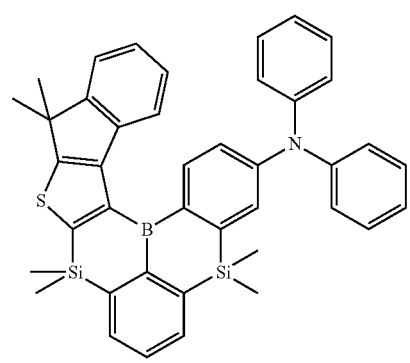
[Chemical Formula 54]
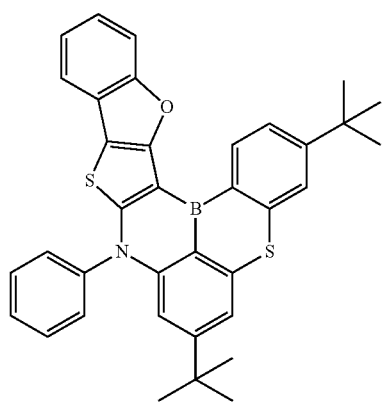
[Chemical Formula 55]
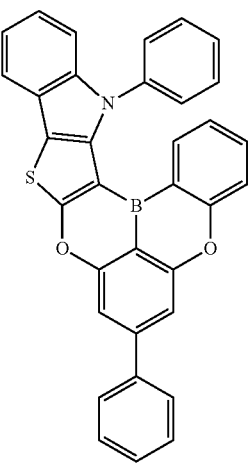
[Chemial Formula 56]
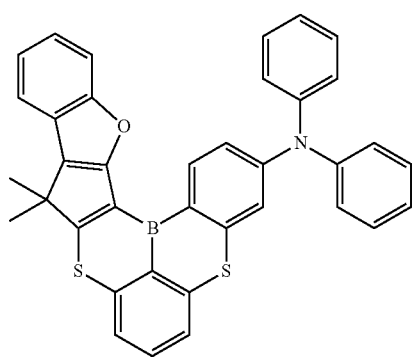
[Chemical Formula 57]
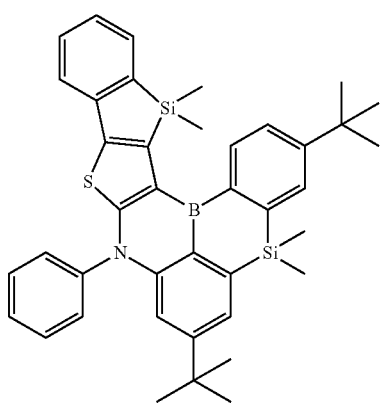

[Chemical Formula 58]
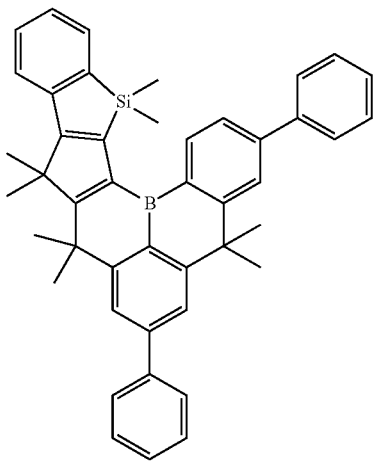
[Chemical Formula 59]
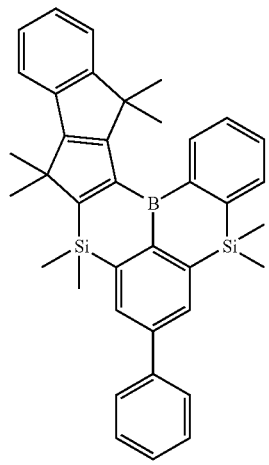
[Chemical Formula 60]
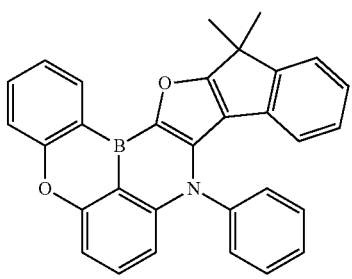
[Chemial Formula 61]
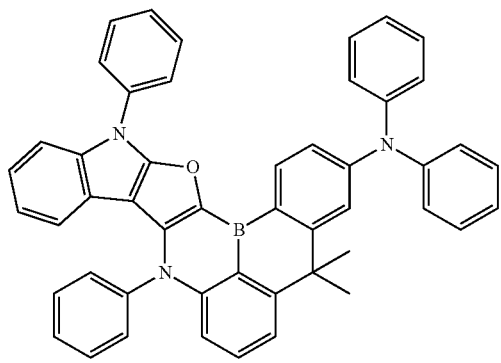
[Chemical Formula 62]
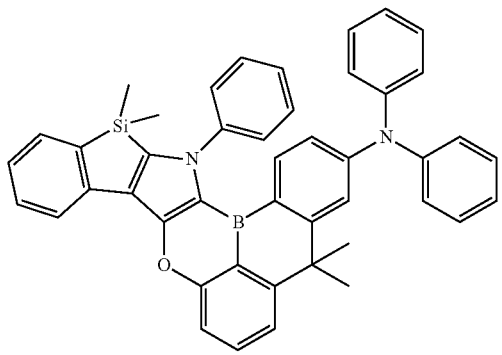
[Chemical Formula 63]
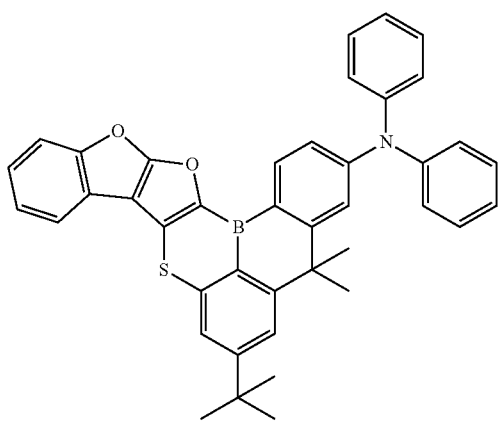
[Chemical Formula 64]
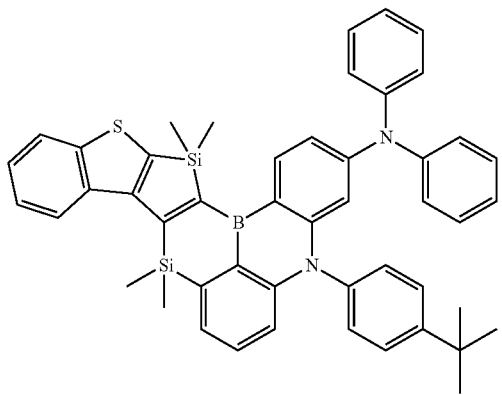
[Chemical Formula 65]
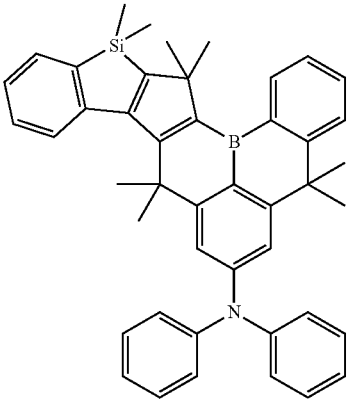

[Chemical Formula 66]
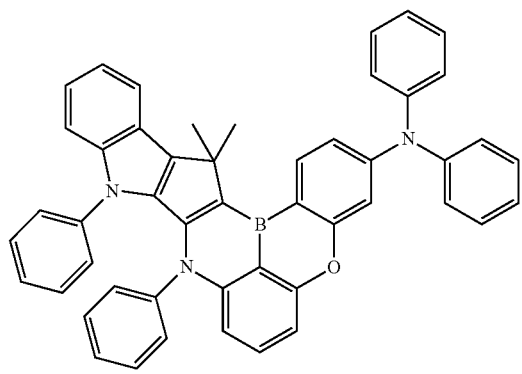
[Chemical Formula 67]
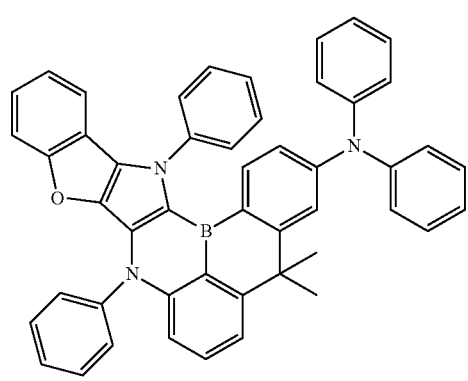
[Chemical Formula 68]
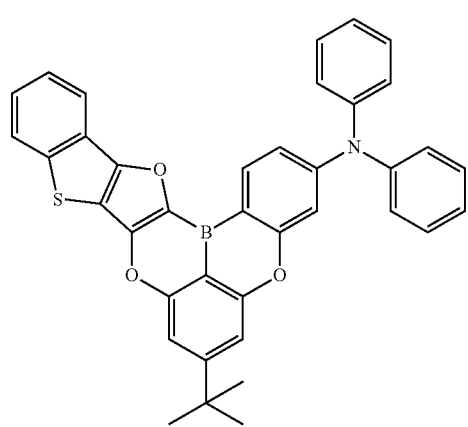
[Chemical Formula 69]
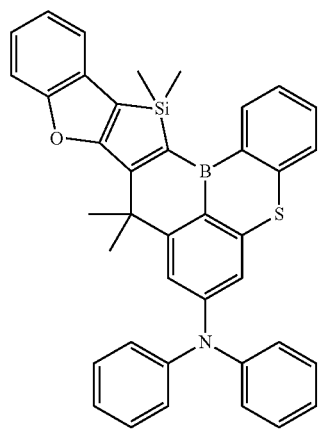
[Chemical Formula 70]
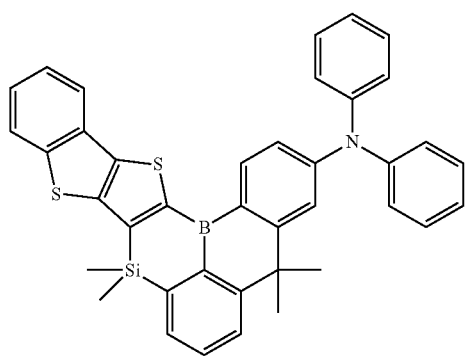
[Chemical Formula 71]
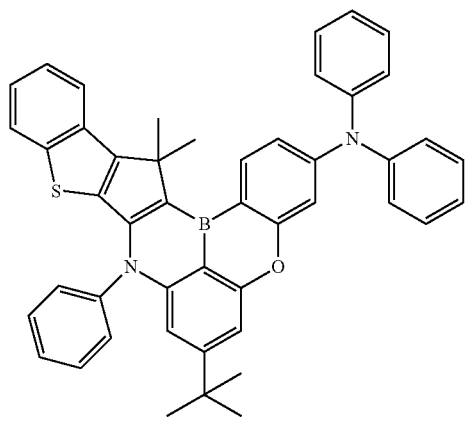

[Chemical Formula 72]
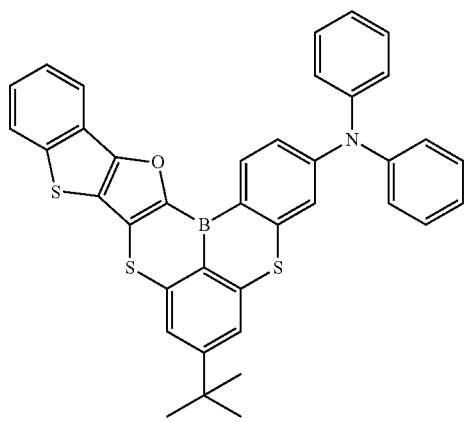
[Chemical Formula 73]
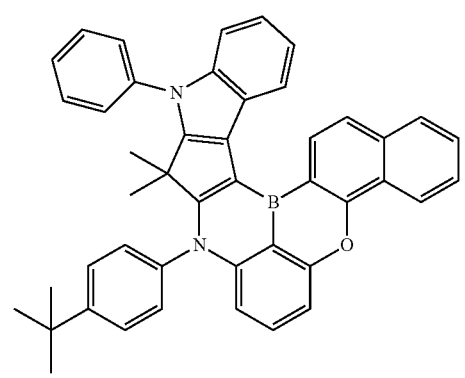
[Chemical Formula 74]
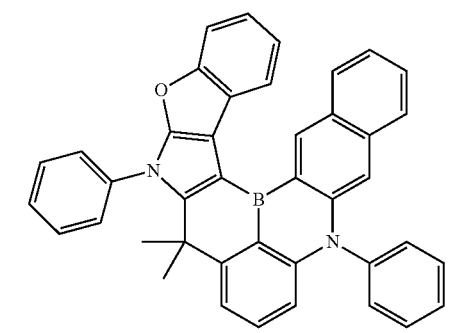
[Chemical Formula 75]
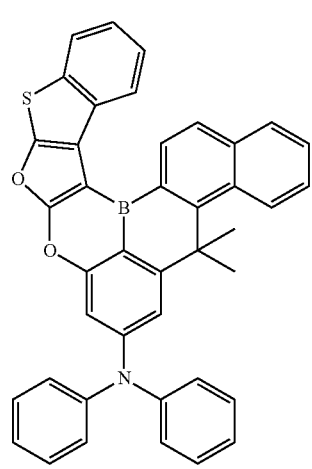
[Chemical Formula 76]
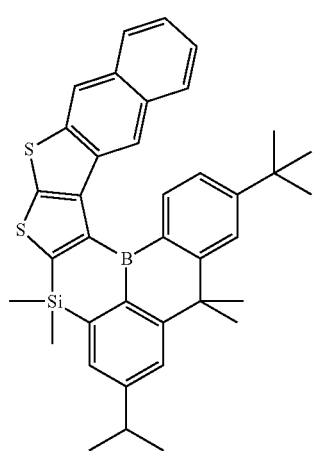
[Chemical Formula 77]
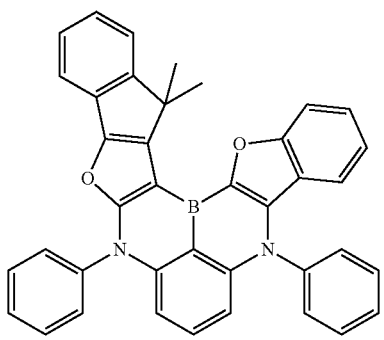
[Chemical Formula 78]
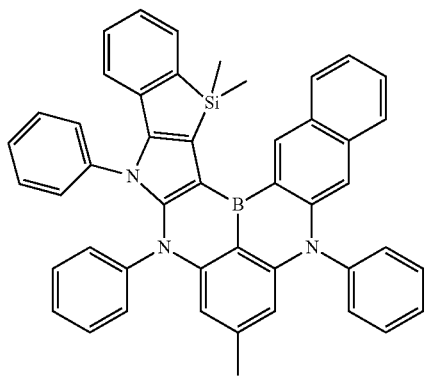
[Chemical Formula 79]
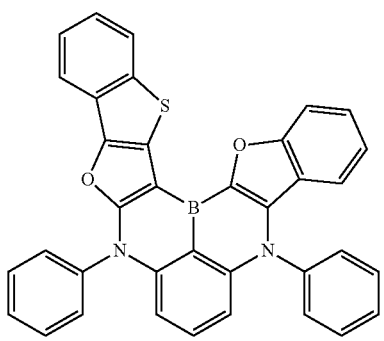

[Chemical Formula 80]
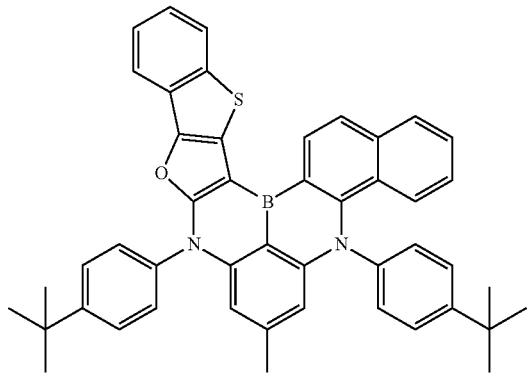
[Chemical Formula 81]
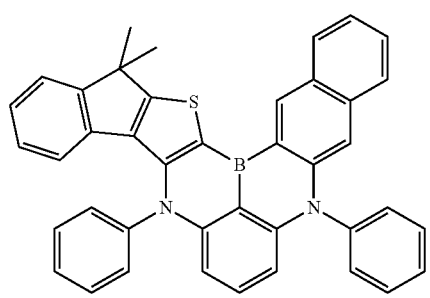
[Chemical Formula 82]
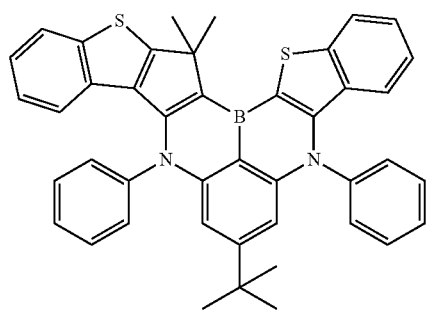
[Chemical Formula 83]
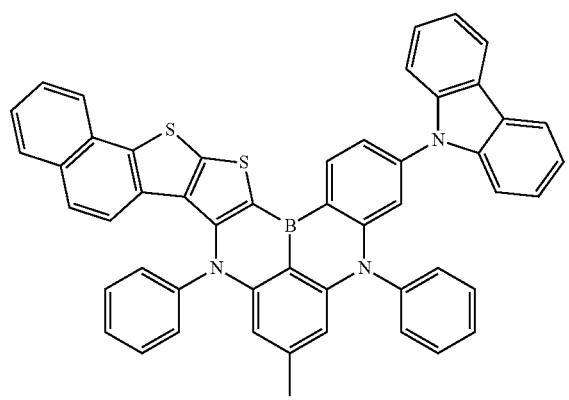
[Chemical Formula 84]
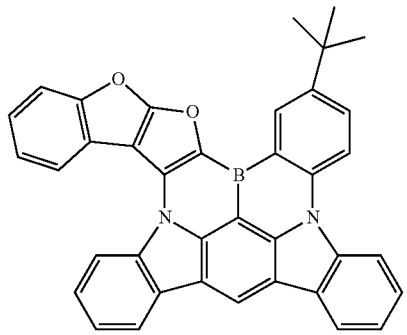
[Chemical Formula 85]
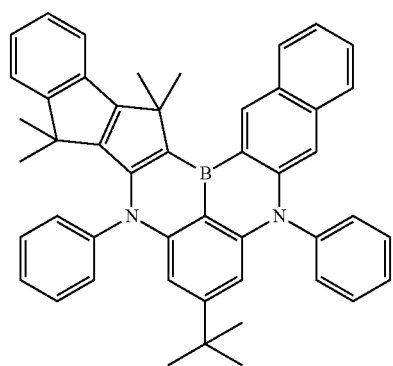
[Chemical Formula 86]
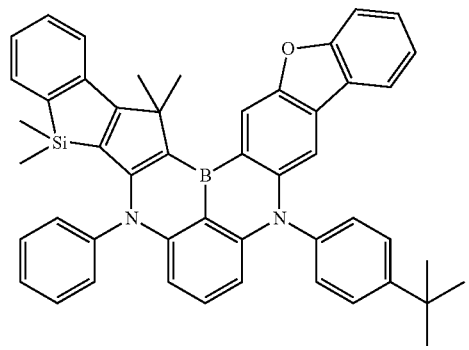
[Chemical Formula 87]
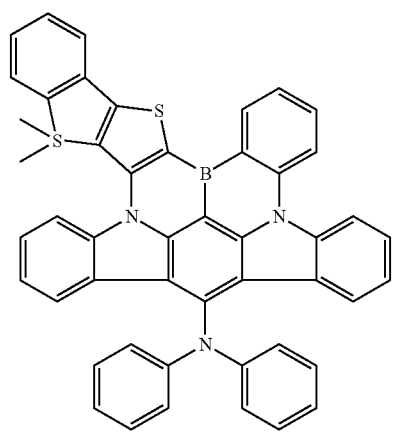

[Chemical Formula 88]
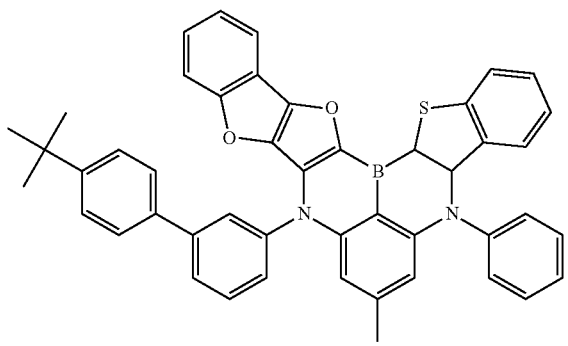
[Chemical Formula 89]
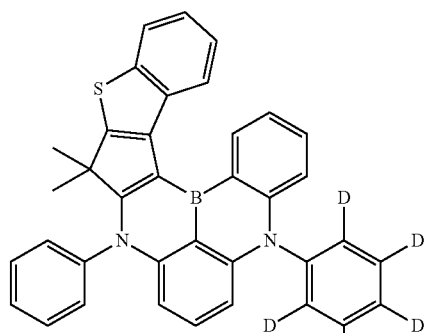
[Chemical Formula 90]
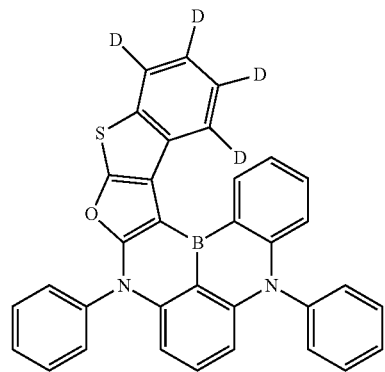
[Chemical Formula 91]
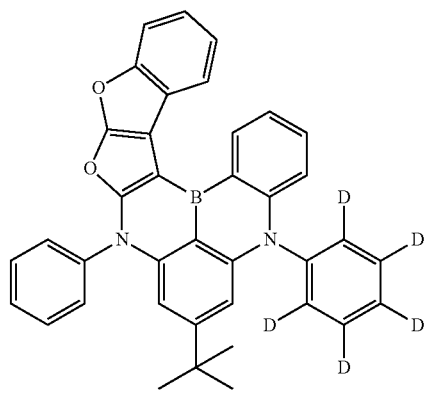
[Chemical Formula 92]
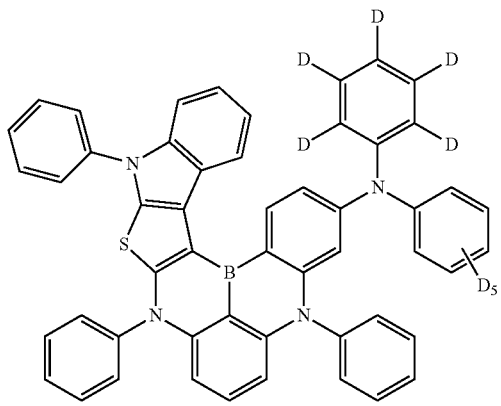
[Chemical Formula 93]
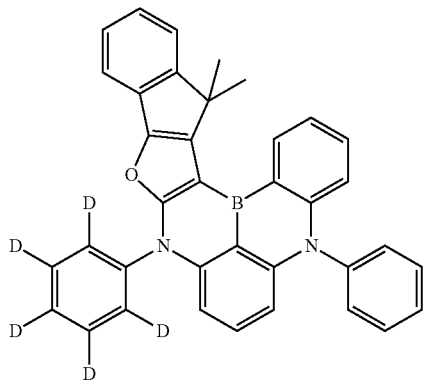
[Chemical Formula 94]
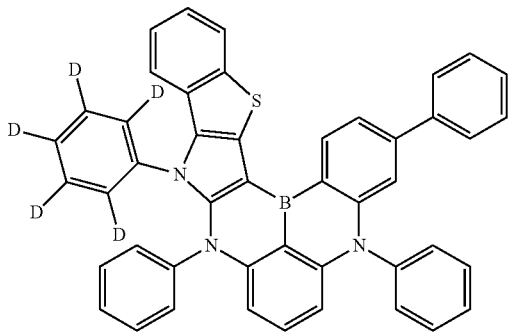
[Chemical Formula 95]
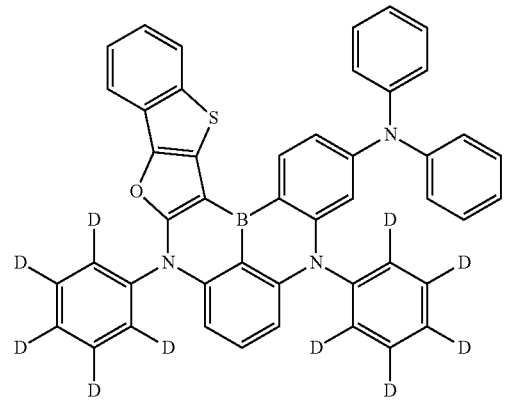

[Chemical Formula 96]
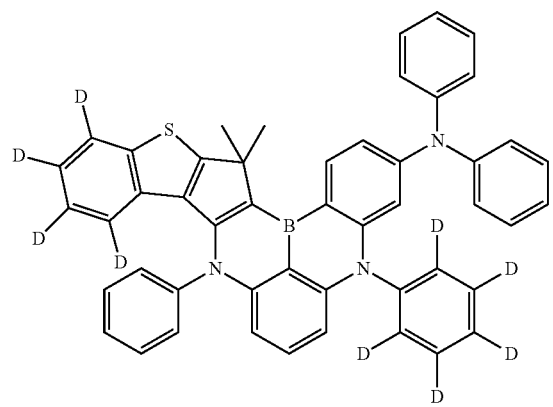
[Chemical Formula 97]
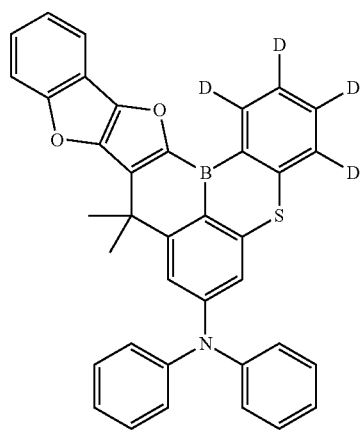
[Chemical Formula 98]
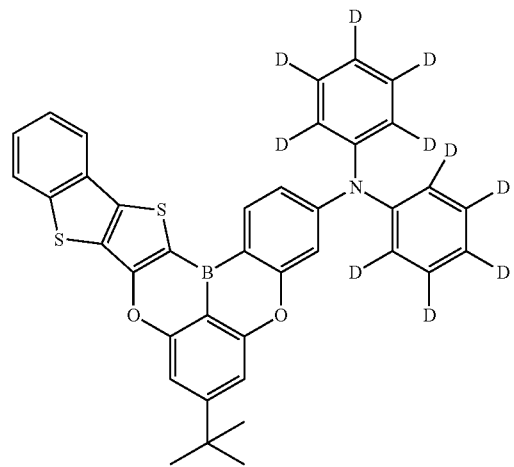
[Chemical Formula 99]
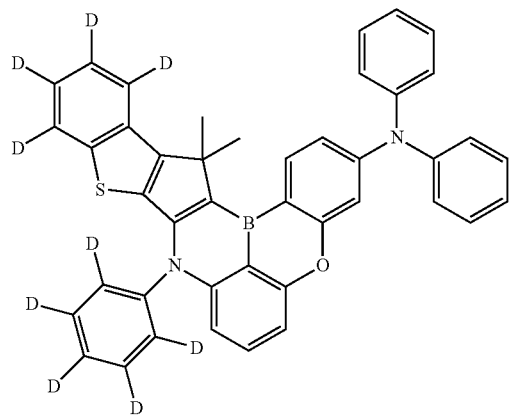
[Chemical Formula 100]
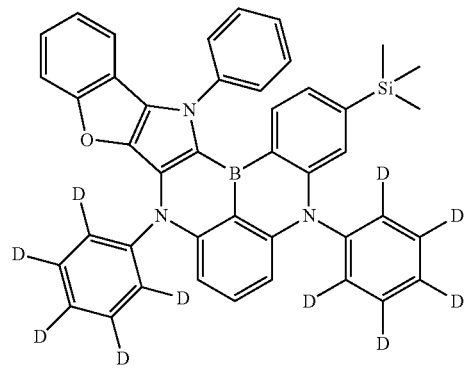
[Chemical Formula 101]
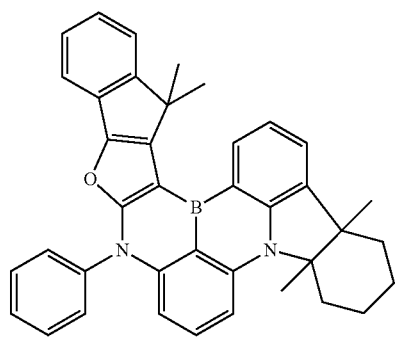
[Chemical Formula 102]
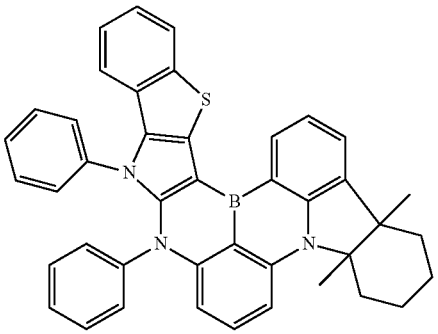

[Chemical Formula 103]
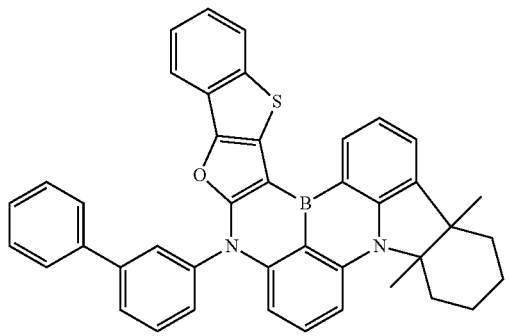
[Chemical Formula 104]
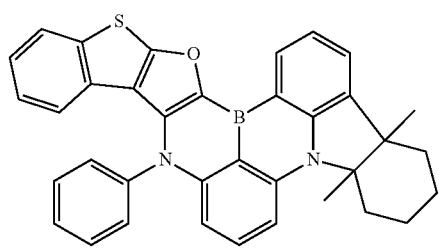
[Chemical Formula 105]
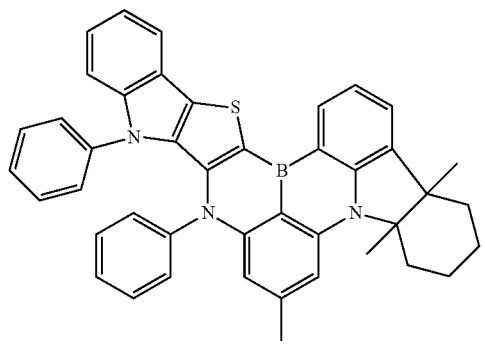
[Chemical Formula 106]
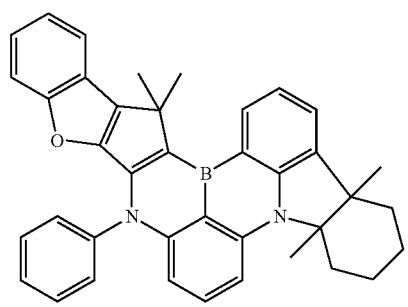
[Chemical Formula 107]
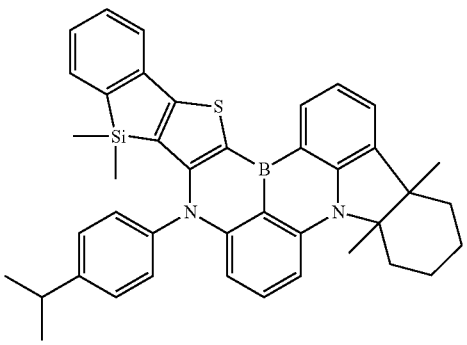
[Chemical Formula 108]
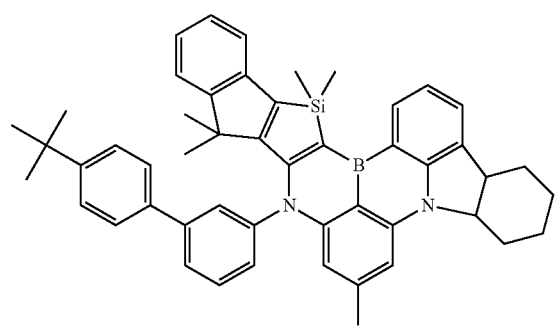
[Chemical Formula 109]
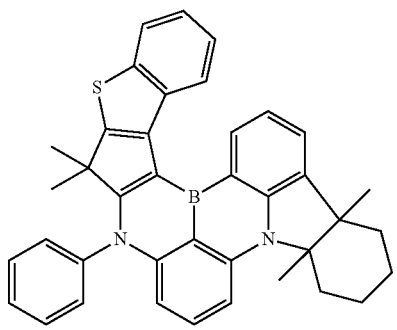
[Chemical Formula 110]
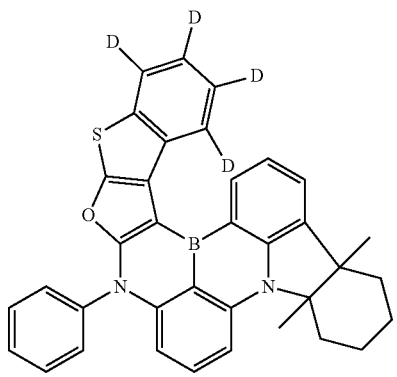

49

-continued

[Chemical Formula 111]

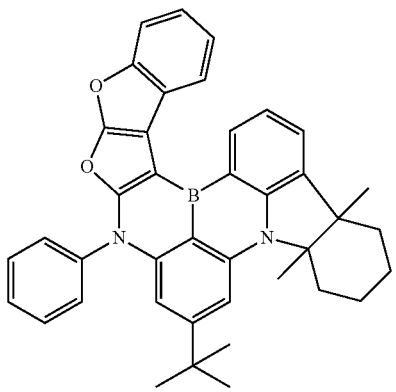

[Chemical Formula 112]

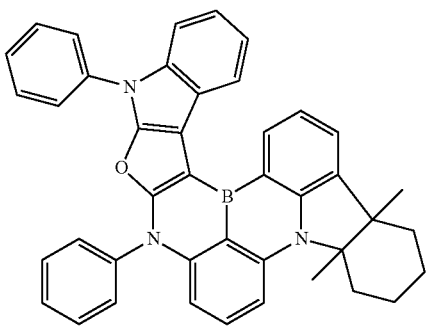

According to another aspect thereof, the present disclosure provides an organic light-emitting diode comprising: a first electrode; a second electrode facing the first electrode; and a light emitting layer interposed between the first electrode and the second electrode, wherein the light emitting layer comprises at least one of the boron compounds represented by Chemical Formulas A to D.

Throughout the description of the present disclosure, the phrase "(an organic layer) includes at least one organic compound" may be construed to mean that "(an organic layer) may include a single organic compound species or two or more difference species of organic compounds falling within the scope of the present disclosure".

In this regard, the organic light emitting diode according to the present disclosure may include at least one of a hole injection layer, a hole transport layer, a functional layer capable of both hole injection and hole transport, an electron transport layer, and an electron injection layer, in addition to the light-emitting layer.

In a further particular embodiment of the present disclosure, the organic light-emitting diode may comprise, as a light-emitting layer, an organic layer interposed between the first electrode and the second electrode, wherein the light-emitting layer includes a host and a dopant, wherein the

50 dopant includes at least one of the boron compounds represented by Chemical Formulas A to D.

In an embodiment, the anthracene derivative represented by the following Chemical Formula H may be used as the host in the organic light-emitting diode according to the present disclosure:

[Chemical Formula H]

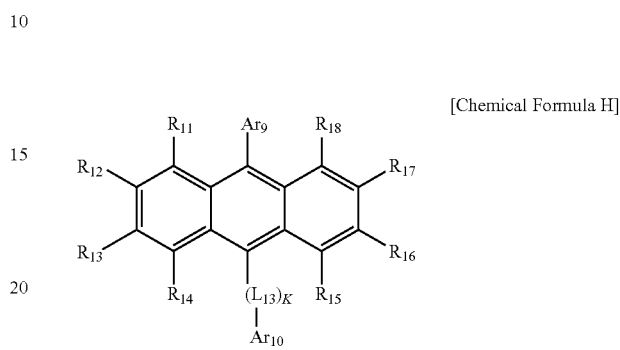

wherein, $R_{11}$ to $R_{18}$, which may be the same or different, are each as defined above for $R_1$ to $R_{10}$ in the boron compound represented by any one of Chemical Formulas A to D;

$Ar_9$ and $Ar_{10}$, which may be the same or different, are each independently selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, and a substituted or unsubstituted arylsilyl of 6 to 30 carbon atoms;

$L_{13}$, which functions as a linker, is a single bond or is selected from a substituted or unsubstituted arylene of 6 to 20 carbon atoms, and a substituted or unsubstituted heteroarylene of 2 to 20 carbon atoms; and k is an integer of 1 to 3, wherein when k is 2 or greater, the corresponding $L_{13}$'s are each the same or different.

In an embodiment, the anthracene derivative, represented by Chemical Formula H, as the host in the organic light-emitting diode according to the present disclosure, may be an anthracene derivative represented by the Chemical Formula H1 or H2:

[Chemical Formula H1]

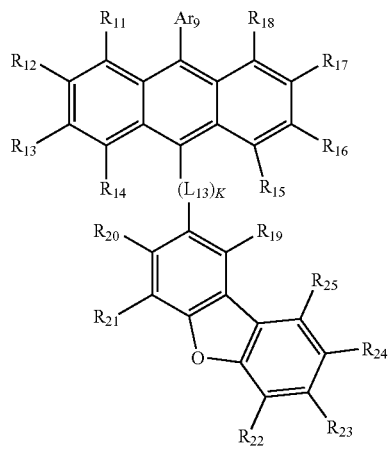

[Chemical Formula H2]

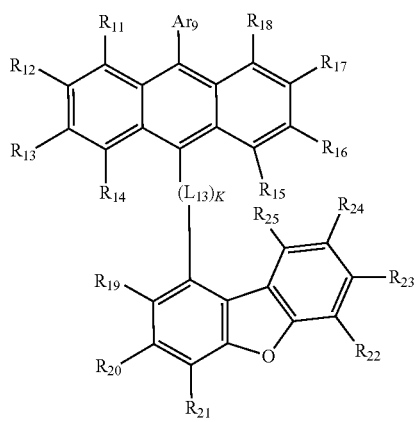

wherein, $R_{19}$ to $R_{25}$, which may be the same or different, are each as defined for $R_1$ to $R_{10}$ in the boron compound represented by any one of Chemical Formulas A to D above.

Here, the compound represented by Chemical Formula H1 or H2 is characterized by the structure in which position 1 or 2 of one phenyl ring or position 1' or 2' of the other phenyl ring in the dibenzofuran moiety shown in the following Diagram 1 may be connected to position 9 of the anthracenyl moiety. The compound represented by Chemical Formula H1 or H2 may be used as a host material in the light-emitting layer.

[Diagram 1]

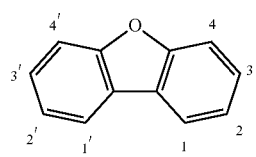

The substituent Ar₉ in the anthracene derivative represented by Chemical Formula H, H1, or H2 according to the present disclosure may be a substituent represented by the following Structural Formula C-1:

[Structural Formula C-1]

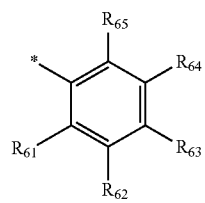

wherein $R_{61}$ to $R_{65}$, which may be the same or different, are each independently one selected from a hydrogen atom, a deuterium atom, a substituted or unsubstituted alkyl of 1 to 20 carbon atoms, a substituted or unsubstituted aryl of 6 to 50 carbon atoms, a substituted or unsubstituted arylalkyl of 7 to 50 carbon atoms, a substituted or unsubstituted cycloalkyl of 3 to 30 carbon atoms, a substituted or unsubstituted alkylsilyl of 1 to 30 carbon atoms, a substituted or unsubstituted arylsilyl of 6 to 30 carbon atoms, and a halogen atom, and "—*" is a bonding site which is linked to position 10 of the anthracenyl moiety in Chemical Formula H, H1, or H2.

In Chemical Formula H, H1, or H2 for the organic light-emitting diode according to an embodiment of the present disclosure, the linker $L_{13}$ may be a single bone or a substituted or unsubstituted arylene of 6 to 20 carbon atoms, and k is an integer of 1 and 2, wherein when k is 2, the corresponding $L_{13}$'s are each the same or different.

The anthracene derivative represented by Chemical Formula H for the organic light-emitting diode according to the present disclosure may be any one selected from the following <Compound 101> to <Compound 166>:

<Compound 101>

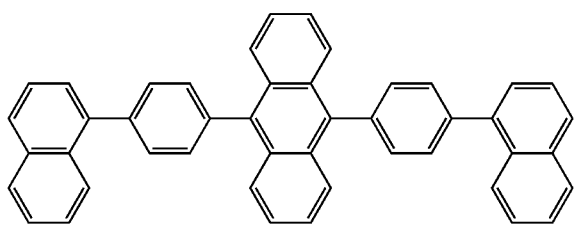

<Compound 102>

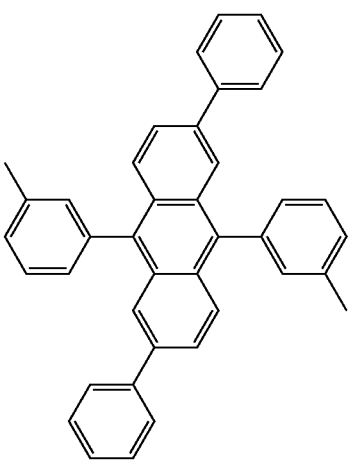

<Compound 103>
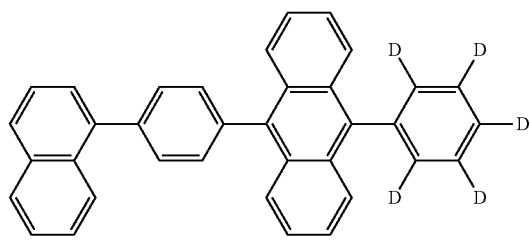
<Compound 104>
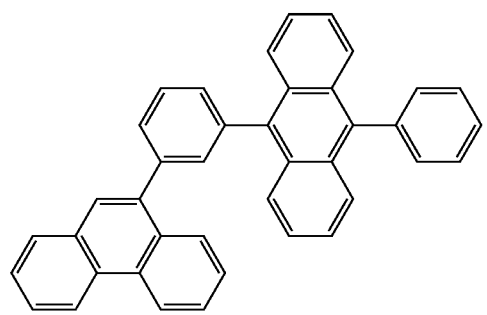
<Compound 105>
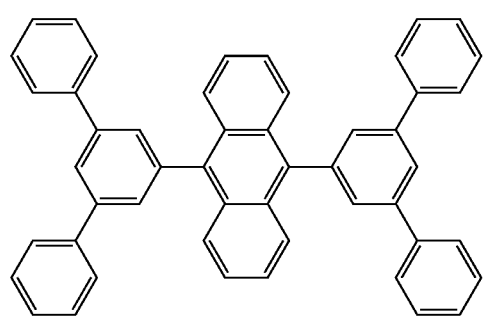
<Compound 106>
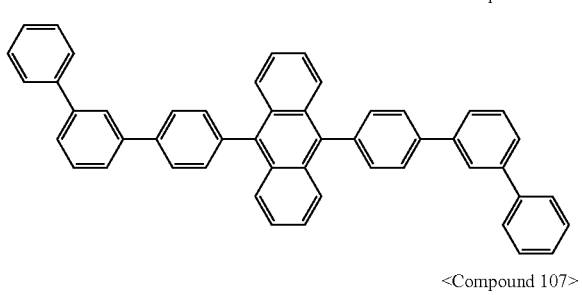
<Compound 107>
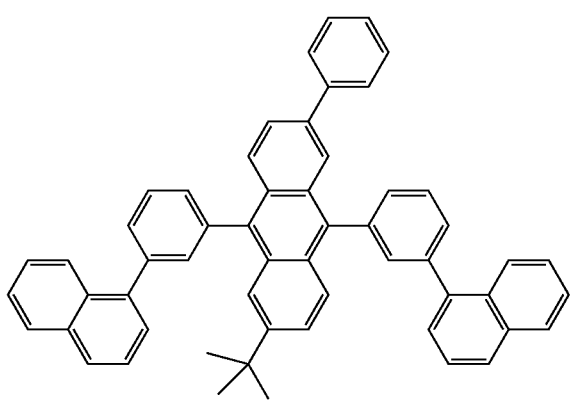
<Compound 108>
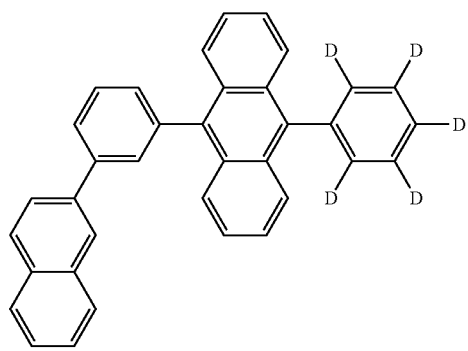
<Compound 109>
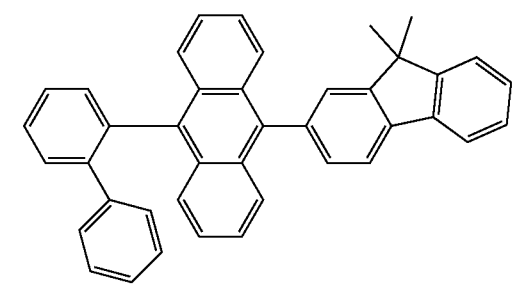
<Compound 110>
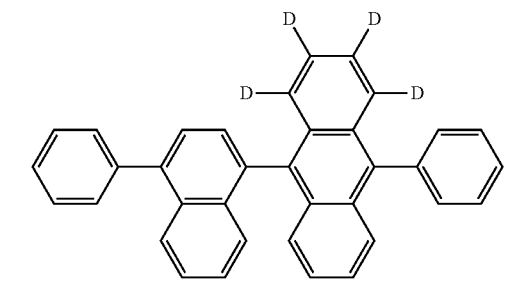
<Compound 111>
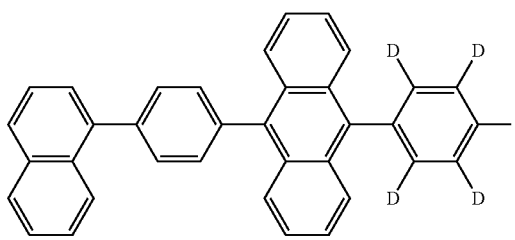
<Compound 112>
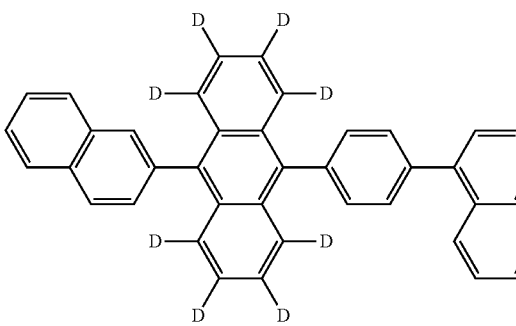

<Compound 113>
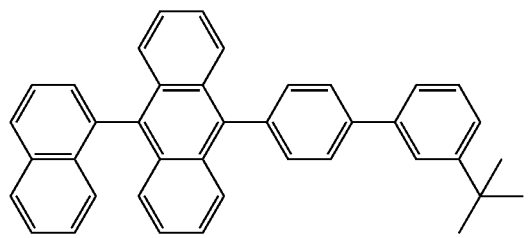
<Compound 114>
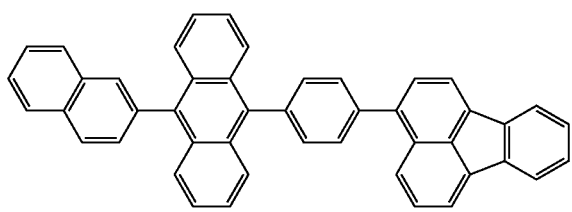
<Compound 115>
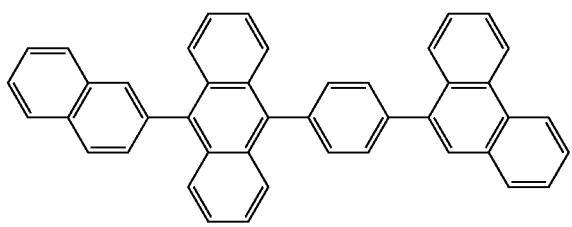
<Compound 116>
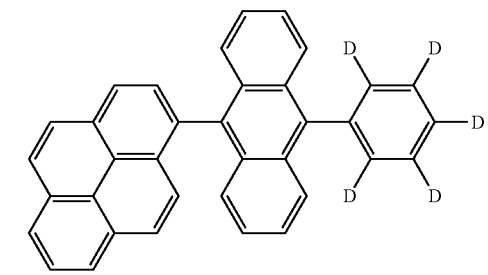
<Compound 117>
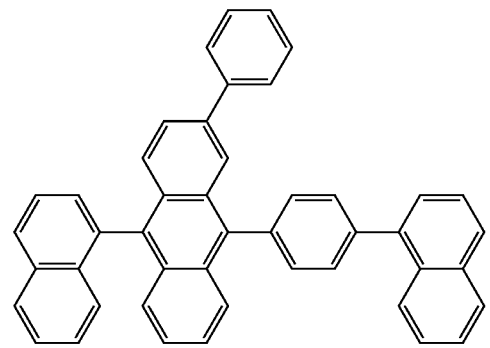
<Compound 118>
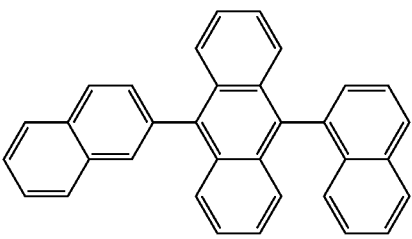
<Compound 119>
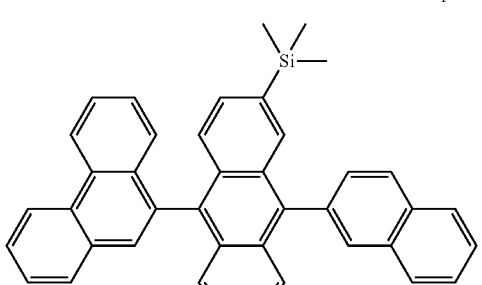
<Compound 120>
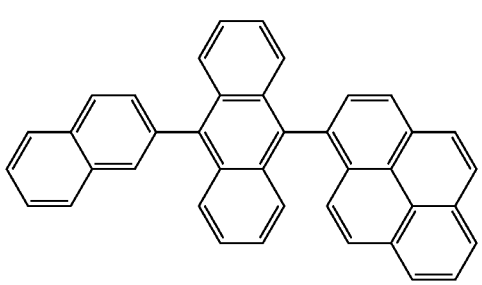
<Compound 121>
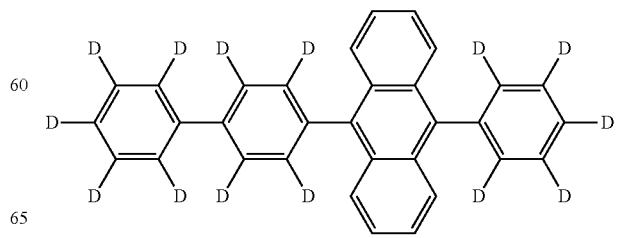
<Compound 122>

<Compound 123>
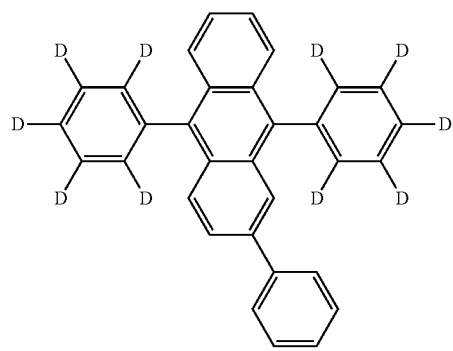
<Compound 124>
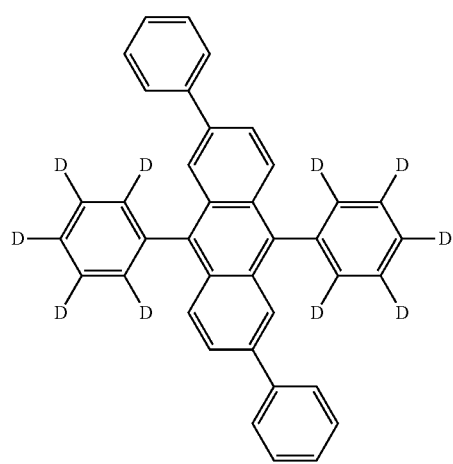
<Compound 125>
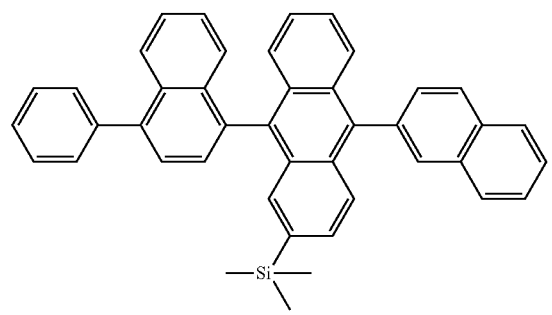
<Compound 126>
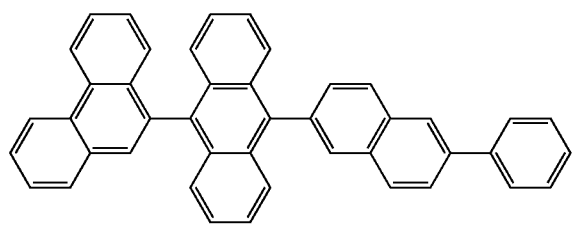
<Compound 127>
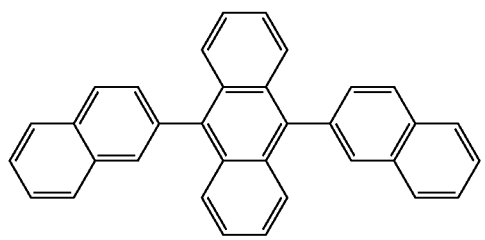
<Compound 128>
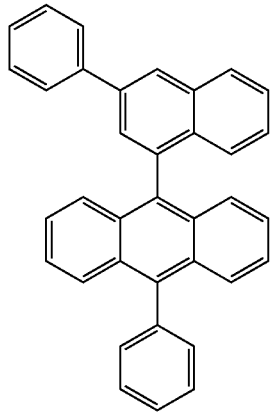
<Compound 129>
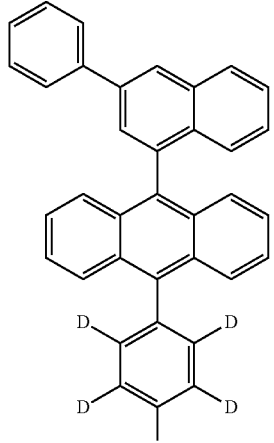
<Compound 130>
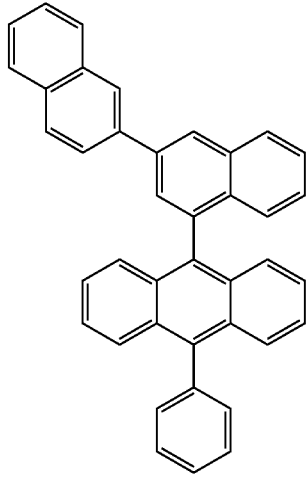

<Compound 131>
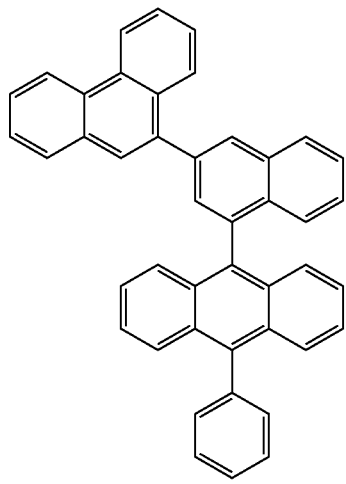
<Compound 132>
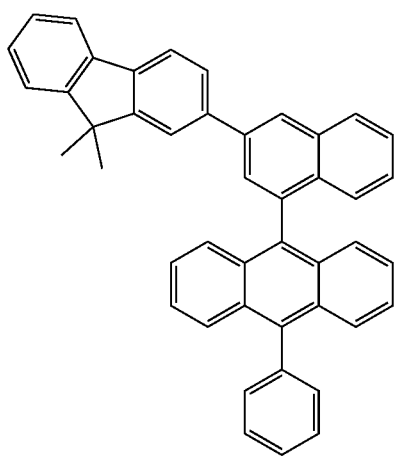
<Compound 133>
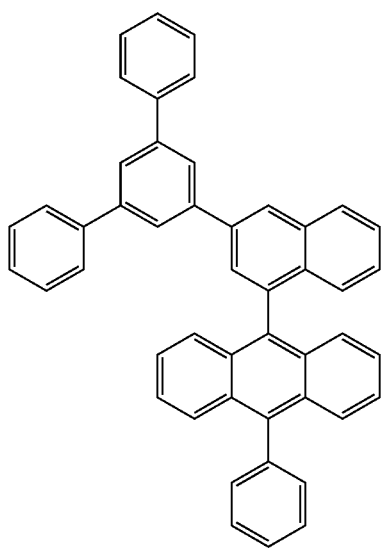
<Compound 134>
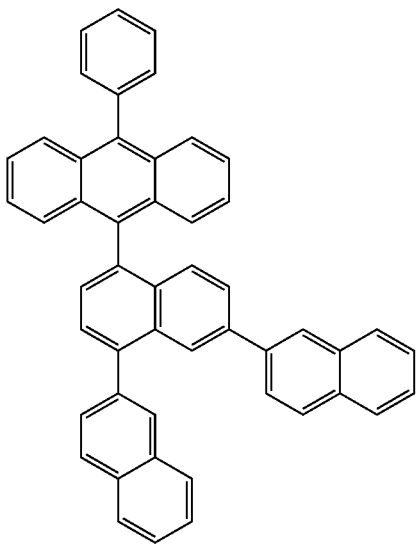
<Compound 135>
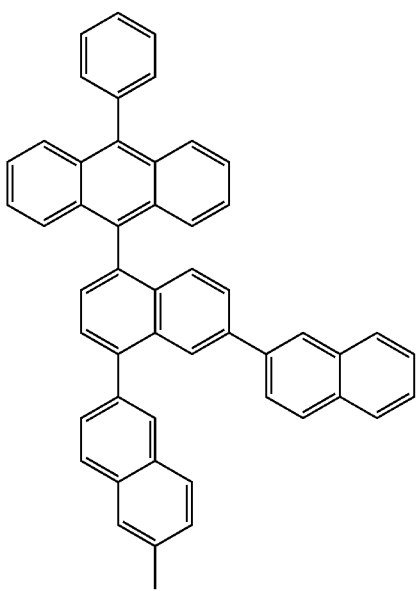

<Compound 136>
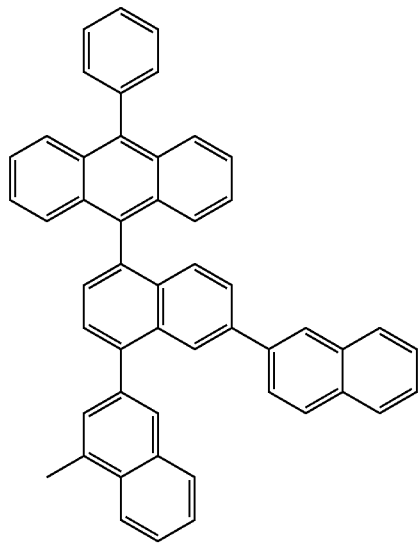
<Compound 137>
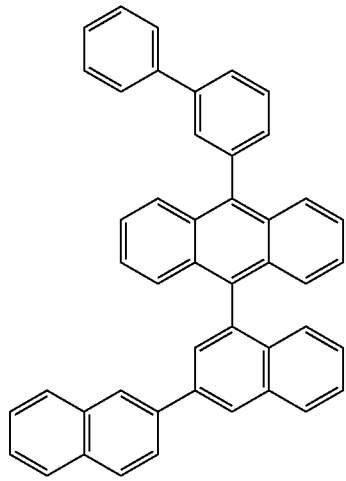
<Compound 138>
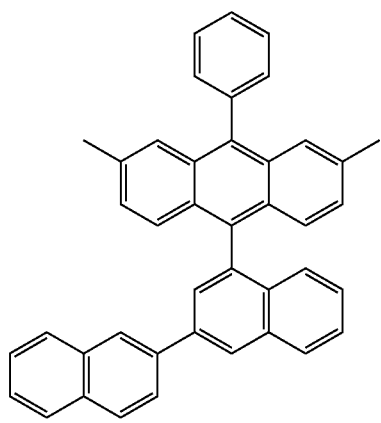
<Compound 139>
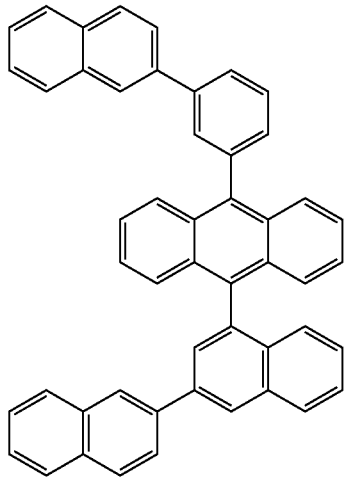
<Compound 140>
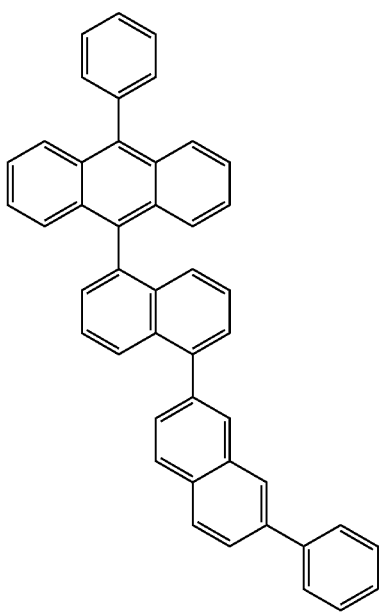

<Compound 141>
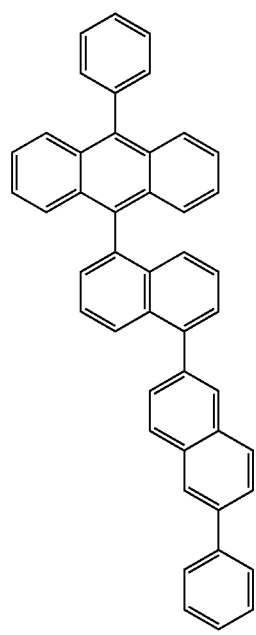
<Compound 143>
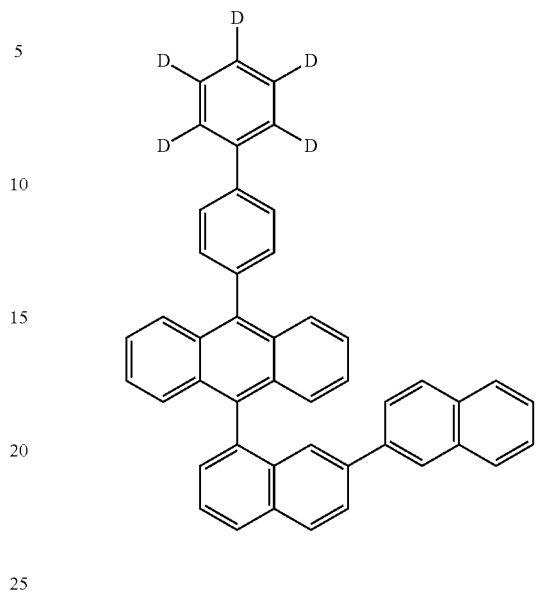
<Compound 144>
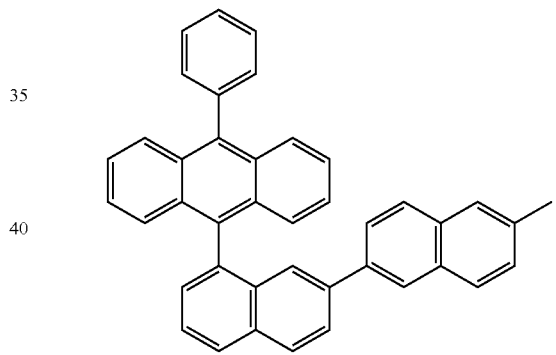
<Compound 142>
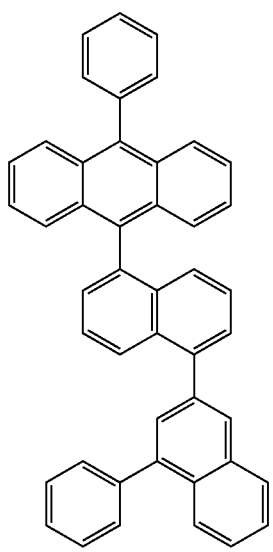
<Compound 145>
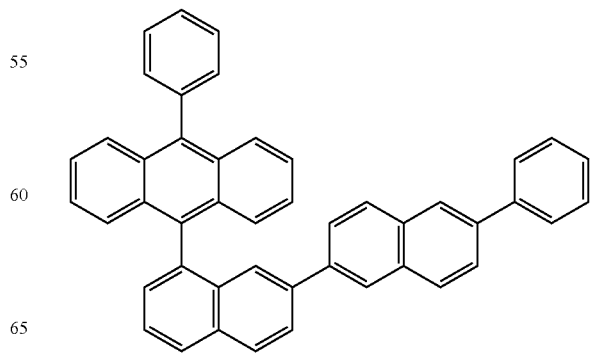

<Compound 146>
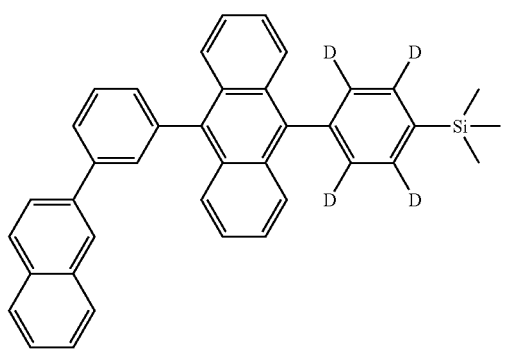
<Compound 147>
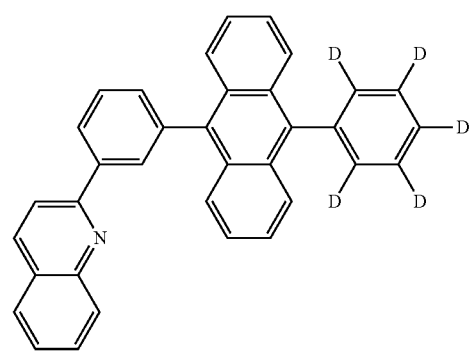
<Compound 148>
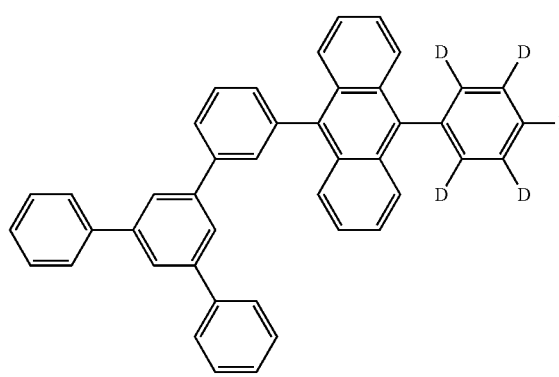
<Compound 149>
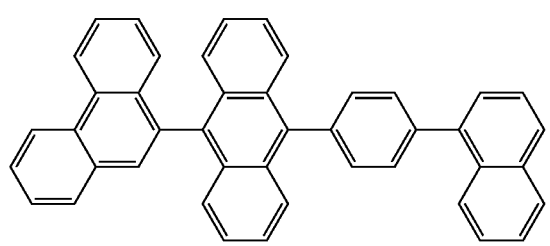
<Compound 150>
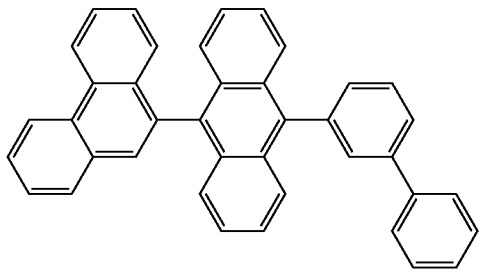
<Compound 151>
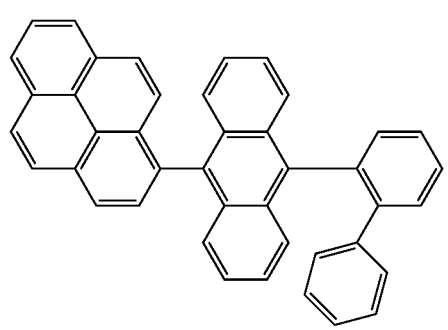
<Compound 152>
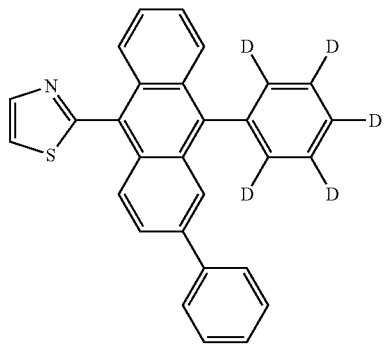
<Compound 153>
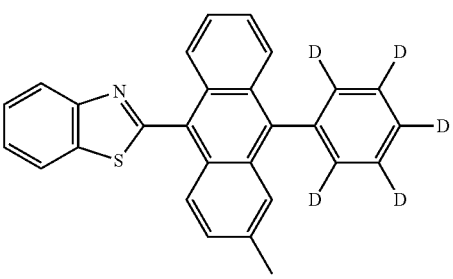
<Compound 154>
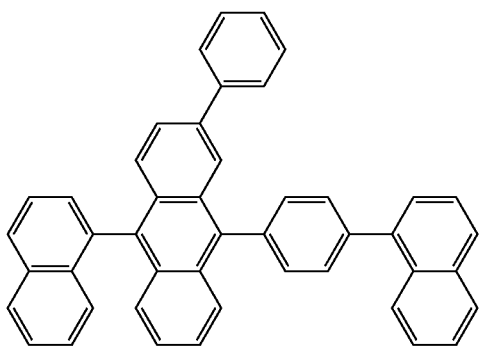

<Compound 155>
<Compound 156>
<Compound 157>
<Compound 158>
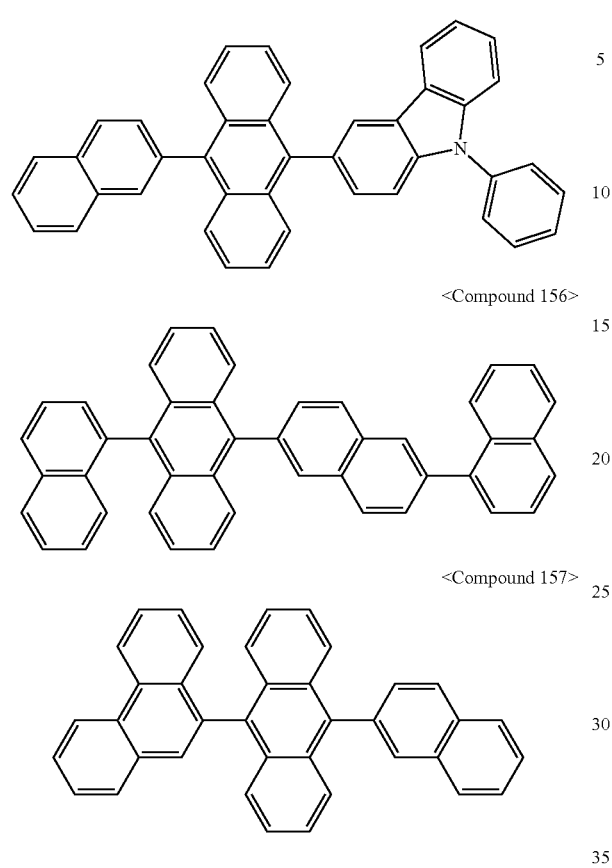
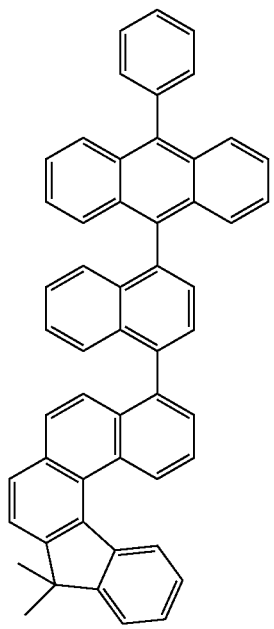
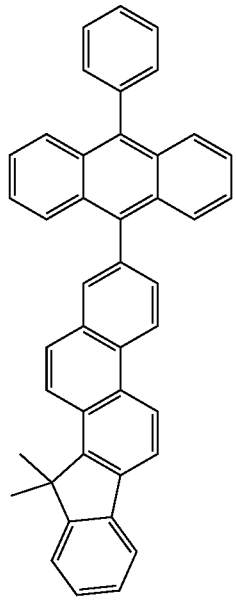
<Compound 159>
<Compound 160>
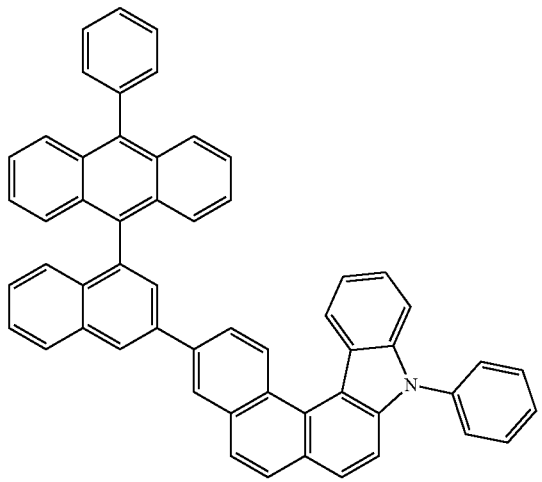

<Compound 161>
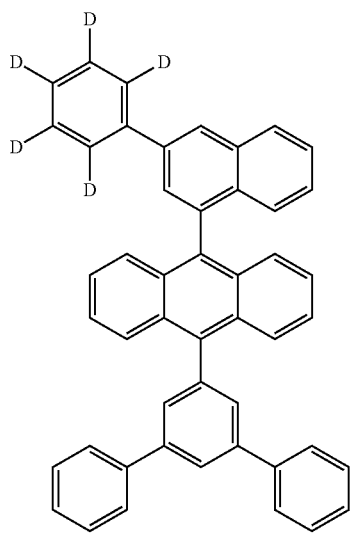
<Compound 162>
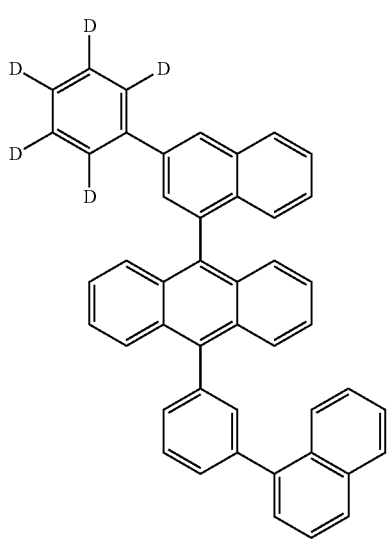
<Compound 163>
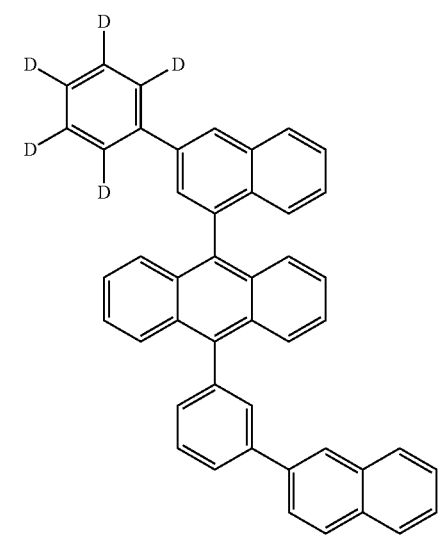
<Compound 164>
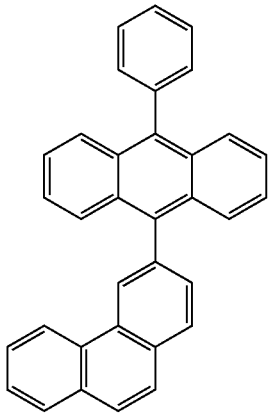
<Compound 165>
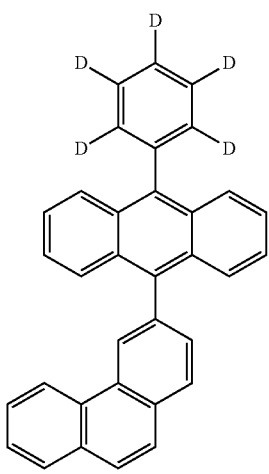
<Compound 166>
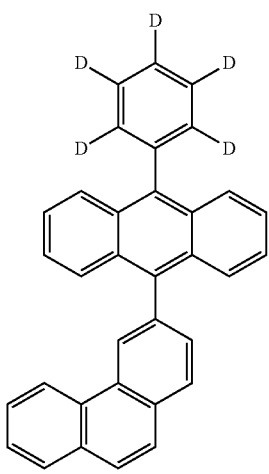
In another embodiment, the anthracene derivative represented by any one of Chemical Formulas H1 and H2 for the organic light-emitting diode according to the present disclosure may be any one selected from the following <Chemical Formula 201> to <Chemical Formula 281>:

<Compound 201>
<Compound 202>
<Compound 203>
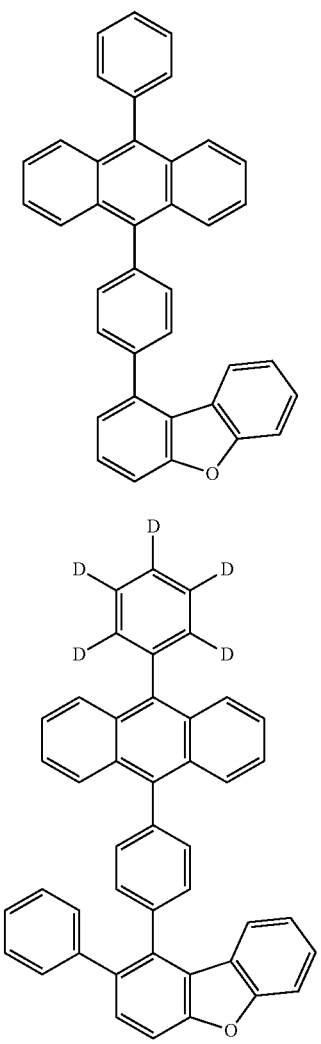
<Compound 204>
<Compound 205>
<Compound 206>
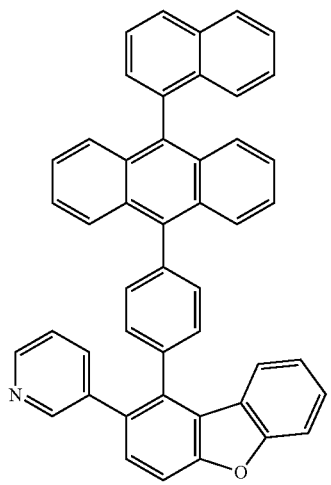
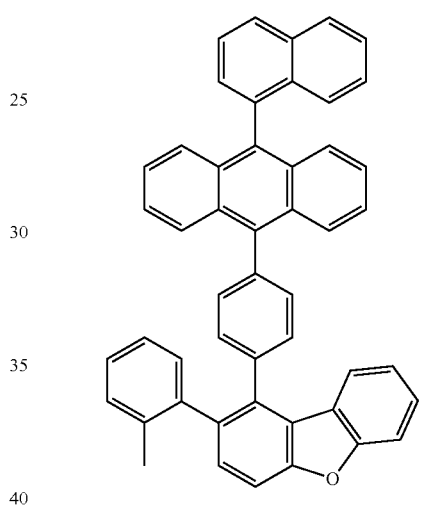
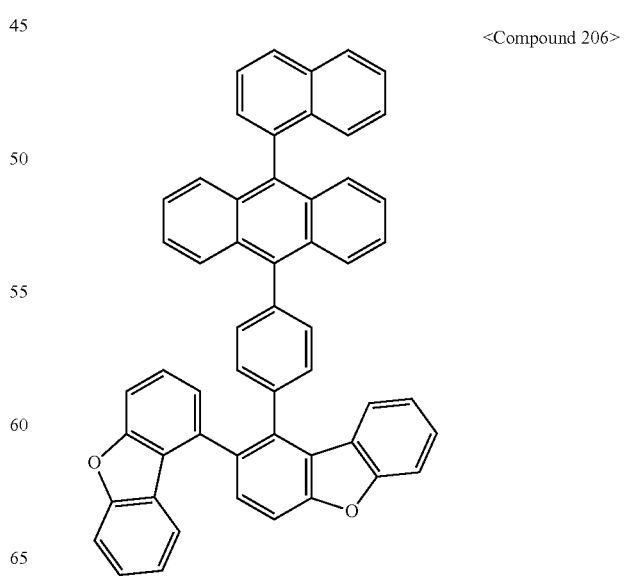

<Compound 207>
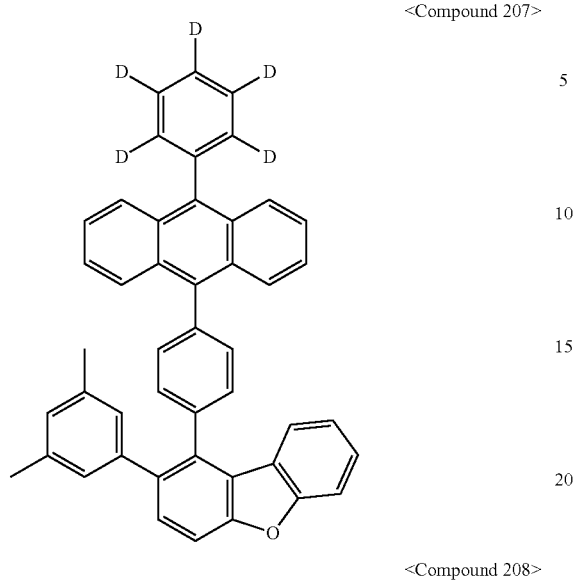
<Compound 208>
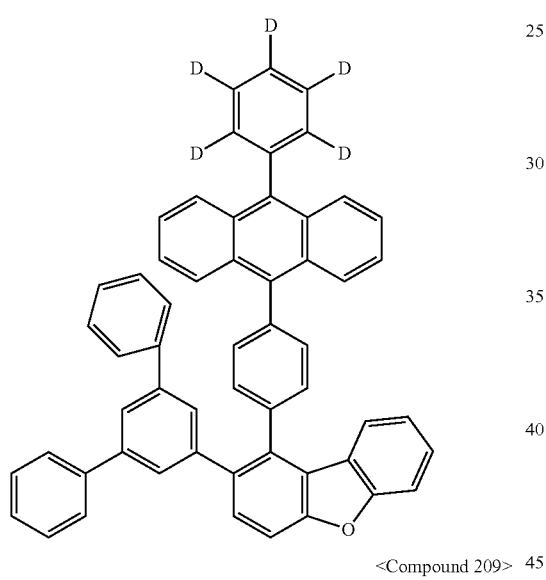
<Compound 209>
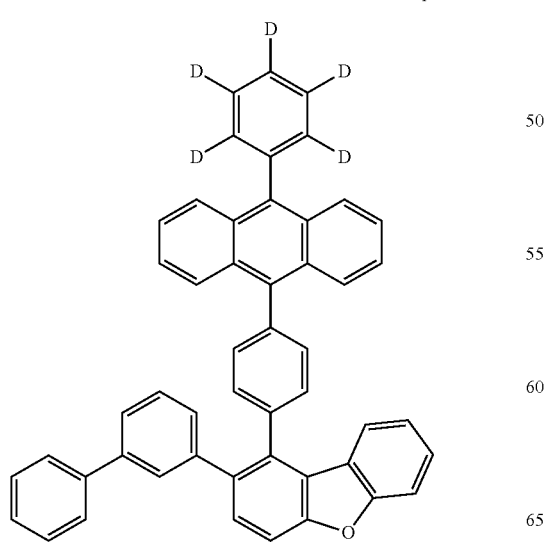
<Compound 210>
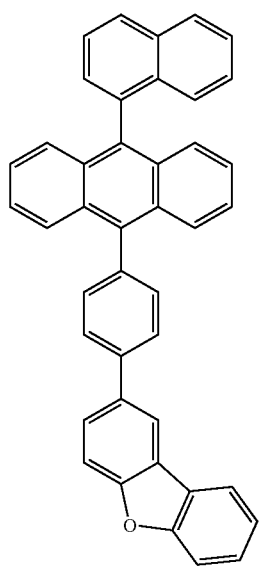
<Compound 211>
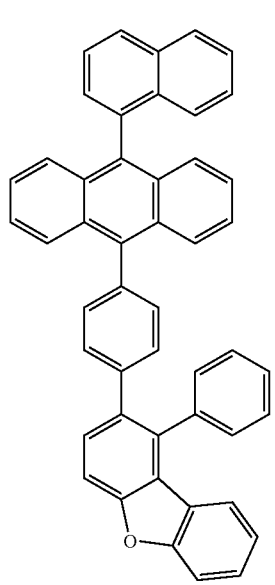

<Compound 212>
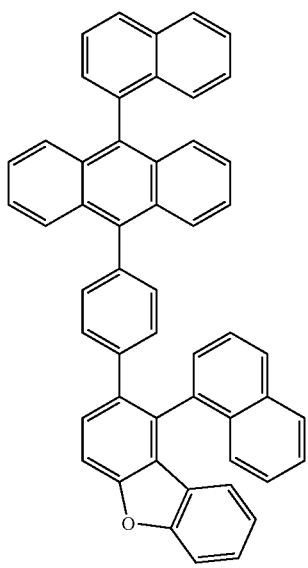
<Compound 214>
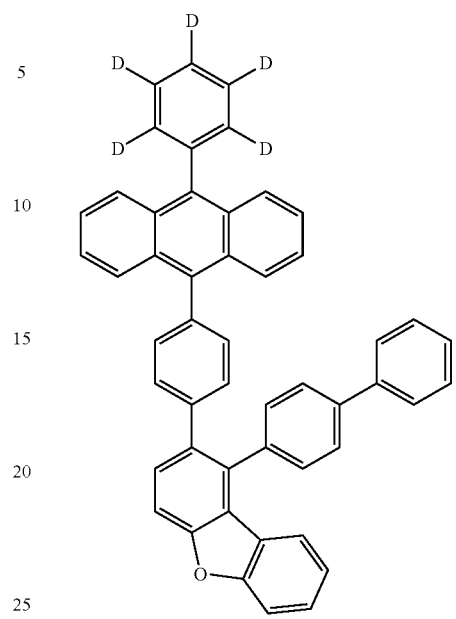
<Compound 213>
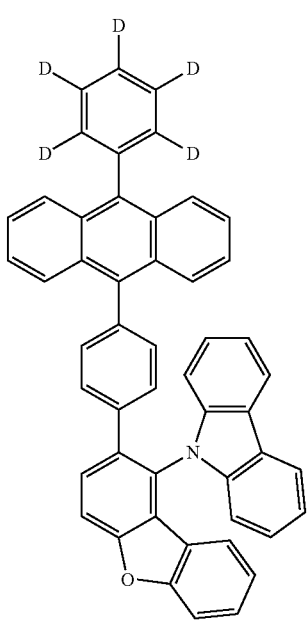
<Compound 215>
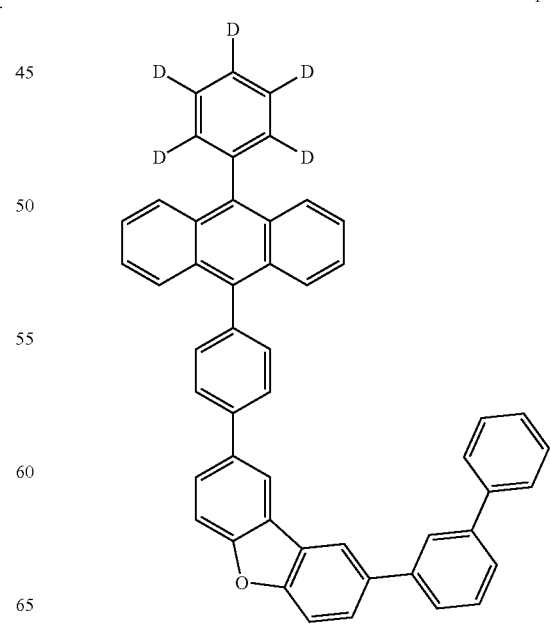

<Compound 216>
<Compound 217>
<Compound 218>
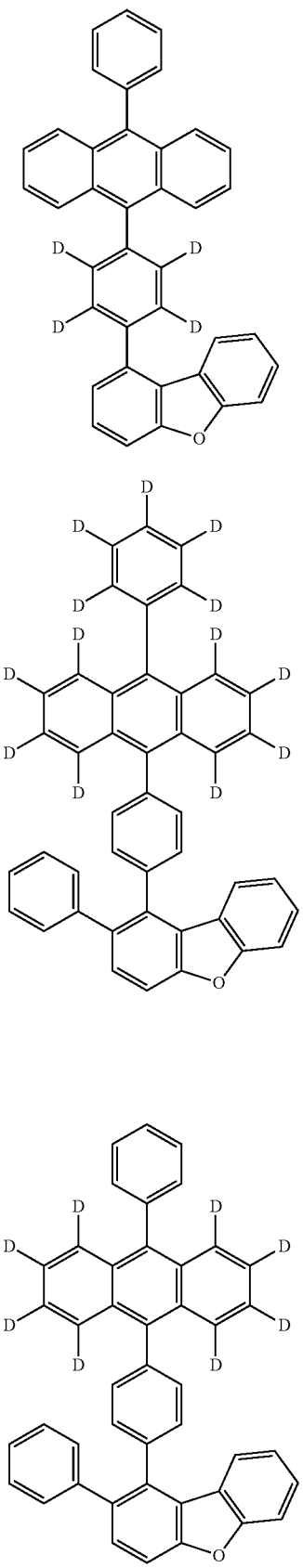
<Compound 219>
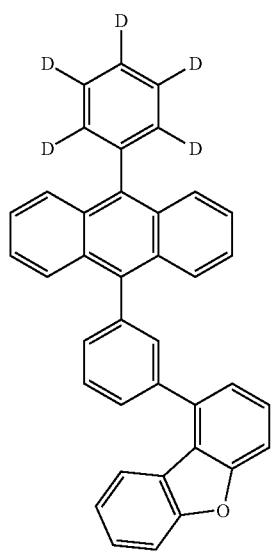
<Compound 220>
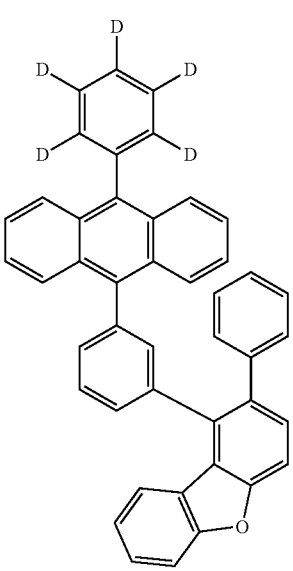

<Compound 221>
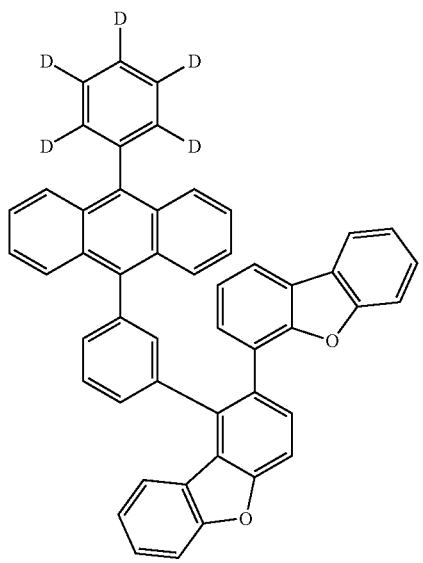
<Compound 222>
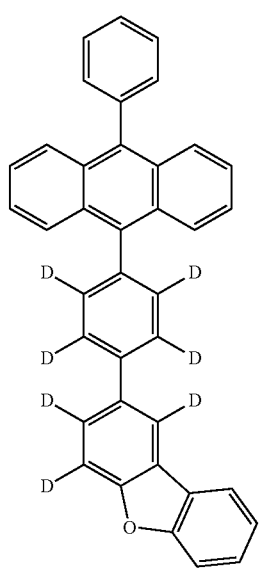
<Compound 223>
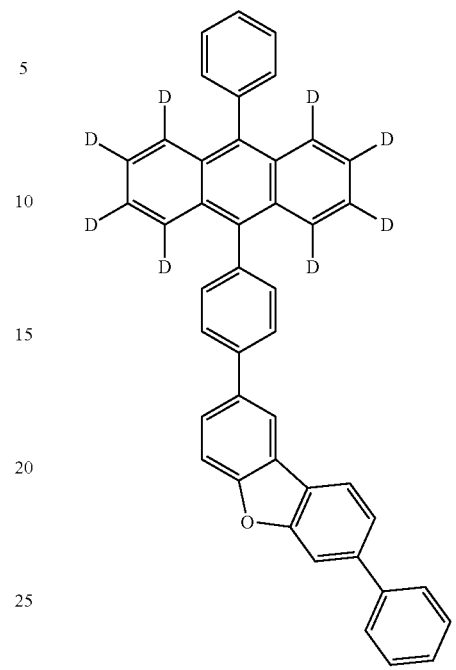
<Compound 224>
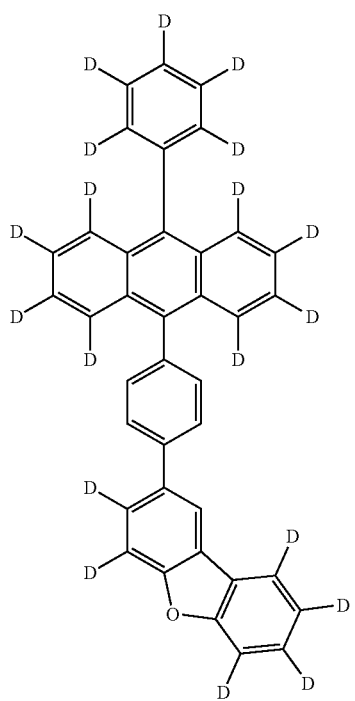

<Compound 225>
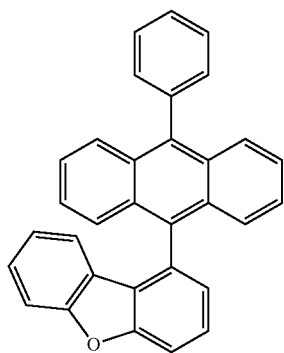
<Compound 226>
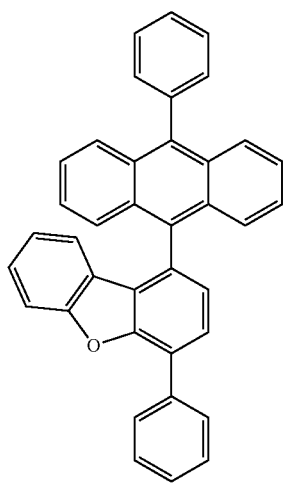
<Compound 227>
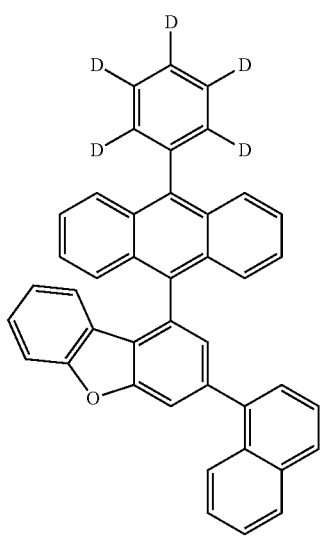
<Compound 228>
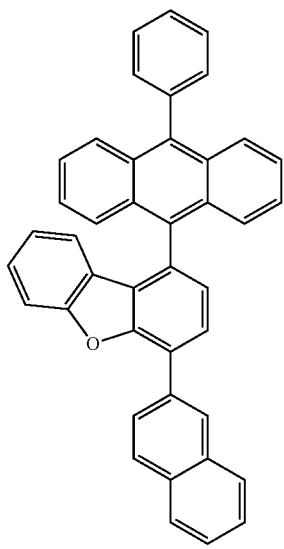
<Compound 229>
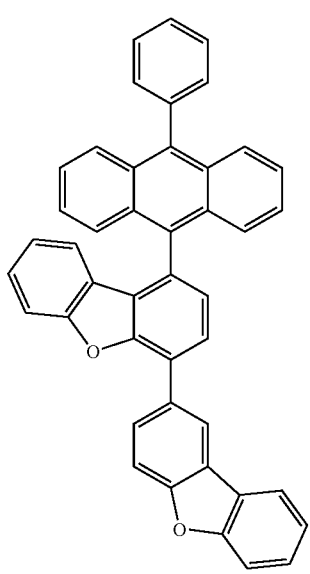
<Compound 230>
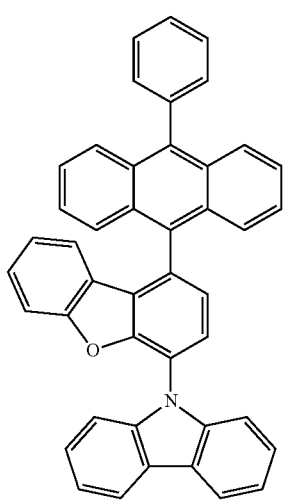

<Compound 231>
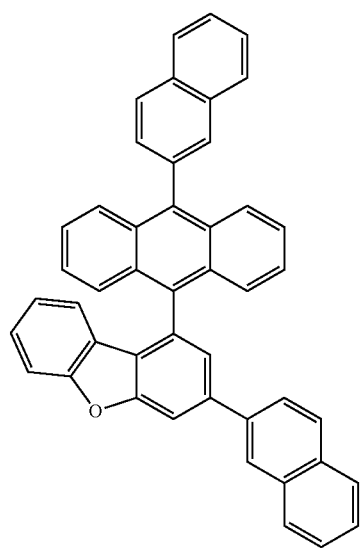
<Compound 234>
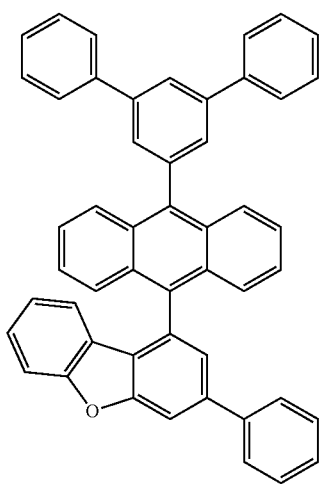
<Compound 232>
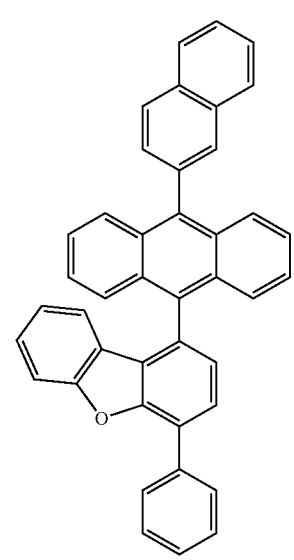
<Compound 235>
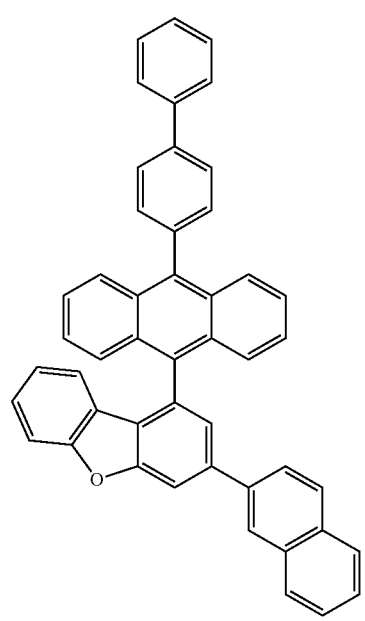
<Compound 233>
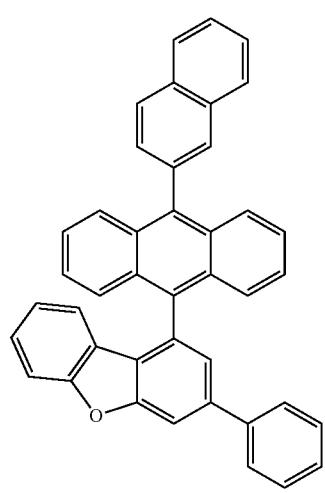
<Compound 236>
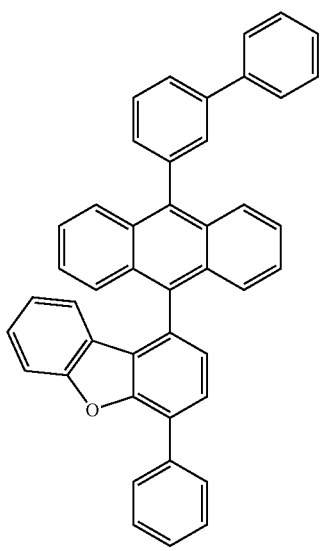

<Compound 237>
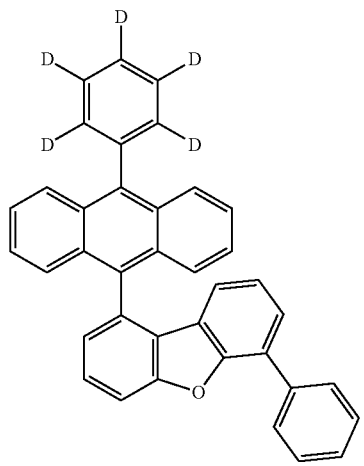
<Compound 238>
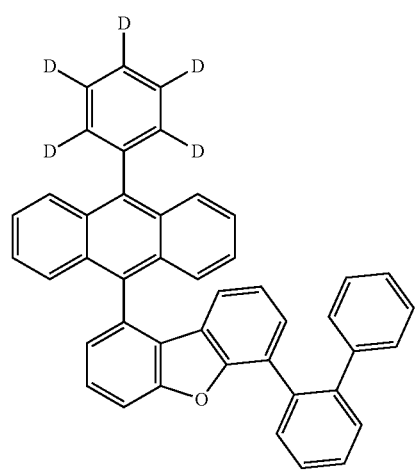
<Compound 239>
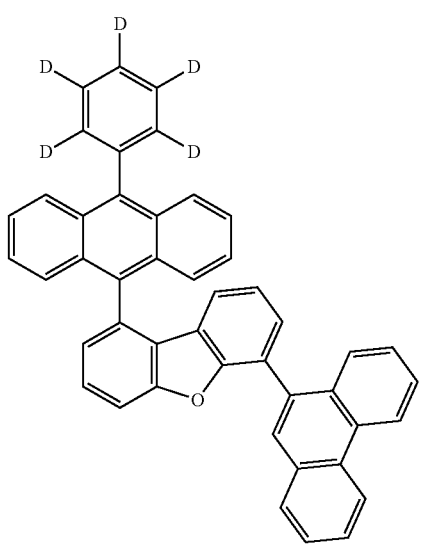
<Compound 240>
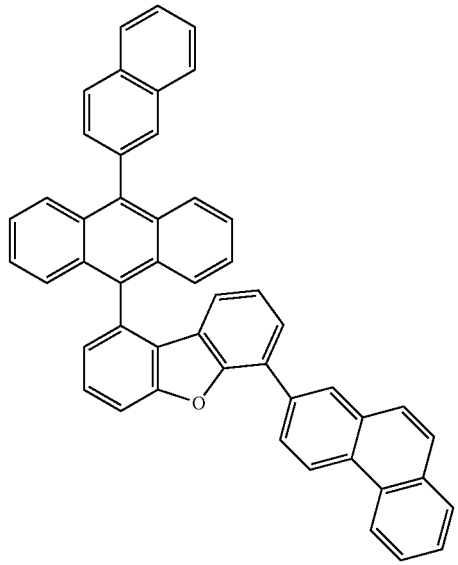
<Compound 241>
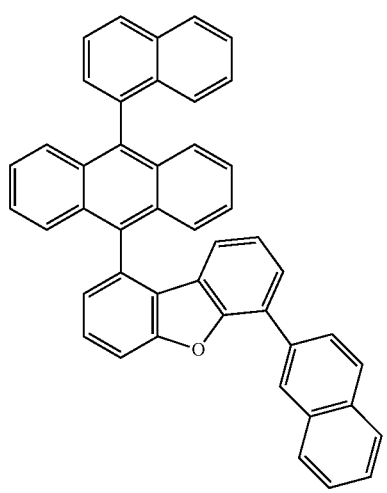
<Compound 242>
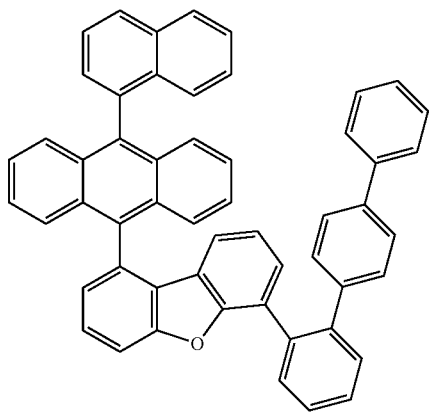

<Compound 243>
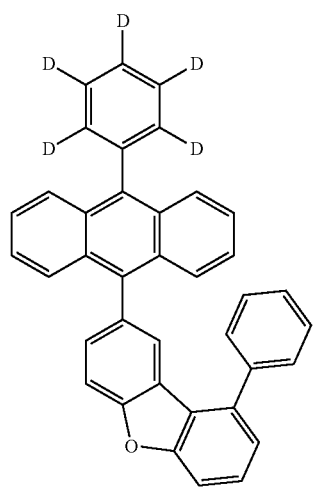
<Compound 244>
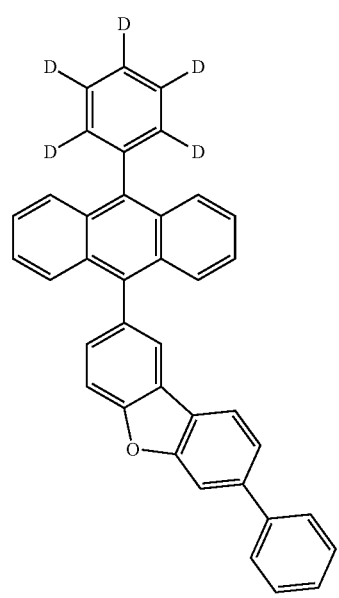
<Compound 245>
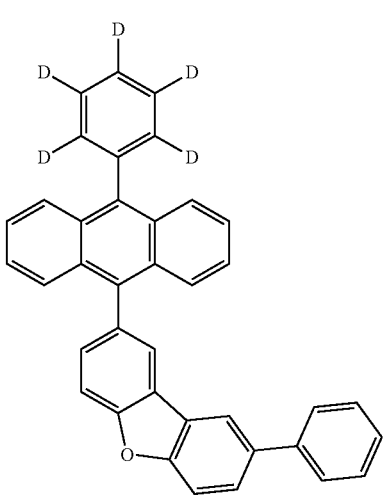
<Compound 246>
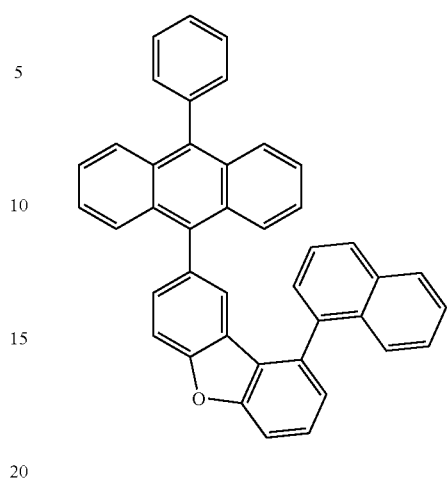
<Compound 247>
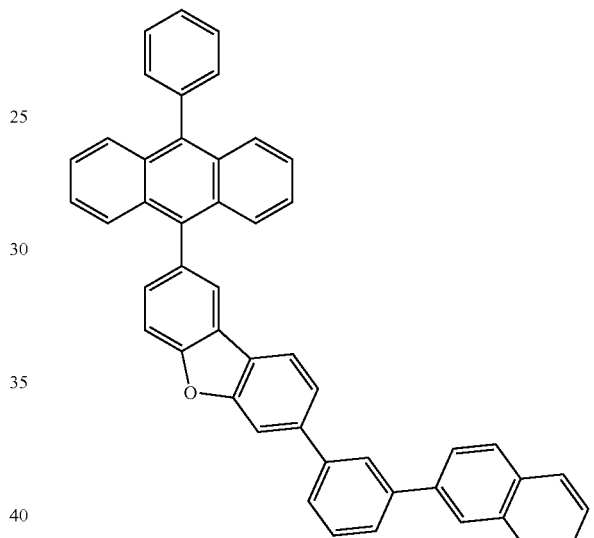
<Compound 248>
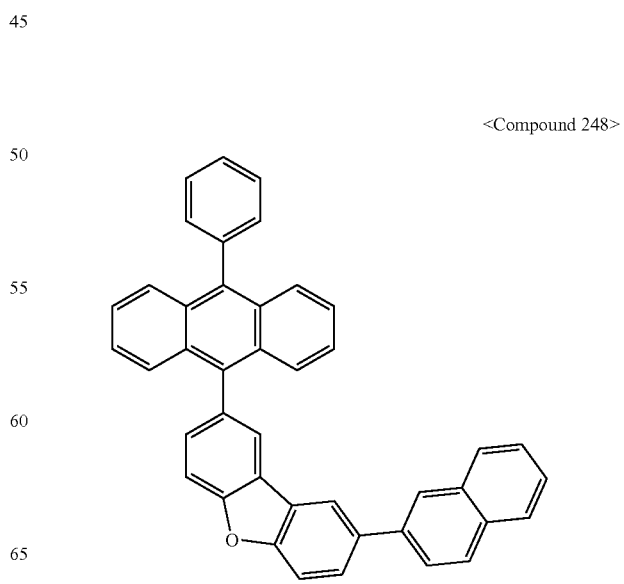

<Compound 249>
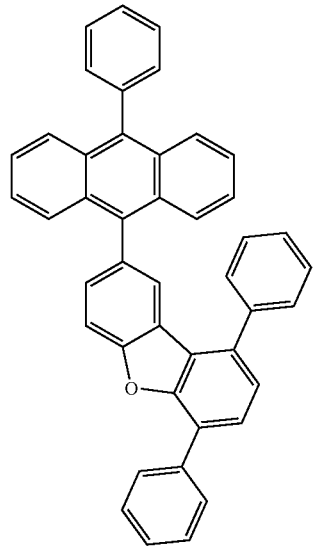
<Compound 250>
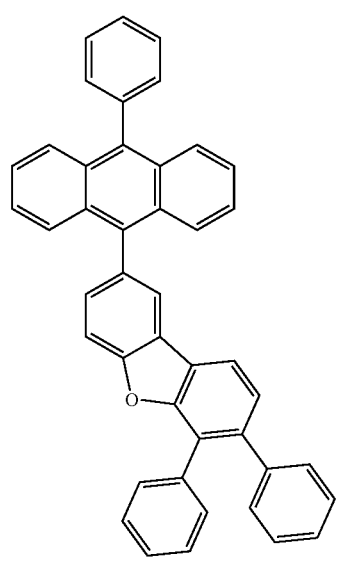
<Compound 251>
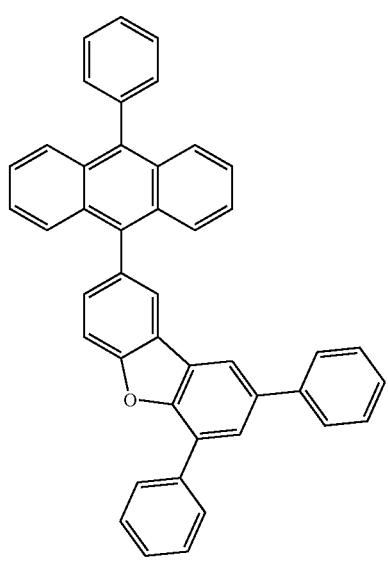
<Compound 252>
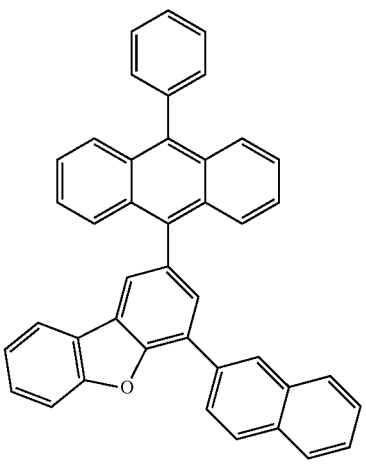
<Compound 253>
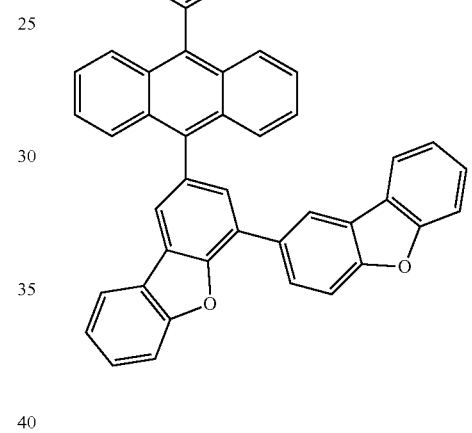
<Compound 254>
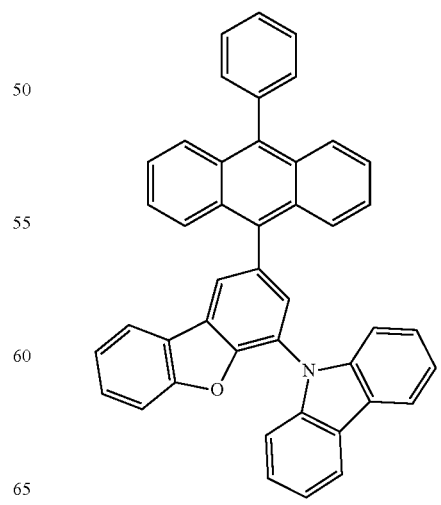

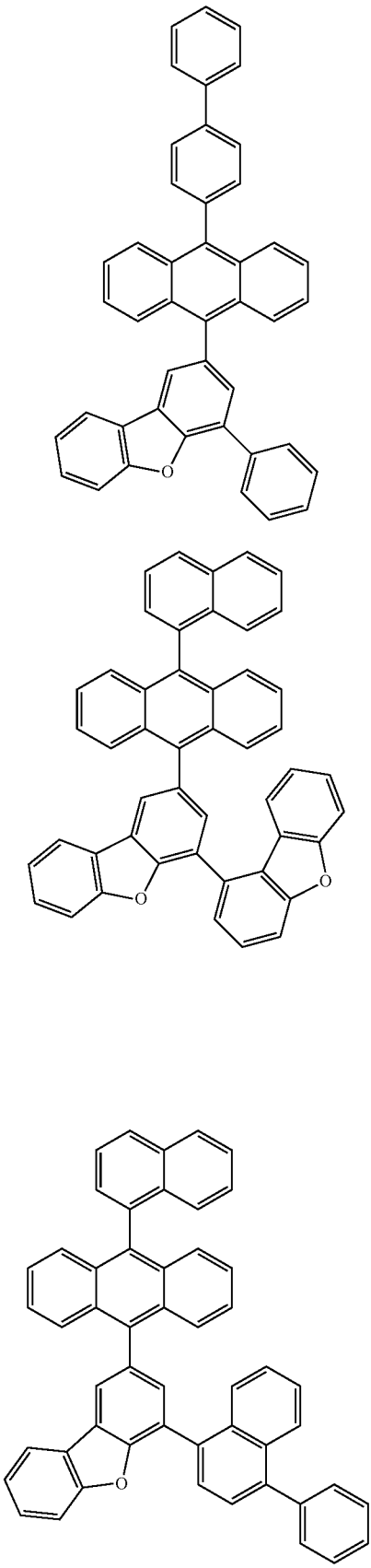
<Compound 255>
<Compound 256>
<Compound 257>
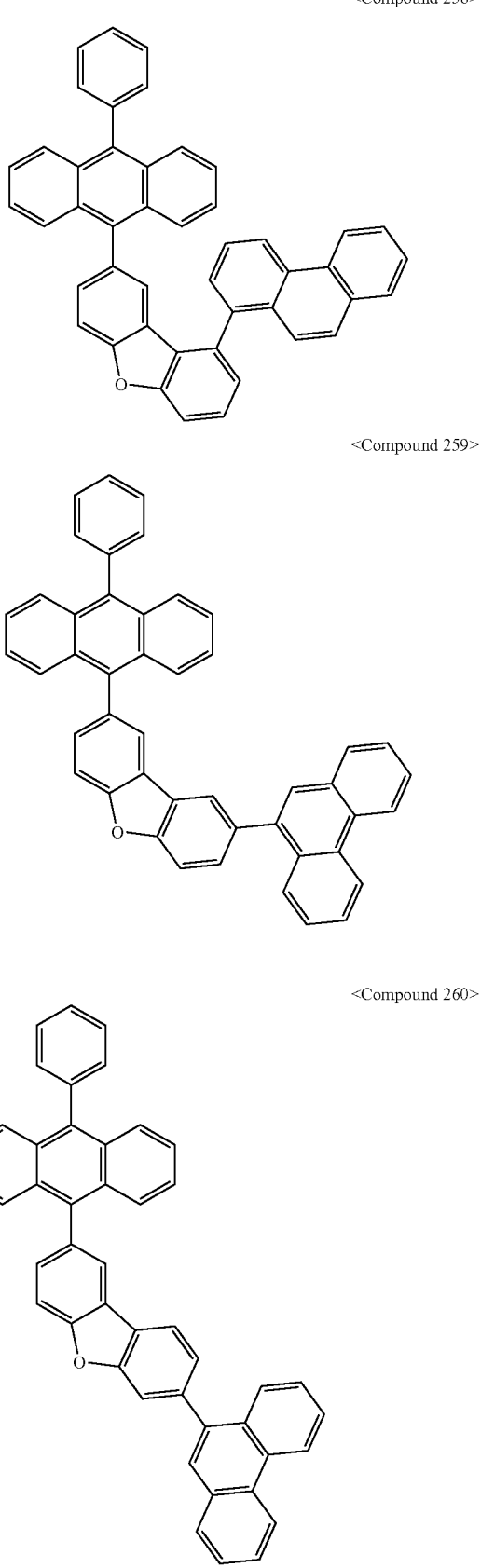
<Compound 258>
<Compound 259>
<Compound 260>

<Compound 261>
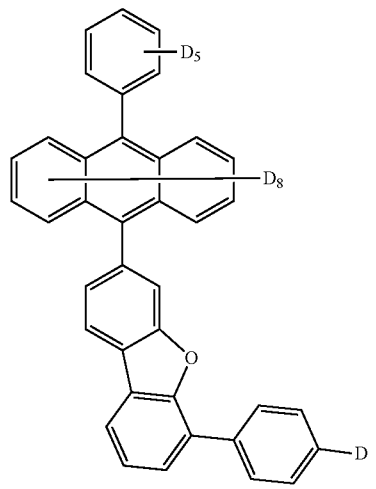
<Compound 262>
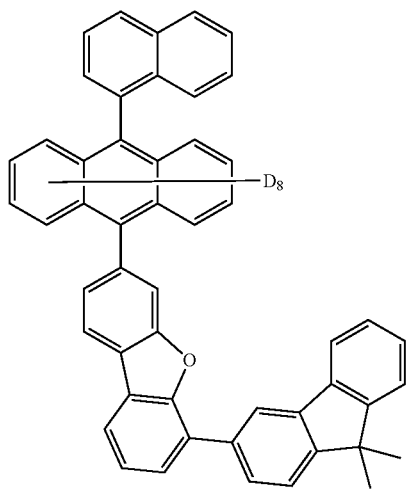
<Compound 263>
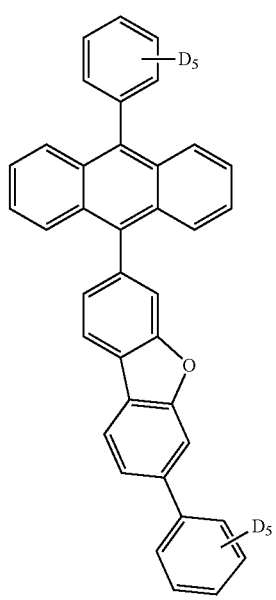
<Compound 264>
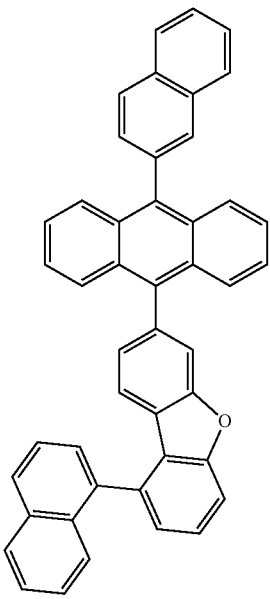
<Compound 265>
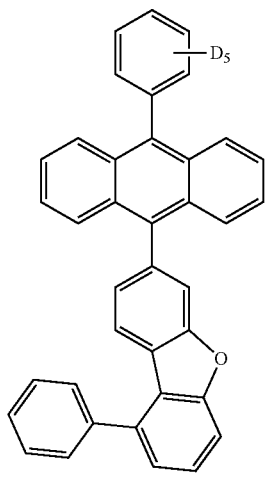
<Compound 266>
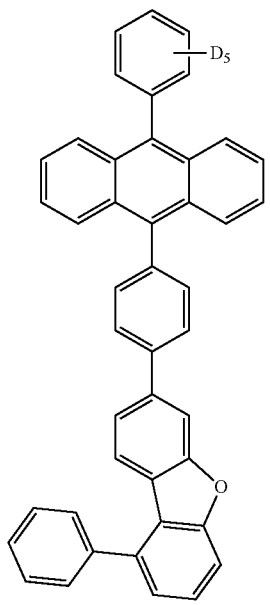

95
-continued
<Compound 267>
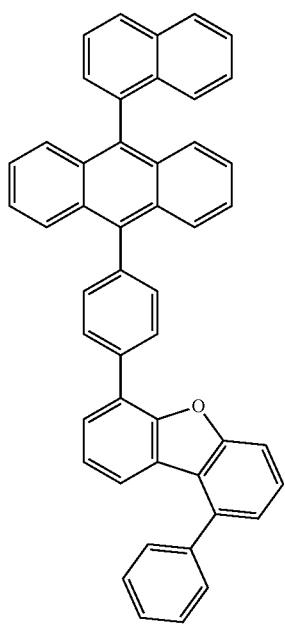
<Compound 268>
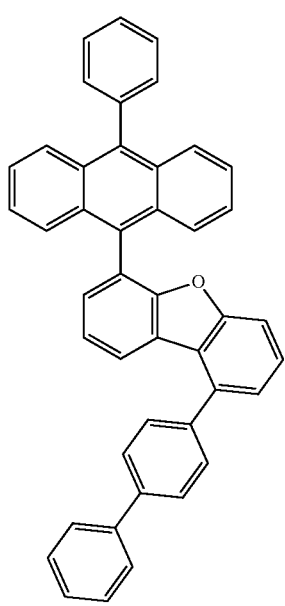
96
-continued
<Compound 269>
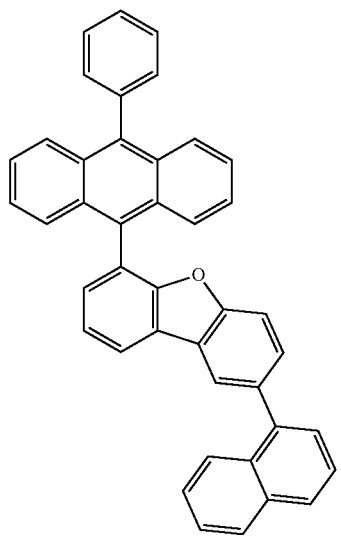
<Compound 270>
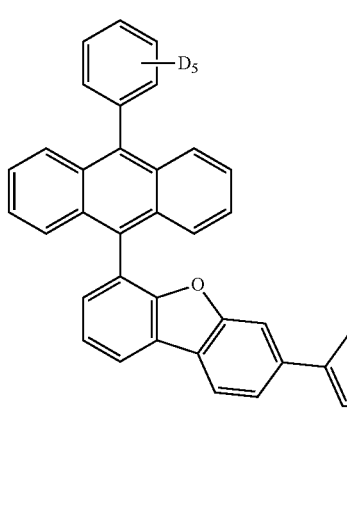
<Compound 271>
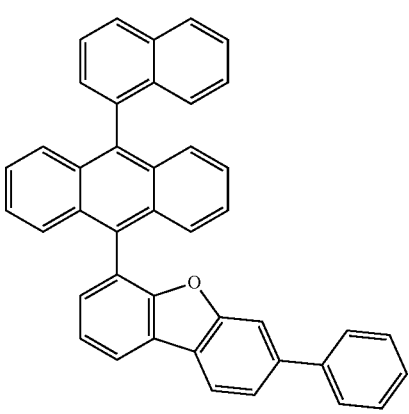

<Compound 272>
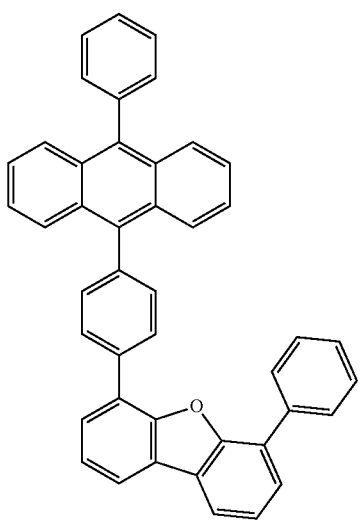
<Compound 273>
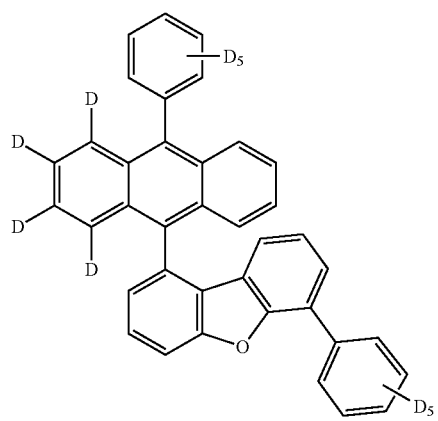
<Compound 274>
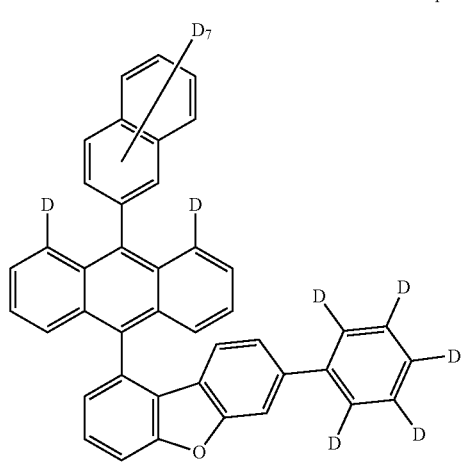
<Compound 275>
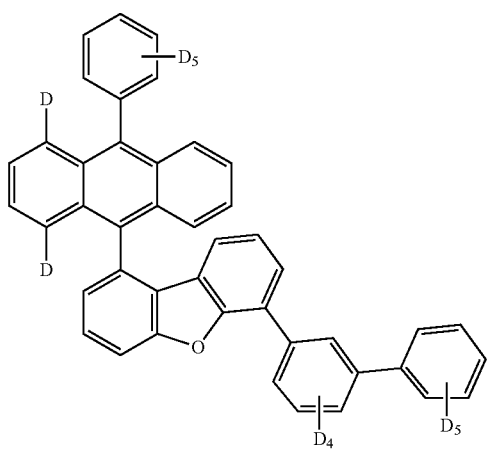
<Compound 276>
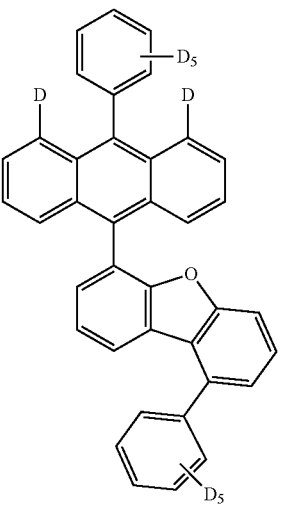
<Compound 277>
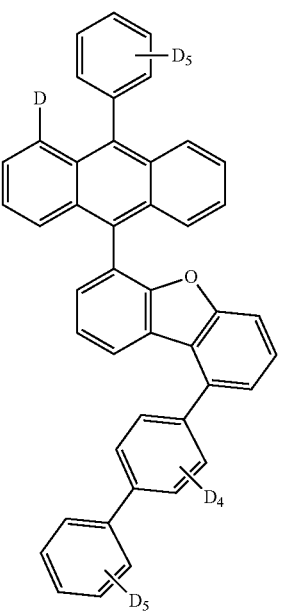

<Compound 278>

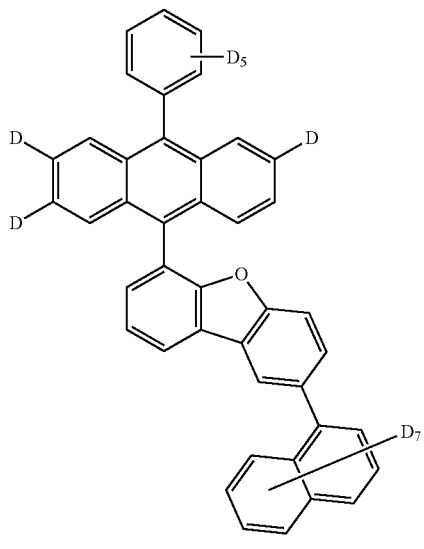

<Compound 280>

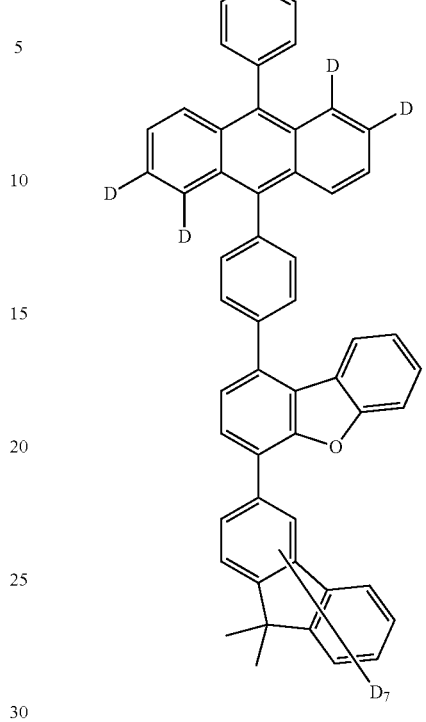

<Compound 281>

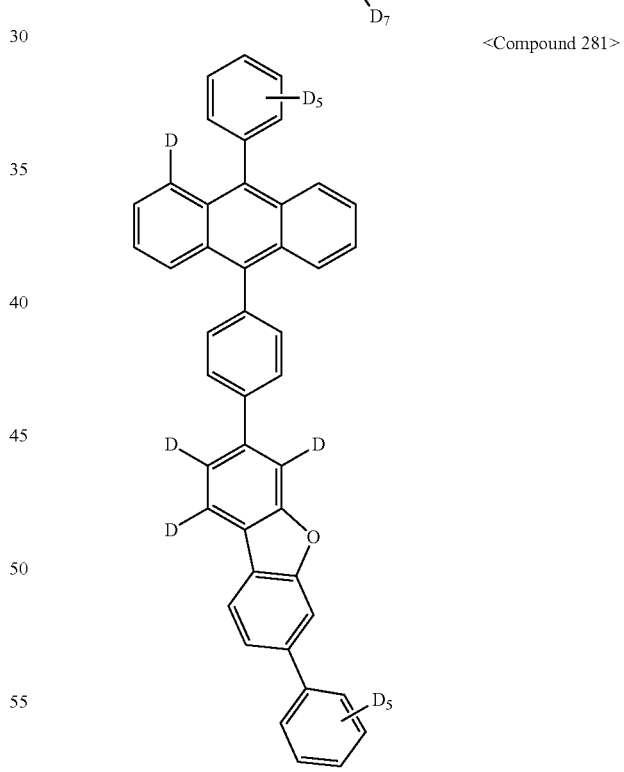

<Compound 279>

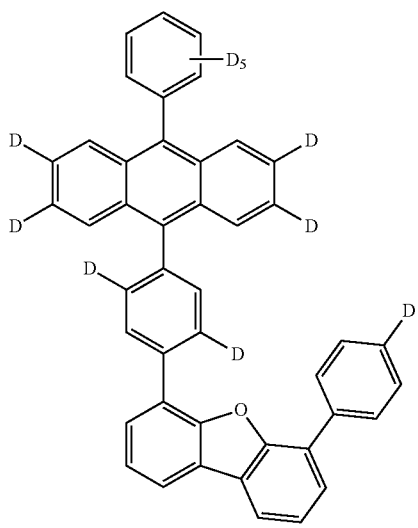

In a more particular embodiment of the present disclosure, an organic light emitting diode comprises an anode as a first electrode; a cathode as a second electrode facing the first electrode; and a light emitting layer interposed between the anode and the cathode, wherein the light emitting layer includes a boron compound represented by any one of Chemical Formulas A to D as a dopant and a compound represented by Chemical Formula H as a host. Having such structural characteristics, the organic light emitting diode according to the present disclosure can drive at low voltage with high luminous efficiency.

When the light-emitting layer contains a host and a dopant, the content of the dopant in the light-emitting layer may range from about 0.01 to 20 parts by weight, based on 100 parts by weight of the host, but is not limited thereto.

Furthermore, the light emitting layer may contain various host materials and various dopant materials in addition to the dopant and host.

Below, an organic light-emitting diode according to an embodiment of the present disclosure is explained with reference to the drawing.

FIG. 1 is a schematic cross-sectional view of the structure of an organic light-emitting diode according to an embodiment of the present disclosure.

As shown in FIG. 1, the organic light-emitting diode according to an embodiment of the present disclosure comprises an anode 20, a hole transport layer 40, an organic light emitting layer 50 containing a host and a dopant, an electron transport layer 60, and a cathode 80 in the order, that is, comprises an anode as a first electrode, a cathode as a second electrode, a hole transport layer between the anode and the light emitting layer, and an electron transport layer between the light emitting layer and the cathode.

In addition, the organic light emitting diode according to an embodiment of the present disclosure may comprise a hole injection layer 30 between the anode 20 and the hole transport layer 40 and an electron injection layer 70 between an electron transport layer 60 and a cathode 80.

Reference is made to FIG. 1 with regard to the organic light emitting diode of the present disclosure and the fabrication thereof.

First, a substrate 10 is coated with an anode electrode material to form an anode 20. So long as it is used in a typical organic light emitting diode, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide (SnO$_2$), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imparted to the hole injection layer material, as long as it is one that is typically used in the art. For example, mention may be made of 2-TNATA [4,4',4''-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], or DNTPD [N,N'-diphenyl-N,N'-bis-[4-(phenyl-m-tolyl-amino)-phenyl]-biphenyl-4,4'-diamine], but the present disclosure is not limited thereby.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenyl-benzidine (a-NPD).

Meanwhile, an electron barrier layer may be further formed on the hole transport layer. The electron barrier layer functions to prevent electrons injected from the electron injection layer from passing through the hole transport layer through the light emitting layer, thereby improving a life span and luminance efficiency of the diode and may be formed at a suitable site between the light emitting layer and the hole injection layer and particularly between the light emitting layer and the hole transport layer.

Then, an organic light-emitting layer 50 is deposited on the hole transport layer 40 or an electron barrier layer by deposition in a vacuum or by spin coating.

Herein, the light emitting layer may contain a host and a dopant and their materials are as described above.

In some embodiments of the present disclosure, the light-emitting layer particularly ranges in thickness from 50 to 2,000 Å.

Here, an electron transport layer 60 is deposited on the organic light emitting layer by deposition in a vacuum or by spin coating.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinorate)aluminum (Alq$_3$), Liq, TAZ, BAlq, beryllium bis(benzoquinolin-10-olate) (Bebq$_2$), Compound ET 201, Compound ET 202, BCP, and oxadiazole derivatives such as PBD, BMD, and BND, but are not limited thereto:

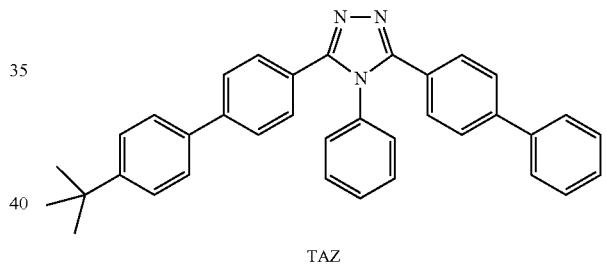

TAZ

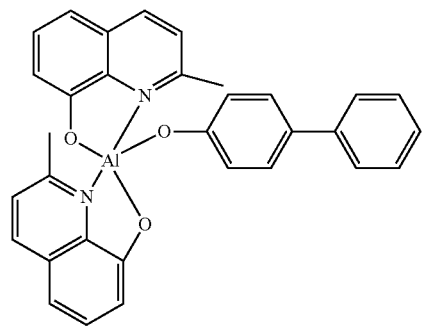

BAlq

-continued

<Compound ET 201>

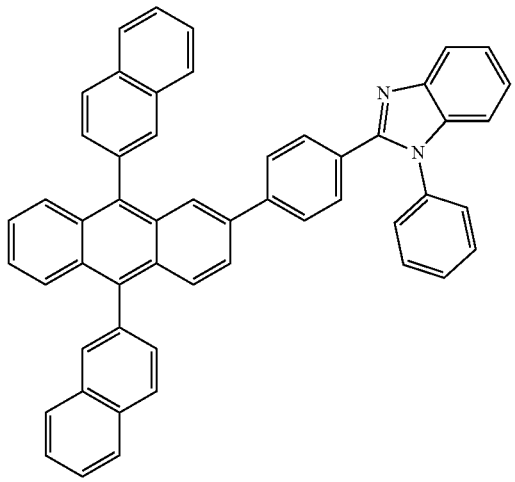

<Compound ET 202>

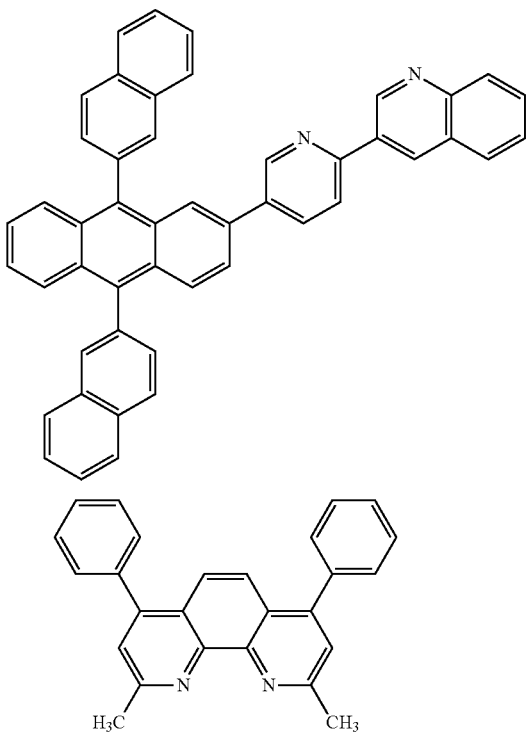

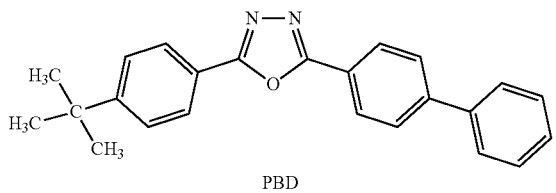
PBD

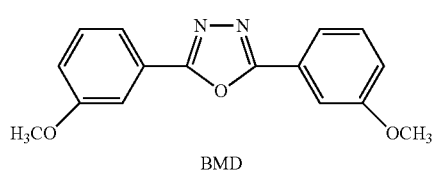
BMD

-continued

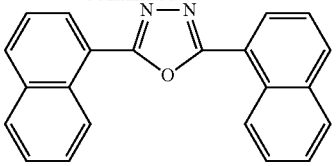
BND

In the organic light emitting diode of the present disclosure, an electron injection layer (EIL) that functions to facilitate electron injection from the cathode may be deposited on the electron transport layer. The material for the EIL is not particularly limited.

So long as it is conventionally used in the art, any material can be available for the electron injection layer without particular limitations. Examples include CsF, NaF, LiF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

In order to facilitate electron injection, the cathode may be made of a material having a small work function, such as metal or metal alloy such as lithium (Li), magnesium (Mg), calcium (Ca), aluminum (Al), aluminum-lithium (Al—Li), magnesium-indium (Mg—In), and magnesium-silver (Mg—Ag). Alternatively, ITO or IZO may be employed to form a transparent cathode for a top-emitting organic light-emitting diode.

In another embodiment, the light-emitting diode of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting diode of the present disclosure may have a multilayer structure in which the additional blue, green, and/or red light-emitting layer may be made of a fluorescent or phosphorescent material.

Further, one or more selected from the layers may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present disclosure.

EXAMPLES

Synthesis Example 1: Synthesis of Compound of Chemical Formula 31

Synthesis Example 1-(1): Synthesis of <Intermediate 1-a>

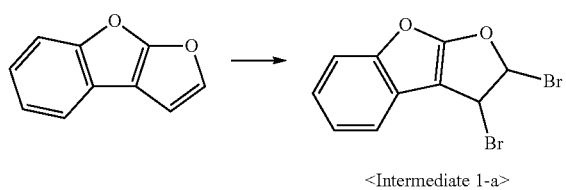 [SMILES: c1ccc2c(c1)oc1occc12 ; BrC1Oc2oc3ccccc3c2C1Br]

<Intermediate 1-a>

In a reactor, furo[2,3-b]benzofuran (33.2 g, 210 mmol) was stirred together with dichloromethane (250 mL). The mixture was cooled to −10° C., dropwise added with a dilution of bromine (33.6 g, 210 mmol) in dichloromethane (50 mL), and then stirred at 0° C. for 2 hours. After completion of the reaction, an aqueous sodium thiosulfate solution was stirred and extracted. The organic layer thus formed was concentrated in a vacuum and recrystallized in ethanol to afford <Intermediate 1-a> (58.7 g). (yield 88%)

Synthesis Example 1-(2): Synthesis of <Intermediate 1-b>

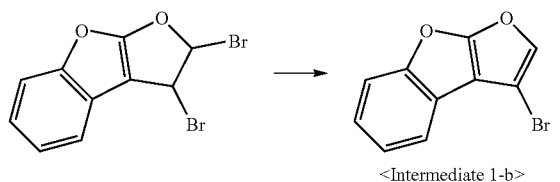 [SMILES: BrC1Oc2oc3ccccc3c2C1Br ; Brc1coc2oc3ccccc3c12]

<Intermediate 1-b>

In a reactor, potassium hydroxide (12.1 g, 216 mmol) was dissolved in ethanol (200 mL). A solution of <Intermediate 1-a> (34.3 g, 108 mmol) in ethanol was dropwise added to the reactor at 0° C. and then stirred under reflux for 2 hours. After completion of the reaction, concentration in a vacuum and subsequent separation by column chromatography afforded <Intermediate 1-b> (12.8 g). (yield 50%)

Synthesis Example 1-3: Synthesis of <Intermediate 1-c>

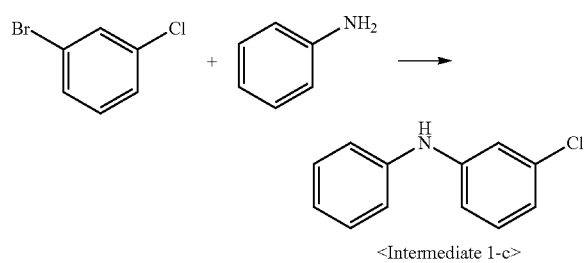

<Intermediate 1-c>

In a reactor, 1-bromo-3-chlorobenzene (3.1 g, 16 mmol), aniline (5.8 g, 16 mmol), palladium acetate (0.1 g, 1 mmol), sodium tert-butoxide (3 g, 32 mmol), bis(diphenylphosphino)-1,1'-binaphthyl (0.2 g, 1 mmol), and toluene (45 mL) were stirred together under reflux for 24 hours. After completion of the reaction, filtration was carried out. The resulting filtrate was concentrated and separated by column chromatography to afford <Intermediate 1-c> (5.2 g). (yield 82%)

Synthesis Example 1-4: Synthesis of <Intermediate 1-d>

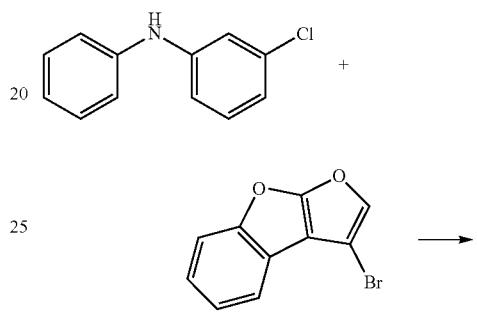

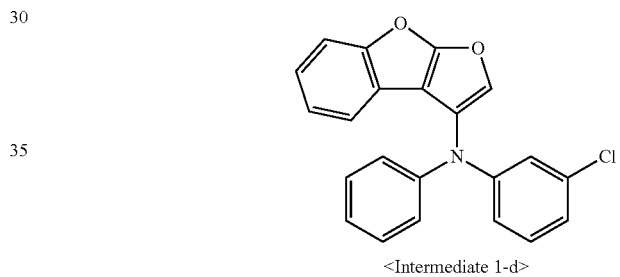

<Intermediate 1-d>

In a reactor, <Intermediate 1-c> (20 g, 98 mmol), <Intermediate 1-b> (23.2 g, 98 mmol), sodium tert-butoxide (18.9 g, 196 mmol), tri-tert-butylphosphine (0.8 g, 4 mmol), and toluene (200 mL) were stirred together under reflux for 5 hours. After completion of the reaction, filtration was carried out. The filtrate was concentrated and separated by column chromatography to afford <Intermediate 1-d> (27.5 g). (yield 78%)

Synthesis Example 1-5: Synthesis of <Intermediate 1-e>

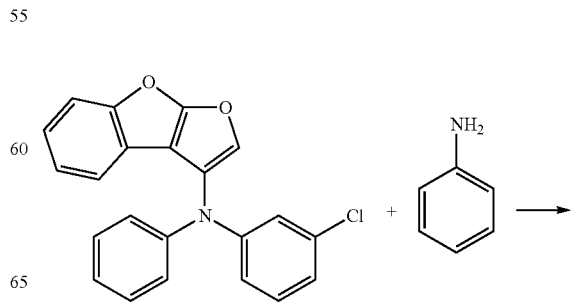

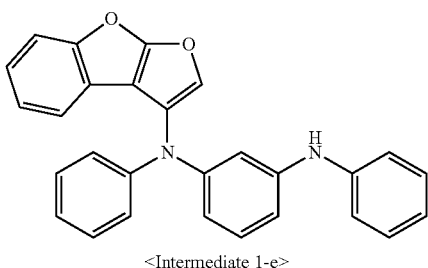

<Intermediate 1-e>

The same procedure as in Synthesis Example 1-3 was carried out, with the exception of using <Intermediate 1-d> instead of 1-bromo-3-chlorobenzene, to afford <Intermediate 1-e>. (yield 71%)

Synthesis Example 1-6. Synthesis of <Intermediate 1-f>

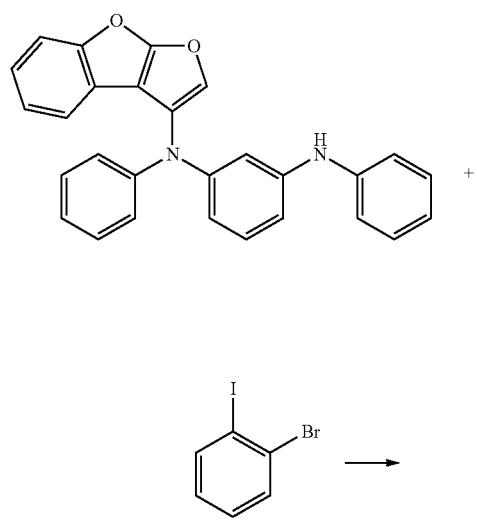

<Intermediate 1-f>

The same procedure as in Synthesis Example 1-(4) was carried out, with the exception of using <Intermediate 1-e> and 1-bromo-2-iodobenzene instead of <Intermediate 1-c> and <Intermediate 1-b>, respectively, to afford <Intermediate 1-f>. (yield 80%)

Synthesis Example 1-7: Synthesis of Compound of <Chemical Formula 31>

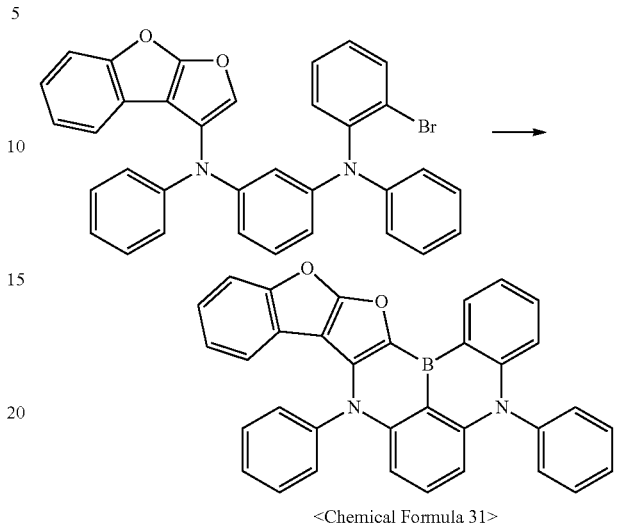

<Chemical Formula 31>

In a reactor were added <Intermediate 1-f> (13.1 g, 23 mmol) and tert-butyl benzene (120 mL). At −78° C., n-butyl lithium (42.5 mL, 68 mmol) was dropwise added. Then, the mixture was stirred at 60° C. for 3 hours. Subsequently, nitrogen was introduced at the same temperature into the reactor to remove heptane. After the temperature was lowered to −78° C., boron tribromide (11.3 g, 45 mmol) was dropwise added and then stirred at room temperature. N, N-Diisopropylethylamine (5.9 g, 45 mmol) was added at 0° C. and then stirred at 120° C. for 2 hours. An aqueous sodium acetate solution was added at room temperature and stirred. After completion of the reaction, concentration by filtration and separation by column chromatography afford <Chemical Formula 31>. (1.4 g, yield 12%)

MS (MALDI-TOF): m/z 500.17 [M$^+$]

Synthesis Example 2: Synthesis of Compound of Chemical Formula 4

Synthesis Example 2-(1): Synthesis of <Intermediate 2-a>

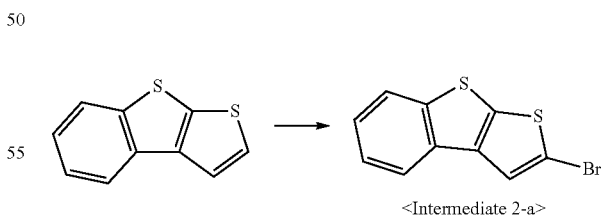

<Intermediate 2-a>

In a reactor, thieno[2,3-b]benzothiophene (19 g, 100 mmol) and chloroform (300 mL) were stirred together. After the temperature was cooled to 0° C., N-bromosuccinimide (17.8 mg, 100 mmol) was slowly dropwise added over 30 min and then stirred for 4 hours. After completion of the reaction, the organic layer was extracted and concentrated and the concentrate was isolated by column chromatography to afford <Intermediate 2-a>. (22.6 g, yield 84%)

Synthesis Example 2-(2): Synthesis of Compound of <Chemical Formula 4>

The same procedures as in Synthesis Examples 1-4 to 1-7 were carried out, with the exception of using <Intermediate 2-a> instead of <Intermediate 1-b> in Synthesis Example 1-4, to afford <Chemical Formula 4>. (yield 12%)

Synthesis Example 3: Synthesis of Compound of Chemical Formula 23

Synthesis Example 3-(1): Synthesis of <Intermediate 3-a>

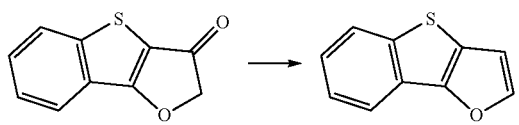 [SMILES: O=C1COc2c1sc1ccccc21 ; c1ccc2c(c1)sc1ccoc12]

In a reactor, benzothienofuran-3(2h)-one (5 g, 26.2 mmol) was dissolved in methanol (50 ml). The temperature was cooled to 0° C. and drops of sodium borohydride (1.5 g, 40 mmol) were slowly added over 15 min, followed by stirring for 1 hour. After dilution by adding ice water (100 ml), the diluted mixture was acidified into a pH of 4 with 5% HCl. Concentration by extraction and then column chromatographic separation afforded <Intermediate 3-a>. (3.5 g, yield 76%)

Synthesis Example 3-(2): Synthesis of <Intermediate 3-b>

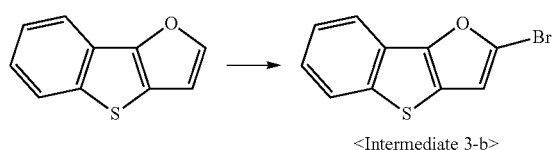 [SMILES: c1ccc2c(c1)sc1ccoc12 ; Brc1cc2sc3ccccc3c2o1]

<Intermediate 3-b>

To a solution of dibromide (1.57 g, 6.33 mmol) in 10 ml of a 1:1 mixture of dioxane and dichloromethane, a solution of <Intermediate 3-a> (1 g, 5.74 mmol) in 6 ml of the same solvent (1:1 mixture of dioxane and dichloromethane) was slowly dropwise added at 0° C. Stirring was conducted for 2 hours at the same temperature. Sodium hydrogen carbonate was added for neutralization 20 min before filtration. Concentration by extraction and then column chromatographic separation afforded <Intermediate 3-b>. (0.84 g, yield 58%)

Synthesis Example 3-(3): Synthesis of <Intermediate 3-c>

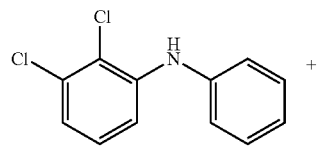 +

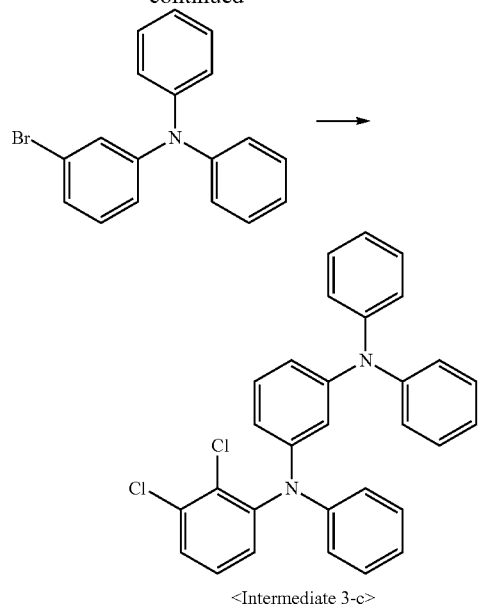

<Intermediate 3-c>

The same procedure as in Synthesis Example 1-4 was carried out, with the exception of using 2,3-dichloro-N-phenylaniline and 3-bromotriphenylamine instead of <Intermediate 1-c> and <Intermediate 1-b>, respectively, to afford <Intermediate 3-c>. (yield 77%)

Synthesis Example 3-(4): Synthesis of <Intermediate 3-d>

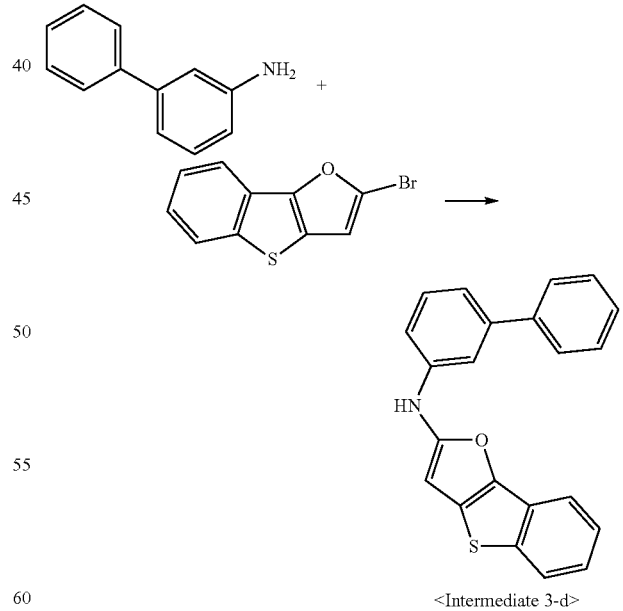

<Intermediate 3-d>

The same procedure as in Synthesis Example 1-3 was carried out, with the exception of using <Intermediate 3-b> and 3-aminobiphenyl instead of 1-bromo-3-chlorobenzene and aniline, respectively, to afford <Intermediate 3-d>. (yield 67%)

Synthesis Example 3-(5): Synthesis of <Intermediate 3-e>

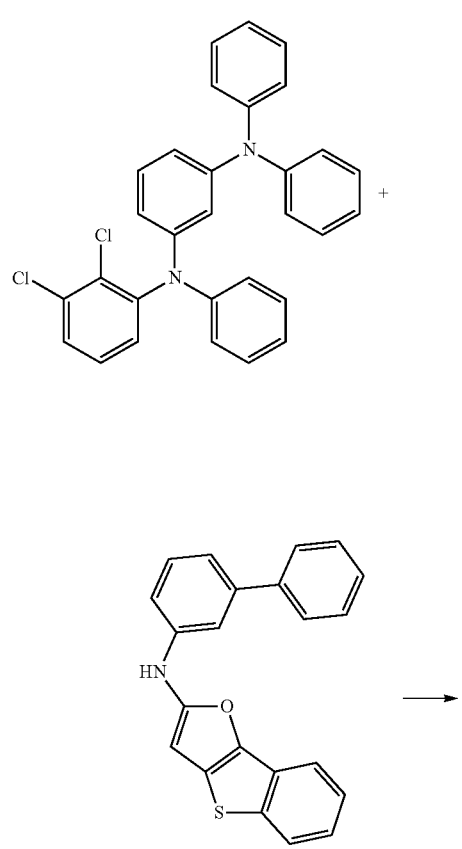

<Intermediate 3-e>

The same procedure as in Synthesis Example 1-4 was carried out, with the exception of using <Intermediate 3-d> and <Intermediate 3-c> instead of <Intermediate 1-c> and <Intermediate 1-b>, respectively, to afford <Intermediate 3-e>. (yield 60%)

Synthesis Example 3-(6): Synthesis of <Chemical Formula 23>

<Chemical Formula 23>

The same procedure as in Synthesis Example 1-7 was carried out, with the exception of using <Intermediate 3-e> instead of <Intermediate 1-f>, to afford <Chemical Formula 23>. (yield 17%)

MS (MALDI-TOF): m/z 759.25 [M⁺]

Synthesis Example 4: Synthesis of Compound of Chemical Formula 8

Synthesis Example 4-(1): Synthesis of <Intermediate 4-a>

<Intermediate 4-a>

In a reactor, 3-bromo-2-nitrothiophene (20.8 g, 100 mmol), phenyl boronic acid (12.2 g, 100 mmol), tetrakis(triphenylphosphine)palladium (4 g, 3 mmol), potassium carbonate (41.5 g, 300 mmol), tetrahydrofuran (250 mL), and distilled water (90 mL) were stirred together under reflux for 24 hours. After completion of the reaction, the organic layer was concentrated in a vacuum and separated through column chromatography to afford <Intermediate 4-a>. (16 g, yield 78%)

Synthesis Example 4-(2): Synthesis of <Intermediate 4-b>

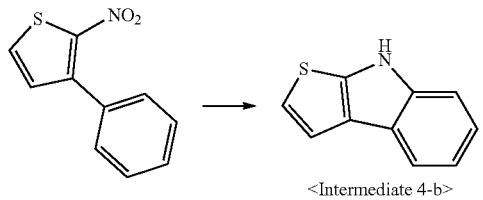 [SMILES: O=[N+]([O-])c1sccc1-c1ccccc1 ; c1ccc2c(c1)[nH]c1sccc12]

<Intermediate 4-b>

In a reactor, <Intermediate 4-a> (16 g, 78 mmol) and triphenylphosphine (51.1 g, 195 mmol) were dissolved in 1,2-dichlorobenzene (300 ml) and stirred under reflux for 24 hours. After completion of the reaction, the organic layer was concentrated in a vacuum and separated by column chromatography to afford <Intermediate 4-b>. (9.7 g, yield 72%)

Synthesis Example 4-(3): Synthesis of <Intermediate 4-c>

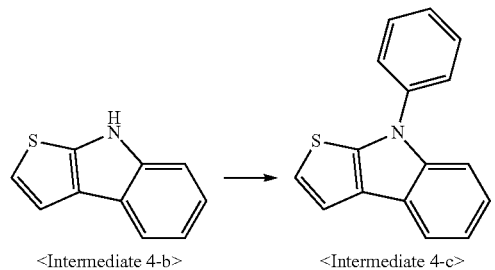 [SMILES: c1ccc2c(c1)[nH]c1sccc12 ; c1ccc(-n2c3ccccc3c3ccsc32)cc1]

<Intermediate 4-b>   <Intermediate 4-c>

The same procedure as in Synthesis Example 1-4 was carried out, with the exception of using <Intermediate 4-b> and iodobenzene instead of <Intermediate 1-c> and <Intermediate 1-b>, respectively, to afford <Intermediate 4-c>. (yield 74%)

Synthesis Example 4-(4): Synthesis of <Intermediate 4-d>

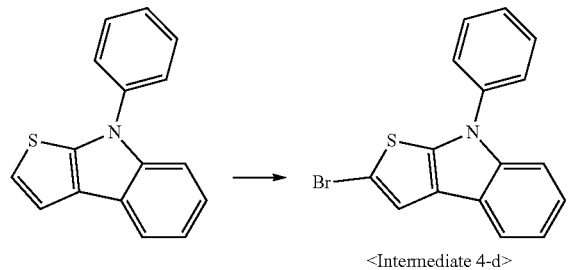 [SMILES: c1ccc(-n2c3ccccc3c3ccsc32)cc1 ; Brc1cc2c3ccccc3n(-c3ccccc3)c2s1]

<Intermediate 4-d>

The same procedure as in Synthesis Example 2-1 was carried out, with the exception of using <Intermediate 4-c> instead of thieno [2,3-b]benzothiophene, to afford <Intermediate 4-d>. (yield 78%)

Synthesis Example 4-(5): Synthesis of Compound of <Chemical Formula 8>

The same procedures as in Synthesis Examples 1-4 to 1-7 were carried out, with the exception of using <Intermediate 4-d> instead of <Intermediate 1-b> in Synthesis Example 1-4, to afford <Chemical Formula 8>. (yield 13%)

MS (MALDI-TOF): m/z 591.19 [M$^+$]

Synthesis Example 5: Synthesis of Chemical Formula 13

Synthesis Example 5-(1): Synthesis of <Intermediate 5-a>

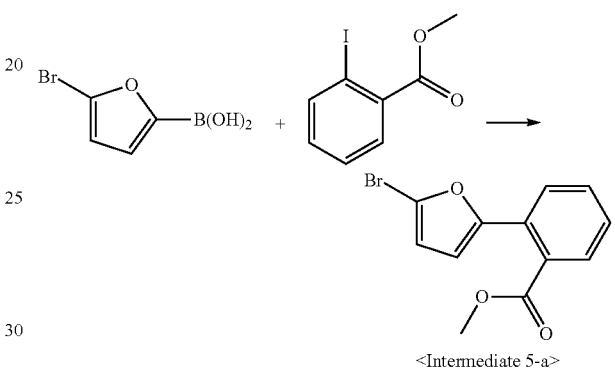

<Intermediate 5-a>

In a reactor, 5-bromofuran-2-boronic acid (22.5 g, 118 mmol), methyl-2-iodobenzoate (30.9 g, 118 mmol), tetrakistriphenylphosphine palladium (2.7 g, 2.3 mmol), potassium carbonate (33 g, 237 mmol), toluene (200 ml), 1,4-dioxane (200 ml), and water (100 ml) were fed in a nitrogen atmosphere and refluxed for 12 hours. After completion of the reaction, the organic layer was concentrated in a vacuum and separated by column chromatography to afford <Intermediate 5-a>. (24.5 g, yield 74%)

Synthesis Example 5-(2): Synthesis of <Intermediate 5-b>

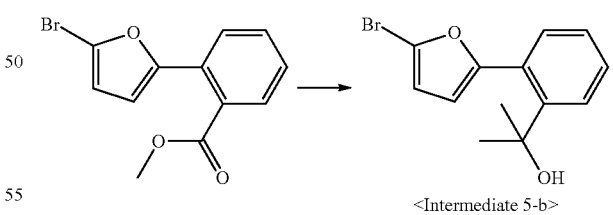

<Intermediate 5-b>

In a reactor, <Intermediate 5-a> (30.9 g, 110 mmol) was added to tetrahydrofuran (150 ml) and cooled to −10° C., followed by slowly adding drops of 3 M methyl magnesium bromide (85 ml, 254 mmol). After temperature elevation to 40° C., the mixture was stirred for 4 hours. The temperature was lowered to −10° C. at which 2 N HCl (70 ml) was slowly added in a dropwise manner and then an aqueous ammonium chloride solution (70 ml) was added before elevation to room temperature. After completion of the reaction, the reaction mixture was washed with water, concentrated in a vacuum, and separated through column chromatography to afford <Intermediate 5-b>. (24.7 g, yield 80%)

Synthesis Example 5-(3): Synthesis of <Intermediate 5-c>

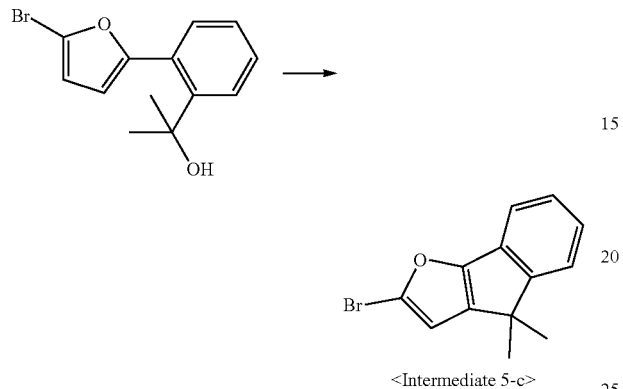

<Intermediate 5-c>

In a reactor, <Intermediate 5-b> (25 g, 89.2 mmol) and phosphoric acid (70 ml) were stirred at room temperature for 12 hours under a nitrogen atmosphere. After completion of the reaction, concentration by extraction and then column chromatographic separation afforded <Intermediate 5-c>. (16.4 g, yield 70%)

Synthesis Example 5-(4): Synthesis of <Intermediate 5-d>

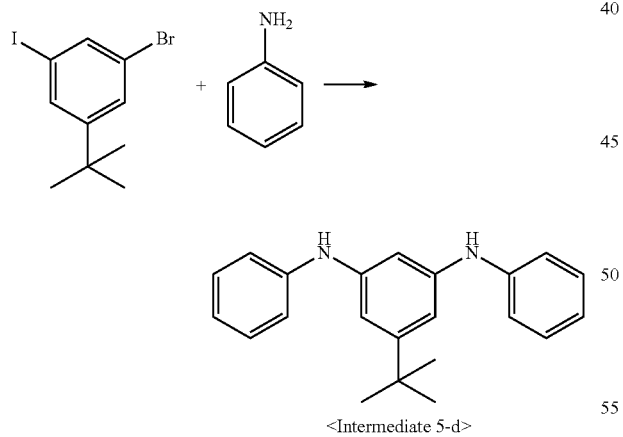

<Intermediate 5-d>

In a reactor, 1-bromo-3-(tert-butyl)-5-iodobenzene (50 g, 177 mmol), aniline (36.2 g, 389 mmol), palladium acetate (1.6 g, 7 mmol), sodium tert-butoxide (51 g, 530 mmol), bis(diphenylphosphino)-1,1'-binaphthyl (4.4 g, 7 mmol), and toluene (500 mL) were stirred together under reflux for 24 hours. After completion of the reaction, filtration was carried out. The resulting filtrate was concentrated and separated by column chromatography to afford <Intermediate 5-d>. (42.5 g, yield 50%)

Synthesis Example 5-(5): Synthesis of <Intermediate 5-e>

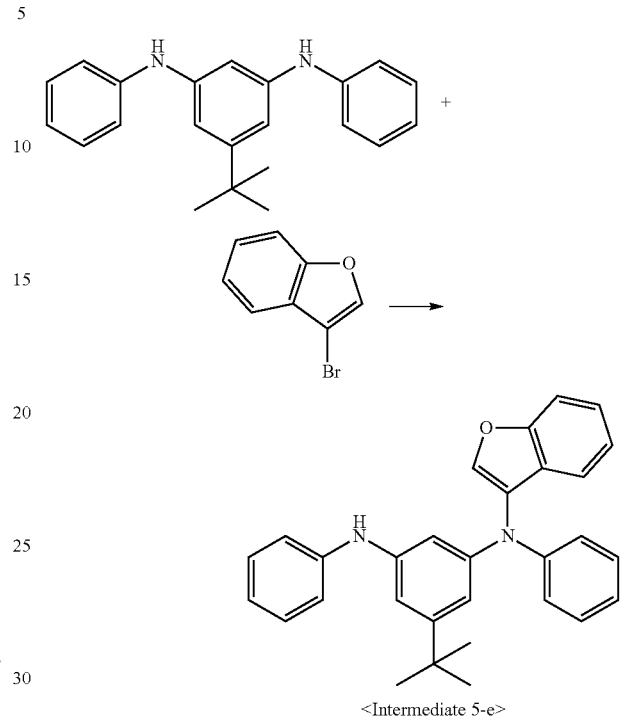

<Intermediate 5-e>

In a reactor, <Intermediate 5-d> (31.6 g, 100 mmol), 3-bromobenzofuran (19.7 g, 100 mmol), palladium acetate (1 g, 2 mmol), sodium tert-butoxide (12.2 g, 127 mmol), tri-tert-butylphosphine (0.7 g, 3 mmol), and toluene (150 mL) were stirred together under reflux for 5 hours. After completion of the reaction, filtration was carried out. The filtrate was concentrated and separated by column chromatography to afford <Intermediate 5-e>. (19.5 g, yield 45%)

Synthesis Example 5-(6): Synthesis of <Intermediate 5-f>

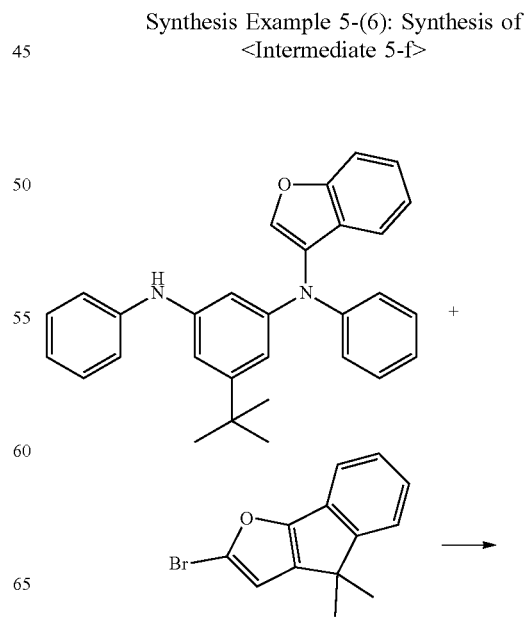

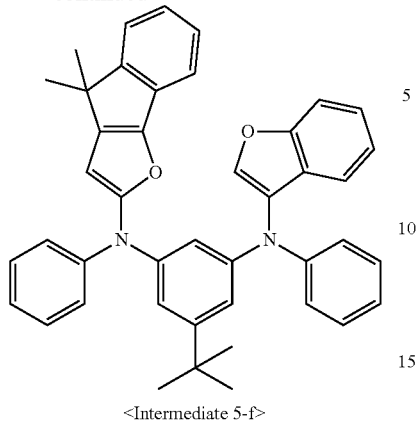

<Intermediate 5-f>

The same procedure as in Synthesis Example 1-4 was carried out, with the exception of using <Intermediate 5-e> and <Intermediate 5-c> instead of <Intermediate 1-c> and <Intermediate 1-b>, respectively, to afford <Intermediate 5-f>. (yield 67%)

Synthesis Example 5-(7): Synthesis of <Chemical Formula 13>

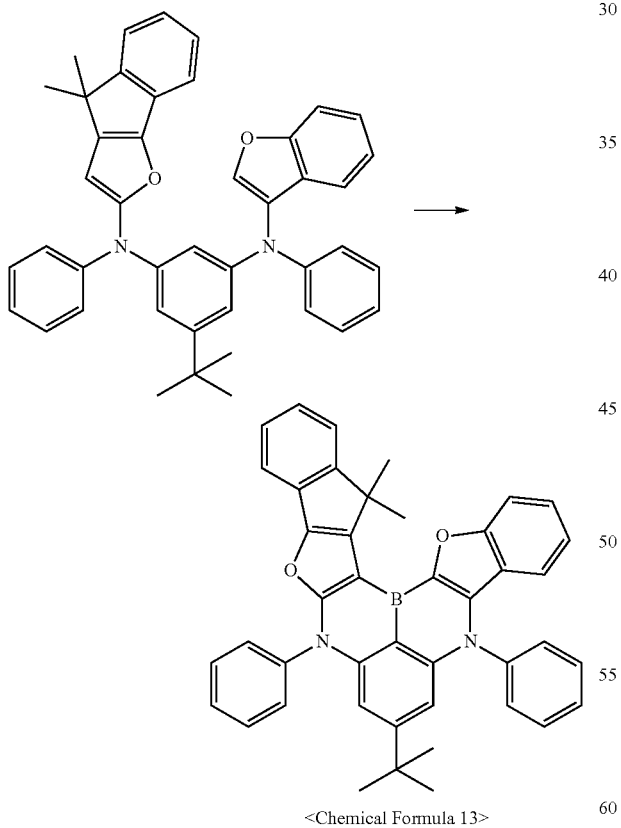

<Chemical Formula 13>

The same procedure as in Synthesis Example 1-7 was carried out, with the exception of using <Intermediate 5-f> instead of <Intermediate 1-f>, to afford <Chemical Formula 13>. (yield 15%)

MS (MALDI-TOF): m/z 622.28 [M⁺]

Synthesis Example 6: Synthesis of Compound of Chemical Formula 60

Synthesis Example 6-(1): Synthesis of <Intermediate 6-a>

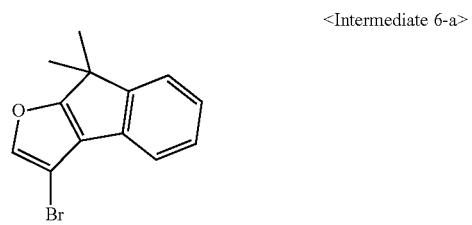

<Intermediate 6-a>

The same procedures as in Synthesis Examples 5-1 to 5-3 were carried out, with the exception of using (4-bromofuran-3-yl)boronic acid instead of 5-bromofuran-2-boronic acid in Synthesis Example 5-1, to afford <Intermediate 6-a>. (yield 65%)

Synthesis Example 6-(2): Synthesis of <Intermediate 6-b>

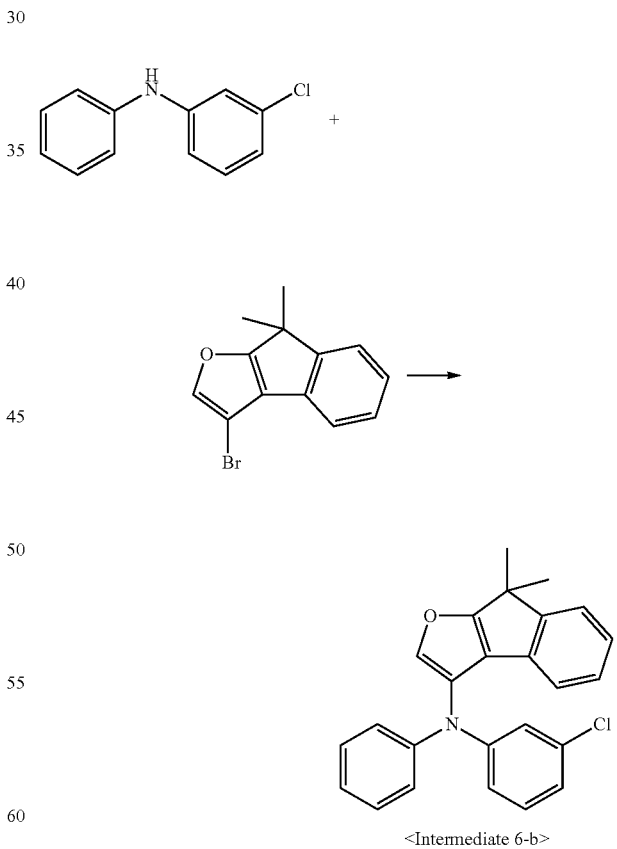

<Intermediate 6-b>

The same procedure as in Synthesis Example 1-4 was carried out, with the exception of using Intermediate 6-a> instead of <Intermediate 1-b>, to afford <Intermediate 6-b>. (yield 72%)

Synthesis Example 6-(3): Synthesis of <Intermediate 6-c>

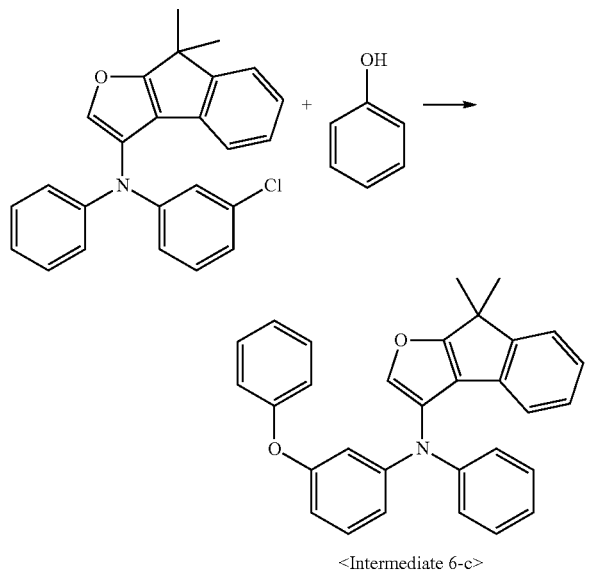

<Intermediate 6-c>

In a reactor, <Intermediate 6-b> (57.9 g, 150 mmol), phenol (31.2 g, 160 mmol), potassium carbonate (45.7 g, 300 mmol), and NMP (250 mL) were stirred together under reflux at 160° C. for 12 hours. After completion of the reaction, the reaction mixture was cooled to room temperature and NMP was removed by distillation at a reduced pressure. Subsequent to extraction, vacuum concentration and column chromatographic separation afforded <Intermediate 6-c>. (43.2 g, yield 65%)

Synthesis Example 6-(4): Synthesis of <Chemical Formula 60>

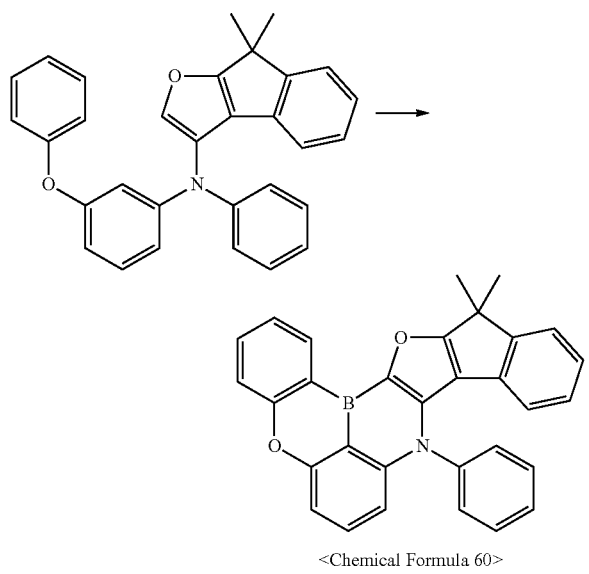

<Chemical Formula 60>

The same procedure as in Synthesis Example 1-7 was carried out, with the exception of using <Intermediate 6-c> instead of <Intermediate 1-f>, to afford <Chemical Formula 60>. (yield 15%)

MS (MALDI-TOF): m/z 451.17 [M$^+$]

Synthesis Example 7: Synthesis of Chemical Formula 84

Synthesis Example 7-(1): Synthesis of <Intermediate 7-a>

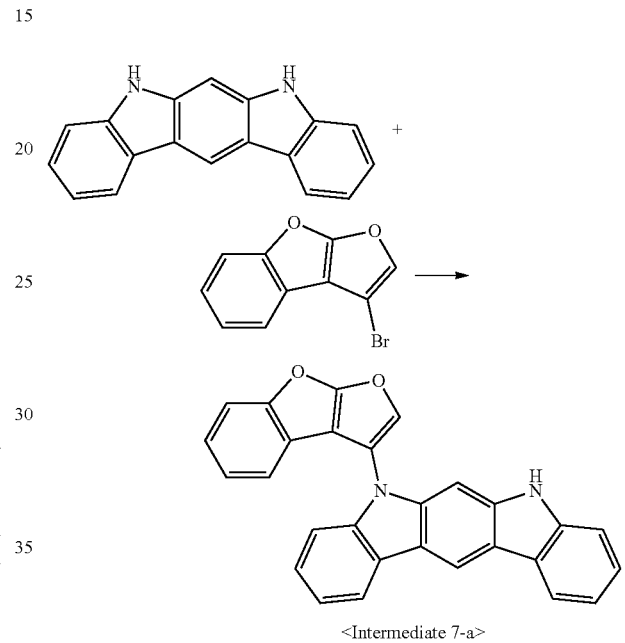

<Intermediate 7-a>

In a reactor, 5,7-dihydroindolo[2,3-b]carbazole (10.8 g, 42 mmol), <Intermediate 1-b> (9.9 g, 42 mmol), copper powder (10.7 g, 1 mmol), 18-crown-6-ether (4.5 g, 17 mmol), potassium carbonate (34.9 g, 253 mmol), and dichlorobenzene (110 mL) were stirred together under reflux at 180° C. for 24 hours. After completion of the reaction, dichlorobenzene was removed and separation by column chromatography afforded <Intermediate 7-a>. (12.5 g, yield 72%)

Synthesis Example 7-(2): Synthesis of <Intermediate 7-b>

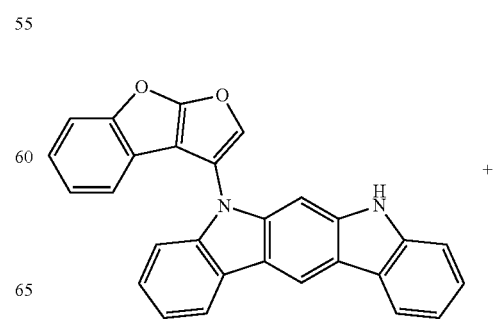

+

-continued

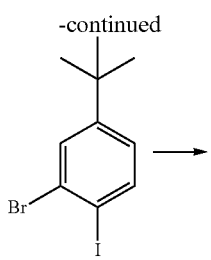

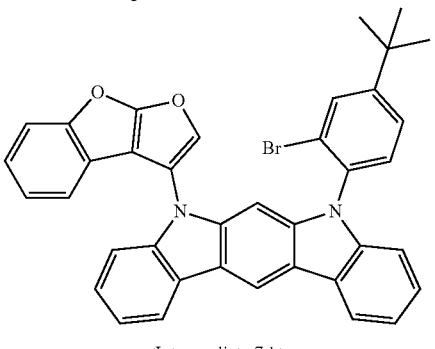

<Intermediate 7-b>

The same procedure as in Synthesis Example 1-4 was carried out, with the exception of using <Intermediate 7-a> and 2-bromo-4-tert-butyl-1-iodobenzene instead of <Intermediate 1-c> and <Intermediate 1-b>, respectively, to afford <Intermediate 7-b>. (yield 67%)

Synthesis Example 7-(3): Synthesis of <Chemical Formula 84>

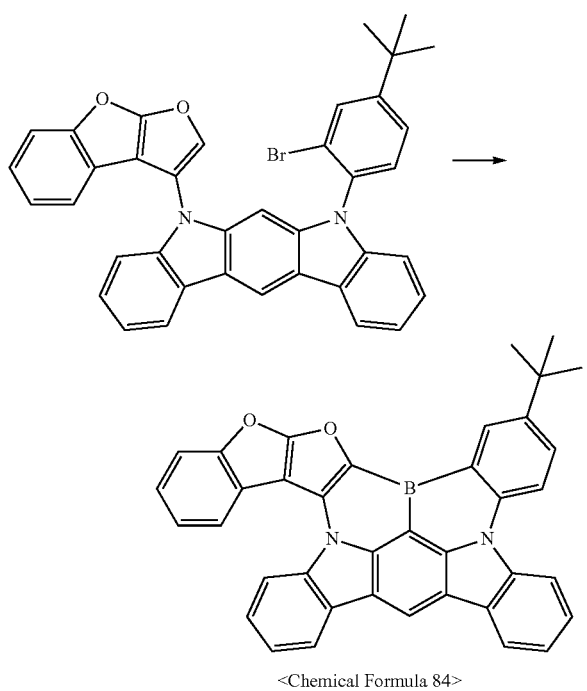

<Chemical Formula 84>

The same procedure as in Synthesis Example 1-7 was carried out, with the exception of using <Intermediate 7-b> instead of <Intermediate 1-f>, to afford <Chemical Formula 84>. (yield 15%)
MS (MALDI-TOF): m/z 552.20 [M⁺]

Synthesis Example 8: Synthesis of Chemical Formula 46

Synthesis Example 8-(1): Synthesis of <Intermediate 8-a>

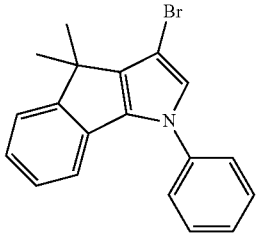

<Intermediate 8-a>

The same procedure as in Synthesis Examples 4-3 to 4-4 was carried out, with the exception of using 4,4-dimethyl-1,4-dihydroindeno[1,2-b]pyrrole instead of <Intermediate 4-b> in Synthesis Example 4-3, to afford <Intermediate 8-a>. (yield 55%)

Synthesis Example 8-(2): Synthesis of <Intermediate 8-b>

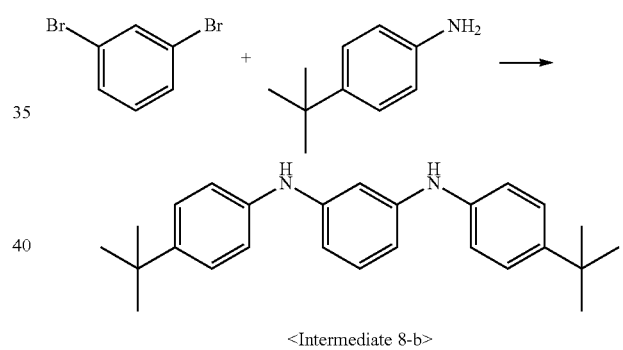

<Intermediate 8-b>

The same procedure as in Synthesis Example 1-3 was carried out, with the exception of using 1,3-dibromobenzene and 4-tert-butylaniline instead of 1-bromo-3-chlorobenzene and aniline, respectively, to afford <Intermediate 8-b>. (yield 77%)

Synthesis Example 8-(3): Synthesis of <Intermediate 8-c>

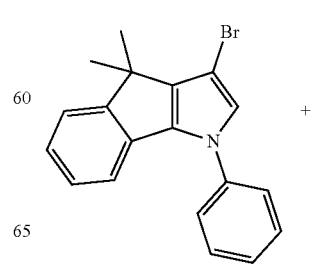

+

-continued

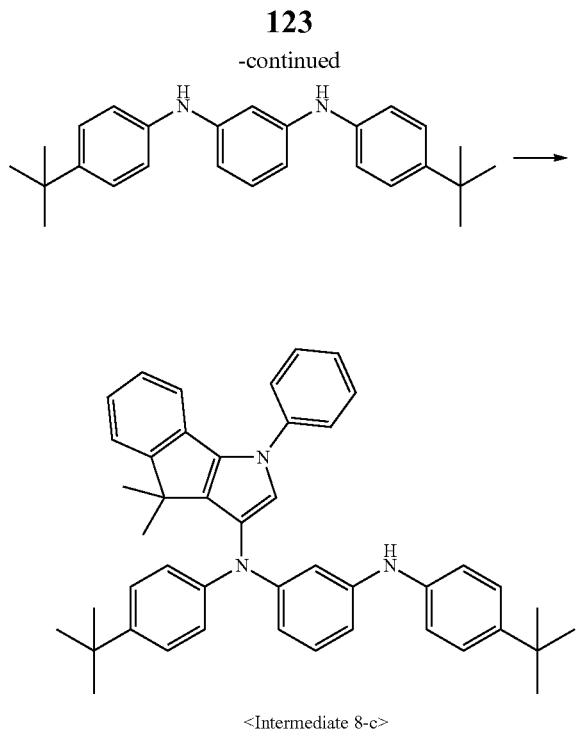

<Intermediate 8-c>

The same procedure as in Synthesis Example 7-1 was carried out, with the exception of using <Intermediate 8-b> and <Intermediate 8-a> instead of 5,7-dihydroindolo[2,3-b]carbazole and <Intermediate 1-b>, respectively, to afford <Intermediate 8-c>. (yield 69%)

Synthesis Example 8-(4): Synthesis of <Intermediate 8-d>

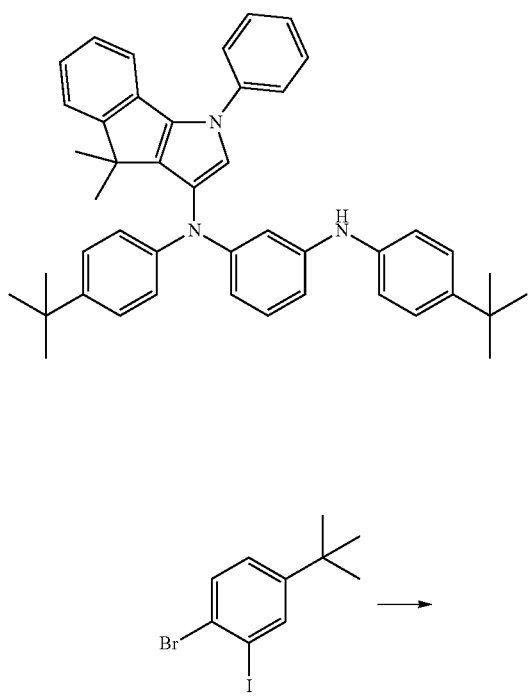

+

-continued

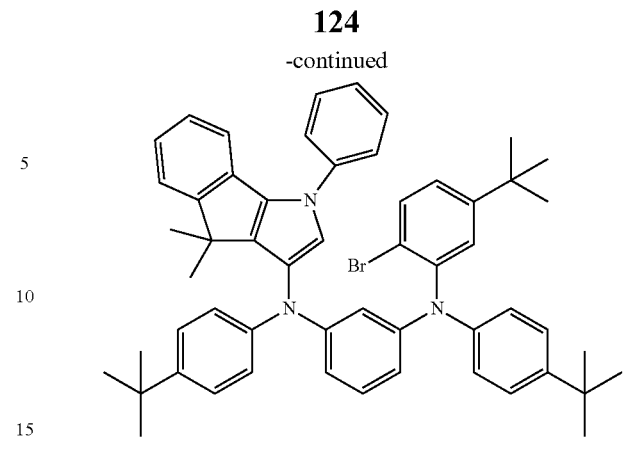

<Intermediate 8-d>

The same procedure as in Synthesis Example 1-4 was carried out, with the exception of using <Intermediate 8-c> and 1-bromo-4-tert-butyl-2-iodobenzene instead of <Intermediate 1-c> and <Intermediate 1-b>, respectively, to afford <Intermediate 8-d>. (yield 72%)

Synthesis Example 8-(5): Synthesis of <Chemical Formula 46>

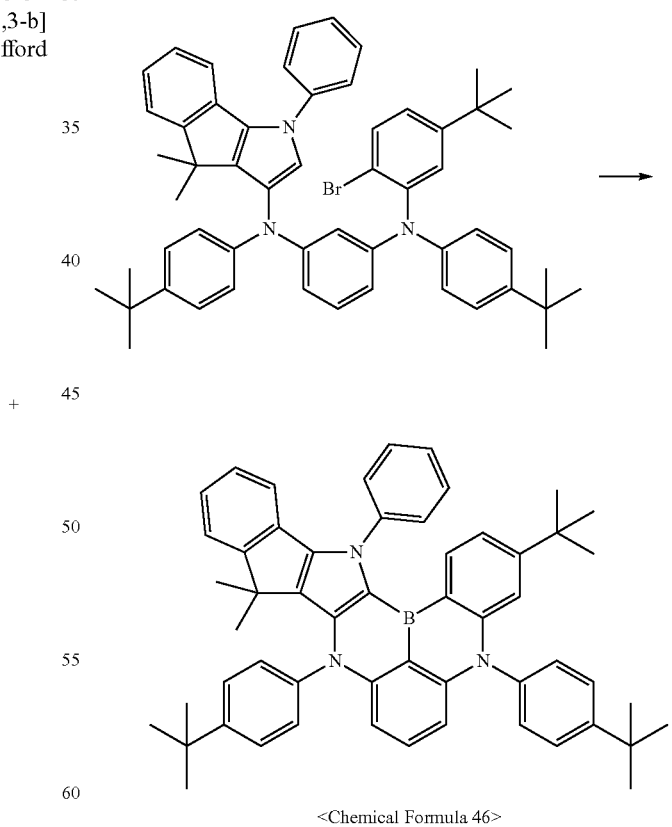

<Chemical Formula 46>

The same procedure as in Synthesis Example 1-7 was carried out, with the exception of using <Intermediate 8-d> instead of <Intermediate 1-f>, to afford <Chemical Formula 46>. (yield 13%)

Synthesis Example 9: Synthesis of Chemical Formula 103

Synthesis Example 9-(1): Synthesis of <Intermediate 9-a>

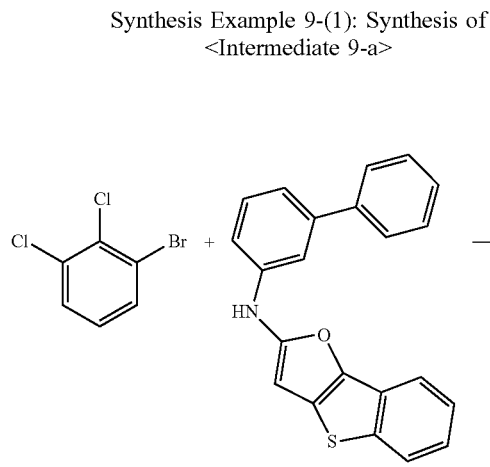

<Intermediate 9-a>

The same procedure as in Synthesis Example 1-4 was carried out, with the exception of using <Intermediate 3-d> and 1-bromo-2,3-dichlorobenzene instead of <Intermediate 1-c> and <Intermediate 1-b>, respectively, to afford <Intermediate 9-a>. (yield 75%)

Synthesis Example 9-(2): <Intermediate 9-b>

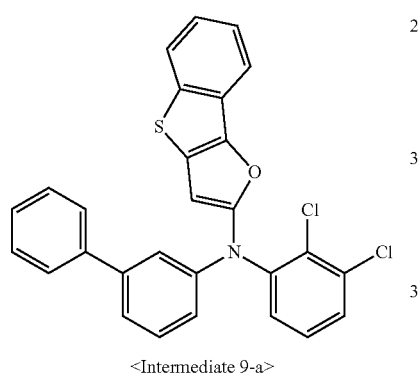

<Intermediate 9-b>

In a reactor, phenylhydrazine (100 g, 0.924 mol) and acetic acid (500 mL) were stirred and then heated to 60° C. Drops of 2-methyl cyclohexanone (103.6 g, 0.924 mol) were slowly added and then stirred under reflux for 8 hours. After completion of the reaction, extraction was carried out with water and ethyl acetate. Concentration and column chromatographic separation afforded <Intermediate 9-b>. (130 g, yield 76%)

Synthesis Example 9-(3): Synthesis of <Intermediate 9-c>

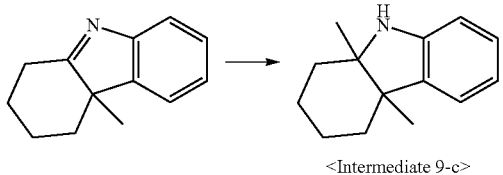

<Intermediate 9-c>

In a reactor, <Intermediate 9-b> (75 g, 405 mmol) was added toluene (750 mL) under a nitrogen atmosphere and cooled to −10° C. Then, 1.6 M methyl lithium (380 mL, 608 mmol) was slowly added, followed by stirring at −10° C. for 3 hours. After completion of the reaction, extraction was conducted with water and ethyl acetate. Concentration of the extract and column chromatographic separation afforded <Intermediate 9-c>. (50.5 g, yield 62%)

Synthesis Example 9-(4): Synthesis of <Intermediate 9-d>

<Intermediate 9-d>

The same procedure as in Synthesis Example 1-4 was carried out, with the exception of using <Intermediate 9-c> and <Intermediate 9-a> instead of <Intermediate 1-c> and <Intermediate 1-b>, respectively, to afford <Intermediate 9-d>. (yield 64%)

Synthesis Example 9-(5): Synthesis of <Chemical Formula 103>

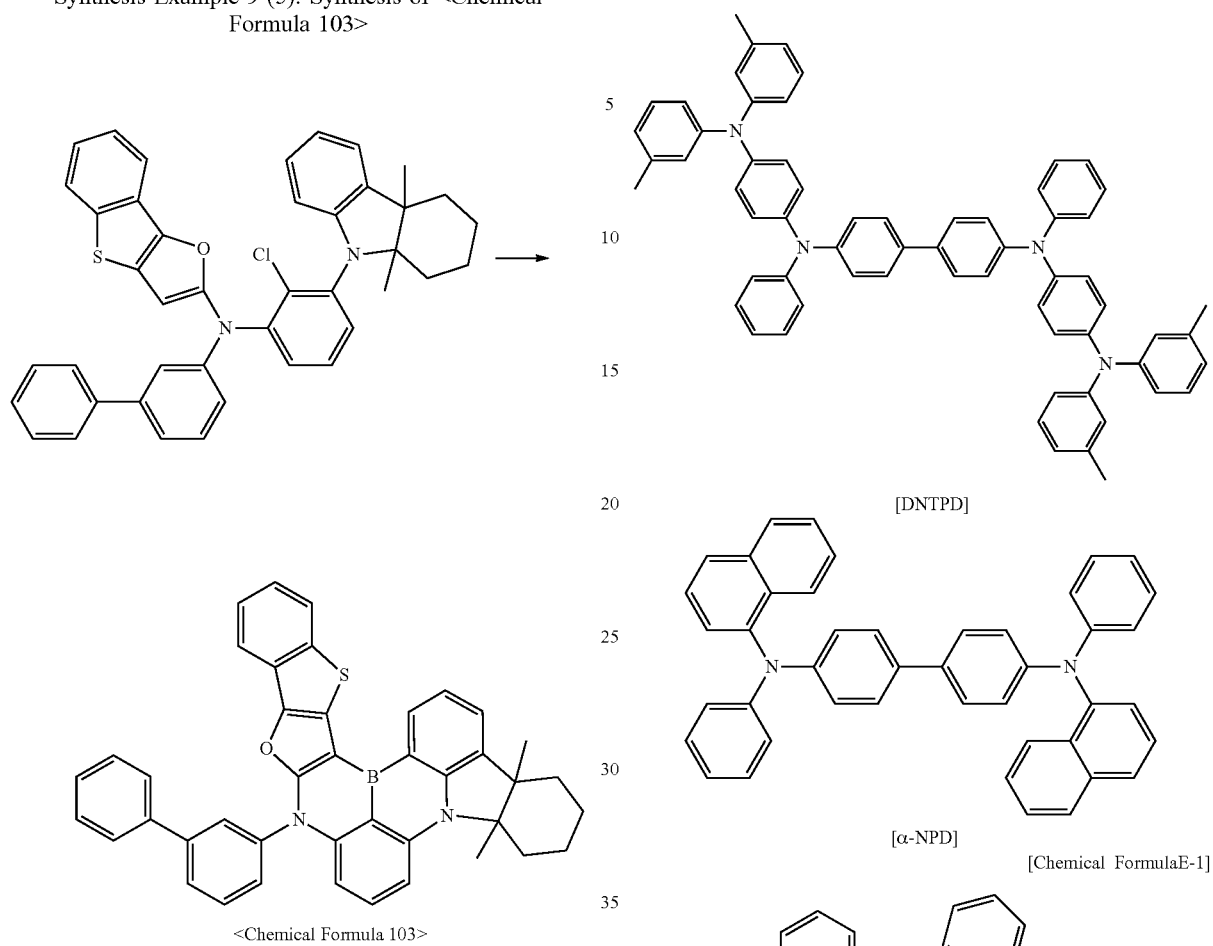

<Chemical Formula 103>

The same procedure as in Synthesis Example 1-7 was carried out, with the exception of using <Intermediate 9-d> instead of <Intermediate 1-f>, to afford <Chemical Formula 103>. (yield 15%)

MS (MALDI-TOF): m/z 624.24 [M$^+$]

Examples 1-18: Fabrication of Organic Light Emitting Diodes

An ITO glass substrate was patterned to have a translucent area of 2 mm×2 mm and cleansed. After the ITO glass was mounted in a vacuum chamber, films were sequentially formed of DNTPD (700 Å) and α-NPD (300 Å) in the order on the ITO glass substrate. A light-emitting layer (250 Å) was formed of a combination of host and dopant compounds (97:3) listed in Table 1, below. Subsequently, [Chemical Formula E-1] (300 Å) was deposited to form an electron transport layer (300 Å), on which an electron injection layer of Liq (10 Å) was formed and then covered with an Al layer (1000 Å) as a cathode to fabricate an organic light-emitting diode. The organic light-emitting diodes thus obtained were measured at 10 mA/cm$^2$ for luminescence properties:

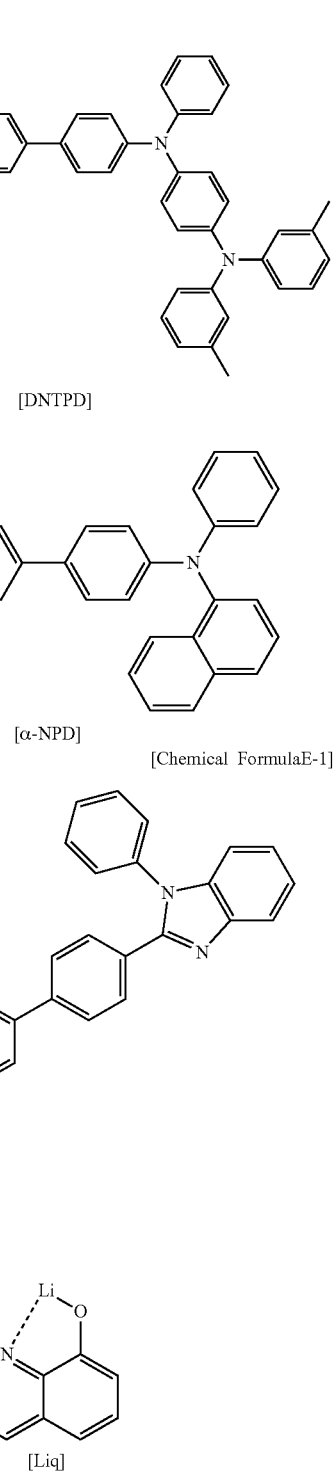

[DNTPD]

[α-NPD]

[Chemical FormulaE-1]

[Liq]

Comparative Examples 1 to 6

Organic light emitting diodes were fabricated in the same manner as in the Examples 1 to 18, with the exception that

[BD1] to [BD3] were used instead of the dopant compounds in Examples 1 to 18. The luminescence of the organic light-emitting diodes thus obtained was measured at 10 mA/cm². Structures of [BD1]-[BD3] are as follows:

[BD1] [BD2] [BD 3]

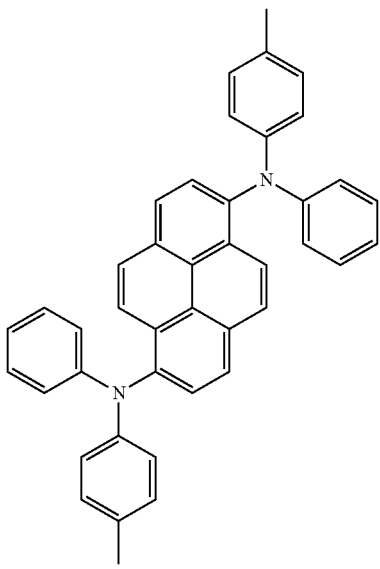

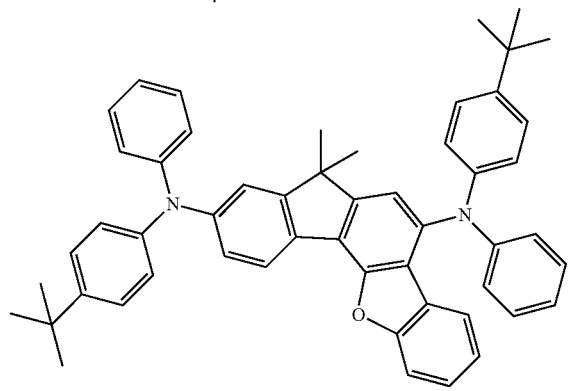

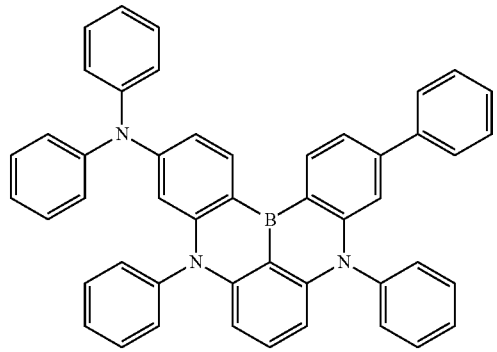

TABLE 1

| | Host | Dopant | EQE | T97 (h) |
|---|---|---|---|---|
| Ex. 1 | Compound 129 | Chemical Formula 4 | 9.05 | 127 |
| Ex. 2 | Compound 244 | Chemical Formula 4 | 9.22 | 136 |
| Ex. 3 | Compound 129 | Chemical Formula 8 | 9.18 | 145 |
| Ex. 4 | Compound 244 | Chemical Formula 8 | 9.27 | 139 |
| Ex. 5 | Compound 129 | Chemical Formula 13 | 9.34 | 154 |

TABLE 1-continued

| | Host | Dopant | EQE | T97 (h) |
|---|---|---|---|---|
| Ex. 6 | Compound 244 | Chemical Formula 13 | 9.65 | 161 |
| Ex. 7 | Compound 129 | Chemical Formula 23 | 9.22 | 169 |
| Ex. 8 | Compound 244 | Chemical Formula 23 | 9.46 | 133 |
| Ex. 9 | Compound 129 | Chemical Formula 31 | 9.38 | 145 |
| Ex. 10 | Compound 244 | Chemical Formula 31 | 9.65 | 158 |
| Ex. 11 | Compound 129 | Chemical Formula 60 | 9.42 | 144 |
| Ex. 12 | Compound 244 | Chemical Formula 60 | 9.59 | 173 |
| Ex. 13 | Compound 129 | Chemical Formula 84 | 9.37 | 166 |
| Ex. 14 | Compound 244 | Chemical Formula 84 | 9.53 | 173 |
| Ex. 15 | Compound 129 | Chemical Formula 46 | 9.68 | 159 |
| Ex. 16 | Compound 244 | Chemical Formula 46 | 9.87 | 175 |
| Ex. 17 | Compound 129 | Chemical Formula 103 | 9.15 | 130 |
| Ex. 18 | Compound 244 | Chemical Formula 103 | 9.32 | 141 |
| C. Ex. 1 | Compound 129 | BD 1 | 5.68 | 81 |
| C. Ex. 2 | Compound 244 | BD 1 | 5.97 | 87 |
| C. Ex. 3 | Compound 129 | BD 2 | 7.16 | 88 |
| C. Ex. 4 | Compound 244 | BD 2 | 7.25 | 92 |
| C. Ex. 5 | Compound 129 | BD 3 | 7.36 | 90 |
| C. Ex. 6 | Compound 244 | BD 3 | 7.51 | 94 |

As is understood from data of Table 1, the organic light-emitting diodes according to the present disclosure exhibited excellent luminous efficiency and a long lifespan, compared to the conventional techniques using the compounds of the Comparative Examples 1 to 6, and are expected to have high applicability.

INDUSTRIAL APPLICABILITY

Exhibiting longer lifespan and higher efficiency compared to conventional materials, the novel boron compounds according to the present disclosure, when used as a dopant in an organic light-emitting diode, gives a guarantee of improved properties to the organic light-emitting diode and can find advantageous applications in the related industrial fields.

The invention claimed is:

1. A boron compound represented by any one of the following Chemical Formulas A to D:

[Chemical Formula A]

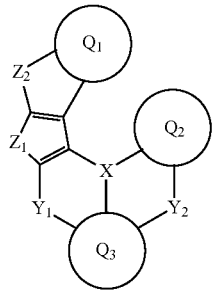

[Chemical Formula B]

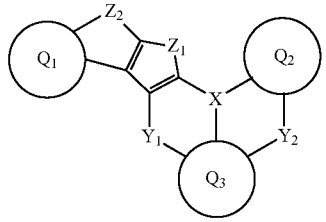

-continued

[Chemical Formula C]

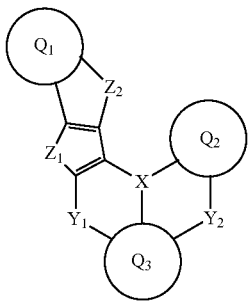

[Chemical Formula D]

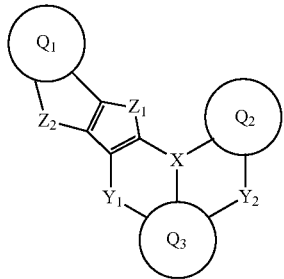

wherein, $Q_1$ to $Q_3$, which are same or different, are each independently a substituted or unsubstituted aromatic hydrocarbon ring of 6 to 50 carbon atoms or a substituted or unsubstituted heteroaromatic ring of 2 to 50 carbon atoms;

X is any one selected from B, P, and P=O;

$Y_1$ and $Y_2$, which are same or different, are each independently any one selected from N-$R_1$, $CR_2R_3$, O, S, and $SiR_4R_5$; and $Z_1$ and $Z_2$, which may be same or different, are each independently any one selected from N-$R_6$, $CR_7R_8$, O, S, and $SiR_9R_{10}$, wherein the substituents $R_1$ to $R_{10}$, which may be same or different, are each independently any one selected from a hydrogen atom, a deuterium atom, a substituted or unsubstituted alkyl of 1 to 30, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, and a halogen, a bond can be formed between $R_2$ and $R_3$, between $R_4$ and $R_5$, between $R_7$ and $R_8$, or between $R_9$ and $R_{10}$ to form an additional mono- or polycyclic aliphatic or aromatic ring, any of the substituents $R_1$ to $R_5$ for $Y_1$ can bond to the $Q_3$ ring to form an additional mono- or polycyclic aliphatic or aromatic ring, any of the substituents $R_1$ to $R_5$ for $Y_2$ can bond to the $Q_2$ or $Q_3$ ring to form an additional mono- or polycyclic aliphatic or aromatic ring, any of the substituents $R_6$ to $R_{10}$ for $Z_2$ can bond to the $Q_1$ ring to form an additional mono- or polycyclic aliphatic or aromatic ring, any of the substituents $R_6$ to $R_{10}$ for $Z_1$ in Chemical Formula A can bond to $Z_2$ or $Y_1$ to form an additional mono- or polycyclic aliphatic or aromatic ring, any of the substituents $R_6$ to $R_{10}$ for $Z_1$ in Chemical Formula B can bond to $Z_2$ to form an additional mono- or polycyclic aliphatic or polycyclic ring, any of the substituents $R_6$ to $R_{10}$ for $Z_1$ in Chemical Formula C can bond to $Y_1$ to form an additional mono- or polycyclic aliphatic or polycyclic ring, any of the substituents $R_6$ to $R_{10}$ for $Z_1$ in Chemical Formula D can bond to $Q_1$ to form an additional mono- or polycyclic aliphatic or polycyclic ring, wherein the term "substituted" in the expression "substituted or unsubstituted" used for compounds of Chemical Formulas A to D means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a cycloalkyl of 3 to 24 carbon atoms, a heteroalkyl of 1 to 24 carbon atoms, an aryl of 6 to 24 carbon atoms, an arylalkyl of 7 to 24 carbon atoms, an alkylaryl of 7 to 24 carbon atoms, a heteroaryl of 2 to 50 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

2. The boron compound of claim 1, wherein at least one of the linkers $Y_1$ and $Y_2$ in Chemical Formulas A to D is N-$R_1$, wherein $R_1$ is as defined in claim 1.

3. The boron compound of claim 2, wherein $R_1$ is a substituted or unsubstituted aryl of 6 to 50 carbon atoms or a substituted or unsubstituted heteroaryl of 2 to 50 carbon atoms.

4. The boron compound of claim 2, wherein $Y_1$ and $Y_2$ in Chemical Formulas A to D, which are same or different, are each a linker represented by the following Structural Formula A:

[Structural Formula A]

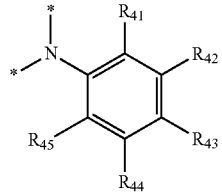

wherein

"-*" denotes a bonding site at which the N atom is bonded to the carbon atom connected to $Z_1$, the carbon atom connected to $Y_1$ in the 5-membered ring bearing $Z_1$, an aromatic carbon atom in the $Q_2$ ring moiety, or an aromatic carbon atom in the $Q_3$ ring moiety; and $R_{41}$ to $R_{45}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a nitro, a cyano, and a halogen, and $R_{41}$ and $R_{45}$ can each independently be bonded to the $Q_2$ or $Q_3$ ring moiety to form an additional aliphatic or aromatic mono- or polycyclic ring.

5. The boron compound of claim 2, wherein the linkers $Y_1$ and $Y_2$ in Chemical Formulas A to D, which are same or different, are each independently be N-$R_1$ wherein $R_1$ is as defined in claim 1.

6. The boron compound of claim 1, wherein at least one of the linkers $Y_1$ and $Y_2$ in Chemical Formulas A to D is an oxygen atom (O).

7. The boron compound of claim 1, wherein X in Chemical Formulas A to D is a boron (B) atom.

8. The boron compound of claim 1, wherein the aromatic hydrocarbon rings of $Q_1$ to $Q_3$, which are same or different, are each independently a substituted or unsubstituted aromatic hydrocarbon ring of 6 to 50 carbon atoms.

9. The boron compound of claim 8, wherein the aromatic hydrocarbon rings of $Q_1$ and $Q_2$ in Chemical Formulas A to D are each independently any one selected from [Structural Formula 10] to [Structural Formula 21], below:

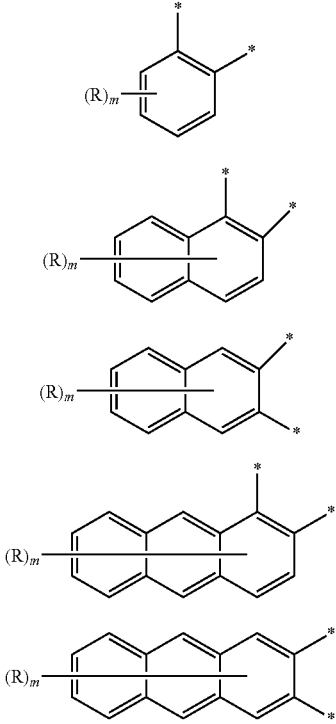

[Structural Formula 10]

[Structural Formula 11]

[Structural Formula 12]

[Structural Formula 13]

[Structural Formula 14]

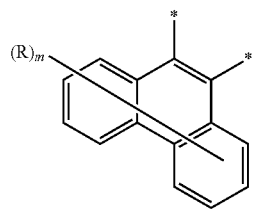

[Structural Formula 15]

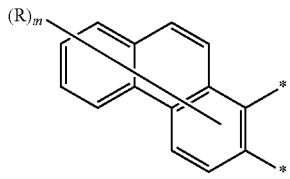

[Structural Formula 16]

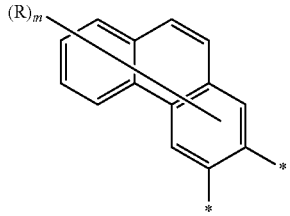

[Structural Formula 17]

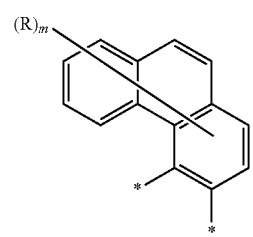

[Structural Formula 18]

[Structural Formula 19]

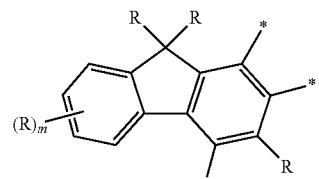

[Structural Formula 20]

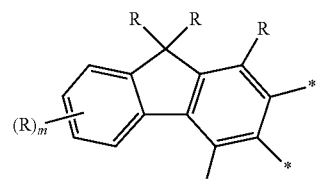

[Structural Formula 21]

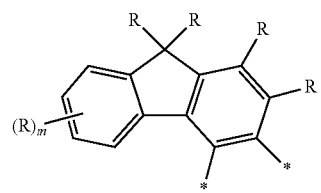

wherein,

"-*" denotes a bonding site at which the carbon ring member of $Q_1$ is bonded to $Z_2$ or a carbon member of the 5-membered ring bearing $Z_2$ or at which the carbon ring member of $Q_2$ is bonded to X or $Y_2$;

R's, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a diarylamino of 12 to 24 carbon atoms, a substituted or unsubstituted diheteroarylamino of 2 to 24 carbon atoms, a substituted or unsubstituted aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a cyano, and a halogen; and m is an integer of 1 to 8 wherein when m is 2 or greater or when two or more R's exist, the individual R's are same or different.

10. The boron compound of claim 8, wherein the aromatic hydrocarbon ring of $Q_3$ in Chemical Formulas A to D is a ring represented by the following Structural Formula B:

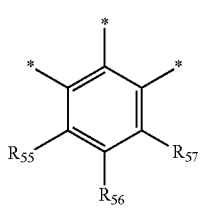

[Structural Formula B]

wherein,

"-*" denotes a bonding site at which the corresponding aromatic carbon ring members of $Q_3$ are bonded to $Y_1$, X, and $Y_2$, respectively; and $R_{55}$ to $R_{57}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted diarylamino of 12 to 24 carbon atoms, a substituted or unsubstituted diheteroarylamino of 2 to 24 carbon atoms, a substituted or unsubstituted aryl(heteroaryl)amino of 7 to 24 carbon atoms, a substituted or unsubstituted alkylsilyl of 1 to 30 carbon atoms, a substituted or unsubstituted arylsilyl of 5 to 30 carbon atoms, a cyano, and a halogen, and $R_{55}$ to $R_{57}$ are each linked to an adjacent substituent to form an additional aliphatic or aromatic mono- or polycyclic ring.

11. The boron compound of claim 1, wherein the aromatic hydrocarbon ring of 6 to 50 carbon atoms or the heteroaromatic ring of 2 to 50 carbon atoms of at least one of the $Q_1$ to $Q_3$ ring moieties in Chemical Formulas A to D may be bonded to an aryl amino radical represented by the following Structural Formula F:

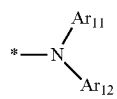

[Structural Formula F]

wherein,

"-*" denotes a bonding site participating in forming a bond to a carbon aromatic ring member of any one of $Q_1$ to $Q_3$, and $Ar_{11}$ and $Ar_{12}$, which are same or different, are each independently a substituted or unsubstituted aryl of 6 to 18 carbon atoms, and can be linked to each other to form a ring.

12. The boron compound of claim 1, wherein the boron compound is any one selected from to [Chemical Formula 1] to [Chemical Formula 112]:

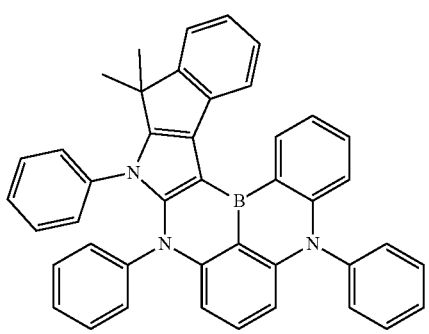

[Chemical Formula 1]

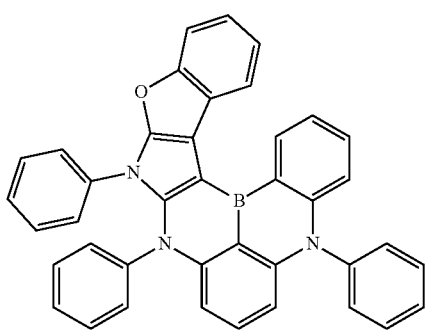

[Chemical Formula 2]

137
-continued
[Chemical Formula 3]
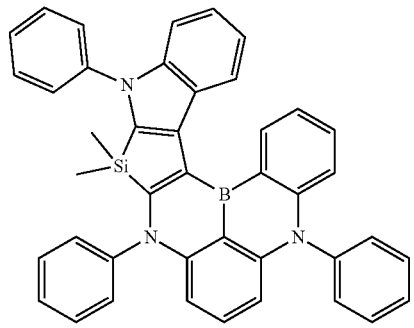
[Chemical Formula 4]
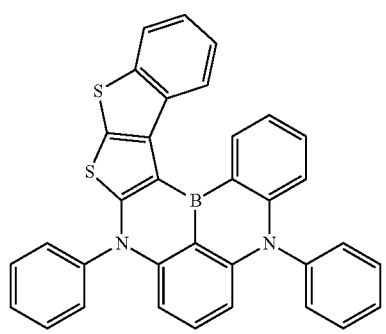
[Chemical Formula 5]
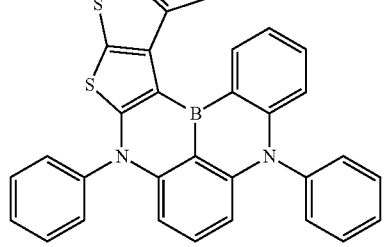
[Chemical Formula 6]
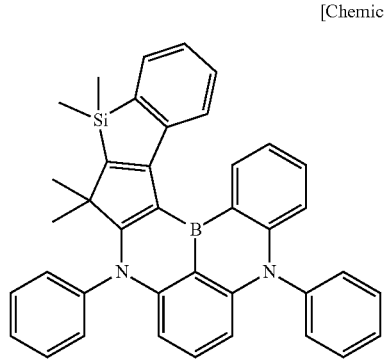
138
-continued
[Chemical Formula 7]
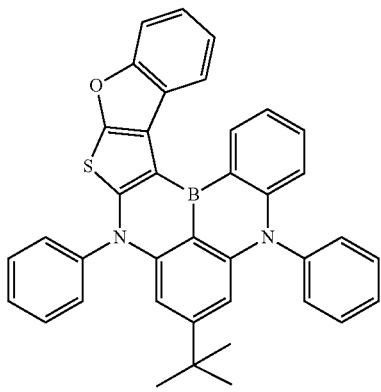
[Chemical Formula 8]
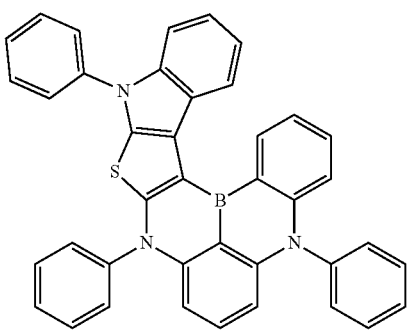
[Chemical Formula 9]
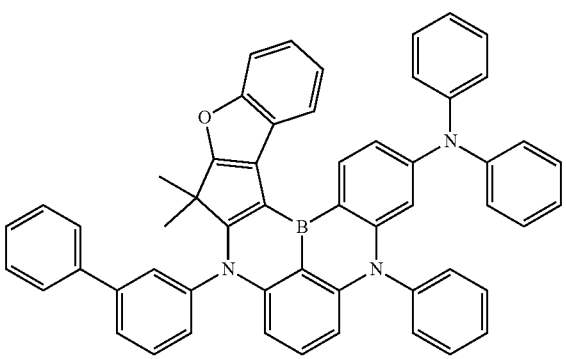
[Chemical Formula 10]
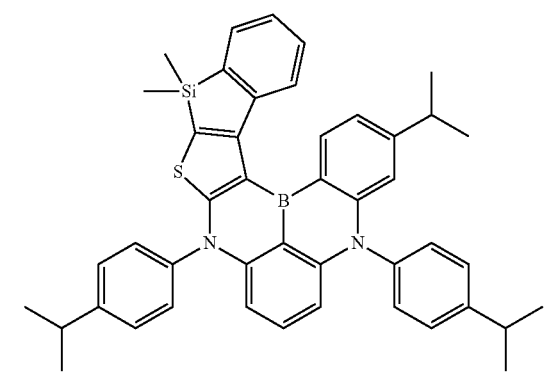

-continued
[Chemical Formula 11]
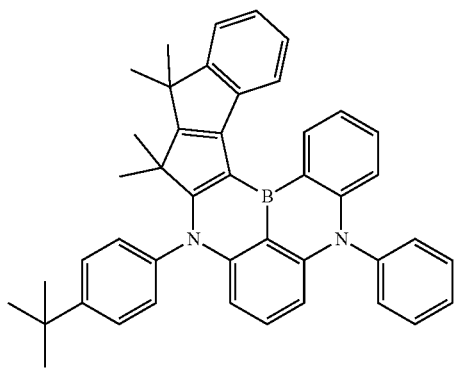
[Chemical Formula 12]
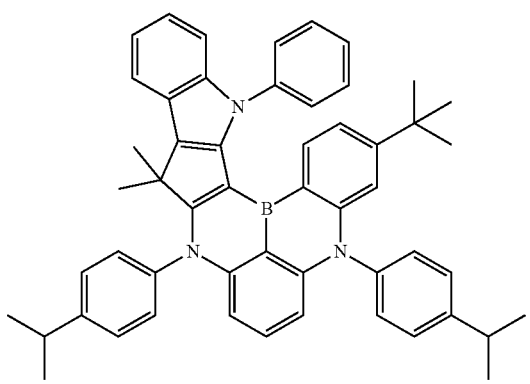
[Chemical Formula 13]
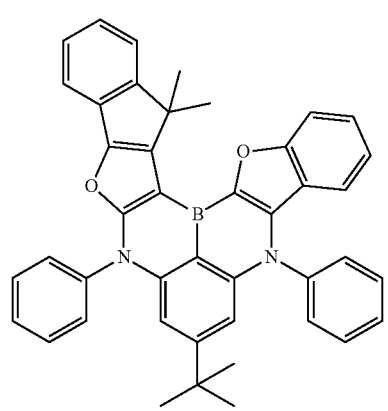
[Chemical Formula 14]
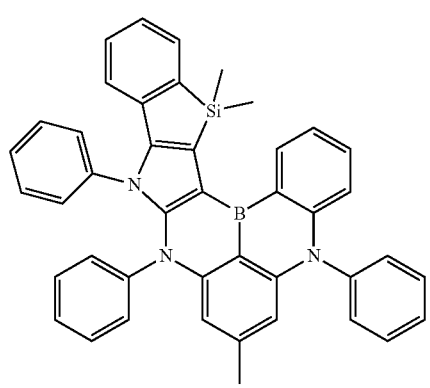
-continued
[Chemical Formula 15]
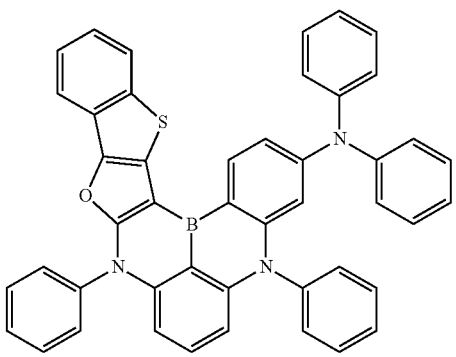
[Chemical Formula 16]
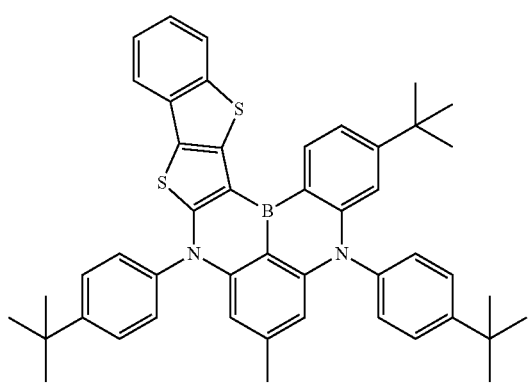
[Chemical Formula 17]
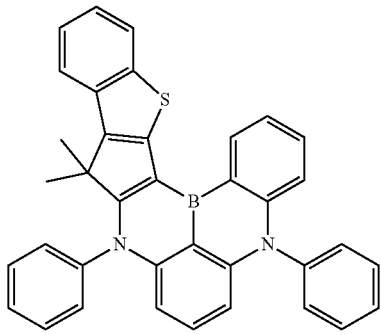
[Chemical Formula 18]
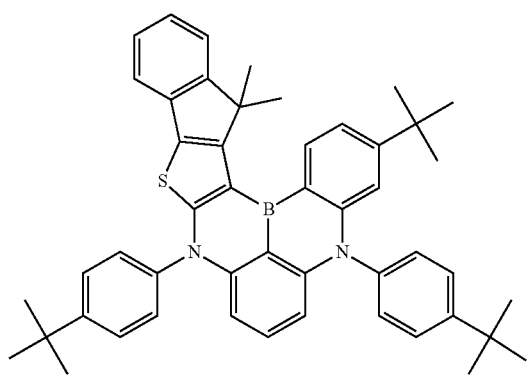

[Chemical Formula 19]
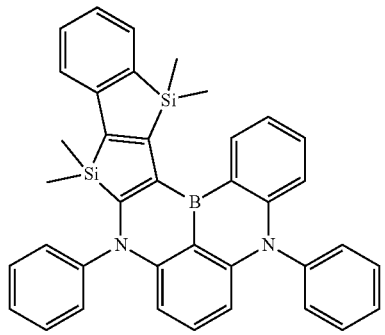
[Chemical Formula 20]
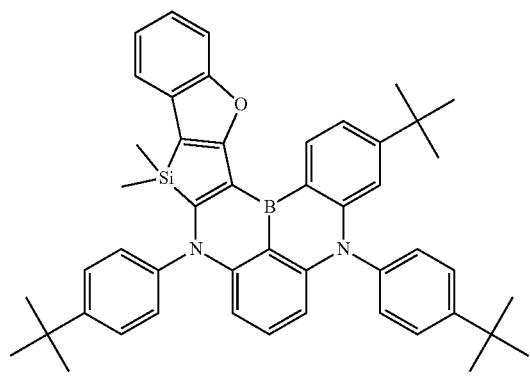
[Chemical Formula 21]
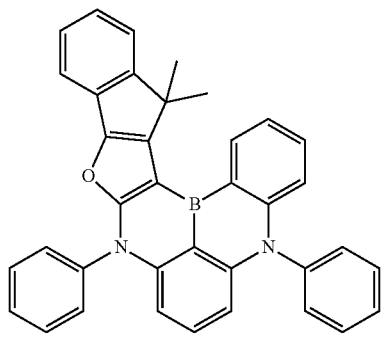
[Chemical Formula 22]
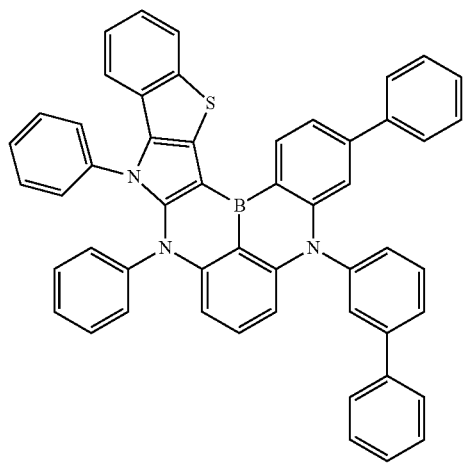
[Chemical Formula 23]
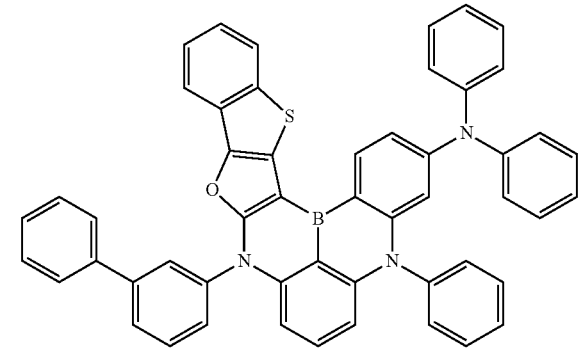
[Chemical Formula 24]
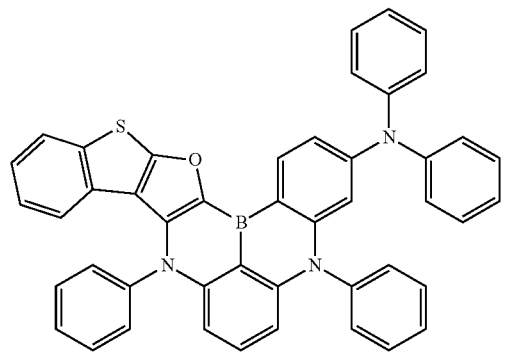
[Chemical Formula 25]
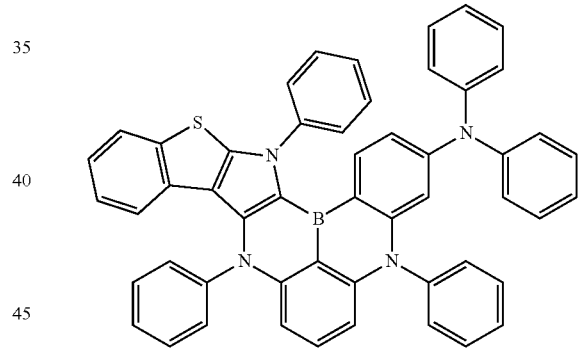
[Chemical Formula 26]
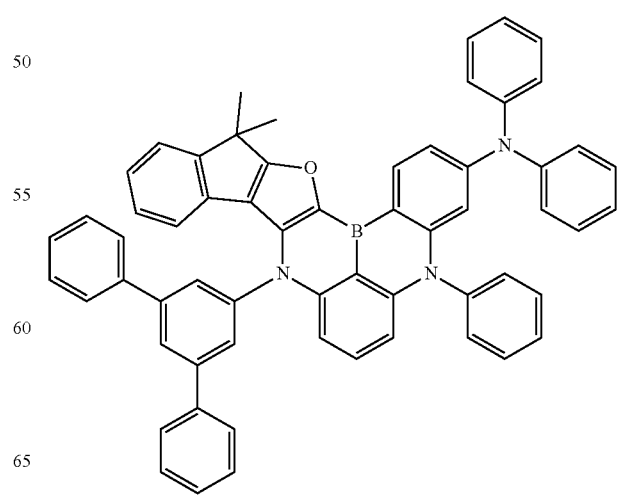

[Chemical Formula 27]
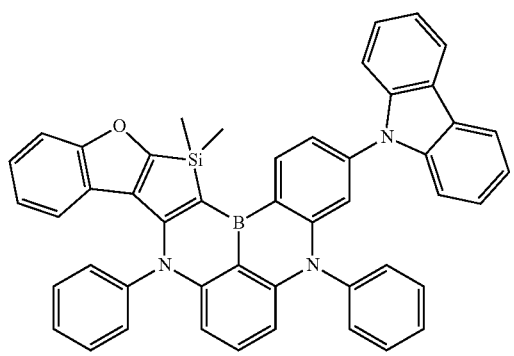
[Chemical Formula 28]
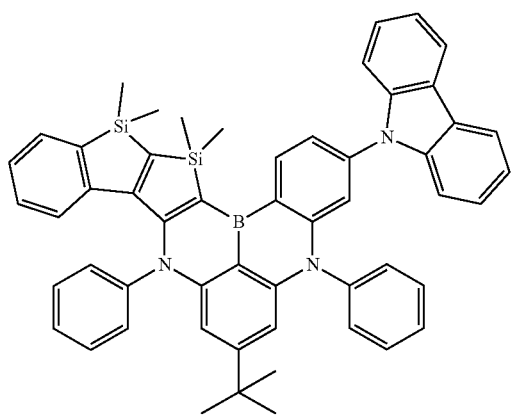
[Chemical Formula 29]
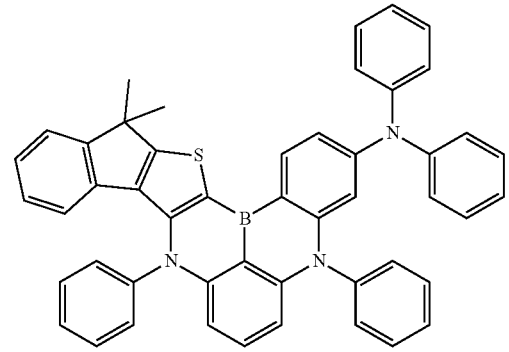
[Chemical Formula 30]
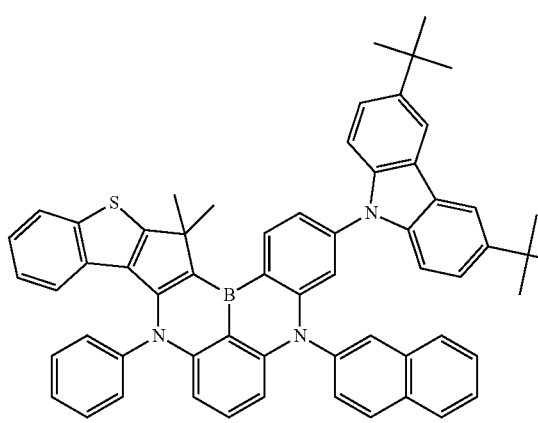
[Chemical Formula 31]
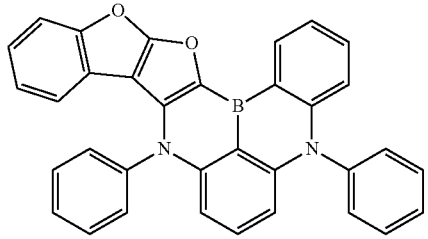
[Chemical Formula 32]
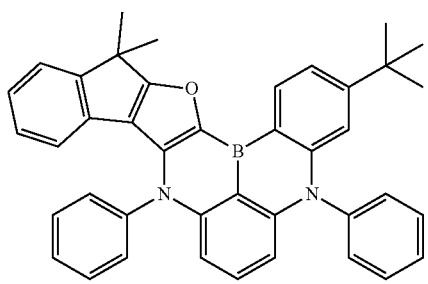
[Chemical Formula 33]
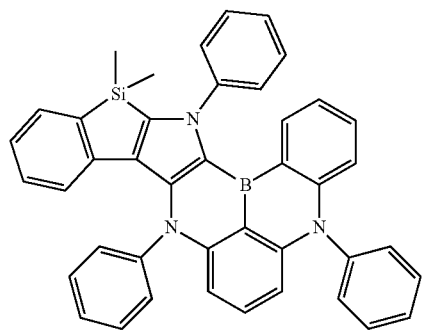
[Chemical Formula 34]
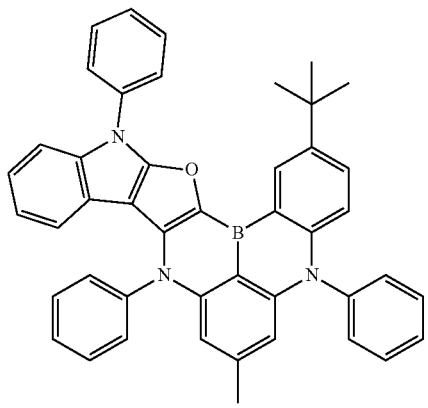

[Chemical Formula 35]
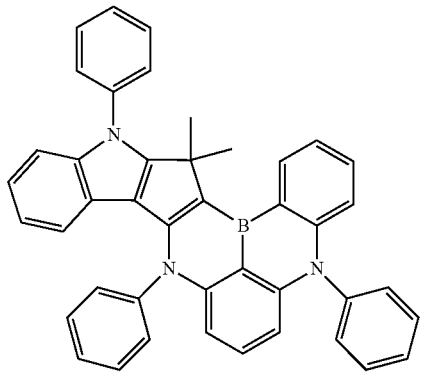
[Chemical Formula 36]
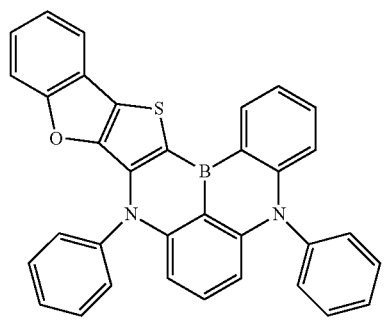
[Chemical Formula 37]
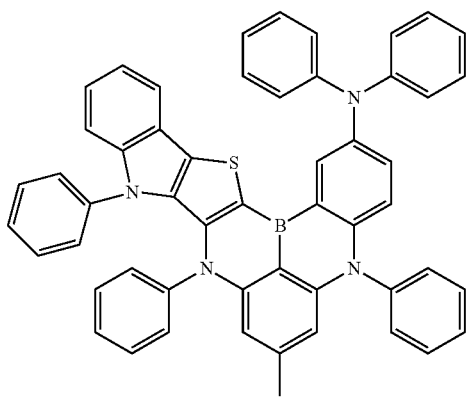
[Chemical Formula 38]
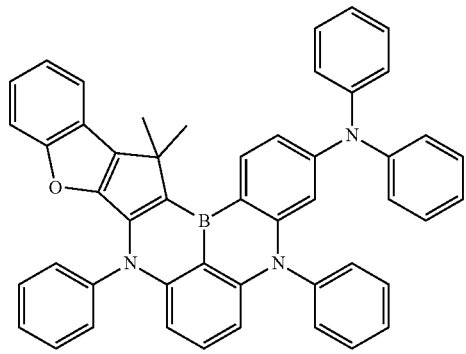
[Chemical Formula 39]
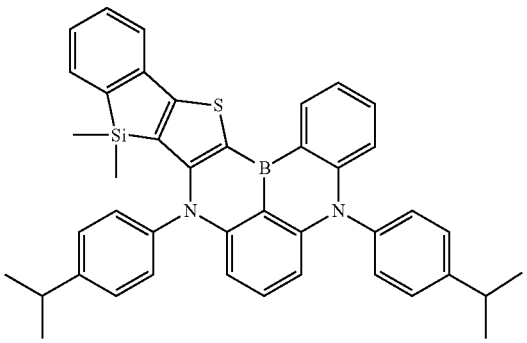
[Chemical Formula 40]
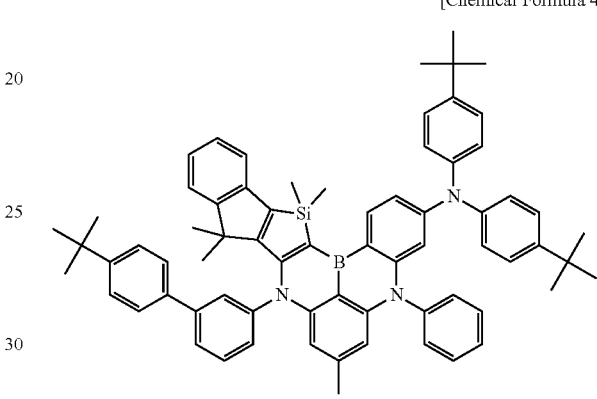
[Chemical Formula 41]
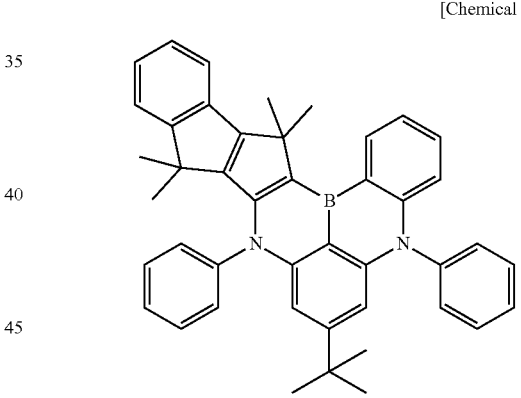
[Chemical Formula 42]
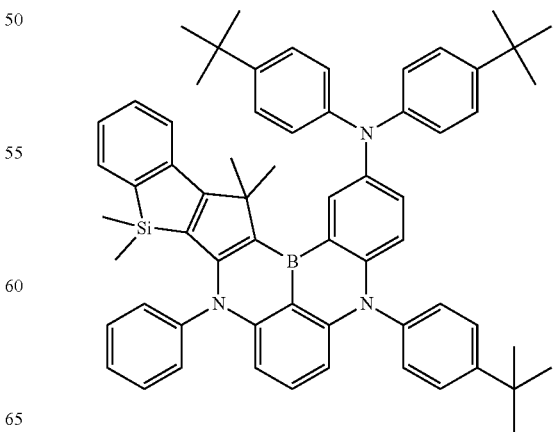

-continued
[Chemical Formula 43]
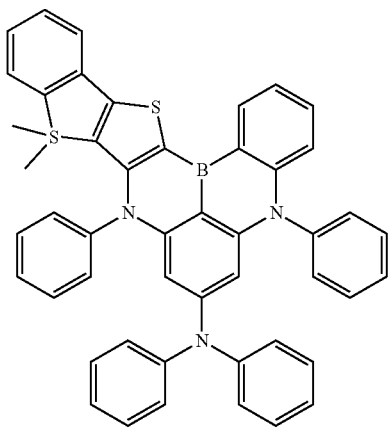
[Chemical Formula 44]
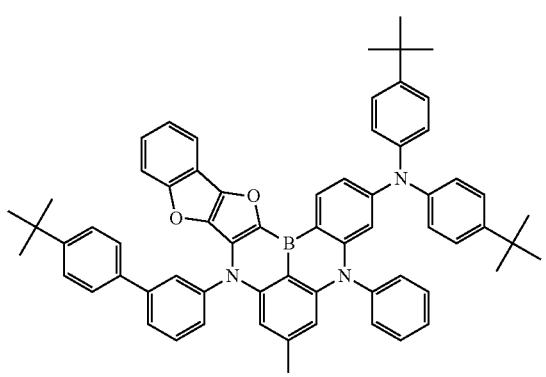
[Chemical Formula 45]
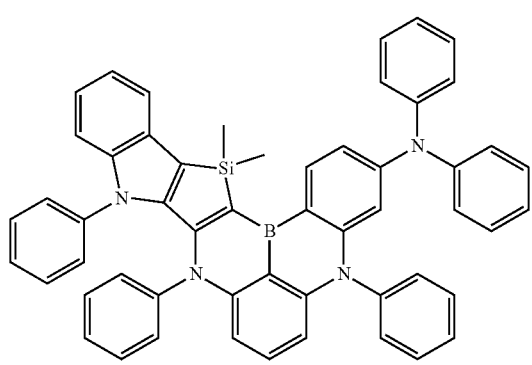
-continued
[Chemical Formula 46]
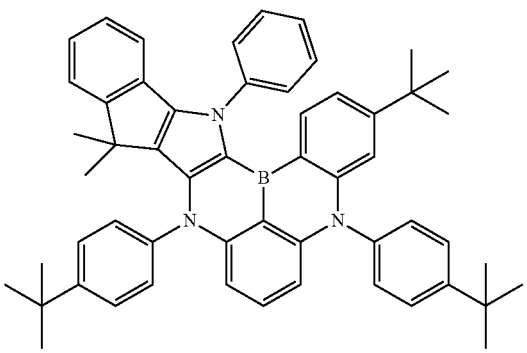
[Chemical Formula 47]
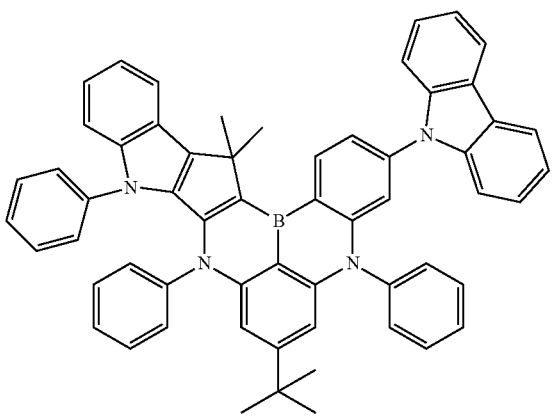
[Chemical Formula 48]
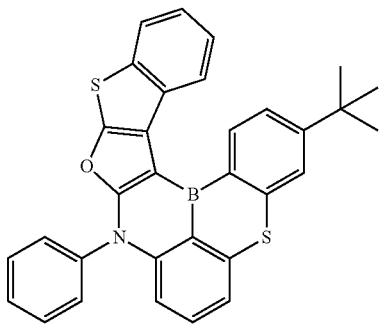
[Chemical Formula 49]
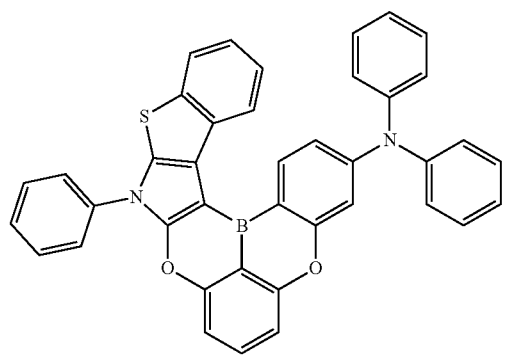

[Chemical Formula 50]
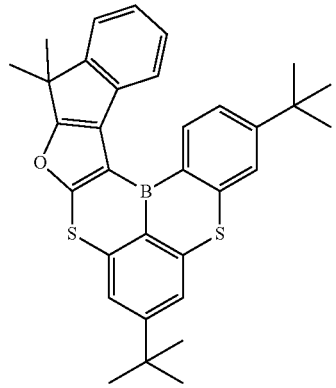
[Chemical Formula 51]
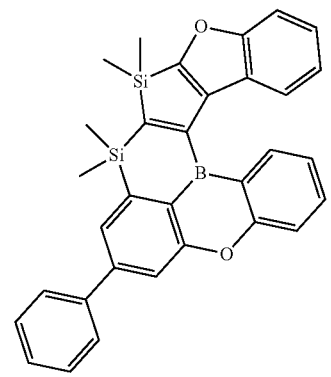
[Chemical Formula 52]
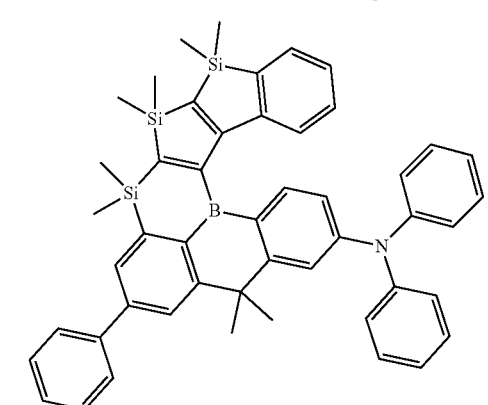
[Chemical Formula 53]
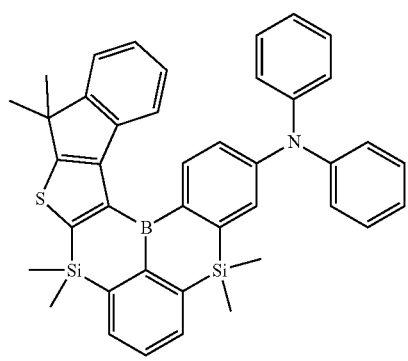
[Chemical Formula 54]
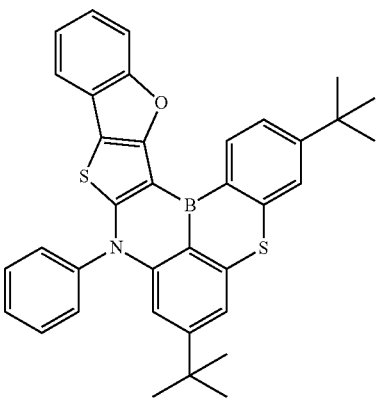
[Chemical Formula 55]
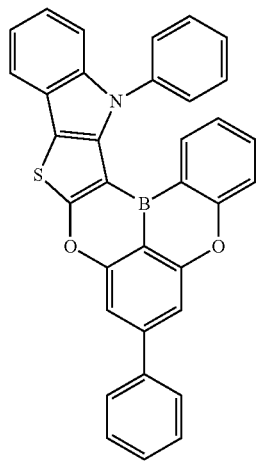
[Chemical Formula 56]
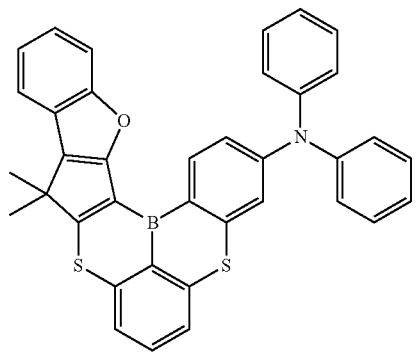

[Chemical Formula 57]
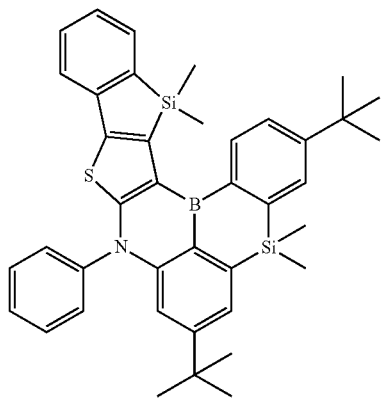
[Chemical Formula 58]
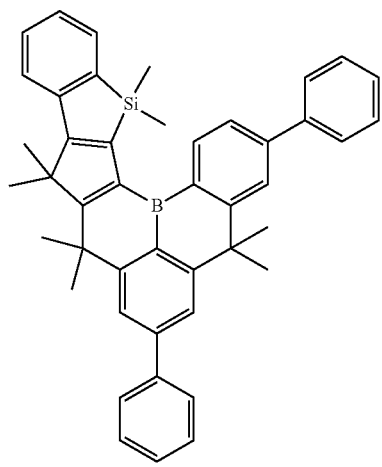
[Chemical Formula 59]
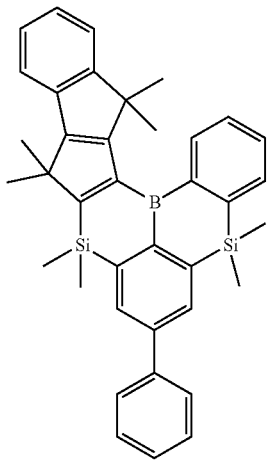
[Chemical Formula 60]
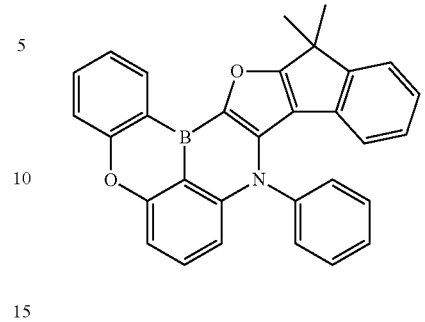
[Chemical Formula 61]
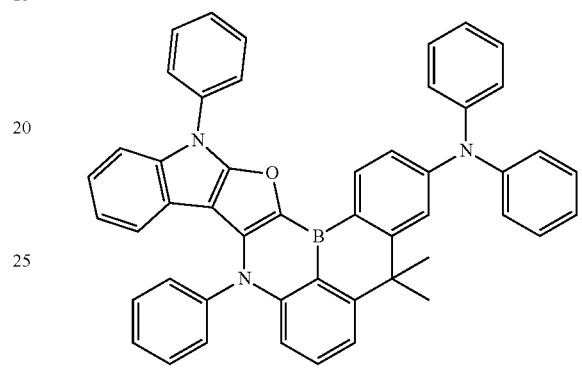
[Chemical Formula 62]
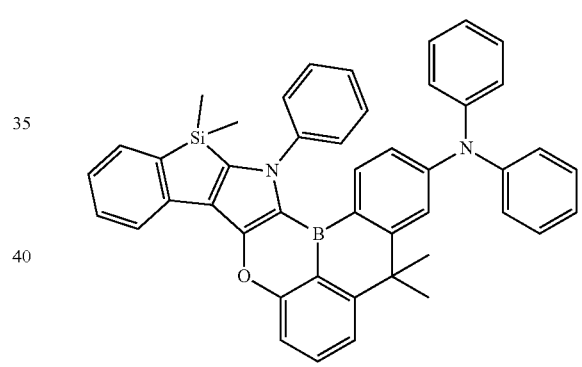
[Chemical Formula 63]
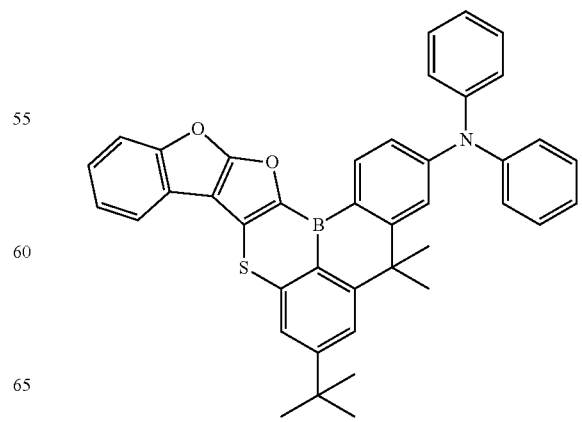

[Chemical Formula 64]
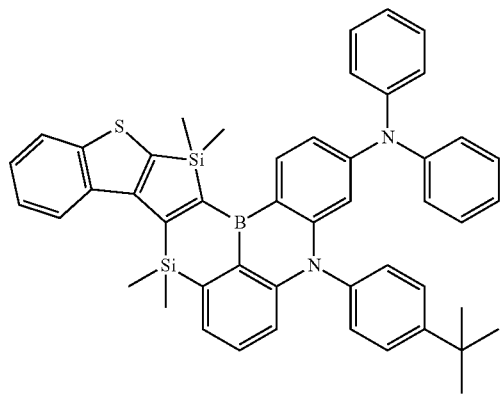
[Chemical Formula 65]
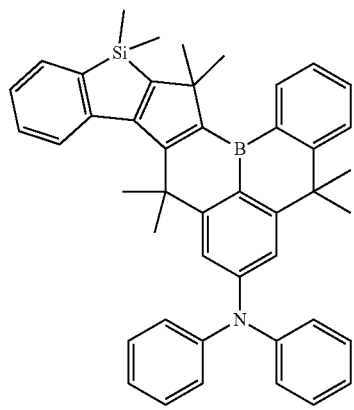
[Chemical Formula 66]
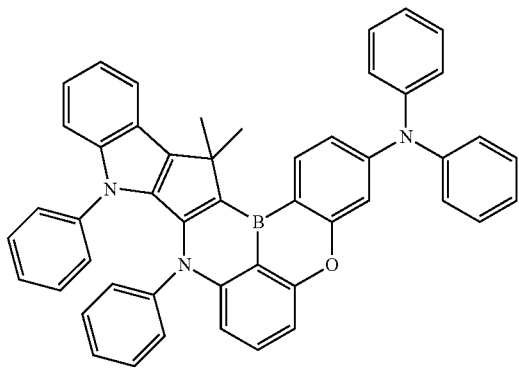
[Chemical Formula 67]
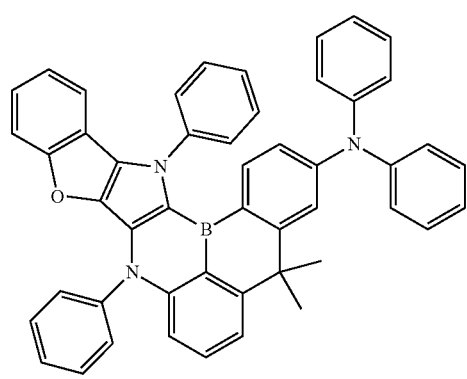
[Chemical Formula 68]
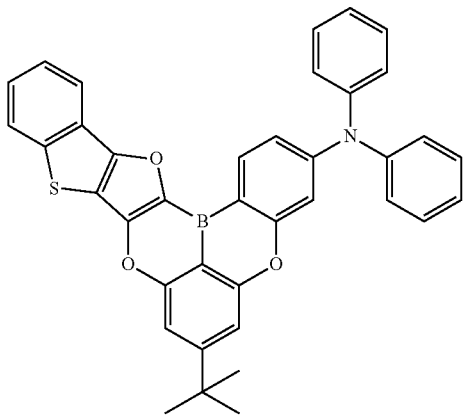
[Chemical Formula 69]
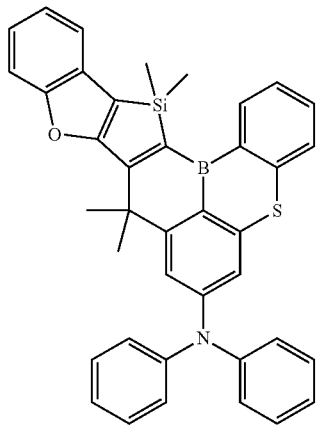
[Chemical Formula 70]
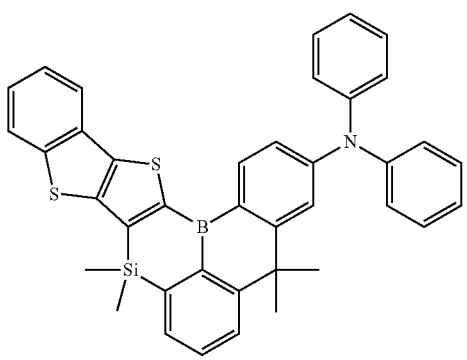

[Chemical Formula 71]
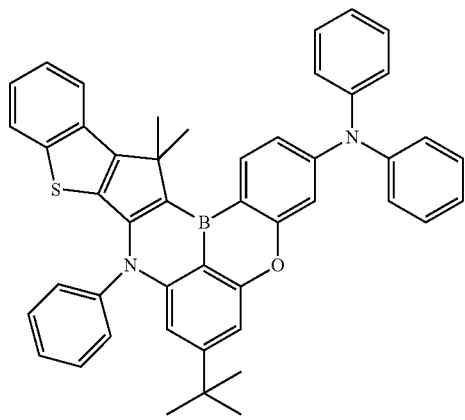
[Chemical Formula 72]
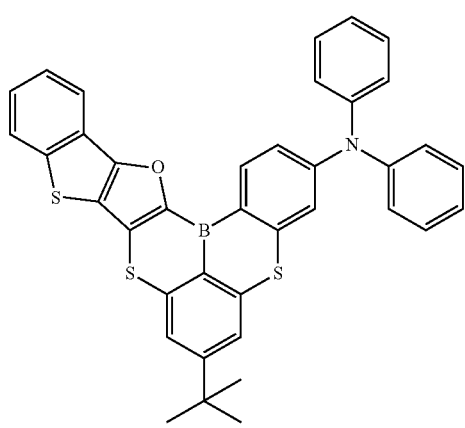
[Chemical Formula 73]
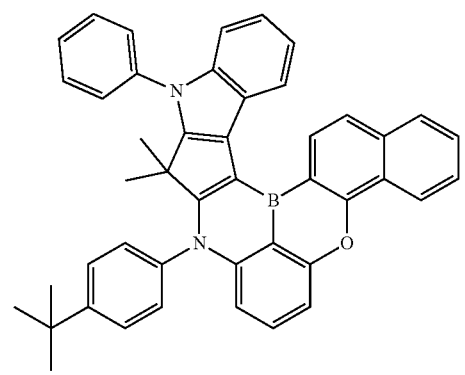
[Chemical Formula 74]
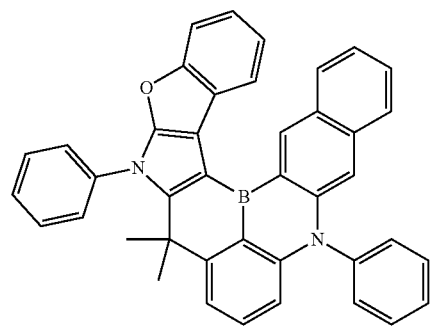
[Chemical Formula 75]
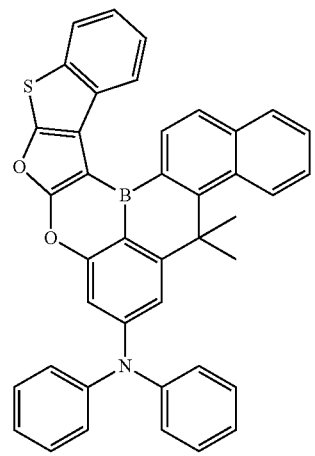
[Chemical Formula 76]
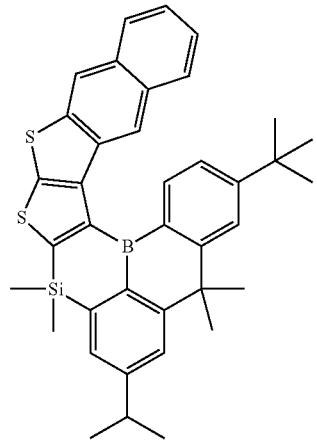
[Chemical Formula 77]
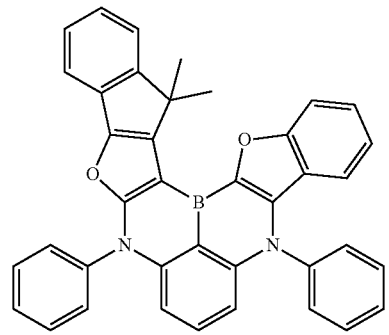
[Chemical Formula 78]
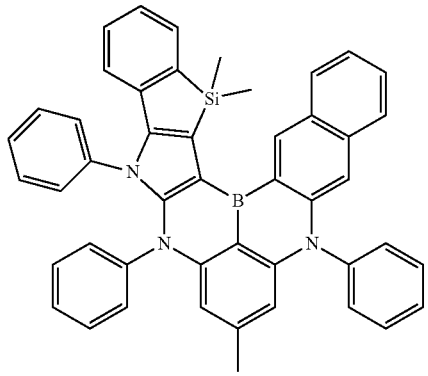

[Chemical Formula 79]
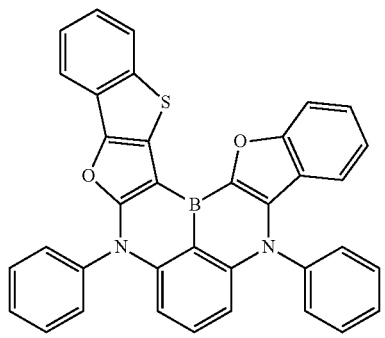
[Chemical Formula 80]
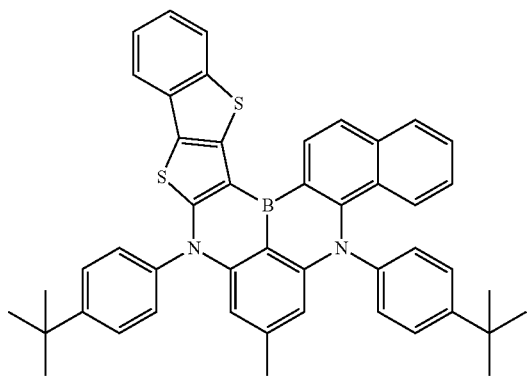
[Chemical Formula 81]
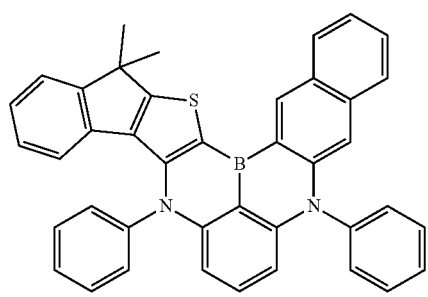
[Chemical Formula 82]
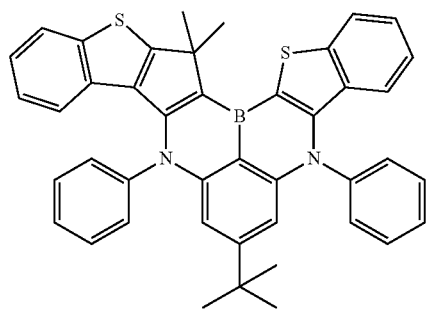
[Chemical Formula 83]
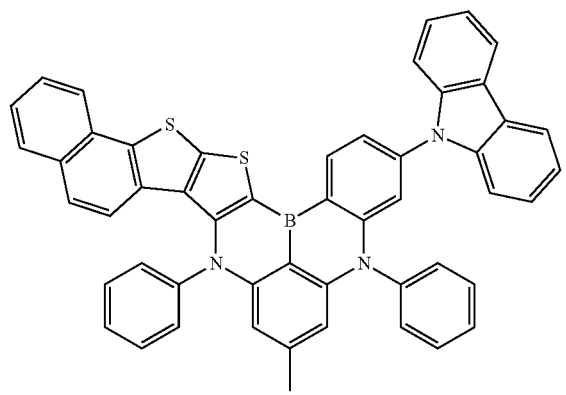
[Chemical Formula 84]
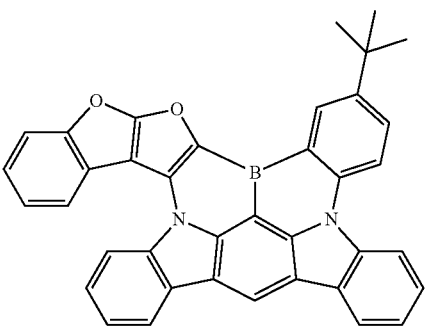
[Chemical Formula 85]
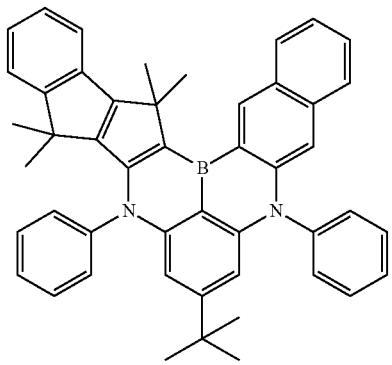
[Chemical Formula 86]
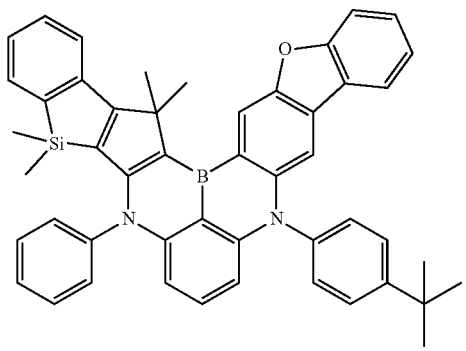

[Chemical Formula 87]
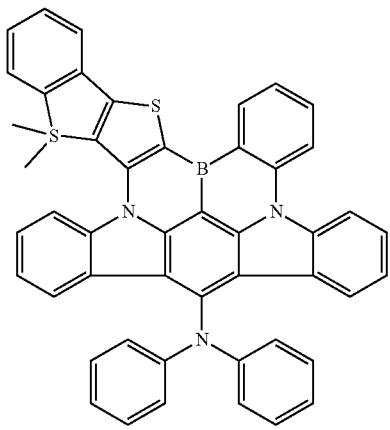
[Chemical Formula 88]
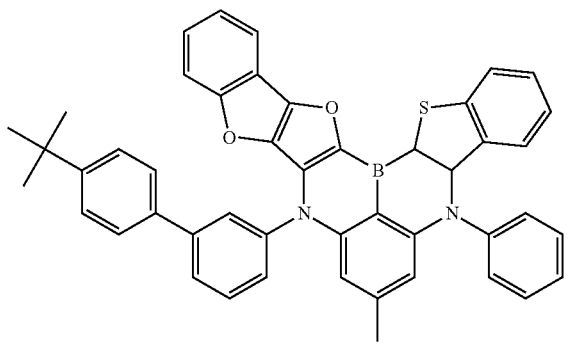
[Chemical Formula 89]
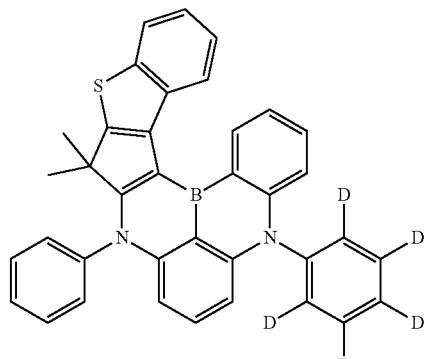
[Chemical Formula 90]
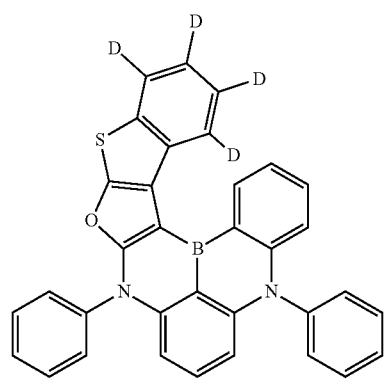
[Chemical Formula 91]
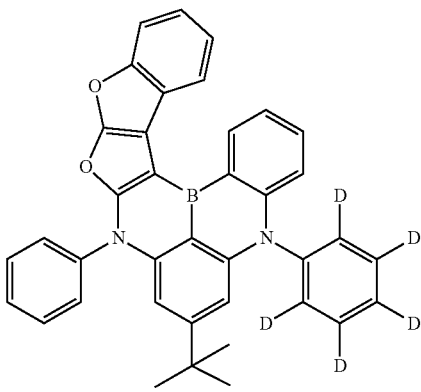
[Chemical Formula 92]
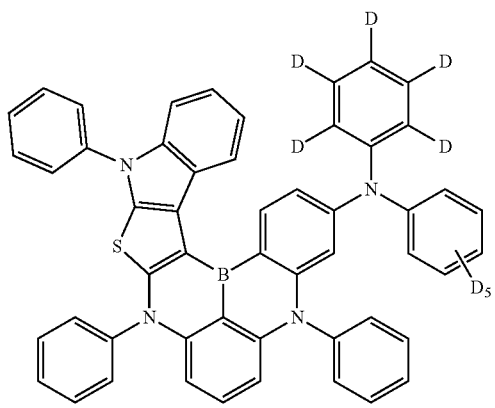
[Chemical Formula 93]
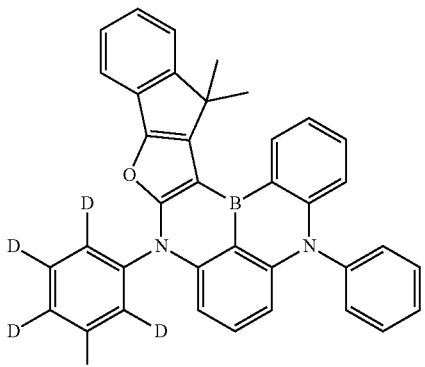
[Chemical Formula 94]
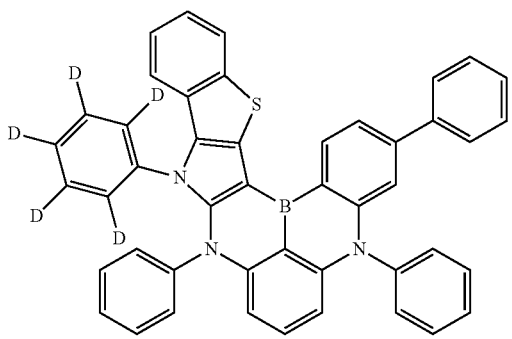

-continued
[Chemical Formula 95]
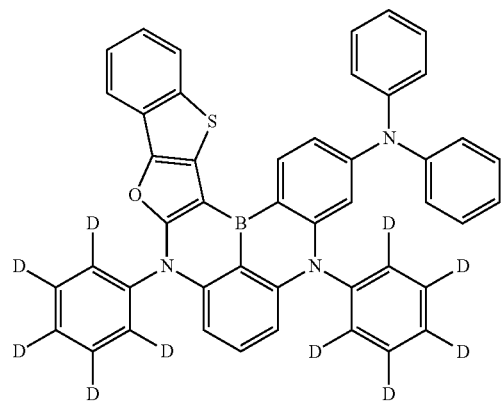
[Chemical Formula 96]
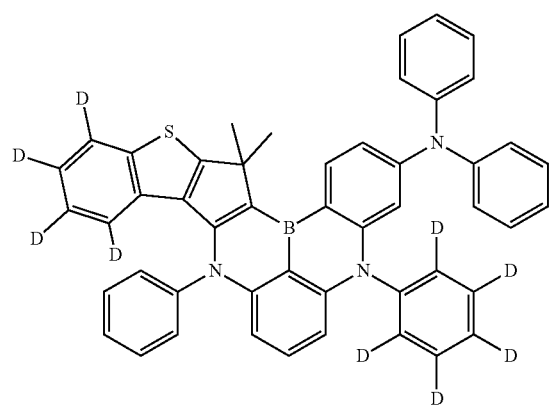
[Chemical Formula 97]
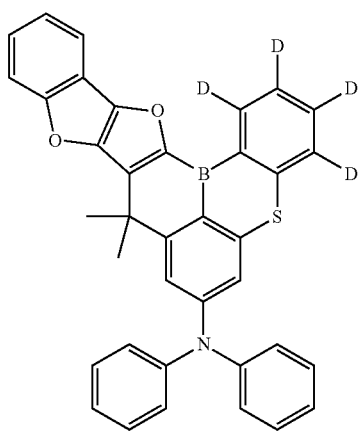
-continued
[Chemical Formula 98]
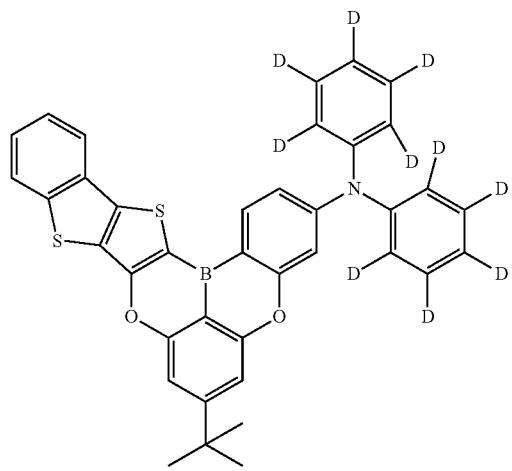
[Chemical Formula 99]
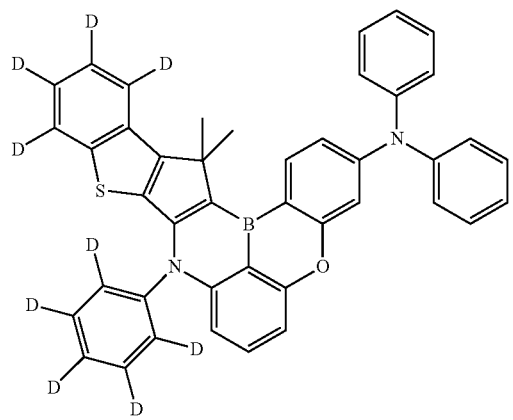
[Chemical Formula 100]
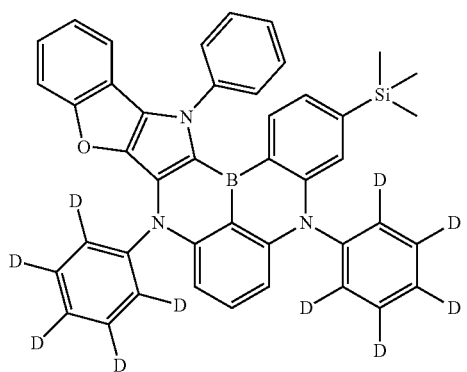

[Chemical Formula 101]
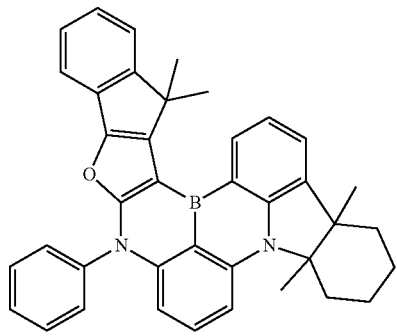
[Chemical Formula 102]
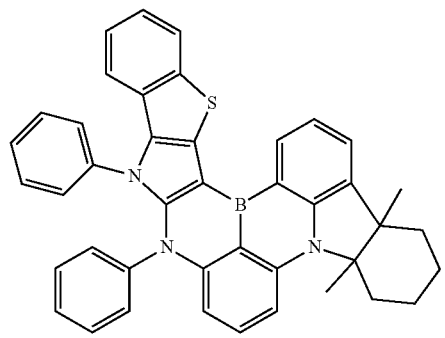
[Chemical Formula 103]
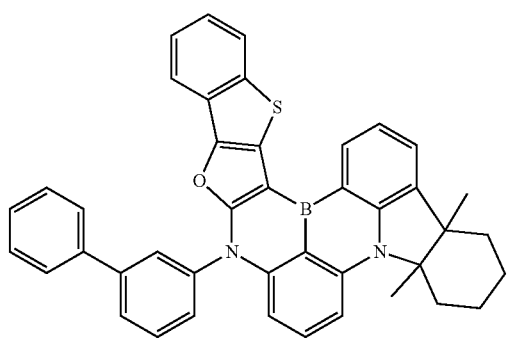
[Chemical Formula 104]
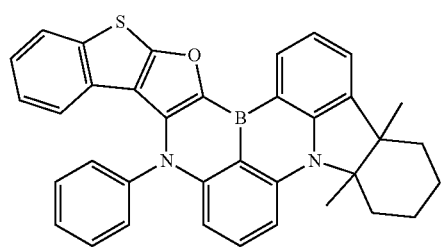
[Chemical Formula 105]
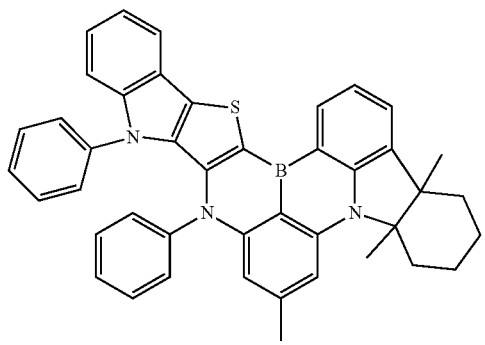
[Chemical Formula 106]
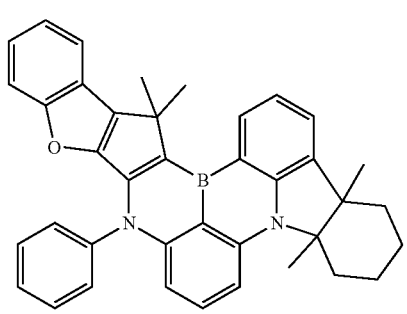
[Chemical Formula 107]
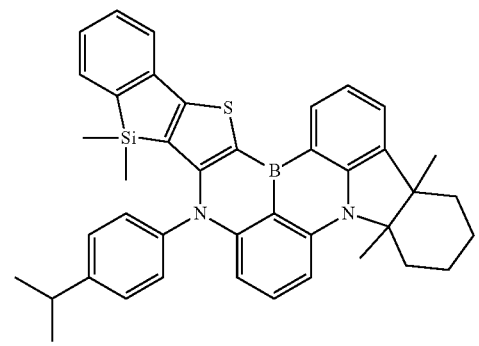
[Chemical Formula 108]
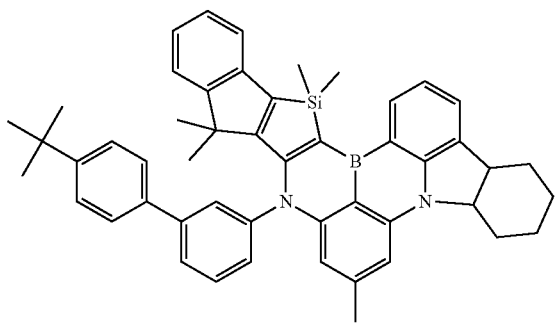

-continued

[Chemical Formula 109]

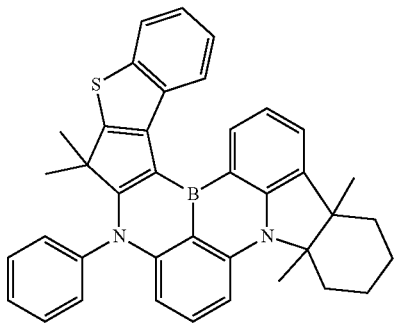

[Chemical Formula 110]

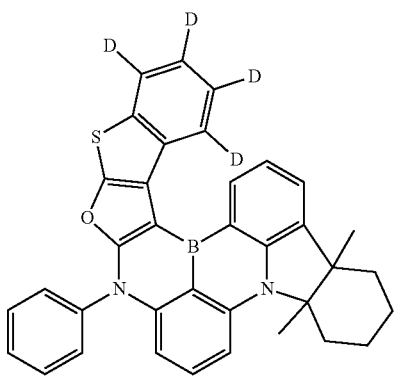

[Chemical Formula 111]

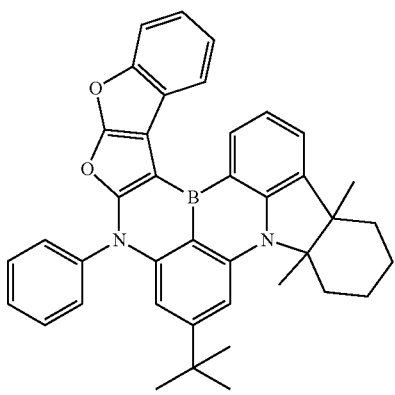

[Chemical Formula 112]

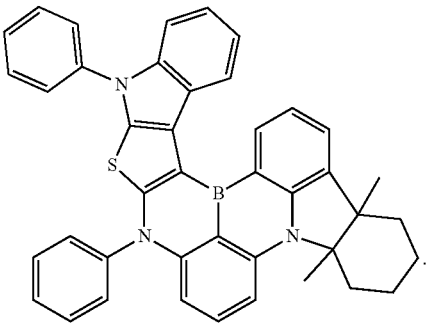

13. An organic light-emitting diode, comprising: a first electrode; a second electrode facing the first electrode; and an organic layer interposed between the first electrode and the second electrode, wherein the light emitting layer comprises the boron compounds of claim 1.

14. The organic light-emitting diode of claim 13, wherein the organic light emitting diode according to the present disclosure comprises at least one of a hole injection layer, a hole transport layer, a functional layer capable of both hole injection and hole transport, a light-emitting layer, an electron transport layer, and an electron injection layer.

15. The organic light-emitting diode of claim 13, wherein the organic layer interposed between the first electrode and the second electrode comprises a light-emitting layer including a host and a dopant, wherein at least one of the boron compounds represented by Chemical Formulas A to D is used as the dopant.

16. The organic light-emitting diode of claim 15, wherein the organic light-emitting diode employs an anthracene derivative represented by the following Chemical Formula H as the host:

[Chemical Formula H]

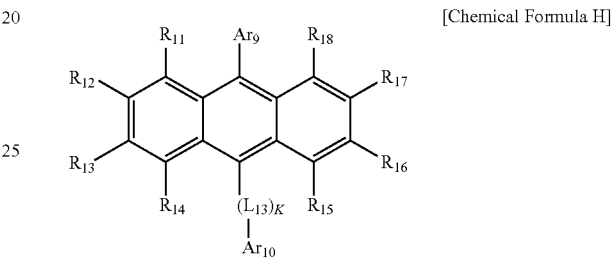

wherein, $R_{11}$ to $R_{18}$, which may be the same or different, are each as defined for $R_1$ to $R_{10}$ in claim 1;

$Ar_9$ and $Ar_{10}$, which may be the same or different, are each independently selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, and a substituted or unsubstituted arylsilyl of 6 to 30 carbon atoms;

$L_{13}$, which functions as a linker, is a single bond or is selected from a substituted or unsubstituted arylene of 6 to 20 carbon atoms, and a substituted or unsubstituted heteroarylene of 2 to 20 carbon atoms; and k is an integer of 1 to 3, wherein when k is 2 or greater, the corresponding $L_{13}$'s are each the same or different.

17. The organic light-emitting diode of claim 16, wherein the anthracene derivative, represented by Chemical Formula H is an anthracene derivative represented by the following Chemical Formula H1 or H2:

[Chemical Formula H1]

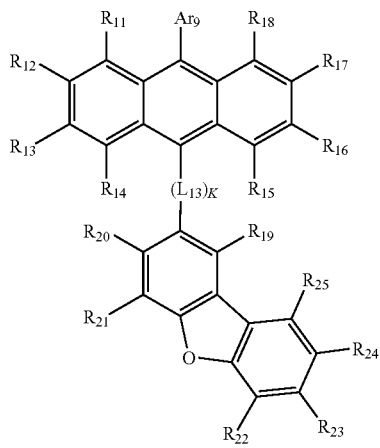

[Chemical Formula H2]

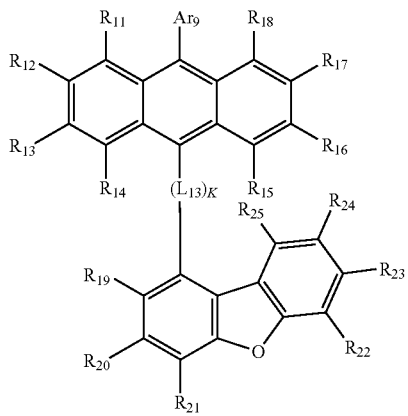

wherein,

R$_{19}$ to R$_{25}$, which may be the same or different, are each as defined for R$_1$ to R$_{10}$ in claim 1.

18. The organic light-emitting diode of claim 16, wherein the linker L$_{13}$ is a single bone or a substituted or unsubstituted arylene of 6 to 20 carbon atoms, and k is an integer of 1 and 2, wherein when k is 2, the corresponding L$_{13}$'s are each same or different.

19. The organic light-emitting diode of claim 16, wherein the anthracene derivative is any one selected from the following <Compound 101> to <Compound 166>:

<Compound 101>

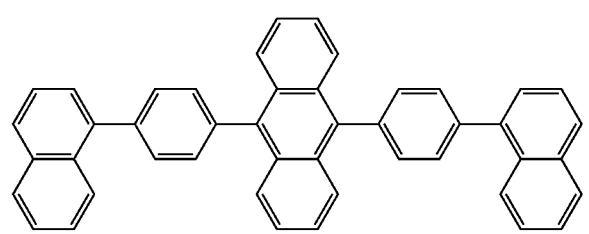

<Compound 102>

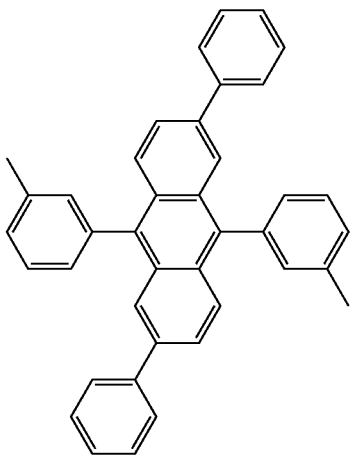

<Compound 103>

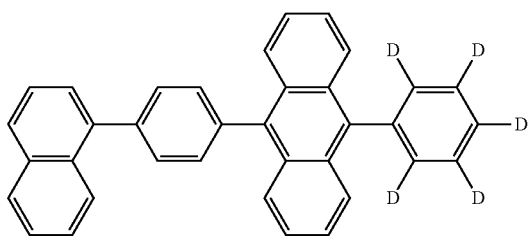

<Compound 104>

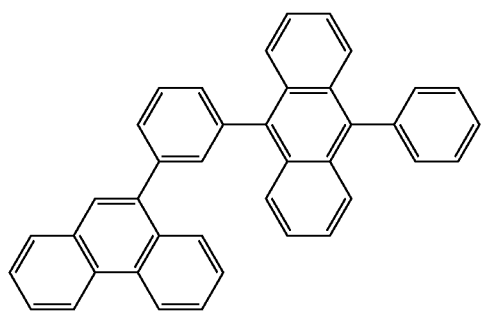

<Compound 105>

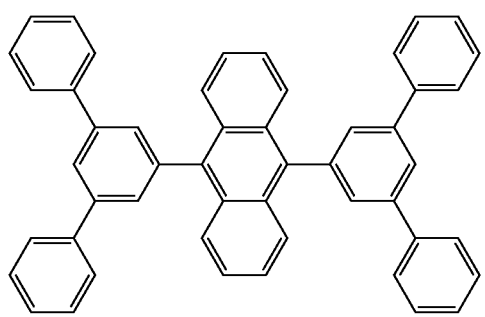

<Compound 106>

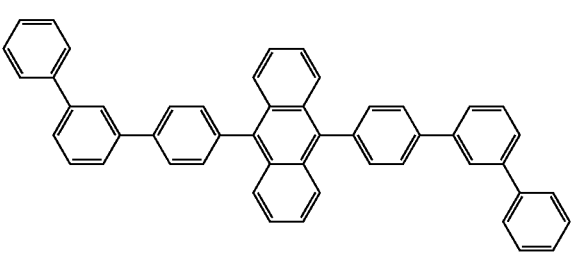

<Compound 107>
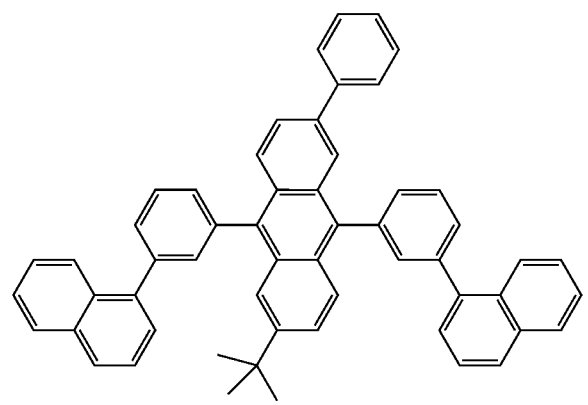
<Compound 108>
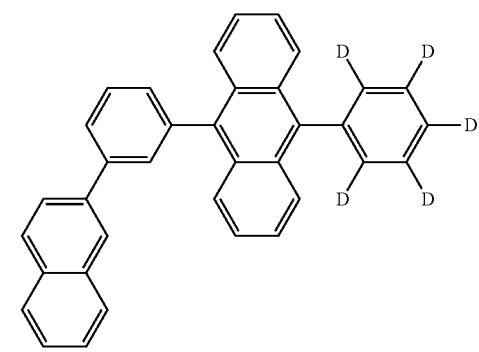
<Compound 109>
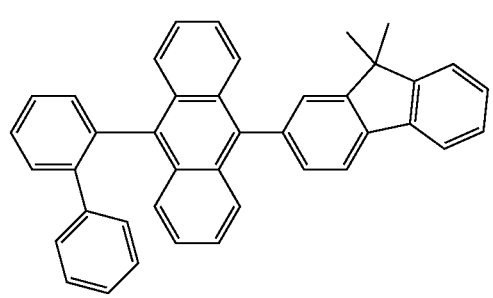
<Compound 110>
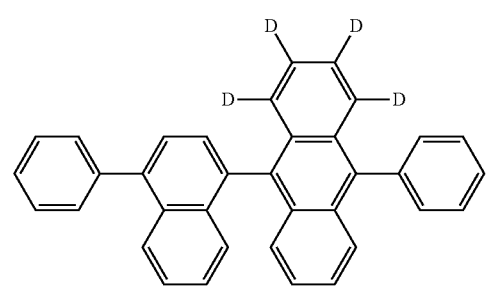
<Compound 111>
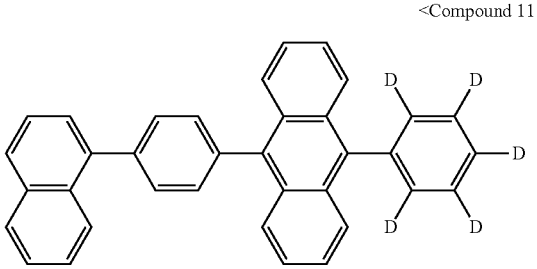
<Compound 112>
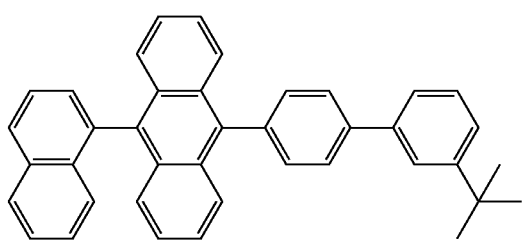
<Compound 113>
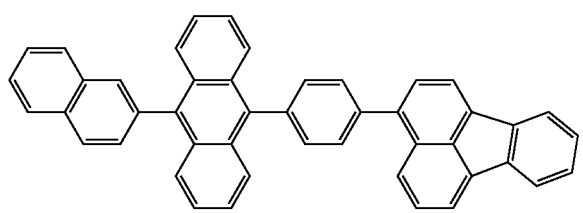
<Compound 114>
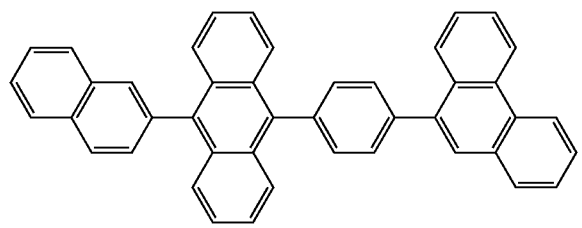
<Compound 115>
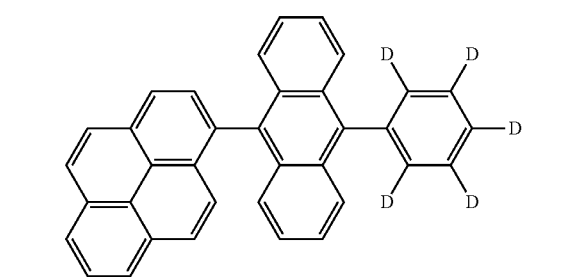
<Compound 116>

<Compound 117>
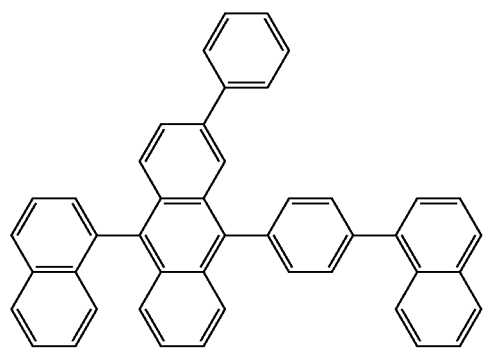
<Compound 118>
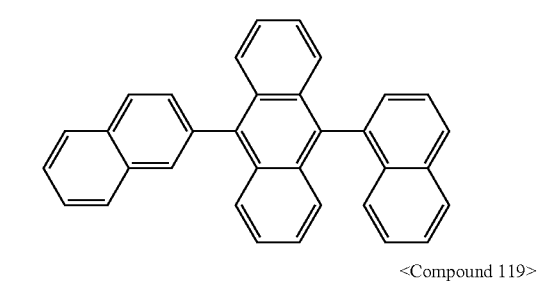
<Compound 119>
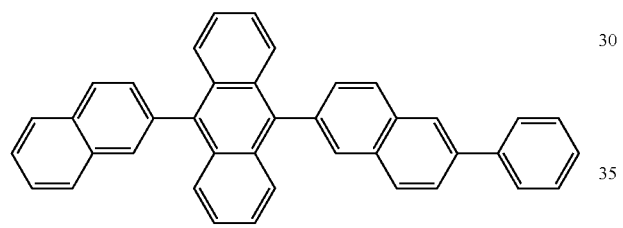
<Compound 120>
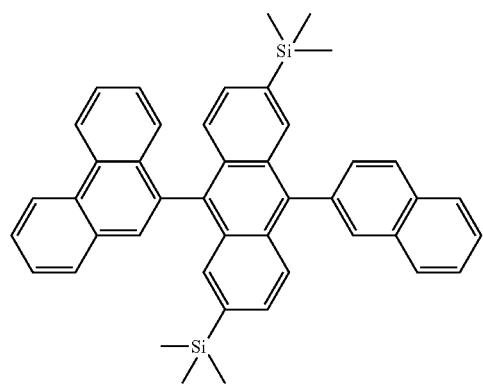
<Compound 121>
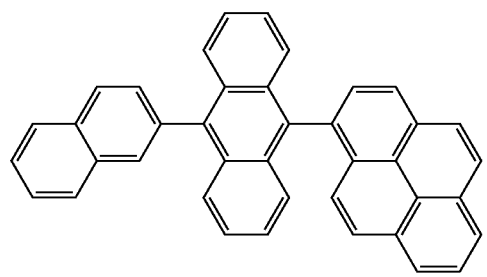
<Compound 122>
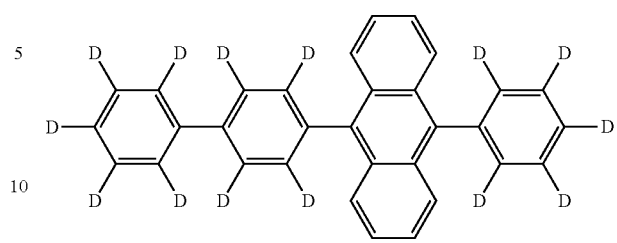
<Compound 123>
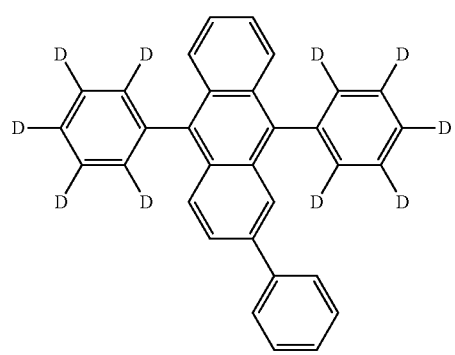
<Compound 124>
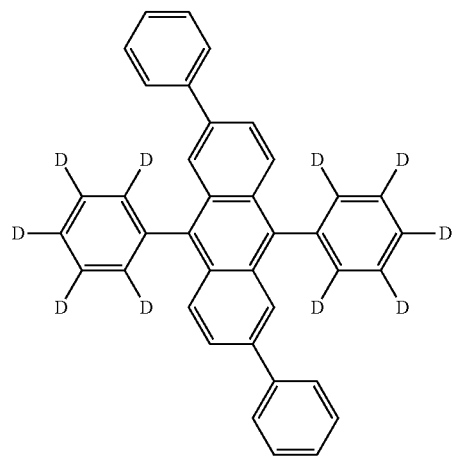
<Compound 125>
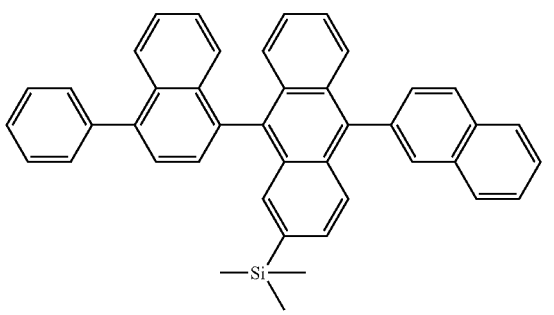

<Compound 126>
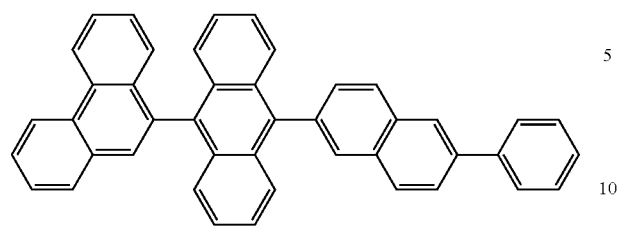
<Compound 127>
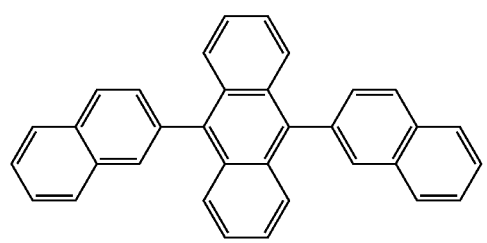
<Compound 128>
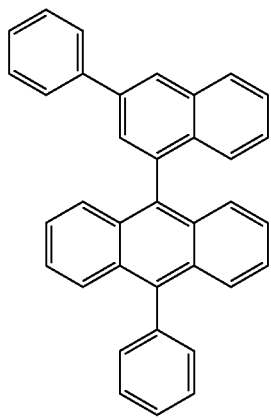
<Compound 129>
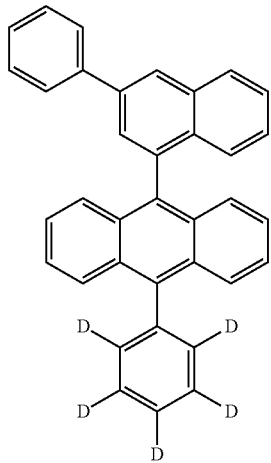
<Compound 130>
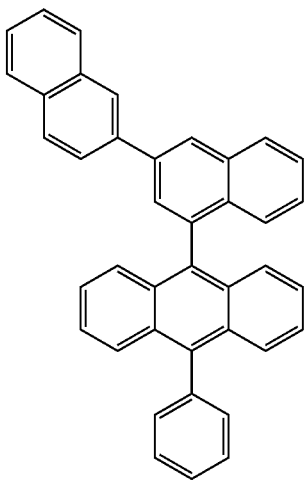
<Compound 131>
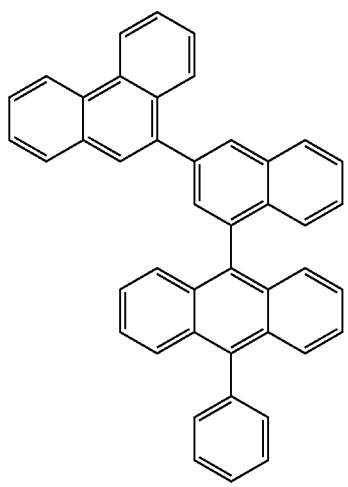
<Compound 132>
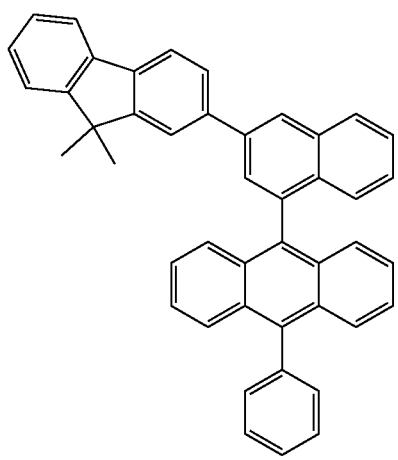

<Compound 133>
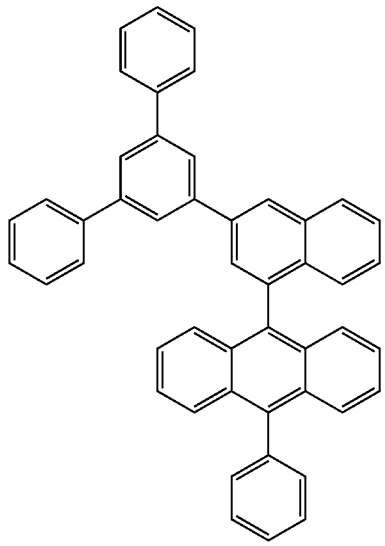
<Compound 135>
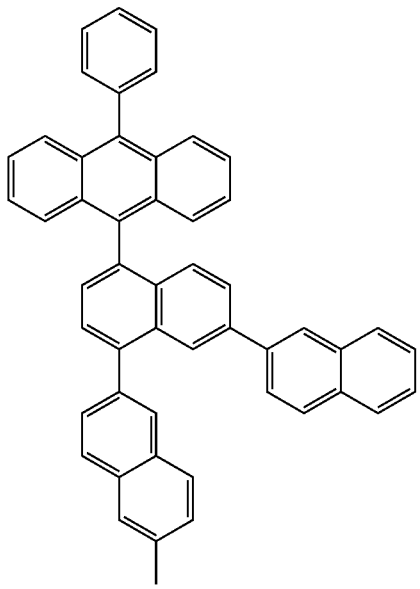
<Compound 136>
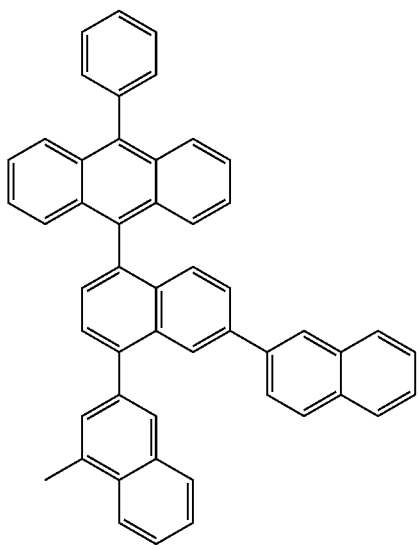
<Compound 134>
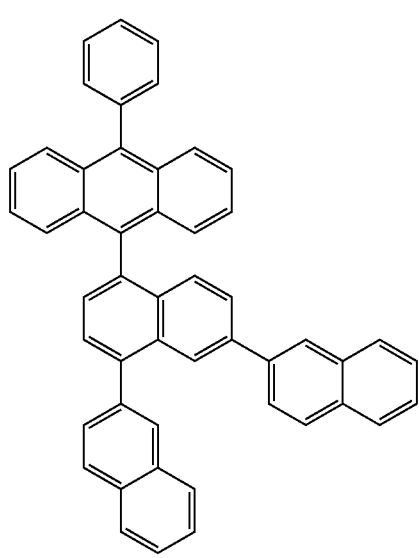
<Compound 137>
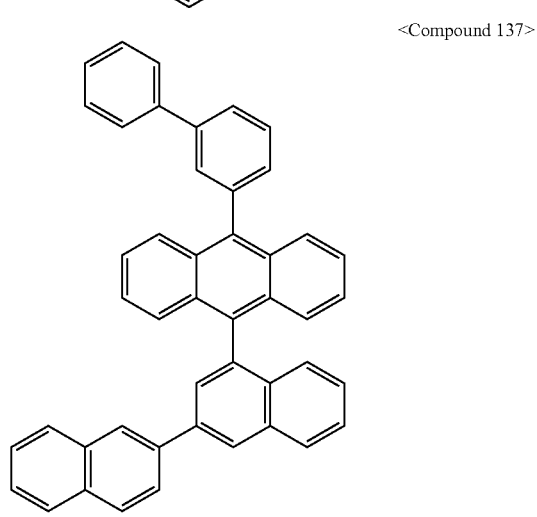

<Compound 138>
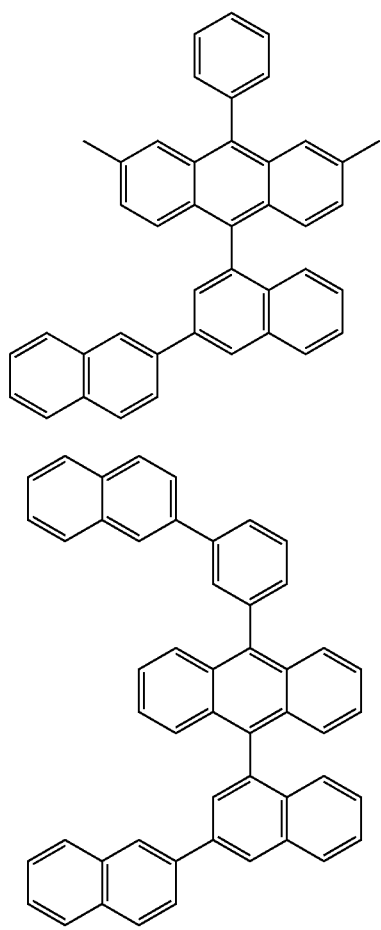
<Compound 139>
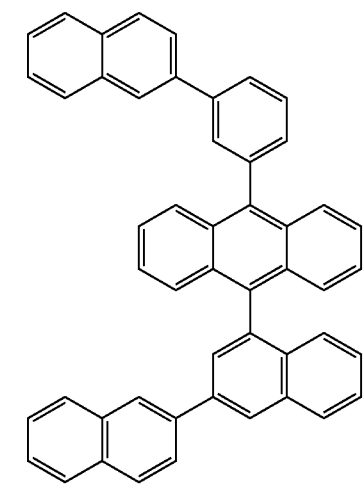
<Compound 140>
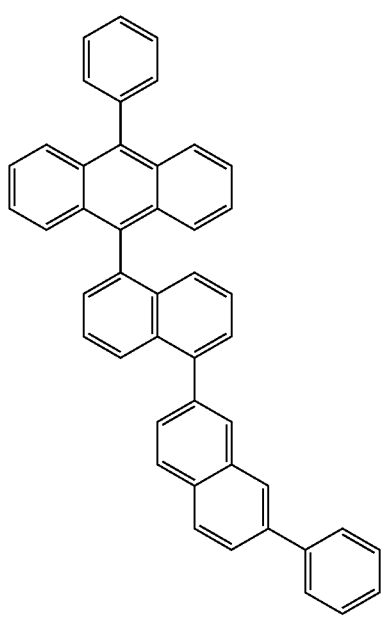
<Compound 141>
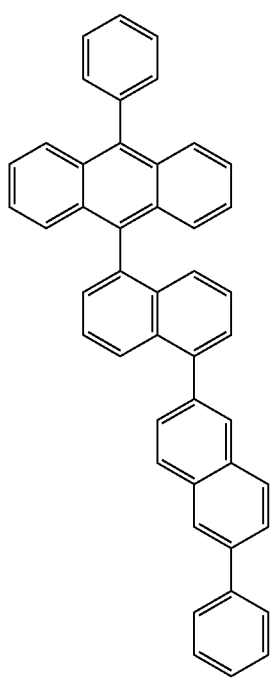
<Compound 142>
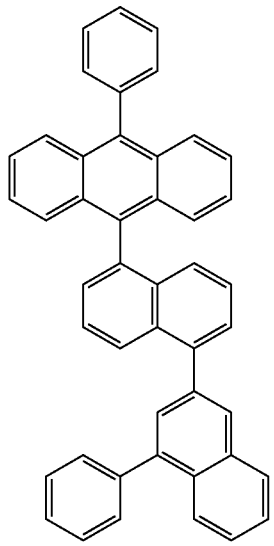

<Compound 143>
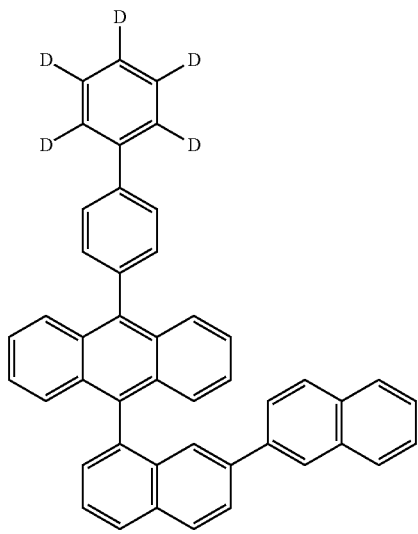
<Compound 144>
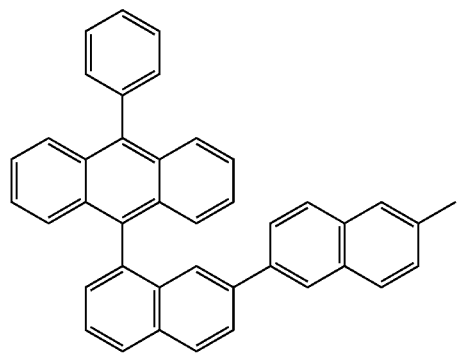
<Compound 145>
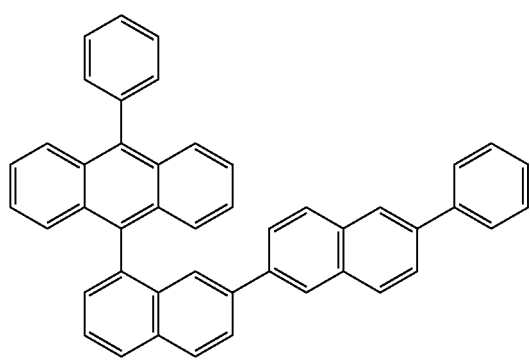
<Compound 146>
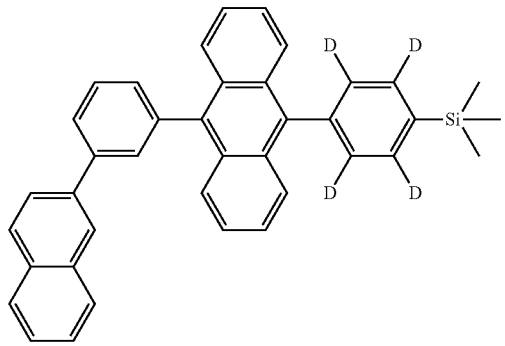
<Compound 147>
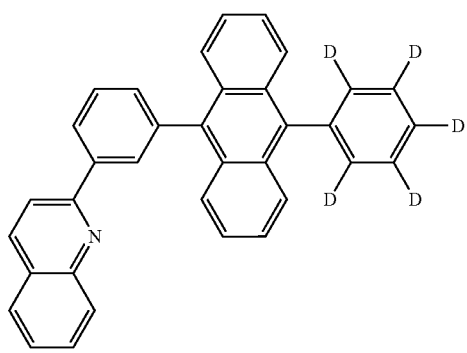
<Compound 148>
<Compound 149>
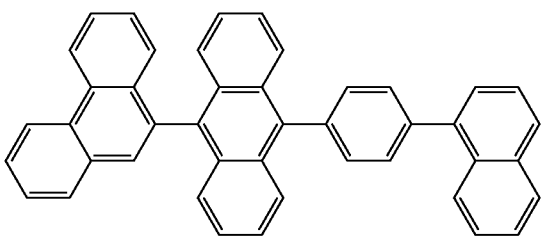

<Compound 150>
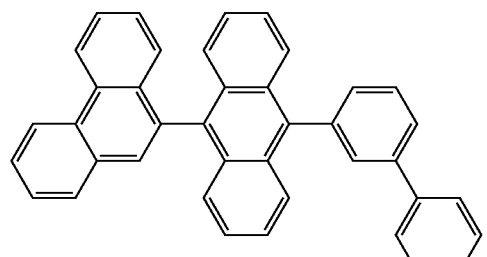
<Compound 151>
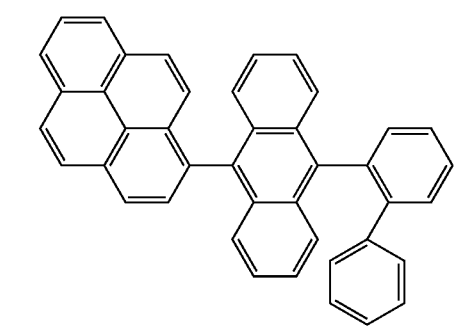
<Compound 152>
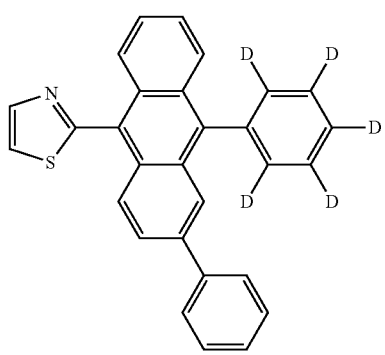
<Compound 153>
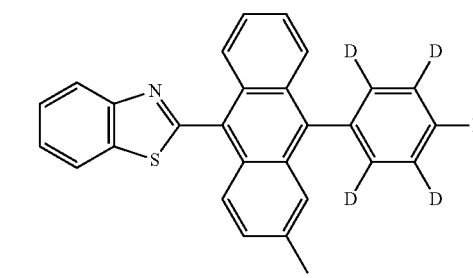
<Compound 154>
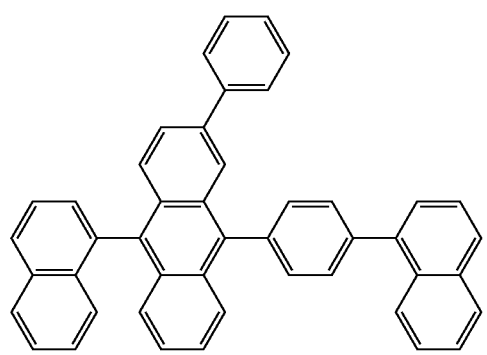
<Compound 155>
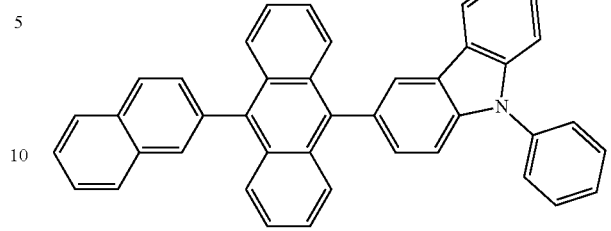
<Compound 156>
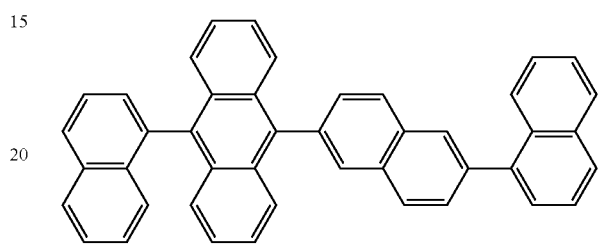
<Compound 157>
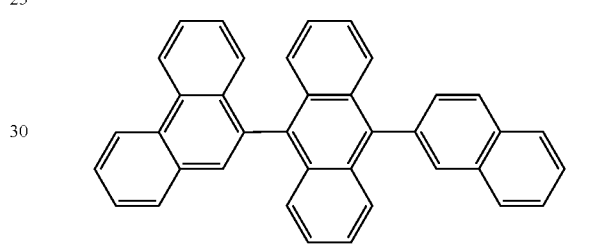
<Compound 158>
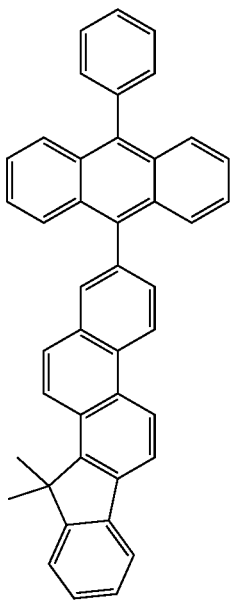

<Compound 159>
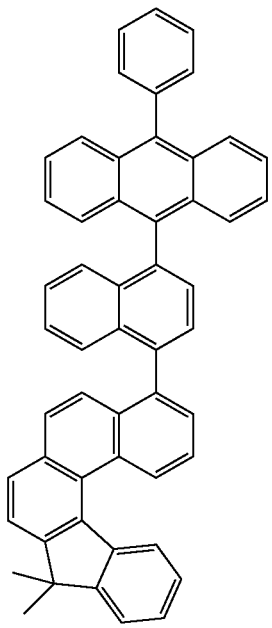
<Compound 160>
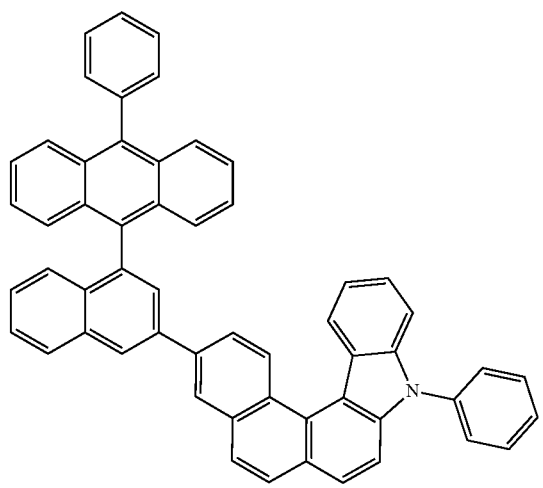
<Compound 161>
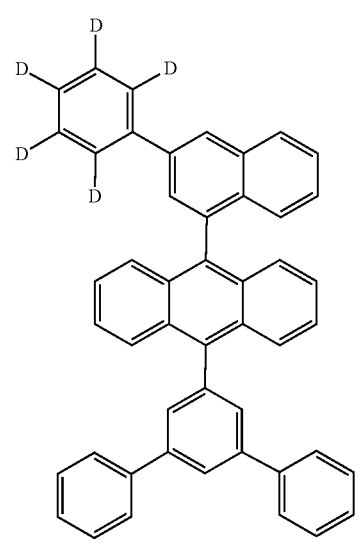
<Compound 162>
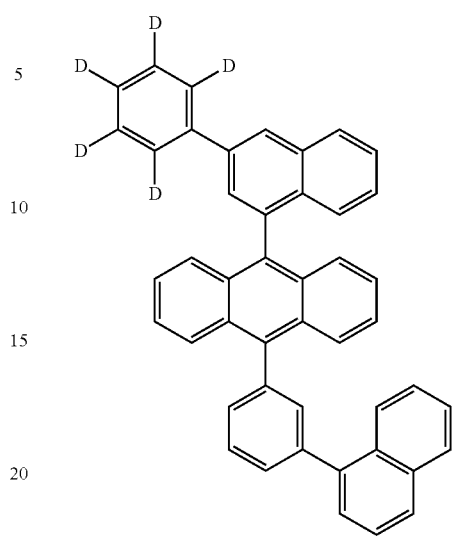
<Compound 163>
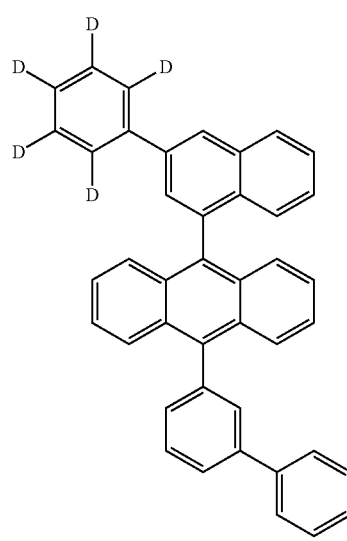
<Compound 164>
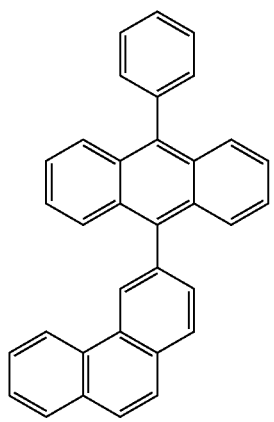

<Compound 165>
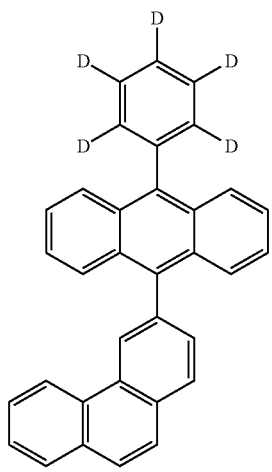
<Compound 166>
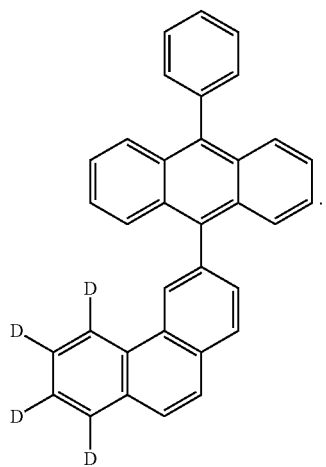
20. The organic light-emitting diode of claim 17, wherein the anthracene derivative is one selected from the following <Chemical Formula 201> to <Chemical Formula 281>:
<Compound 201>
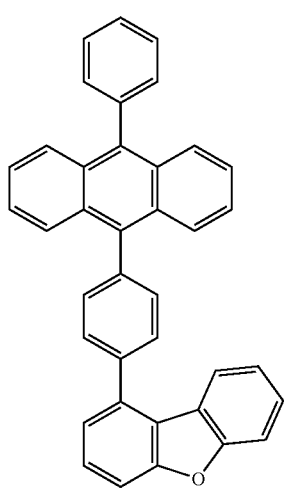
<Compound 202>
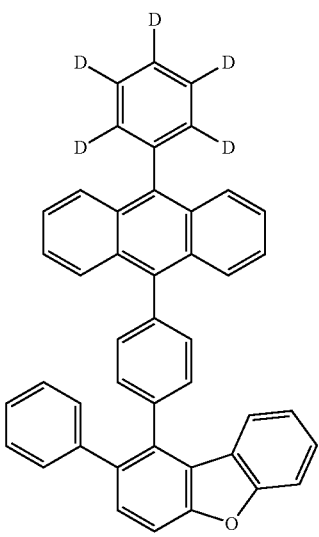
<Compound 203>
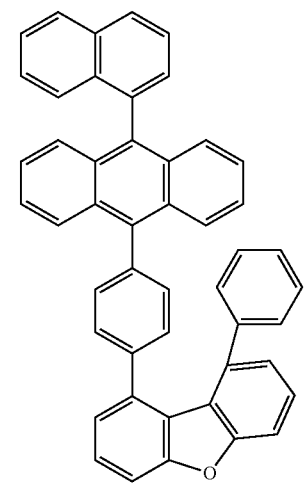
<Compound 204>
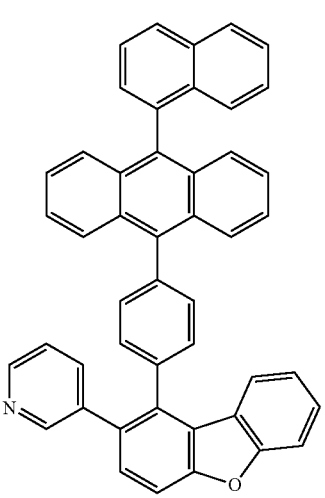

<Compound 205>
<Compound 206>
<Compound 207>
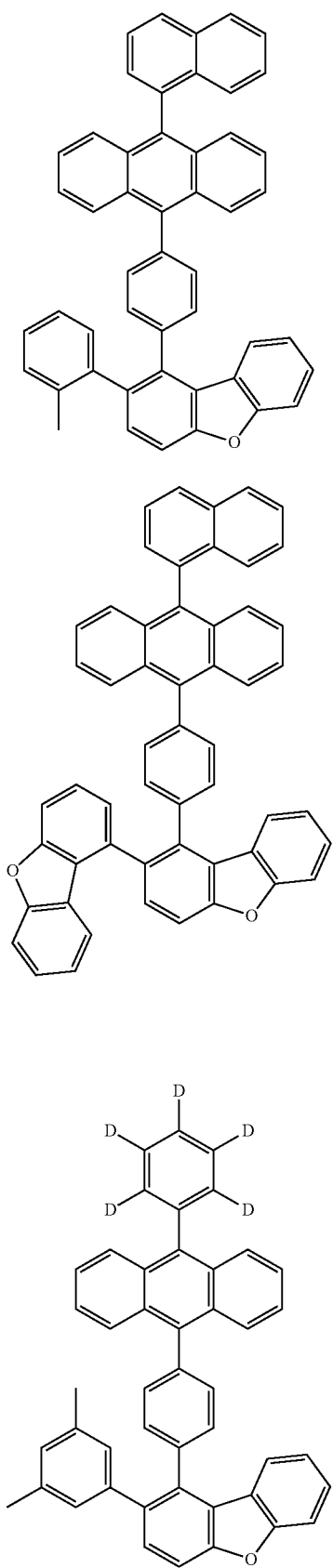
<Compound 208>
<Compound 209>
<Compound 210>
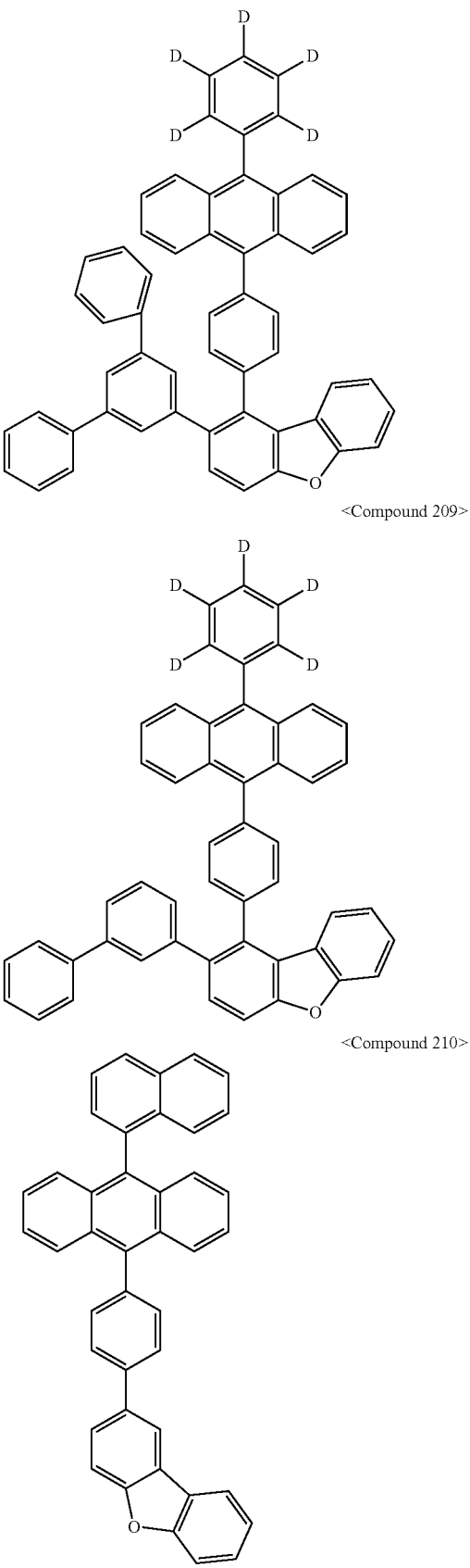

<Compound 211>
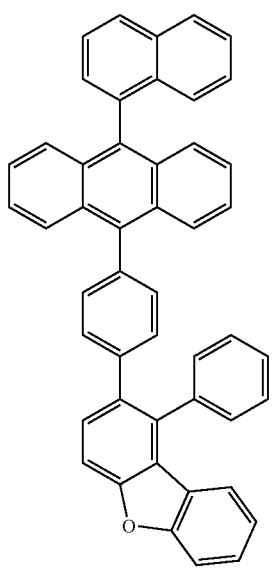
<Compound 213>
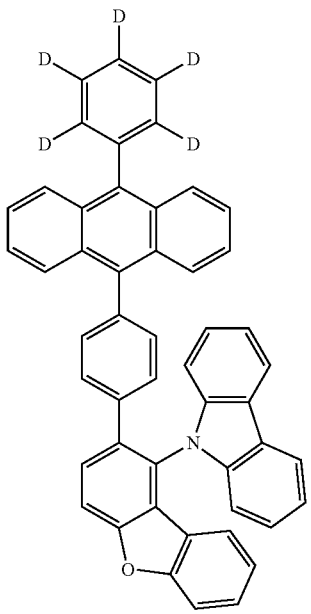
<Compound 212>
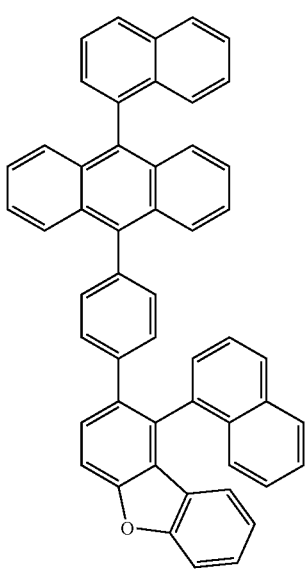
<Compound 214>
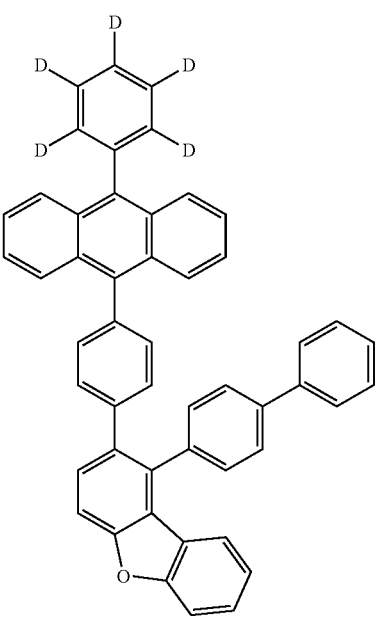

<Compound 215>
<Compound 216>
<Compound 217>
<Compound 218>
<Compound 219>
<Compound 220>
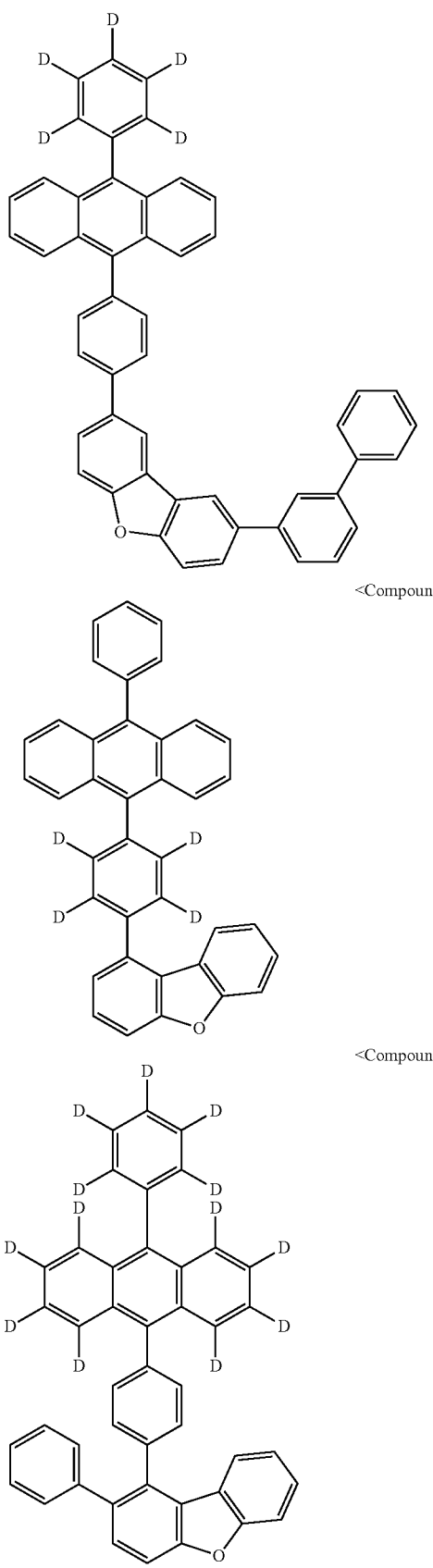
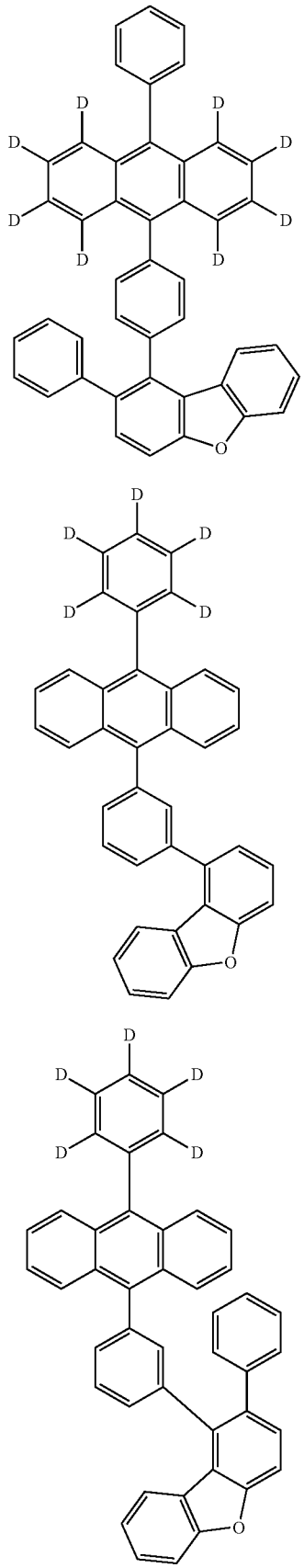

<Compound 221>
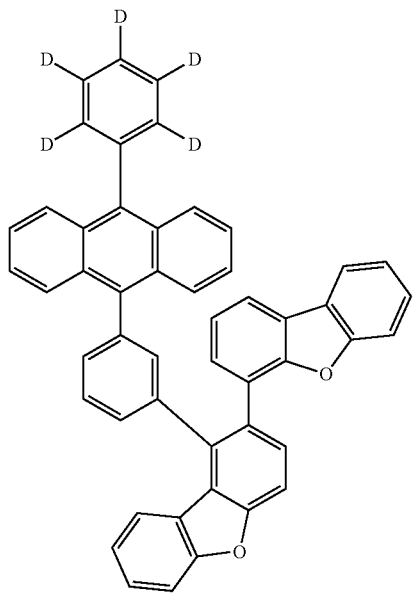
<Compound 222>
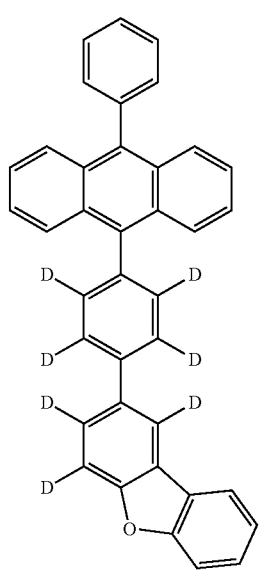
<Compound 223>
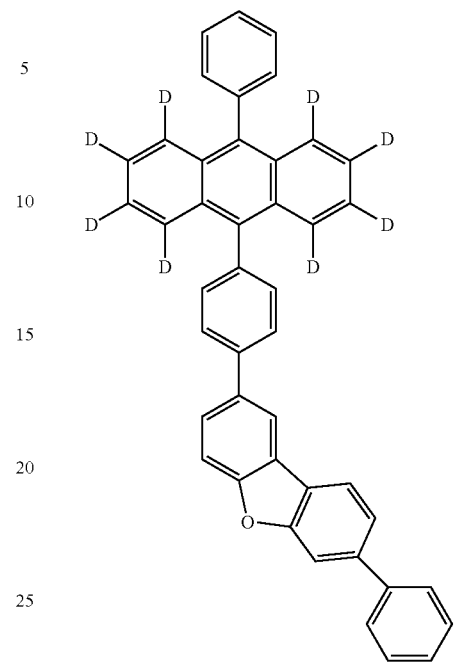
<Compound 224>
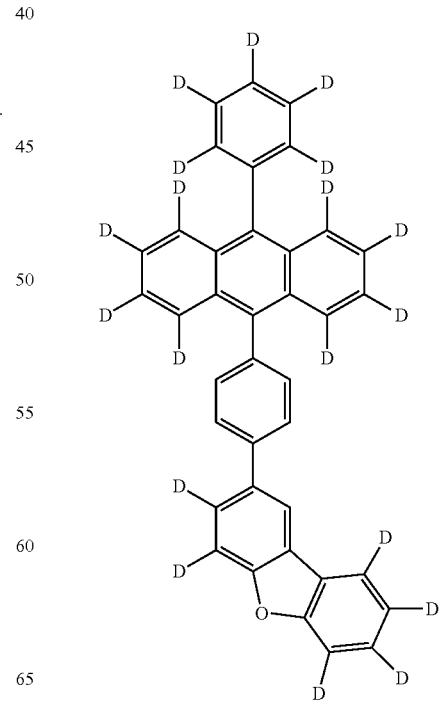

<Compound 225>
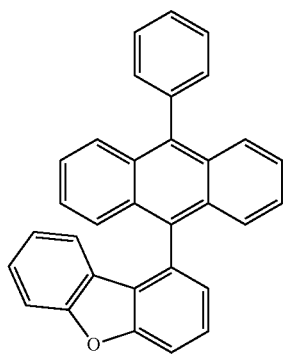
<Compound 226>
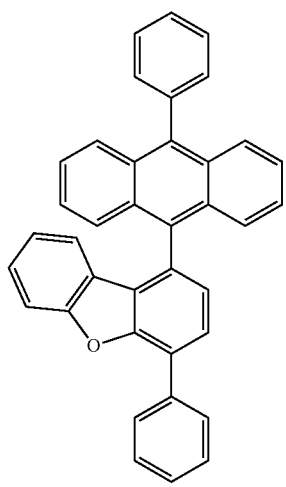
<Compound 227>
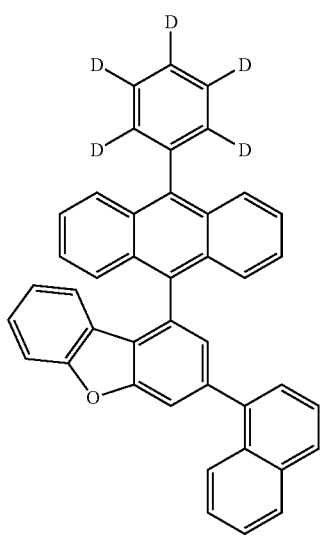
<Compound 228>
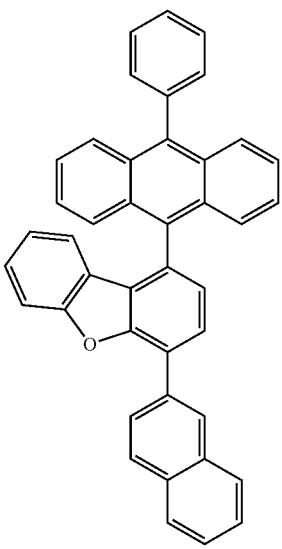
<Compound 229>
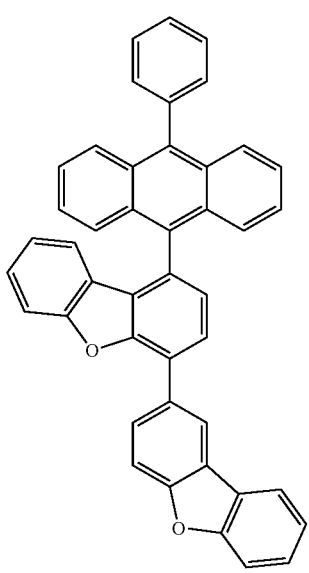
<Compound 230>
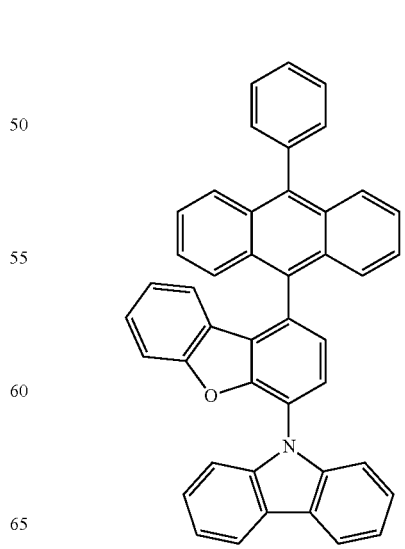

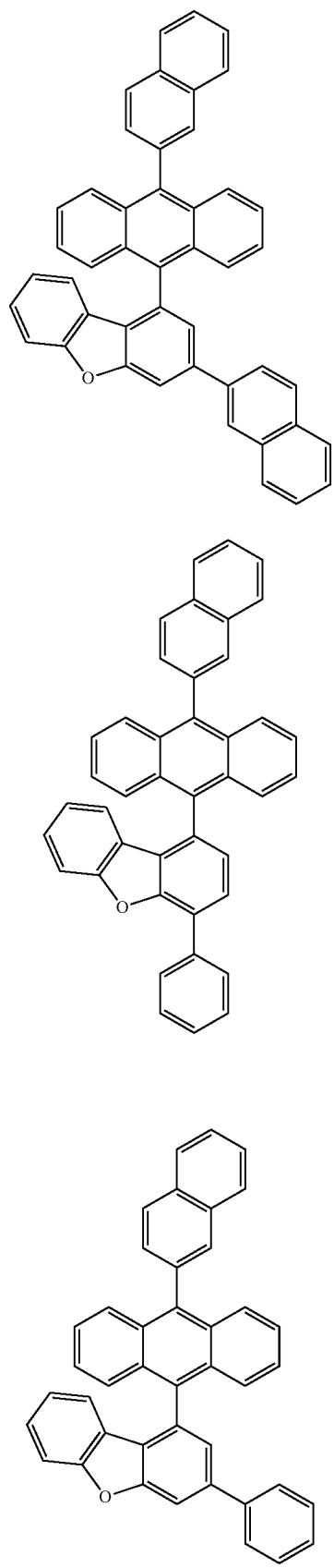
<Compound 231>
<Compound 232>
<Compound 233>
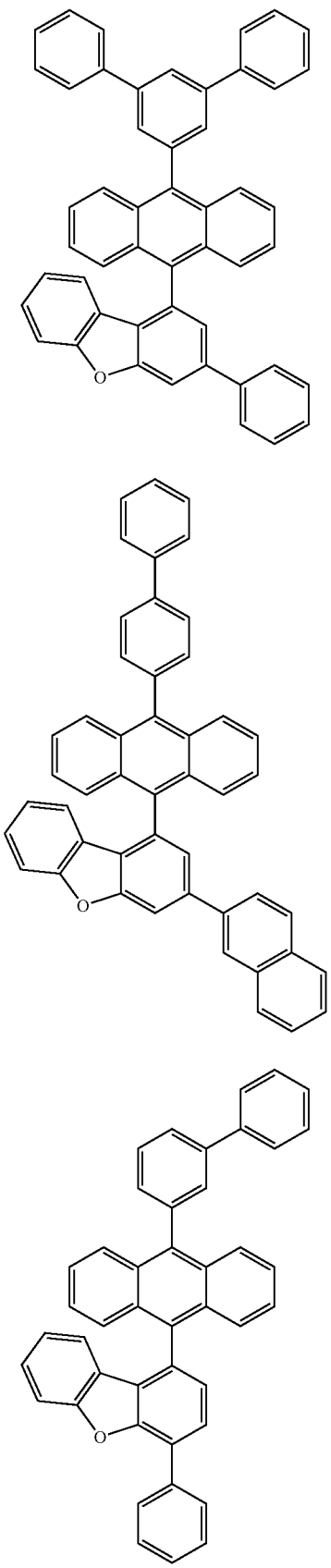
<Compound 234>
<Compound 235>
<Compound 236>

<Compound 237>
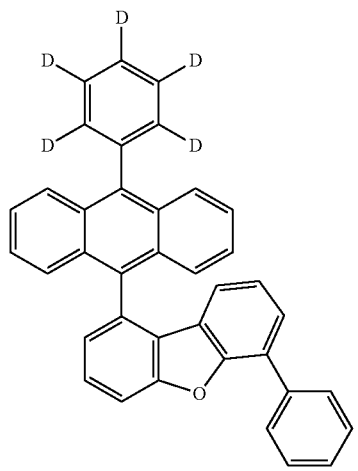
<Compound 238>
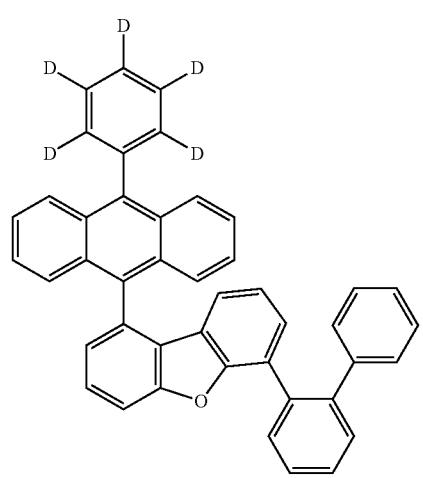
<Compound 239>
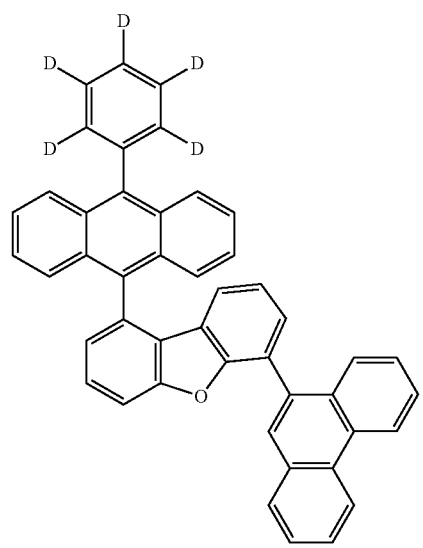
<Compound 240>
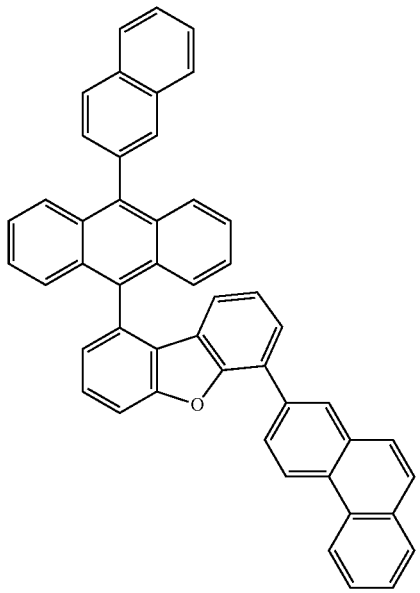
<Compound 241>
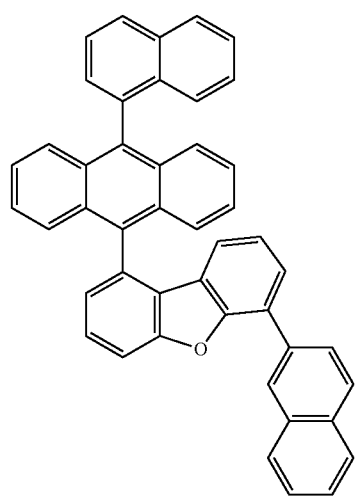
<Compound 242>
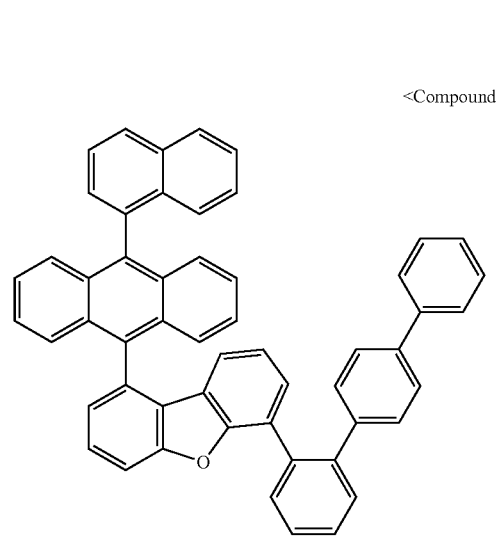

<Compound 243>
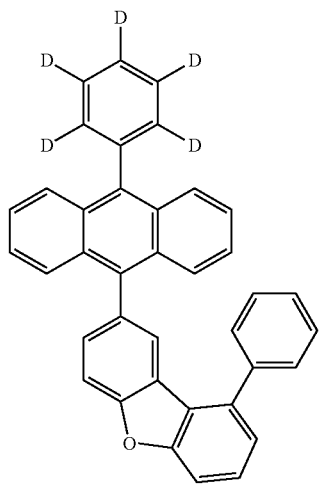
<Compound 244>
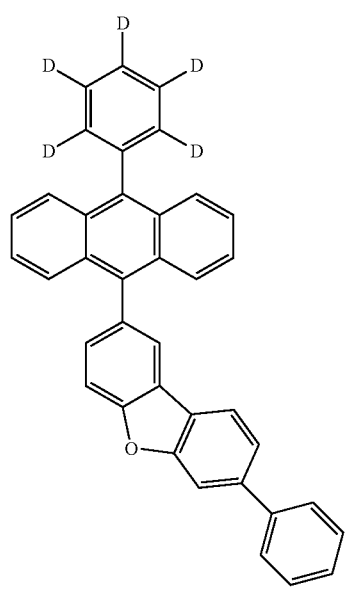
<Compound 245>
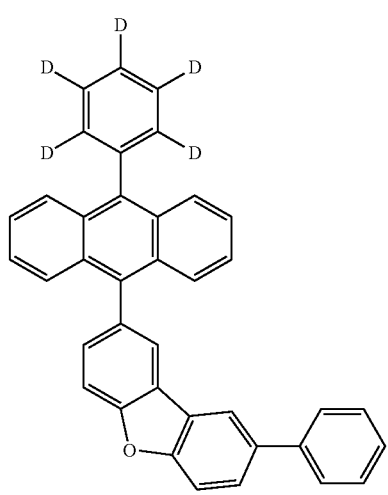
<Compound 246>
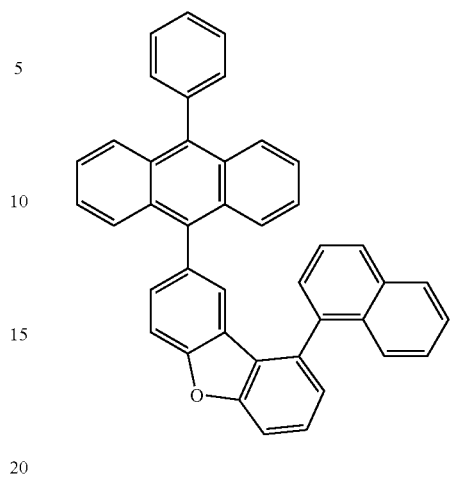
<Compound 247>
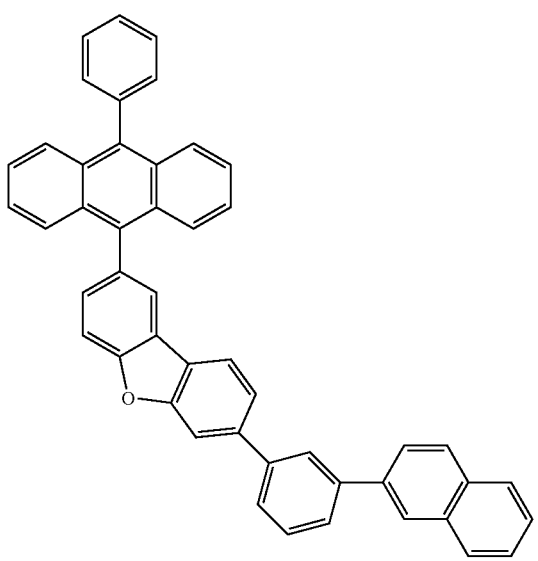
<Compound 248>
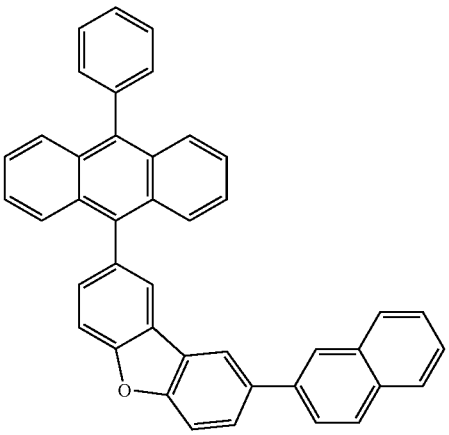

<Compound 249>
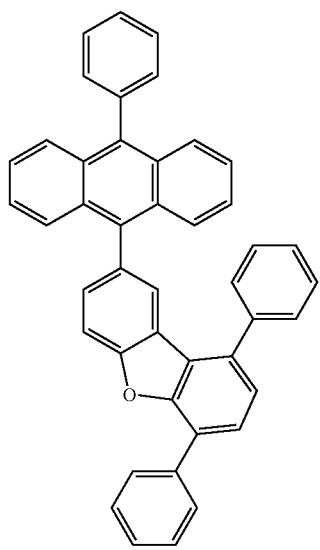
<Compound 252>
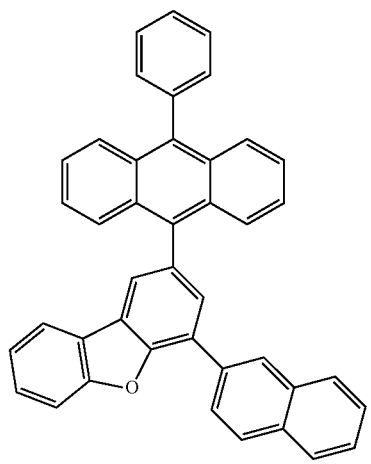
<Compound 250>
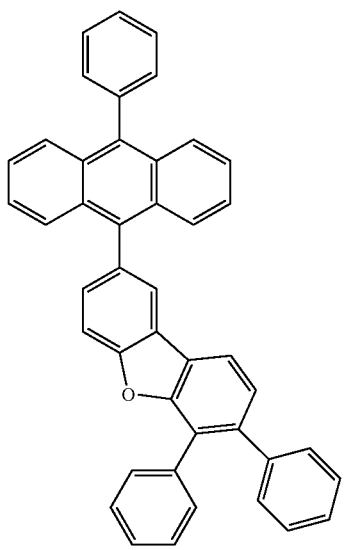
<Compound 253>
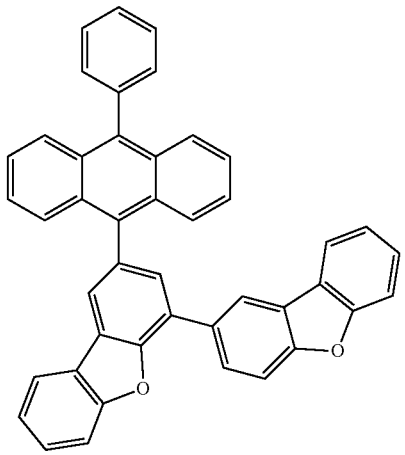
<Compound 251>
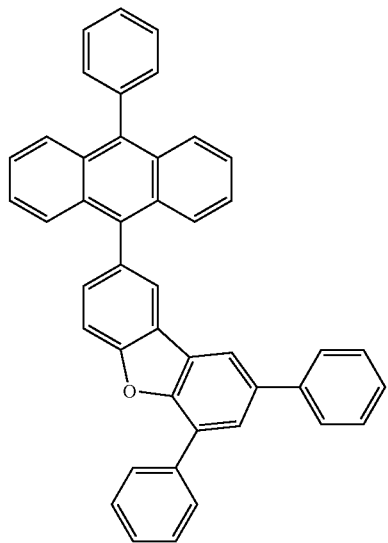
<Compound 254>
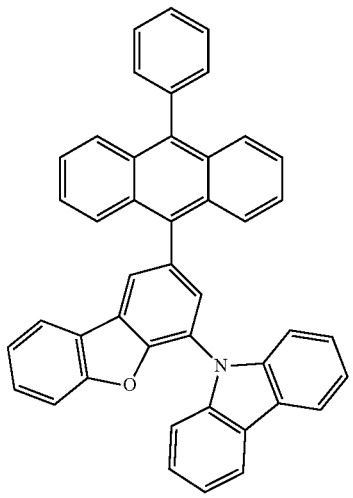

<Compound 255>
<Compound 256>
<Compound 257>
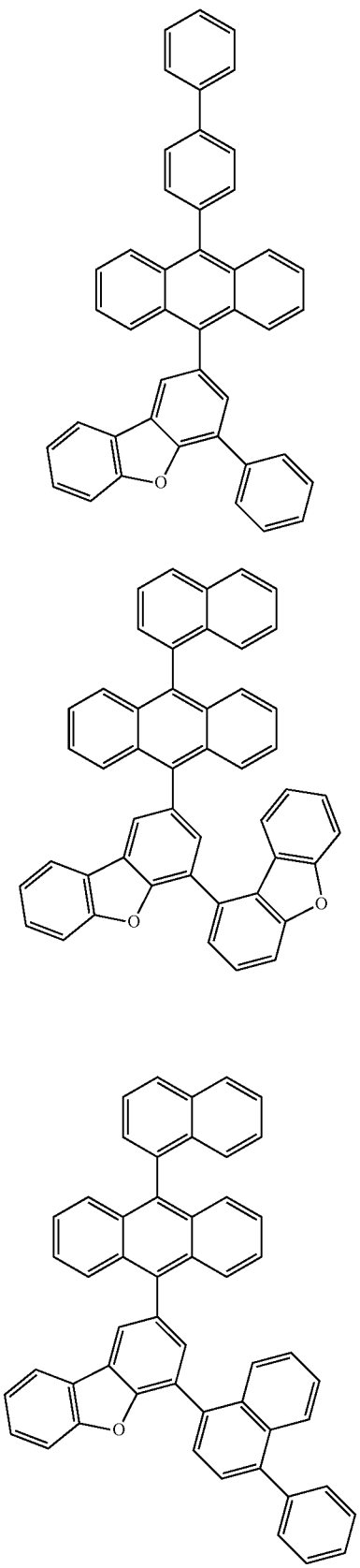
<Compound 258>
<Compound 259>
<Compound 260>
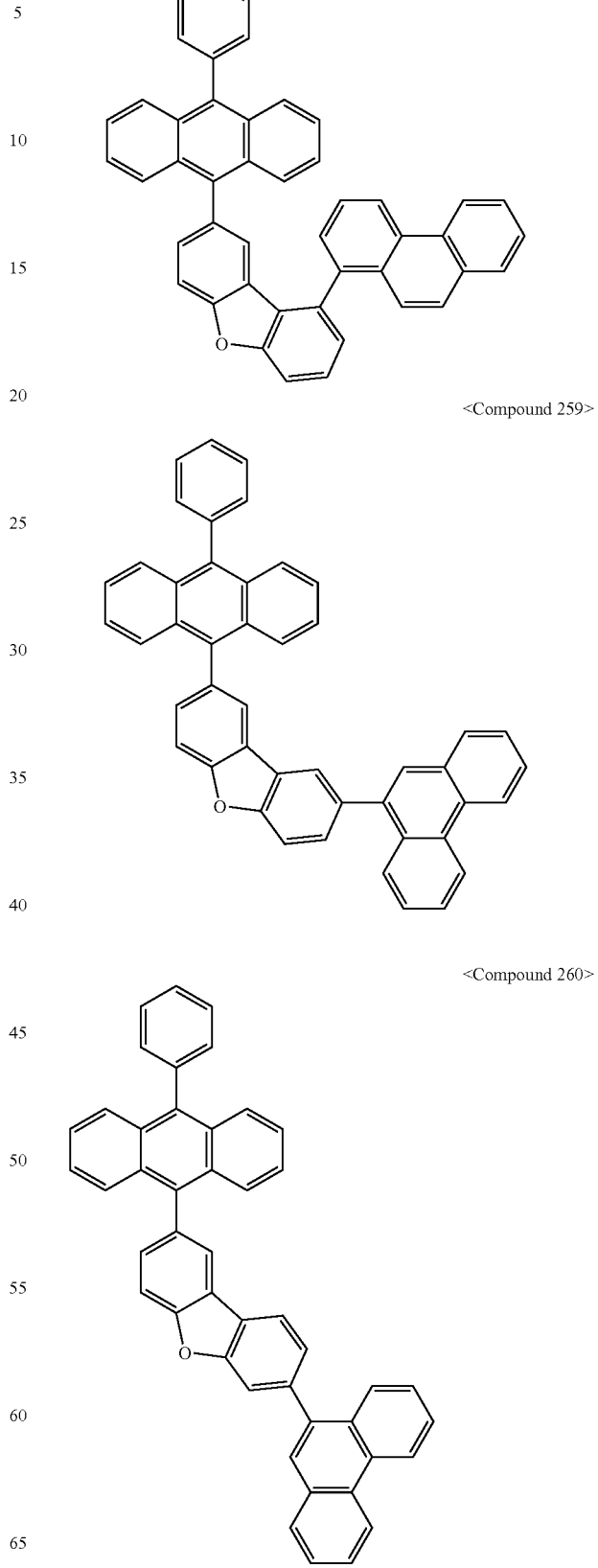

<Compound 261>
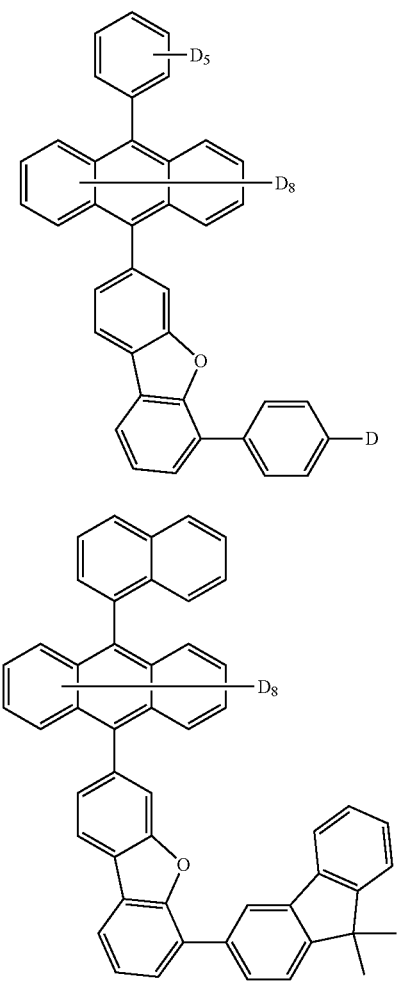
<Compound 262>
<Compound 263>
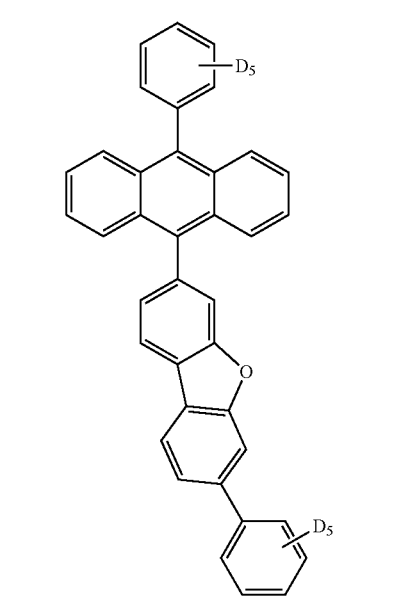
<Compound 264>
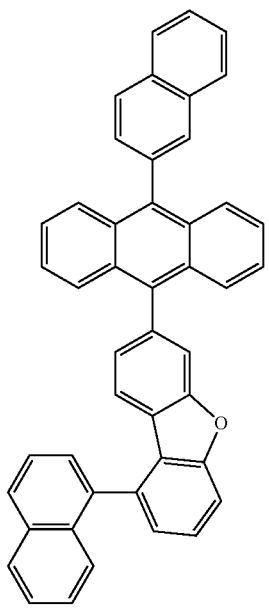
<Compound 265>
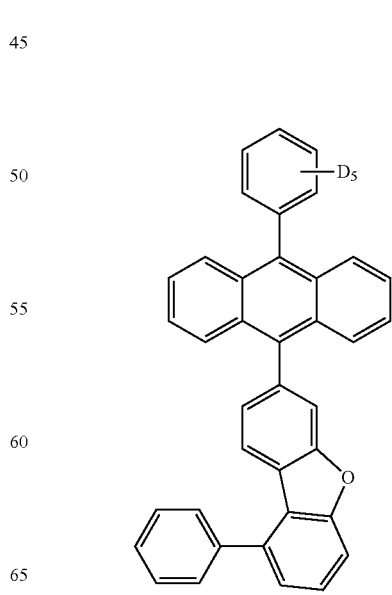

<Compound 266>
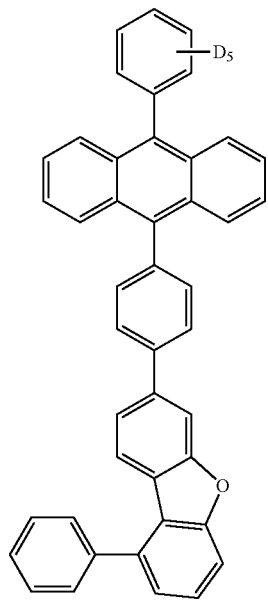
<Compound 267>
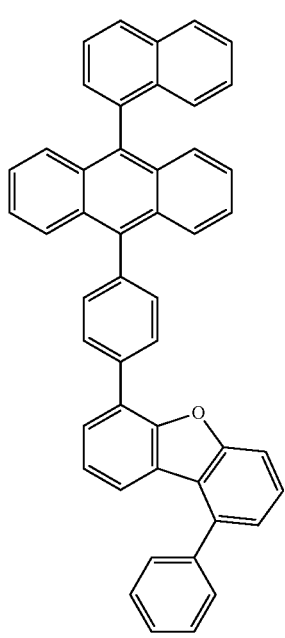
<Compound 268>
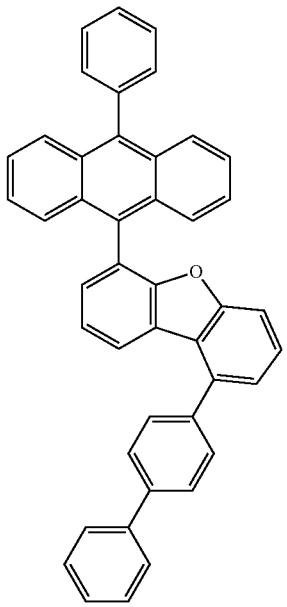
<Compound 269>
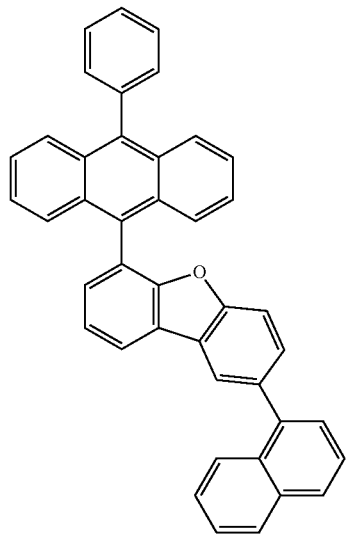
<Compound 270>

<Compound 271>
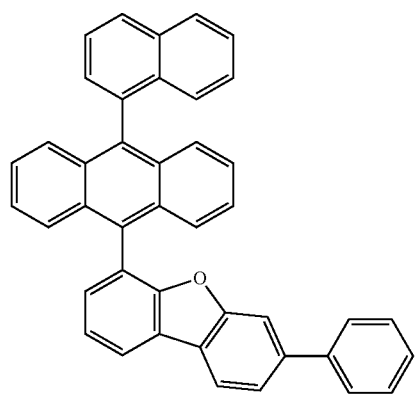
<Compound 272>
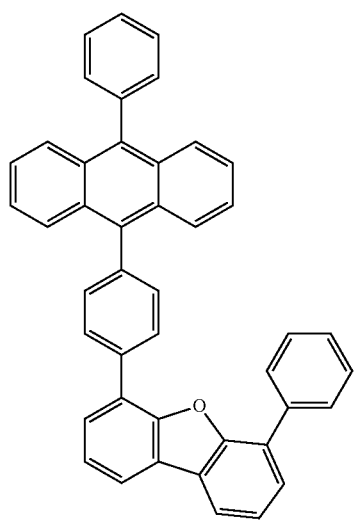
<Compound 273>
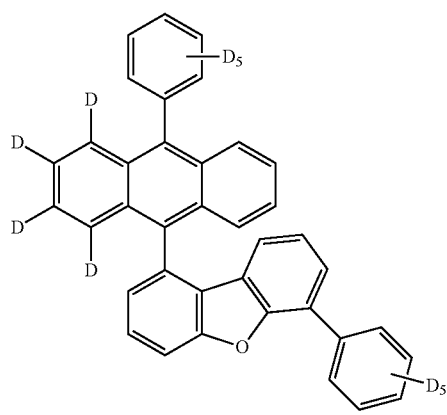
<Compound 274>
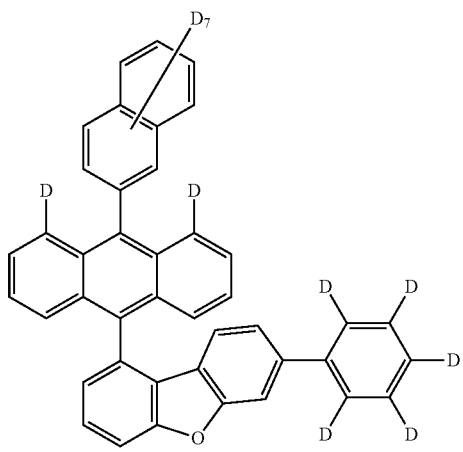
<Compound 275>
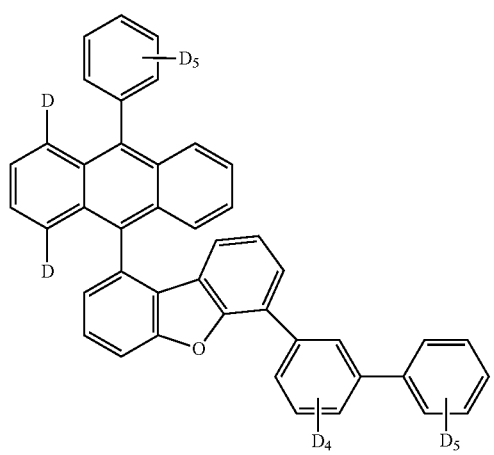
<Compound 276>
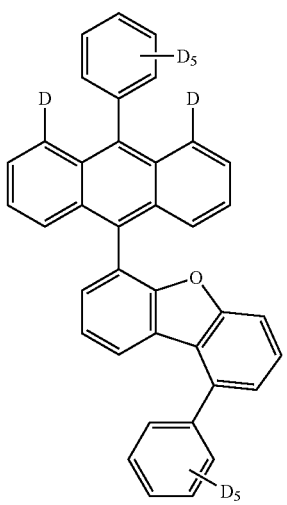

<Compound 277>
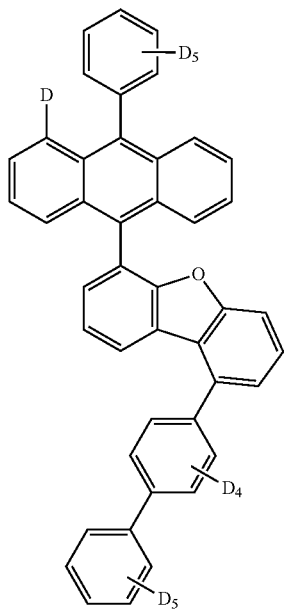
<Compound 279>
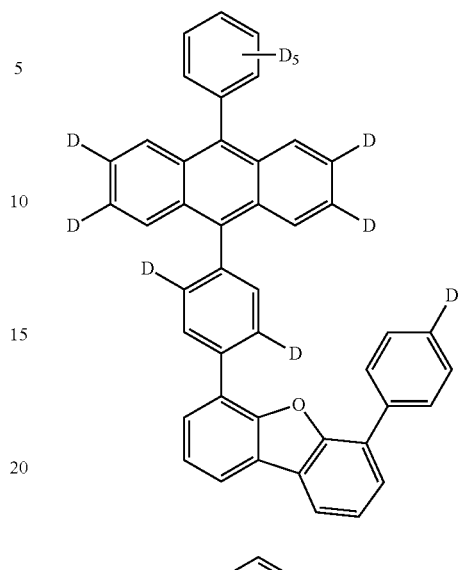
<Compound 280>
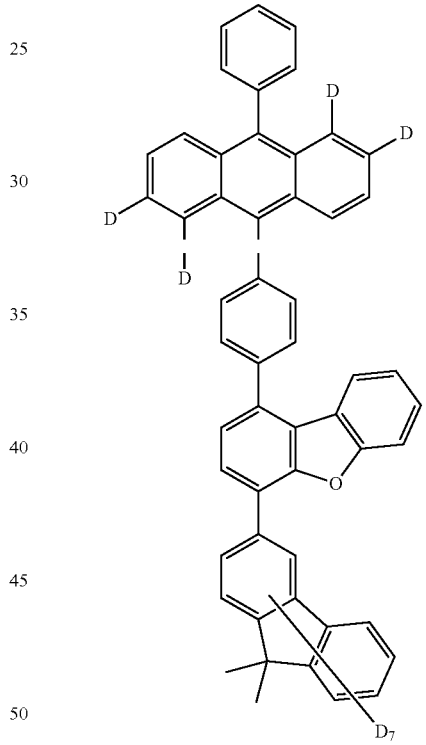
<Compound 278>
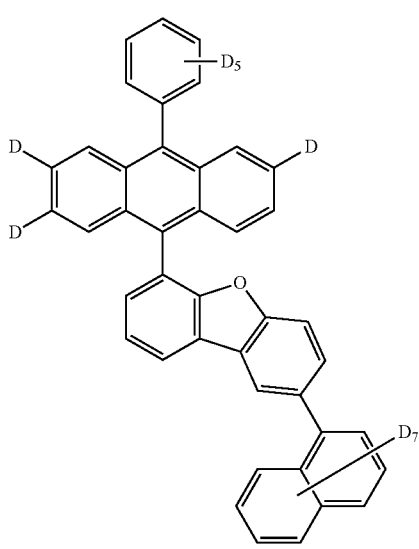
<Compound 281>
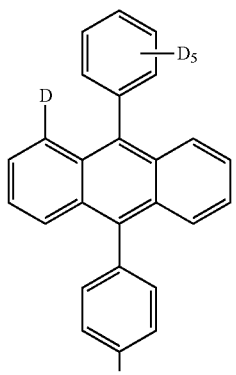

-continued

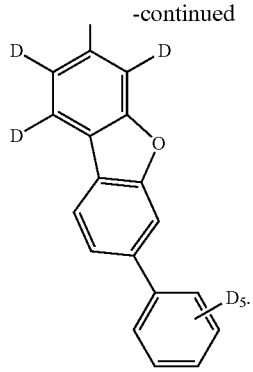

21. The organic light-emitting diode of claim 14, wherein at least one of the layers is deposited using a single-molecule deposition process or a solution process.

22. The organic light-emitting diode of claim 13, wherein the organic light-emitting diode is applied to a device selected from flat display devices, flexible display devices, monochrome or grayscale flat illumination devices, and monochrome or grayscale flexible illumination devices.

* * * * *